(12) United States Patent
Toyoda et al.

(10) Patent No.: US 8,324,512 B2
(45) Date of Patent: *Dec. 4, 2012

(54) MULTILAYER PRINTED WIRING BOARD

(75) Inventors: Yukihiko Toyoda, Ibi-gun (JP); Yoichiro Kawamura, Ibi-gun (JP); Tomoyuki Ikeda, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 4 days.

This patent is subject to a terminal disclaimer.

(21) Appl. No.: 13/004,325

(22) Filed: Jan. 11, 2011

(65) Prior Publication Data

US 2011/0108311 A1 May 12, 2011

Related U.S. Application Data

(63) Continuation of application No. 12/099,957, filed on Apr. 9, 2008, now Pat. No. 8,030,579, which is a continuation of application No. 10/257,370, filed as application No. PCT/JP02/02336 on Mar. 13, 2002, now Pat. No. 7,371,974.

(30) Foreign Application Priority Data

| Mar. 14, 2001 | (JP) | 2001-073066 |
| Mar. 16, 2001 | (JP) | 2001-075856 |
| Jul. 10, 2001 | (JP) | 2001-209953 |
| Jul. 10, 2001 | (JP) | 2001-209954 |
| Jul. 10, 2001 | (JP) | 2001-209955 |

(51) Int. Cl.
*H05K 1/11* (2006.01)

(52) U.S. Cl. ............ 174/262; 361/792

(58) Field of Classification Search ......... 174/262–266; 361/792–795
See application file for complete search history.

(56) References Cited

U.S. PATENT DOCUMENTS

| 4,713,494 A | 12/1987 | Oikawa et al. |
| 5,574,630 A | 11/1996 | Kresge et al. |
| 5,662,987 A | 9/1997 | Mizumoto et al. |
| 5,758,413 A | 6/1998 | Chong et al. |
| 5,883,335 A | 3/1999 | Mizumoto et al. |
| 6,085,415 A | 7/2000 | Gandhi et al. |
| 6,131,279 A | 10/2000 | Jones et al. |

(Continued)

FOREIGN PATENT DOCUMENTS

CN 1279157 1/2001
(Continued)

*Primary Examiner* — Jeremy Norris
(74) *Attorney, Agent, or Firm* — Oblon, Spivak, McClelland, Maier & Neustadt, L.L.P.

(57) ABSTRACT

A multilayered printed circuit board including a substrate, a multilayered structure built thereon and having conductor circuits and interlaminar resin insulating layers in an alternate fashion, and one or more stack-via structures including via-holes stacked one another and electrically connected to the conductor circuits through the insulating layers. Each of the via-holes includes a land portion formed on a respective one of the insulating layers and a filled via structure portion filling an opening of the respective one of the insulating layers with a metal layer such that the via-holes are stacked one another immediately above the filled via structure portion of each via-hole, the via-holes include the outermost layer via-hole in the outermost layer of the insulating layers, and one or more via-holes have the land portion having the land diameter which is larger than the land diameter of the land portion of the outermost layer via-hole.

35 Claims, 53 Drawing Sheets

U.S. PATENT DOCUMENTS

| | | |
|---|---|---|
| 6,323,439 B1 | 11/2001 | Kambe et al. |
| 6,329,610 B1 | 12/2001 | Takubo et al. |
| 6,365,843 B1 | 4/2002 | Shirai et al. |
| 6,376,052 B1 | 4/2002 | Asai et al. |
| 6,490,170 B2 | 12/2002 | Asai et al. |
| 6,506,982 B1 | 1/2003 | Shige et al. |
| 7,371,974 B2 | 5/2008 | Toyoda et al. |
| 8,030,579 B2 * | 10/2011 | Toyoda et al. ............ 174/262 |

FOREIGN PATENT DOCUMENTS

| | | |
|---|---|---|
| EP | 1 043 922 A2 | 10/2000 |
| EP | 1 211 920 A1 | 6/2002 |
| JP | 5-218645 | 8/1993 |
| JP | 05-82082 | 11/1993 |
| JP | 7-235768 | 9/1995 |
| JP | 7-273455 | 10/1995 |
| JP | 9-23065 | 1/1997 |
| JP | 09-130050 | 5/1997 |
| JP | 09-232760 | 9/1997 |
| JP | 09-237972 | 9/1997 |
| JP | 09-298369 | 11/1997 |
| JP | 10-294565 | 11/1998 |
| JP | 11-087924 | 3/1999 |
| JP | 11-289025 | 10/1999 |
| JP | 11-298153 | 10/1999 |
| JP | 2000-096022 | 4/2000 |
| JP | 2000-101246 | 4/2000 |
| JP | 2000-101248 | 4/2000 |
| JP | 2000-165046 | 6/2000 |
| JP | 2000-323841 | 11/2000 |
| JP | 2000-340953 | 12/2000 |
| JP | 2001-7256 | 1/2001 |
| JP | 2001-85837 | 3/2001 |
| JP | 2001-102758 | 4/2001 |
| JP | 2001-160687 | 6/2001 |
| WO | 01/13686 A1 | 2/2001 |

* cited by examiner (a)

(b)

(a)

(b)

(a)

(b)

(a)

(b)

(a)

(b)

(a)

(b)

(a)

(b)

(a)

(b)

(a)

(b)

MULTILAYER PRINTED WIRING BOARD

CROSS-REFERENCE TO RELATED APPLICATIONS

This application is a continuation of and claims the benefit of priority under 35 U.S.C. §120 from U.S. Ser. No. 12/099,957, filed Apr. 9, 2008, the entire contents of which are hereby incorporated by reference. U.S. Ser. No. 12/099,957 is a continuation of and claims the benefit of priority under 35 U.S.C. §120 from U.S. Ser. No. 10/257,370, filed May 7, 2003, now U.S. Pat. No. 7,371,974, issued May 13, 2008, which is a National Stage under 35 U.S.C. 371 of International Patent Application PCT/JP02/02336, filed Mar. 13, 2002. This application further is based upon and claims the benefit of priority under 35 U.S.C. §119 from the prior Japanese Patent Applications No. 2001-073066, filed Mar. 14, 2001, No. 2001-075856, fled Mar. 16, 2001, No. 2001-209953, filed Jul. 10, 2001, No. 2001-209954, filed Jul. 10, 2001, and No. 2001-209955, filed Jul. 10, 2001.

FIELD OF THE INVENTION

The present invention relates to a multilayered printed circuit board.

BACKGROUND OF THE INVENTION

A multilayered printed circuit board so-called a multilayered built-up circuit substrate is manufactured by a semi-additive method and the like and produced by reciprocally layering conductor circuits of copper and the like and interlaminar resin insulating layers on a resin substrate reinforced with a 0.5 to 1.5 mm-thick glass cloth so-called a core. The interlaminar connection of the conductor circuits through the interlaminar resin insulating layers of the multilayered printed circuit board is performed by a via-hole.

Conventionally, the built-up multilayered printed circuit board has been manufactured by a method, for example, disclosed in JP H09-130050 A.

That is, at first, a through hole is formed in a copper-clad laminate board bearing a copper foil and successively, the substrate is plated by electroless copper plating treatment to form a plated-through hole. Next, a conductor circuit is formed by etching the surface of the substrate in a conductor pattern by employing a photolithographic technique. Next, the surface of the conductor circuit is roughened by electroless plating or etching and the like. Continuously, a resin insulating layer is formed on the conductor circuit having a roughened surface and then subjected to exposure and development treatment to form an opening part for a via-hole and after that, the interlaminar resin insulating layer is formed by UV curing and main curing.

Further, after the interlaminar resin insulating layer is roughened by roughening treatment by an acid or an oxidizing agent,
a thin electroless plating film is formed and, then after a plating resist is formed on the electroless plating film, the electroless plating film is thickened by electroplating and after the plating resist is parted, etching is carried out to form a conductor circuit connected with an under-level conductor circuit through the via-hole.

After repeating these steps, finally a solder resist layer for protecting the conductor circuit is formed and the parts exposing openings for connection with electronic parts, such as an IC chip, or a mother board and the like are plated to form a pad for solder bump formation and then a solder bump is formed by printing a solder paste to the side of an electronic part such as an IC chip to manufacture a build-up multilayered printed circuit board. Further, if it is necessary, a solder bump is also formed in the mother board side.

SUMMARY OF THE INVENTION

Recently, along with introduce of high frequency to an IC chip, a multilayered printed circuit board with high densification and high speed performance is required, and as a multilayered printed circuit board corresponding to the requirements, a multilayered printed circuit board having a via-hole of a stack-via structure (a structure in which a via-hole is formed immediately above the via-hole) has been proposed (see FIG. 19)

In a multilayered printed circuit board having a via-hole of such a stack-via structure, since the signal transmission time can be shortened, the requirement for the high speed performance of the multilayered printed circuit board can be satisfied, and further since the room for option of the design of the conductor circuit is increased, the requirement for the high densification of the multilayered printed circuit board can be satisfied.

However, in the multilayered printed circuit board having a via hole with such a stack-via structure, crack generation in the interlaminar resin insulating layer in the vicinity of the via-hole takes place. Especially, in the case a multilayered printed circuit board is left for a prescribed duration under heat cycle conditions, cracks are frequently generated. Further, owing to the cracks, separation and disconnection have been occurred in the conductor circuit in the vicinity of the via-hole.

That is, in a conventional multilayered printed circuit board 600 (reference to FIGS. 19(*a*) and 19(*b*)) having a via-hole of the stack-via structure, the land diameter of via-holes 1071 to 1073 are generally almost same and no conductor circuit exists in a lower region (see region A in FIG. 19) of a non conductor circuit area between the via-hole 1071 in the outermost layer and the conductor circuit 105*a* neighboring the via-hole 1071 and only an interlaminar resin insulating layer 102 is formed in the lower region and in addition to that, no reinforcing material such as glass fiber and the like is not mixed in the interlaminar resin insulating layer, so that the mechanical strength in the region A is not sufficient and therefore, it is thought that cracks and the like are easy to be generated.

Especially, in the case where a stack-via structure in which via-holes of three layers or more are stacked is formed, the cracks are easy to be generated in the interlaminar resin insulating layer in the outermost layer and further owing to the cracks, separation and disconnection have been frequently occurred in a conductor circuit in the vicinity of the interlaminar resin insulating layer in the outermost layer.

The present inventors have enthusiastically made investigations and found that the problem of the generation of cracks and the like in an interlaminar resin insulating layer in the vicinity of a via-hole can be eliminated by making the land diameter of at least one via-hole among via-holes having the stack-via structure different from other land diameters, leading to achieve the present invention which is summarized in the following contents.

That is, a printed circuit board of a first aspect of the present invention is a multilayered printed circuit board comprising a substrate and, as serially built up thereon, a conductor circuit and an interlaminar resin insulating layer in an alternate fashion and in repetition, with a connection of the above-mentioned conductor circuits through the above-mentioned interlaminar resin insulating layer being performed by a via-hole, wherein: via-holes in different level layers among the above-mentioned via-holes are formed so as to form the stack-via structure; and at least one of the land diameters of the above-mentioned via-holes in different level layers is different from the land diameters of other via-holes in different level layers.

Further, a multilayered printed circuit board of a second aspect of the present invention is a multilayered printed circuit board comprising a substrate and, as serially built up thereon, a conductor circuit and an interlaminar resin insulating layer in an alternate fashion and in repetition, with: a connection of the above-mentioned conductor circuits through the above-mentioned interlaminar resin insulating layer being performed by a via-hole; and a connection of the above-mentioned conductor circuits through the above-mentioned substrate being performed by a plated-through hole, wherein: a via-hole having the stack-via structure is formed immediately above the above-mentioned plated-through hole; and at least one of the land diameters of the above-mentioned via-holes having the stack-via structure is different from the land diameters of other via-holes having the stack-via structure.

Further, a multilayered printed circuit board of a third aspect of the present invention is a multilayered printed circuit board comprising a substrate and, as serially built up thereon, a conductor circuit and an interlaminar resin insulating layer in an alternate fashion and in repetition, with: a connection of the above-mentioned conductor circuits through the above-mentioned interlaminar resin insulating layer being performed by a via-hole; and a connection of the above-mentioned conductor circuits through the above-mentioned substrate and the above-mentioned interlaminar resin insulating layer being performed by a plated-through hole, wherein: a via-hole having the stack-via structure is formed immediately above the above-mentioned plated-through hole; and at least one of the land diameters of the above-mentioned via-holes having the stack-via structure is different from the land diameters of other via-holes having the stack-via structure.

In the multilayered printed circuit boards of the first to third aspect of the present invention, it is desirable that at least one of the via-holes has a filled via shape.

Further, the present inventors have enthusiastically made investigations and found that the problem that the generation of cracks and the like is generated in an interlaminar resin insulating layer in the vicinity of a via-hole can be eliminated by forming a land of at least one of via-holes having the stack-via structure while extending to a non conductor circuit area formed in the periphery of the via-holes of the stack-via structure, that is, the conductor circuit non formed area can be reinforced by the enlarged lands of the via-holes made of a metal material, or that the above-mentioned problem can be eliminated by filling the non conductor circuit area with the via-holes and lands of the via-holes and thus have reached the invention with the contents as follows.

That is, a printed circuit board of a fourth aspect of the present invention is a multilayered printed circuit board comprising a substrate and, as serially built up thereon, a conductor circuit and an interlaminar resin insulating layer in an alternate fashion and in repetition, with a connection of the above-mentioned conductor circuits through the above-mentioned interlaminar resin insulating layers being performed by a via-hole wherein: via-holes in different level layers among the above-mentioned via-holes are formed so as to form the stack-via structure; and at least one of the lands of the above-mentioned via-holes in different level layers is formed to extend in a non conductor circuit formed area formed in the periphery of the via-hole with the stack-via structure.

Further, a multilayered printed circuit board of a fifth aspect of the present invention is a multilayered printed circuit board comprising a substrate and, as serially built up thereon, a conductor circuit and an interlaminar resin insulating layer in an alternate fashion and in repetition, with: a connection of the above-mentioned conductor circuits through the above-mentioned interlaminar resin insulating layer being performed by a via-hole; and a connection of the above-mentioned conductor circuits through the above-mentioned substrate being performed by a plated-through hole, wherein: a via-hole having the stack-via structure is formed immediately above the above-mentioned plated-through hole; and at least one of the lands of the above-mentioned via-holes having the stack-via structure is formed to extend in a non conductor circuit formed area formed in the periphery of the via-hole with the stack-via structure.

Further, a multilayered printed circuit board of a sixth aspect of the present invention is a multilayered printed circuit board comprising a substrate and, as serially built up thereon, a conductor circuit and an interlaminar resin insulating layer in an alternate fashion and in repetition, with: a connection of the above-mentioned conductor circuits through the above-mentioned interlaminar resin insulating layer being performed by a via-hole; and a connection of the above-mentioned conductor circuits through the above-mentioned substrate and the above-mentioned interlaminar resin insulating layer being performed by a plated-through hole, wherein: a via-hole having the stack-via structure is formed immediately above the above-mentioned plated-through hole; and at least one of the lands of the above-mentioned via-holes having the stack-via structure is formed to extend in a non conductor circuit formed area formed in the periphery of the above-mentioned via-hole with the stack-via structure.

In the multilayered printed circuit boards of the fourth to sixth aspect of the present invention, it is desirable that a part of the via-hole formed in an extending manner exists in a region of ½ or more of a width of the non conductor circuit area formed in the peripheral parts of the via-holes with the stack-via structure, in a planar view of the non conductor circuit areas.

Further, in the multilayered printed circuit boards of the fourth to sixth aspect of the present invention, it is desirable that at least one of the via-holes has a filled via shape. It is also desirable that the roughness of its upper face is desirably 5 μm or less.

Further, the present inventors have made investigations of causes of the generation of the cracks in the interlaminar resin insulating layers (especially, the interlaminar resin insulating layer in the outermost layer) in the vicinity of the via-holes in the case the via-holes of the stack-via structure are formed.

Consequently, it has been found: that in the via-holes of the stack-via structure, since the via-holes have a structure in which they are arranged linearly one another, when a stress is generated owing to the differences of the coefficients of linear expansion between the interlaminar resin insulating layers and the via-holes, the stress is difficult to be moderated and additionally that since the upper part of the via-hole in the uppermost level has generally an external terminal such as a solder bump and the like, the stress is especially difficult to be moderated; and that this is supposed to be the cause of easy generation of the cracks in the interlaminar resin insulating layers (especially, the interlaminar resin insulating layer in the outermost layer) in the peripheral parts of the via-holes.

The present inventors consider it might be possible to eliminate the above-mentioned problems by making the coefficient of linear expansion of the interlaminar resin insulating layers, especially the coefficient of linear expansion of the interlaminar resin insulating layer in the outermost layer smaller and making it difficult to cause stress in the via-holes of a stack-via structure, especially in the via-hole in the uppermost level and thus have reached the invention with the contents as follows.

That is, a printed circuit board of a seventh aspect of the present invention is a multilayered printed circuit board comprising: a substrate and, as serially built up thereon, a conductor circuit and an interlaminar resin insulating layer in an alternate fashion and in repetition; and a solder resist layer formed further thereon as an outermost layer, with a connection of the above-mentioned conductor circuits through the above-mentioned interlaminar resin insulating layer being performed by a via-hole, wherein: via-holes in different level layers among the above-mentioned via-holes are formed so as to form the stack-via structure; and among the above-mentioned interlaminar resin insulating layers, a coefficient of linear expansion of the interlaminar resin insulating layer in the outermost layer is smaller than the coefficients of linear expansion of the interlaminar resin insulating layers in other layers or equal to the coefficients of linear expansion of the interlaminar resin insulating layers in other layers.

Further, a multilayered printed circuit board of an eighth aspect of the present invention is a multilayered printed circuit board comprising: a substrate and, as serially built up thereon, a conductor circuit and an interlaminar resin insulating layer in an alternate fashion and in repetition; and a solder resist layer formed further thereon as an outermost layer, with a connection of the above-mentioned conductor circuits through the above-mentioned interlaminar resin insulating layer being performed by a via-hole, wherein: via-holes in different level layers among the above-mentioned via-holes are formed so as to form the stack-via structure; and among the above-mentioned interlaminar resin insulating layers, at least the interlaminar resin insulating layer in the outermost layer has a coefficient of linear expansion of 100 ppm/° C. or less.

Further, a multilayered printed circuit board of a ninth aspect of the present invention is a multilayered printed circuit board comprising a substrate and, as serially built up thereon, a conductor circuit and an interlaminar resin insulating layer in an alternate fashion and in repetition; and a solder resist layer formed further thereon as an outermost layer, with a connection of the above-mentioned conductor circuits through the above-mentioned interlaminar resin insulating layer being performed by a via-hole, wherein: via-holes in different level layers among the above-mentioned via-holes are formed so as to form the stack-via structure; and among the above-mentioned interlaminar resin insulating layers, at least the interlaminar resin insulating layer in the outermost layer contains a particle and a rubber component and has a coefficient of linear expansion of 100 ppm/° C. or less.

Further, in the multilayered printed circuit board of the ninth aspect of the present invention, it is desirable that the particle is at least one kind of an inorganic particle, a resin particle and a metal particle.

Further, in the multilayered printed circuit boards of the seventh to ninth aspect of the present invention, it is desirable that the interlaminar resin insulating layer in the outermost layer is made of a resin composition including at least one kind of thermosetting resin, photosensitive resin, a resin complex of thermosetting resin and thermoplastic resin, and a resin complex of thermosetting resin and photosensitive resin.

Further, the present inventors have made investigations of the causes for crack generation in the interlaminar resin insulating layers (especially the interlaminar resin insulating layer in the outermost layer) in the vicinity of the via-holes in the case the via-holes are formed in the stack-via structure.

As a result, it has been found: that since the via-holes of the stack-via structure are arranged linearly one another, when stress is generated owing to the differences of the coefficients of linear expansion between the interlaminar resin insulating layers and the via-holes, the stress is difficult to be moderated and the stress is especially difficult to be moderated and further the stress is easy to be concentrated in the via-hole in the uppermost level since an external terminal such as a solder bump and the like is generally formed thereon; and that this is supposed to be a cause of the crack generation in the interlaminar resin insulating layers in the vicinity of the via-holes (especially in the interlaminar resin insulating layer in the outermost layer).

Thus, the present inventors have found that if the via-holes are not arranged linearly in a multilayered printed circuit board where via-holes in different level layers are piled, that is, if the via-holes are piled while their center being shifted from one another, the stress is hardly concentrated in some of the via-holes and the above-mentioned problems might be eliminated and thus have achieved the invention with the contents as follows.

That is, a multilayered printed circuit board of a tenth aspect of the present invention is a multilayered printed circuit board comprising: a substrate and, as serially built up thereon, a conductor circuit and an interlaminar resin insulating layer in an alternate fashion and in repetition; and a solder resist layer formed further thereon as an outermost layer, with a connection of the above-mentioned conductor circuits through the above-mentioned interlaminar resin insulating layer being performed by a via-hole, wherein: via-holes in different level layers among the above-mentioned via-holes are piled on one another; and among the above-mentioned piled via-holes, at least one via-hole is piled on other via-holes with its center deviated from other via-holes, and other via-holes are piled on one another with those centers approximately overlapped one another.

Further, in the multilayered printed circuit board of the tenth aspect of the present invention, it is desirable that among the interlaminar resin insulating layers, at least the interlaminar resin insulating layer in the outermost layer has the coefficient of linear expansion of 100 ppm/° C. or less.

Further, in the above-mentioned multilayered printed circuit board, it is desirable that, among the interlaminar resin insulating layers, at least the interlaminar resin insulating layer in the outermost layer contains a particle and a rubber component.

Further, it is desirable that the particle is at least one kind of an inorganic particle, a resin particle and a metal particle.

Further, in the above-mentioned multilayered printed circuit board, it is desirable that, among the interlaminar resin insulating layers, at least the interlaminar resin insulating layer in the outermost layer is made of a resin composition including at least one kind of thermosetting resin, photosensitive resin, a resin complex of thermosetting resin and thermoplastic resin, and a resin complex of thermosetting resin and photosensitive resin.

Further, the present inventors have made investigations of the causes for crack generation in the interlaminar resin insulating layers (especially the interlaminar resin insulating layer in the outermost layer) in the vicinity of the via-holes in the case the via-holes are formed in the stack-via structure.

As a result, it has been found: that regarding the via-holes of the stack-via structure, generally, the shape of the respective via-holes are made to have a filled via-hole shape suitable to form a via-hole immediately above themselves and the via-holes have structures arranged linearly one another, thus, when stress is generated owing to the differences of the coefficients of linear expansion between the interlaminar resin insulating layers and the via-holes, the stress is difficult to be moderated; that the stress is especially difficult to be moderated and further the stress is easy to be concentrated in the via-hole in the uppermost level since an external terminal such as a solder bump and the like is generally formed thereon; and that this is supposed to be a cause of the crack generation in the interlaminar resin insulating layers in the vicinity of the via-holes (especially in the interlaminar resin insulating layer in the outermost layer).

The present inventors have also found that, when a concave portion is formed on the upper face of the via-hole in the uppermost level in a multilayered printed circuit board where the via-holes in different level layers are piled on one another, the above-mentioned problems might be eliminated and thus have achieved the inventions with the contents as follows.

That is, a multilayered printed circuit board of an eleventh aspect of the present invention is a multilayered printed circuit board comprising: a substrate and, as serially built up thereon, a conductor circuit and an interlaminar resin insulating layer in an alternate fashion and in repetition; and a solder resist layer formed further thereon as an outermost layer, with a connection of the above-mentioned conductor circuits through the above-mentioned interlaminar resin insulating layer being performed by a via-hole, wherein: via-holes in different level layers among the above-mentioned via-holes are piled on one another; and among the above-mentioned piled via-holes, the via-hole in the uppermost level has a concave portion formed thereon.

Further, in the multilayered printed circuit board of the present invention, it is desirable that the piled via-holes are piled on one another with those centers approximately overlapped one another.

Further, in the multilayered printed circuit board, it is also desirable that, among the piled via-holes, at least one via-hole is piled on other via-holes with its center deviated, and the other via-holes are piled on one another with those centers approximately overlapped one another.

In the multilayered printed circuit board, it is desirable that the depth of the concave portion is 5 to 25 μm.

Further, in the multilayered printed circuit board, it is desirable that, among the interlaminar resin insulating layers, at least the interlaminar resin insulating layer in the outermost layer has a coefficient of linear expansion of 100 ppm/° C. or less.

Further, in the multilayered printed circuit board, it is desirable that, among the interlaminar resin insulating layers, at least the interlaminar resin insulating layer in the outermost layer contains a particle and a rubber component, and it is also desirable that the particle is at least one kind of an inorganic particle, a resin particle and a metal particle.

Further, in the multilayered printed circuit board, it is desirable that, among the interlaminar resin insulating layers, at least the interlaminar resin insulating layer in the outermost layer is made of a resin composition including at least one kind of thermosetting resin, photosensitive resin, a resin complex of thermosetting resin and thermoplastic resin, and a resin complex of thermosetting resin and photosensitive resin.

Figure 1:
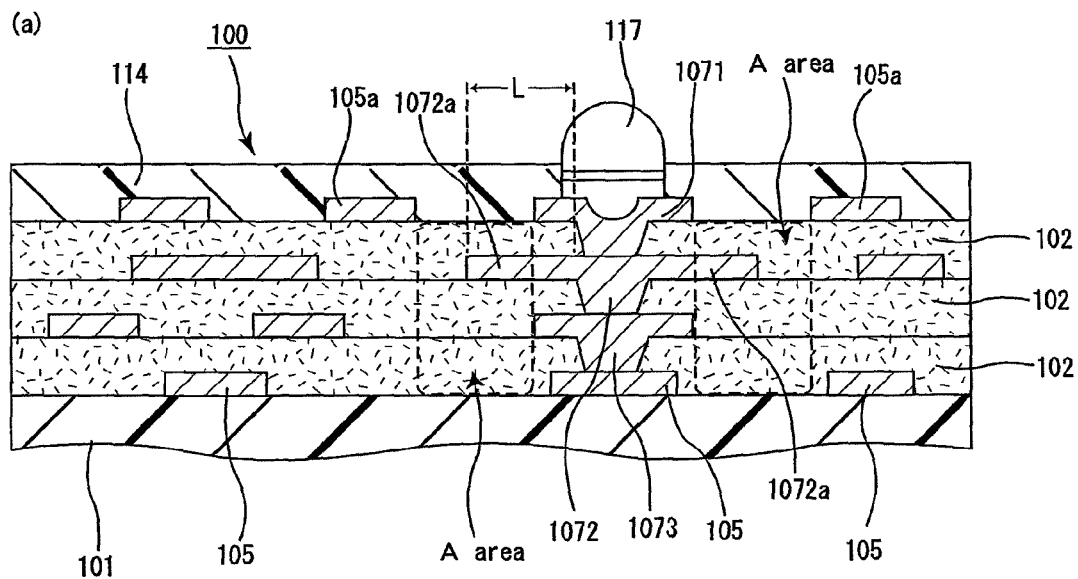
FIG. 1 (a) is a partial cross-section figure schematically showing a part of an embodiment of a multilayered printed circuit board of the first aspect of the present invention and FIG. 1 (b) is a perspective figure schematically showing a via-hole of the multilayered printed circuit board shown in FIG. 1 (a).
Figure 1:
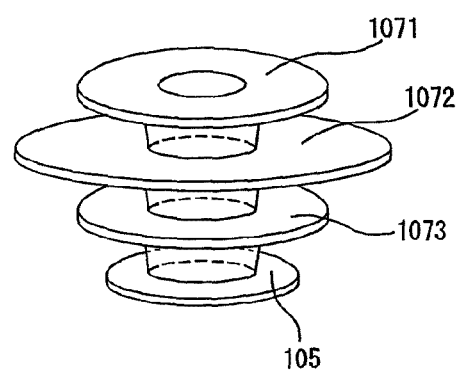

DESCRIPTION OF SYMBOLS 1, 21, 41, 61, 81, 121 a substrate
2, 22, 42, 62, 82, 122 an interlaminar resin insulating layer
3, 23, 43, 63, 83, 123 a plating resist
4, 24, 44, 64, 84, 124 an under-level conductor circuit
5, 25, 45, 65, 85, 125 a conductor circuit
6, 26, 46, 66, 86, 126 an opening for a via-hole
7, 27, 47, 67, 87, 127 a via-hole
8, 28, 48, 68, 88, 128 a copper foil
9, 29, 49, 69, 89, 129 a plated-through hole
10, 30, 50, 70, 90, 130 a resin filler layer
12, 32, 52, 72, 92, 132 a thin film conductor layer
13, 33, 53, 73, 93, 133 an electroplating film
14, 34, 54, 74, 94, 134 a solder resist layer
17, 37, 57, 77, 97, 137 a solder bump
31, 71, 131 a cover plating layer

DETAILED DESCRIPTION OF THE INVENTION

At first, a multilayered printed circuit board of a first aspect of the present invention will be described.

The multilayered printed circuit board of the first aspect of the present invention is a multilayered printed circuit board comprising a substrate and, as serially built up thereon, a conductor circuit and an interlaminar resin insulating layer in an alternate fashion and in repetition, with a connection of the above-mentioned conductor circuits through the above-mentioned interlaminar resin insulating layer being performed by a via-hole, wherein:

via-holes in different level layers among the above-mentioned via-holes are formed so as to form the stack-via structure; and at least one of the land diameters of the above-mentioned via-holes in different level layers is different from the land diameters of other via-holes in different level layers.

In the multilayered printed circuit board of the first aspect of the present invention, the via-holes in different level layers are arranged one another so as to form a stack-via structure.

As mentioned above, in the case via-holes are formed in a stack-via structure, the wiring distance becomes short, so that the signal transmission time can be shortened and the room for option of the design of a conductor circuit can be increased and therefore it becomes easy to deal with high density wiring.

Further, in the above-mentioned multilayered printed circuit board, at least one of the land diameters among the via-holes in different level layers is different from the land diameters of other via-holes in different level layers.

In the case via-holes have such a constitution, the via-hole with a larger land diameter functions as a reinforcing material of interlaminar resin insulating layers and accordingly, the mechanical strength of the interlaminar resin insulating layers is increased and especially, cracks are hardly generated in the interlaminar resin insulating layers in the vicinity of the via-holes.

The above-mentioned matter will be described with the reference to figures below.

Figure 2:
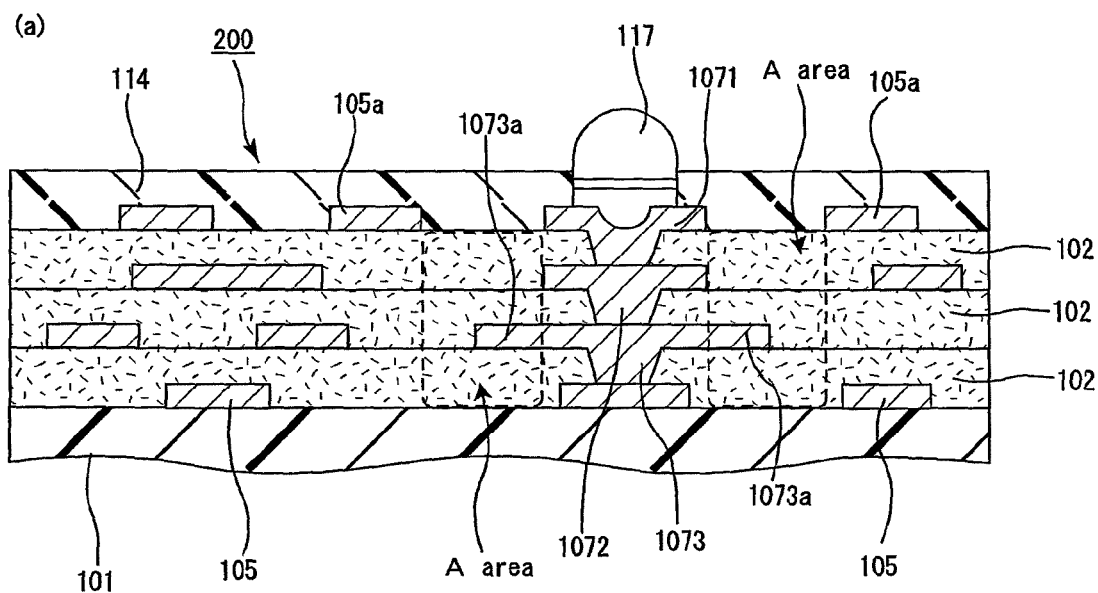
FIG. 2 (a) is a partial cross-section figure schematically showing a part of an embodiment of a multilayered printed circuit board of the first aspect of the present invention and FIG. 2 (b) is a perspective figure schematically showing a via-hole of the multilayered printed circuit board shown in FIG. 2 (a).
Figure 2:
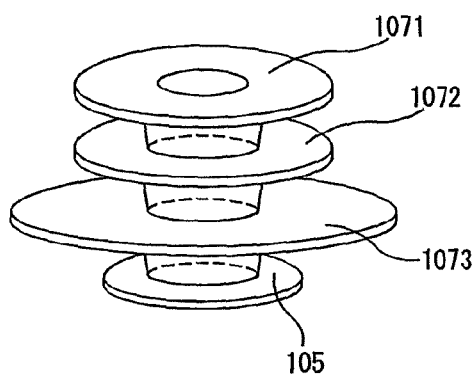
Figure 3:
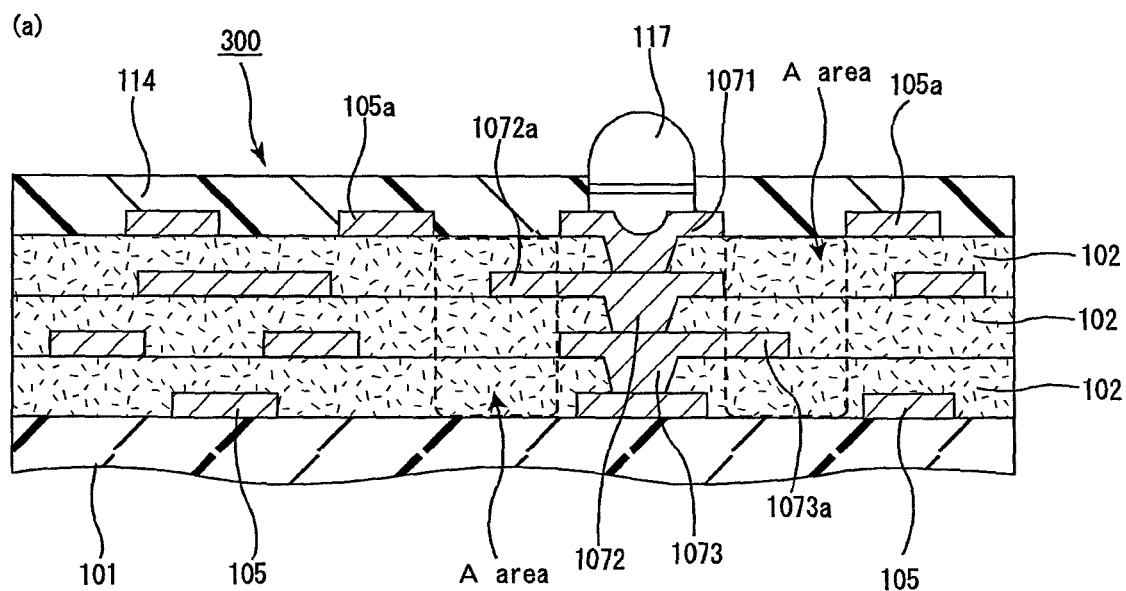
FIG. 3 (a) is a partial cross-section figure schematically showing a part of an embodiment of a multilayered printed circuit board of the first aspect of the present invention and FIG. 3 (b) is a perspective figure schematically showing a via-hole of the multilayered printed circuit board shown in FIG. 3 (a).
Figure 3:
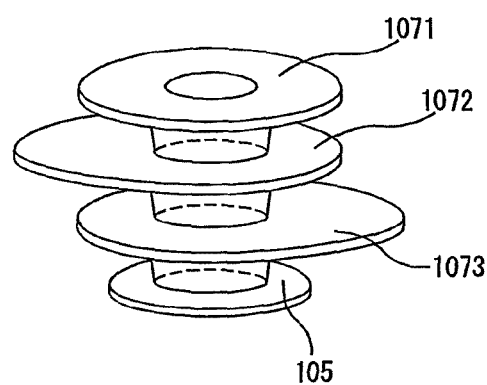

In respective FIG. 1 to FIG. 3, those denoted as (a) are partial cross-section figures schematically showing a part of one embodiment of a multilayered printed circuit board of a first aspect of the present invention, those denoted as (b) are perspective figures schematically showing only a via-hole of the multilayered printed circuit board shown in (a).

In the multilayered printed circuit board of the first aspect of the present invention, at least one of the land diameters of the via-holes in different level layers is different from the land diameters of other via-holes in different level layers. Specifically, for example, as shown in FIGS. 1 (a), (b), the land diameters of via-holes 1072 in inner layers are made larger than the land diameter of a via-hole 1071 in the outermost layer. In this case, the via-holes of the respective level layers are formed so as to have a circular shape and be concentric in a planar view.

Also, for example, as shown in FIGS. 2 (a), (b), the land diameter of a via-hole 1073 in the lowest layer may be formed so as to have a larger land diameter than that of the via-hole 1071 in the outermost layer. In this case, the respective via-holes in the respective level layers are formed so as to have a circular shape and be concentric in a planar view as well.

Further, as shown in FIGS. 3 (a), (b), a part of land diameters of the via-hole 1072 of the inner layer and a part of the land diameter of the via-hole 1073 of the lowest layer may be formed so as to be larger than the land diameter of the via-hole 1071 in the outermost layer at different portions of the lower regions (in the figure, A area) of the non conductor circuit formed area between the via-hole 1071 of the outermost layer and the conductor circuits 105a neighboring the via-hole 1071. In this case, the respective via-holes of the respective layers are formed to have circular shapes in a planar view, however the centers of the outer rims thereof (that is, the centers of the circles in the planar view) are at different positions, that is, the center of the outer rim of a via-hole of an inner layer and the center of the outer rim of the via-hole of the lowest layer are at opposite positions each other across the center of the outer rim of the via-hole in the outermost layer. Incidentally, the centers of the outer rim of the via-hole in the inner layers and the center of the outer rim of the via-hole in the lowest layer, in the planar view, may be positioned at differently from the position that they are at the opposite positions each other across the center of the outer rim of the via hole in the outermost layer.

In the case via-holes having a stack-via structure with such a constitution is formed, not only the interlaminar resin insulating layers 102 but also the land parts 1072a, 1073a of the via-holes exist in some portions of the areas (A areas) under the non conductor circuit formed area between the via-hole of the outermost layer and conductor circuits neighboring the via-hole. In this case, the land parts work as a reinforcing member of the interlaminar resin insulating layers, so that the mechanical strength of the A areas is improved and subsequently, the generation of cracks and occurrence of separation of the conductor circuits and the via-holes from the interlaminar resin insulating layers can be prevented.

Incidentally, in FIGS. 1 to 3, 101 denotes a substrate, 114 denotes a solder resist layer, 117 denotes a solder bump.

The shapes of the via-holes are not necessarily limited to the shapes as illustrated in FIGS. 1 to 3 and although not being illustrated, for example, both of the land diameter of the via-holes 1072 in the inner layers and the land diameter of the via-hole 1073 in the lowest layer are made to be larger than the land diameter of the via-hole of the outermost layer.

The land diameters of the via-holes of the respective level layers may be different from one another.

In the above-mentioned example, the shapes of the via-holes of the respective level layers in a planar view are described to be circular, however the shapes are not limited to circular and may be, for example, elliptic, rectangular and the like.

In the multilayered printed circuit board of the first aspect of the present invention, the number of the layers of the via-holes having the stack-via structure is not particularly limited if it is two or more and it may be three as the illustrated multilayered printed circuit board or two layers or four or more layers.

Incidentally, in this specification, "the land diameter of a via-hole" means the distance from the outer rim of an opening for a via-hole to the outer rim of the via-hole and, for example, it means the distance L shown in FIG. 1 (a).

The above-mentioned land diameter of the via-hole is: desirable to be such a length that at least one land portion exists in a half area of the via-hole side of the A area; and more desirable to be such a length that at least one land portion penetrates the A area.

As mentioned above, in the above-mentioned multilayered printed circuit board, the via-holes in different level layers among the via-holes are formed so as to have a stack-via structure.

Accordingly, in order to make the via-holes highly reliable, the shapes of the via-holes in underlevel layers (of via-holes immediately above which another via-hole is formed) are desirable to be filled via shape. That is because in the case of filled via shape, since the upper face of the via-hole is approximately flat, layering another via-hole immediately thereon is easy.

Further, the via-hole is generally formed by plating treatment as it will be described later and in the case the via-hole is made to have a filled via shape; the filled via shape may be formed by plating treatment; or after a via-hole with a shape having a concave portion on the upper face, the concave portion may be filled by a conductor containing paste and the like to make the shape of the via-hole be a filled via.

A plating solution to be employed in the case the via-hole with the filled via shape is formed by plating will be described later.

Further, it is also acceptable that: firstly, the via-hole is not formed to be a filled via but to be a via-hole having a concave portion on the upper face and then the concave portion is filled with a resin filler and the like, and after that, a cover plating layer is formed so as to cover the filled resin and make the upper face of the via-hole flat.

In the above-mentioned via-hole, in the case the shape is made to be the filled via shape or the cover plating layer is formed on the via-hole, the average roughness Ra of the upper face is desirably 5 μm or lower.

Because that is suitable for formation of the via-holes with the stack-via structure and capable of providing excellent connection reliability of the via-holes with the stack-via structure.

In the multilayered printed circuit board of the first aspect of the present invention, the via-holes in all of the different level layers are not necessarily formed to have the stack-via structure and some via-holes on which no other via-hole is formed may exist.

The method for manufacturing the multilayered printed circuit board of the first aspect of the present invention will be described in order of the respective processes.

(1) At first, a conductor circuit is formed on a substrate using, as a starting material, a resin substrate such as glass epoxy substrate, a polyimide substrate, a bismaleimide-triazine resin (BT resin) substrate, a fluororesin substrate or a copper-clad laminate plate.

Specifically, for example, after a conductor layer in a spreaded state is formed on both faces of a substrate by electroless plating and the like, an etching resist corresponding to a conductor circuit pattern is formed on the conductor layer and after that, etching is carried out to form the conductor circuit.

Further, a copper-clad laminate plate may be used as a substrate on which a conductor layer is formed in a spread state.

Further, at the time of execution of the above-mentioned electroless plating treatment, through holes are previously formed in the insulating substrate to be subjected to the electroless plating treatment in the wall faces of the through holes and form plated-through holes for electrically connecting the conductor circuits sandwiching the substrate.

Further, after the formation of the plated-through holes, it is desirable to fill the plated-through holes with a resin filler. At that time, the resin filler is desirable to be packed in non conductor circuit formed area.

Examples of the above-mentioned resin filler include a resin composition and the like containing epoxy resin, a curing agent, and an inorganic particle.

(2) Next, based on the necessity, the surface roughening treatment of the conductor circuits is carried out. The roughening treatment may be, for example, a blackening (oxidizing)-reducing treatment, an etching treatment using a solution mixture containing an organic acid and a cupric complex, a treatment of Cu—Ni—P needle-like alloy plating and the like.

(3) Next, either a un-cured resin layer comprising thermosetting resin or a resin complex or a resin layer containing thermoplastic resin is formed on the conductor circuits.

The above-mentioned un-cured resin layer may be formed by applying un-cured resin by a roll coater, a curtain coater, and the like or by thermally bonding an un-cured (half-cured) resin film. Further, a resin film obtained by forming a metal layer of such as a copper foil to one face of an un-cured resin film may be attached to.

The resin layer comprising the thermoplastic resin is desirable to be formed by thermally bonding a resin formed body formed into a film-like thereon.

In the case of applying the above-mentioned un-cured resin, after resin is applied, heating treatment is carried out.

The execution of the above-mentioned heating treatment makes it possible to thermally cure the un-cured resin.

Incidentally, the above-mentioned thermal curing may be carried out after formation of the opening for a via-hole which will be described later.

The practical examples of the thermosetting resin to be used for the formation of such a resin layer include, for example, epoxy resin, phenol resin, polyimide resin, polyester resin, bismaleimide resin, polyolefin type resin, polyphenylene ether resin and the like.

The examples of the above-mentioned epoxy resin include cresol-novolak type epoxy resin, bisphenol A-type epoxy resin, bisphenol F-type epoxy resin, phenol-novolak type epoxy resin, alkylphenol-novolak type epoxy resin, biphenol F-type epoxy resin, naphthalene type epoxy resin, dicyclopentadiene type epoxy resin, epoxylated compounds of condensates of phenols and aromatic aldehydes containing a phenolic hydroxyl group, triglycidyl isocyanurate, alicyclic epoxy resin and the like. They may be used alone or in combination of two or more of them. Accordingly, excellent heat resistance can be provided.

Examples of the above-mentioned polyolefin type resin include polyethylene, polystyrene, polypropylene, polyisobutylene, polybutadiene, polyisoprene, cycloolefin type resin, copolymers of these resin materials and the like.

Further, examples of the above-mentioned thermoplastic resin include phenoxy resin, polyethersulfone, polysulfone and the like.

Further, the complexes (resin complexes) of thermosetting resin and thermoplastic resin are not particularly limited if they contain thermosetting resin and thermoplastic resin and their practical examples include resin compositions for roughened surface formation.

The above-mentioned resin compositions for roughened surface formation include, for example, those in which a substance soluble in the roughening solution containing at least one kind selected from an acid, an alkali, and an oxidizing agent is dispersed in the matrix, which is un-cured heat resistant resin matrix hardly soluble in a roughening solution containing at least one kind selected from an acid, an alkali, and an oxidizing agent.

Incidentally, the terms, "hardly soluble" and "soluble", means those which have a relatively high dissolution speed are called as soluble for the convenience and those which have a relatively slow dissolution speed are called as hardly soluble for the convenience in the case they are immersed in the same roughening solution for the same period.

The above-mentioned heat resistant resin matrix is desirable to be those which are capable of keeping the shape of the roughened surface at the time of roughened surface formation on an interlaminar resin insulating layer using the above-mentioned roughening solution and examples of the resin matrix include thermosetting resin, thermoplastic resin, and their complexes and the like. Further, it may be a photosensitive resin. Because an opening can be formed by exposure and development treatment in the process of forming an opening for a via-hole, the process will be described later.

Examples of the above-mentioned thermosetting resin include epoxy resin, phenol resin, polyimide resin, polyolefin resin, fluororesin and the like. Further, resin obtained by providing photosensitivity to these thermosetting resin materials, that is, resin obtained by (meth)acrylation of the thermosetting group using methacrylic acid, acrylic acid and the like may be used. Specifically, (meth)acrylate of epoxy resin is desirable and further epoxy resin containing two or more of epoxy groups in a molecule is more desirable.

Examples of the above-mentioned thermoplastic resin include phenoxy resin, polyethersulfone, polysulfone, polyphenylenesulfone, polyphenylene sulfide, polyphenyl ether, polyetherimide and the like. They may be used alone or in combination of two or more of them.

Examples of the above-mentioned soluble substances include an inorganic particle, a resin particle, a metal particle, a rubber particle, a liquid-phase resin, a liquid-phase rubber and the like. They may be used alone or in combination of two or more of them.

Examples of the above-mentioned inorganic particle include aluminum compounds such as alumina, aluminum hydroxide; calcium compounds such as calcium carbonate, calcium hydroxide; potassium compounds such as potassium carbonate; magnesium compounds such as magnesia, dolomite, basic magnesium carbonate, talc and the like; silicon compounds such as silica, zeolite and the like. They may be used alone or in combination of two or more of them.

The above-mentioned alumina particle can be dissolved in and removed by hydrofluoric acid, and calcium carbonate can be dissolved in and removed by hydrochloric acid. Sodium-containing silica and dolomite can be dissolved in and removed by an aqueous alkaline solution.

Examples of the above-mentioned resin particle include those comprising thermosetting resin and thermoplastic resin, and those which have a higher dissolution speed than that of the above-mentioned heat resistant resin matrix in the case of immersion in a roughening solution containing at one kind of compounds selected from an acid, an alkali, and an oxidizing agent can be used without any specific limitation and specifically, examples include amino resin (melamine resin, urea resin, guanamine resin and the like), epoxy resin, phenol resin, phenoxy resin, polyimide resin, polyphenylene resin, polyolefin resin, fluoro resin, bismaleimide-triazine resin and the like. They may be used alone or in combination of two or more of them.

The above-mentioned resin particle is required to be previously subjected to curing treatment. That is because if curing is not carried out, the above-mentioned resin particle is dissolved in a solvent for dissolving the resin matrix and mixed evenly and therefore, the resin particle cannot be dissolved and removed selectively alone.

Examples of the above-mentioned metal particle include gold, silver, copper, tin, zinc, stainless steel, aluminum, nickel, iron, lead and the like. They may be used alone or in combination of two or more of them.

Further, the above-mentioned metal particle may be coated with resin on the surface layer in order to assure the insulating property.

(4) Next, in the case an interlaminar resin insulating layer is formed using thermosetting resin or resin complex as the material for it, an un-cured resin layer is cured by curing treatment and at the same time an opening for a via-hole is formed to obtain the interlaminar resin insulating layer.

The above-mentioned opening for a via-hole is desirable to be formed by laser treatment. The above-mentioned laser treatment may be carried out before the above-mentioned curing treatment or after the curing treatment.

Further, in the case of formation of the interlaminar resin insulating layer made of a photosensitive resin, the opening for a via-hole may be formed by exposure and development treatment. Incidentally, in this case, the exposure and development treatment is carried out before the above-mentioned curing treatment.

Further, in the case of formation of the interlaminar resin insulating layer using thermoplastic resin as the material for the layer, an opening for a via-hole is formed in the resin layer comprising the thermoplastic resin by laser treatment to obtain the interlaminar resin insulating layer.

The laser to be employed at that time includes, for example, carbonic acid gas laser, excimer laser, UV laser, YAG laser and the like. They may be properly employed in consideration of the shape and the like of the opening for a via-hole to be formed.

In the case of forming the above-mentioned opening for a via-hole, laser beam radiation by excimer laser of a hologram method through a mask makes it possible to form a large number of openings for via-holes at once.

Further, in the case of forming the opening for a via-hole using short pulses of carbonic acid gas laser, the remaining of resin in the opening can be slight and damages to the resin in the peripheral part of the opening are scarce.

In the case of radiating laser beam through optical system lenses and a mask, a large number of openings for via-holes can be formed at once.

That is because the use of the optical system lenses and the mask makes it possible to simultaneously radiate laser beam of the same intensity at the same radiation angle to a plurality of portions.

Further, although the thickness of the above-mentioned interlaminar resin insulating layer is not specifically limited, generally, it is desirable to be 5 to 50 μm. Also, although the opening diameter of the opening for a via-hole is not specifically limited, it is desirable to be 40 to 200 μm.

(5) Next, the surface of the interlaminar resin insulating layer including the inner wall of the opening for a via-hole is roughened by surface roughening treatment using an acid or an oxidizing agent based on the necessity.

Incidentally, the roughened surface is formed in order to improve the adhesion property of the interlaminar resin insulating layer to a thin film conductor layer to be formed thereon and therefore, if adhesion strength is sufficient between the interlaminar resin insulating layer and the thin film conductor layer, the roughened face does not need to be formed.

Examples of the above-mentioned acid include sulfuric acid, nitric acid, hydrochloric acid, phosphoric acid, formic acid and the like and examples of the above-mentioned oxidizing agent include chromic acid, chromic acid mixture, permanganate such as sodium permanganate and the like.

After the formation of the roughened surface, it is desirable to neutralize the surface of the interlaminar resin insulating layer using an aqueous alkaline solution, a neutralization solution and the like.

That is because the acid and the oxidizing agent are prevented from causing effects on the next step.

Further, for formation of the above-mentioned roughened surface, plasma treatment and the like may be employed.

(6) Next, the thin film conductor layer is formed on the surface of the interlaminar resin insulating layer in which the opening for a via-hole is formed.

The above-mentioned thin film conductor layer can be formed by an electroless plating, a sputtering, or a vapor deposition method. Incidentally, in the case the surface of the interlaminar resin insulating layer is not subjected to the surface roughening, the above-mentioned thin film conductor layer is desirable to be formed by sputtering.

Incidentally, in the case the thin film conductor layer is formed by electroless plating, a catalyst is previously supplied to the object surface to be plated. Examples of the above-mentioned catalyst include palladium chloride and the like.

Although the thickness of the above-mentioned thin film conductor layer is not particularly limited, in the case the thin film conductor layer is formed by electroless plating, it is desirably 0.6 to 1.2 μm, and in the case of formation by sputtering, it is desirably 0.1 to 1.0 μm.

Further, examples of the material for the above-mentioned thin film conductor layer include Cu, Ni, P, Pd, Co, W and the like. Cu and Ni are desirable among them.

(7) Next, the plating resist is formed on a portion of the above-mentioned thin film conductor layer using a dry film and after that, electrolytic plating is carried out using the above-mentioned thin film conductor layer as a plating lead to form an electroplating layer in the non plating resist formed area.

Here, the plating resist is formed so as to make it possible to form the via-hole with a desired land diameter. That is, in the particular level layer, if the via-hole with a large land diameter is to be formed, the width of the non plating resist formed area should be made wide.

Further, in this process, the opening for a via-hole may be filled by electroplating to be a filled via structure, or after a via-hole having a concave portion on the upper face is formed, the concave portion may be filled with a conductor containing paste to form a filled via structure. Further, after a via-hole having a concave portion on the upper face is formed, the concave portion may be filled with a resin filler and the like and further a cover plating layer may be formed thereon to form a via-hole with a flat upper face.

In the case of forming the via-hole with the filled via structure at the time of electroplating, for example, an electroplating solution with the following composition is employed to carry out electroplating treatment.

That is, an electroplating solution containing 50 to 300 g/l of copper sulfate, 30 to 200 g/l of sulfuric acid, 25 to 90 mg/l of chlorine ion, and 1 to 1000 mg/l of additives comprising at least a leveling agent and a brightener is employed to carry out electroplating treatment.

With an electroplating solution of such a composition, the via-hole with the filled via structure can be formed regardless of: the opening diameter of the via-hole; the material and the thickness of the resin insulating layer; and the existence of the roughened surface of the interlaminar resin insulating layer.

Additionally, since the electroplating solution contains copper ion at a high concentration, copper ion can be supplied sufficiently to the opening for a via-hole and plating of the opening for a via-hole can be carried out at a plating speed of 40 to 100 μm/hour to result in the high speed electroplating process.

The above-mentioned electroplating solution is desirable to have a composition containing 100 to 250 g/l of copper sulfate, 50 to 150 g/l of sulfuric acid, 30 to 70 mg/l of chlorine ion, and 1 to 600 mg/l of additives comprising at least a leveling agent and a brightener.

Further, in the above-mentioned electroplating solution, the above-mentioned additives may comprise at least a leveling agent and a brightener and may include other components.

The above-mentioned leveling agent includes, for example, polyethylene, gelatin, and their derivatives and the like.

Also, the above-mentioned brightener includes, for example, sulfur oxide and its relevant compounds, hydrogen sulfide and its relevant compounds, and other sulfur compounds and the like.

The mixing amount of the above-mentioned leveling agent is desirably 1 to 1000 mg/l, the mixing amount of the above-mentioned brightener is desirably 0.1 to 100 mg/l and the mixing ratio of both is desirably (2:1) to (10:1).

(8) Next, the plating resist is separated and the thin film conductor layer which was under the plating resist is removed by etching to form an independent conductor circuit. Examples of an etching solution include an aqueous sulfuric acid-hydrogen peroxide solution, an aqueous solution of a persulfate such as ammonium persulfate and the like, ferric chloride, cupric chloride, hydrochloric acid and the like. Further, as the etching solution, a mixed solution containing the above-mentioned cupric complex and an organic acid may be used.

Further, in place of the above-mentioned methods described in (7), (8), the following method may be employed to form the conductor circuit.

That is, after formation of the electroplating layer on the entire surface of the above-mentioned thin film conductor layer, an etching resist is formed on a portion of the electroplating layer using a dry film and then, the thin film conductor layer and the electroplating layer under the non etching resist formed area are removed by etching and then further the etching resist is parted to form the independent conductor circuit.

(9) After that, the processes of the above-mentioned (3) to (8) are repeated once or twice or more to manufacture a substrate on which the interlaminar resin insulating layers bearing the conductor circuit on the uppermost layer are formed. Incidentally, the number of the times of repetition of the above-mentioned processes (3) to (8) may be properly selected corresponding to the design of the multilayered printed circuit board.

In this case, the respective via-holes are formed immediately above the existing via-holes so as to form the via-holes with a stack-via structure. The adjustment of the land diameter of the via-holes can be carried out as described above by adjusting the size of the non plating resist formed area at the time of plating resist formation.

(10) Next, on the substrate bearing the conductor circuit of the uppermost layer, a solder resist layer having a plurality of openings for solder bumps is formed.

Specifically, after: an un-cured solder resist composition is applied by a roll coater, a curtain coater and the like; or a solder resist composition formed to be like a film is pressure bonded, the openings for the solder bumps are formed by laser treatment, and the exposure and development treatment and based on the necessity, curing treatment are carried out to form the solder resist layer.

The above-mentioned solder resist layer may be formed using a solder resist composition containing, for example, polyphenylene ether resin, polyolefin resin, fluoro resin, thermoplastic elastomer, epoxy resin, polyimide resin and the like.

Further, the solder resist composition other than the above-mentioned ones includes, for example, a paste-like fluid containing thermosetting resin comprising (meth)acrylate of novolak type epoxy resin, an imidazole curing agent, a bifunctional (meth)acrylic acid ester monomer, (meth)acrylic acid ester polymer with a molecular weight of about 500 to 5000, bisphenol type epoxy resin and the like, a photosensitive monomer such as a multivalent acrylic monomer, and a glycol ether type solvent, and its viscosity is desirably adjusted to be 1 to 10 Pa·s at 25° C.

The above-mentioned solder resist composition may contain an elastomer and an inorganic filler.

Further, as the solder resist composition, a commercially available solder resist composition may be used.

Further, laser to be employed for forming the above-mentioned openings for the solder bumps may be laser same as that employed at the time of the formation of the above-mentioned openings for via-holes.

Next, based on the necessity, solder pads are formed on the surface of the conductor circuit exposed in the bottom faces of the above-mentioned openings for the solder bumps.

The above-mentioned solder pads may be formed by covering the above-mentioned conductor circuit surface with a corrosion resistant metal such as nickel, palladium, gold, silver, platinum and the like.

Specifically, it is desirable to form using a metallic material such as nickel-gold, nickel-silver, nickel-palladium, nickel-palladium-gold and the like.

Further, the above-mentioned solder pad can be formed by, for example, plating, vapor deposition, electrodeposition and the like, and among them, plating is desirable from a viewpoint that the coating layer is excellent in evenness.

(11) Next, a solder paste is filled in the above-mentioned openings for the solder bumps and subjected to reflow treatment or a solder paste is filled therein and subjected to reflow treatment after conductive pins are installed to form solder bumps or a BGA (Ball Grid Array) or PGA (Pin Grid Array).

A letter printing process for forming product identification latter and treatment with plasma of oxygen, tetrachlorocarbon and the like for the solder resist layer modification may be carried out.

Through such processes, the multilayered printed circuit board of the first aspect of the present invention can be manufactured.

Next, a multilayered printed circuit board of a second aspect of the present invention will be described.

The multilayered printed circuit board of the second aspect of the present invention is a multilayered printed circuit board comprising a substrate and, as serially built up thereon, a conductor circuit and an interlaminar resin insulating layer in an alternate fashion and in repetition, with:

a connection of the above-mentioned conductor circuits through the above-mentioned interlaminar resin insulating layer being performed by a via-hole; and a connection of the above-mentioned conductor circuits through the above-mentioned substrate being performed by a plated-through hole, wherein:

a via-hole having the stack-via structure is formed immediately above the above-mentioned plated-through hole; and at least one of the land diameters of the above-mentioned via-holes having the stack-via structure is different from the land diameters of other via-holes having the stack-via structure.

Accordingly, the multilayered printed circuit board of the second aspect of the present invention differs from the multilayered printed circuit board of the first aspect of the present invention in a point that the via-holes having the stack-via structure are formed immediately above the plated-through holes.

Figure 4:
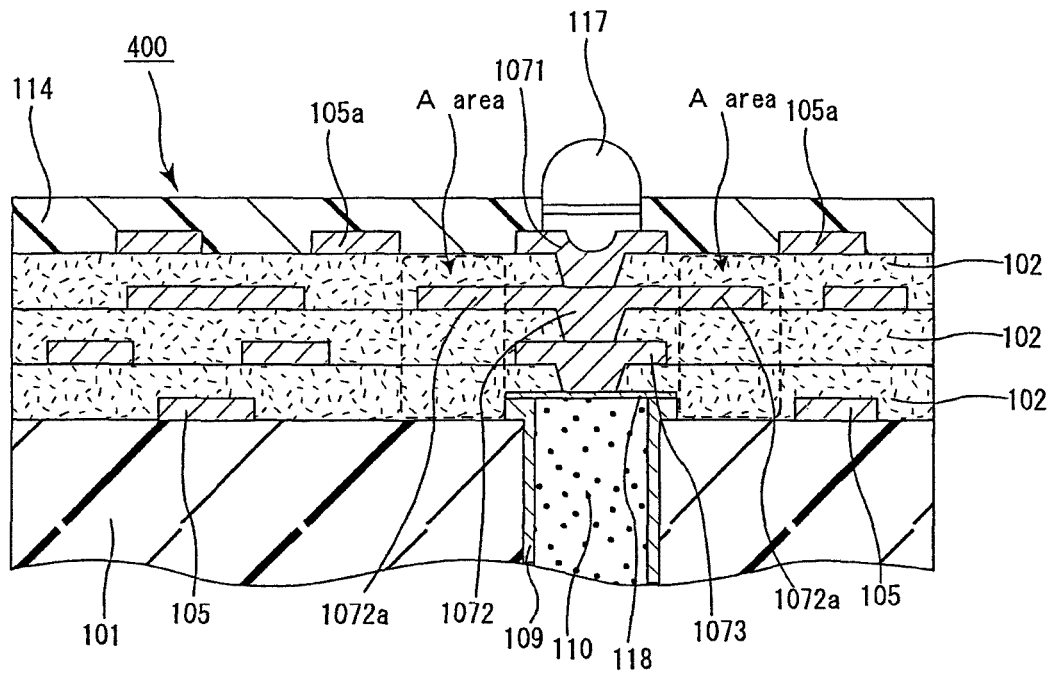
FIG. 4 is a partial cross-section figure schematically showing a part of an embodiment of a multilayered printed circuit board of a second aspect of the present invention.

FIG. 4 is a partial cross-section figure schematically showing a part of an embodiment of a multilayered printed circuit board of a second aspect of the present invention.

In a multilayered printed circuit board 400, a plated-through hole 109 for connecting the conductor circuits sandwiching a substrate is formed and via-holes 1071 to 1073 having a stack-via structure are formed immediately above the plated-through hole. Further, in order to form via-holes with the stack-via structure, a cover plating layer 118 is formed on the plated-through hole 109. Further, the inside of the plated-through hole 109 is filled with a resin filler layer 110.

In the multilayered printed circuit board with such a structure, since via-holes with the stack-via structure are formed immediately above the plated-through hole, the wiring distance of the conductor circuits sandwiching the substrate is shortened and the signal transmission time can be shortened and at the same time, the room for option of the design of the conductor circuits is improved, so that the multilayered printed circuit board can easily satisfy high density wiring requirement.

Further, in the multilayered printed circuit board of the second aspect of the present invention, at least one of the land diameters of the above-mentioned via-holes with the stack-via structure is different from the land diameters of other via-holes with the stack-via structure. Specifically, for example, it has the same constitution as that of the multilayered printed circuit board of the first aspect of the present invention. That is, just like the multilayered printed circuit board 400 shown in FIG. 4, the constitution allowable are that the land diameter of a via-hole 1072 in an inner layer is wider than the land diameter of the via-hole 1071 in the outermost layer and the land part 1072a of the via-hole 1072 exists in the A area, that the land diameter of the via-hole in the lowest layer is larger than the land diameter of the via-hole in the outermost layer and land part of the via-hole exists in the A area, that some portions of the land diameter of the via-hole in the inner layer and the land diameter of the via-hole in the outermost layer are larger than the land diameter of the via-hole in the outermost layer at the respectively different A areas and the like.

Further, both of the land diameter of the via-hole in the inner layer and the land diameter of the via-hole in the lowest layer may be larger than the land diameter of the via-hole in the outermost layer.

Incidentally, the above-mentioned A area is an area composed of only the interlaminar resin insulating layers in the vicinity of the via-holes and in the second aspect of the present invention, the A area means the narrower area either 1) the area under the area between the via-hole in the outermost layer and a conductor circuit neighboring the above-mentioned via-hole or 2) the area between the plated-through hole and the position of a conductor circuit in the outer most layer when it is assumed to be shifted parallel to the same level layer as that of the plated-through hole and the above area thereof. In the case of the multilayered printed circuit board shown in FIG. 4, the area of the above-mentioned 2) becomes the A area.

In the case the via-holes have such a constitution, similarly to the multilayered printed circuit board of the first aspect of the present invention, the via-hole with a large land diameter works as a reinforcing material of the interlaminar resin insulating layer and the mechanical strength of the interlaminar resin insulating layer is improved and especially, the cracking is hardly generated in the interlaminar resin insulating layer in the vicinity of the via-hole. That is because the land part of the via-hole exists in a portion of the area (in FIG. 4, the A area) under the non conductor circuit formed area between the via-hole of the outermost layer and the conductor circuits neighboring the via-hole, so that the area of the land part works as a reinforcing material of the interlaminar resin insulating layer.

Also, in the multilayered printed circuit board of the second aspect of the present invention, the number of the layers of the via-holes having the stack-via structure is not limited if it is two or more and it may be three-layers as shown in the illustrated multilayered printed circuit board, or two layers or four or more layers.

Further, similarly to that in the multilayered printed circuit board of the first aspect of the present invention, the land diameter of the above-mentioned via-hole is desirable to be such a length that at least one land portion exists in a half or wider area of the via-hole side of the A area; and more desirable to be such a length that at least one land portion penetrate a whole area of the A area.

Further, in the multilayered printed circuit board of the second aspect of the present invention, since the via-holes have the stack-via structure, the shape of the underlevel via-hole is desirable to be a filled via shape.

In the multilayered printed circuit board of the second aspect of the present invention, via holes with the stack-via structure are formed immediately above the plated-through hole and in order to make the multilayered printed circuit board excellent in the connection reliability, a cover plating layer is desirable to be formed on the plated-through hole. That is because the cover plating layer has a flat surface and therefore it is suitable to form via-holes thereon. Further, the above-mentioned cover plating layer may be composed of one layer or two or more layers.

Further, it is desirable to form a resin filler layer inside the plated-through hole. That is because it is suitable for formation of the above-mentioned cover plating layer to fill the plated-through hole with the resin filler.

In the multilayered printed circuit board of the second aspect of the present invention, it is not necessary that the via-holes with the stack-via structure are formed immediately above all of the plated-through holes and it is allowed that: plated-through holes immediately above which any other via-holes are not piled thereon exist; or the through holes immediately above which no via-hole is formed thereon exist.

Next, the method for manufacturing the multilayered printed circuit board of the second aspect of the present invention is described. As described above, the multilayered printed circuit board of the second aspect of the present invention is different from the multilayered printed circuit board of the first aspect of the present invention in a point that the via-holes with the stack-via structure are formed immediately above a plated-through hole.

Accordingly, the multilayered printed circuit board of the second aspect of the present invention can be manufactured by a method similar to the method for manufacturing the multilayered printed circuit board of the first aspect of the present invention, except that the via-holes are formed immediately above a plated-through hole.

Specifically, except: that in the processes (1), (2) of the method for manufacturing the multilayered printed circuit board of the first aspect of the present invention, plated-through hole connecting the conductor circuits sandwiching the substrate is formed and further, based on the necessity, after formation of the resin filler layer and the conductor circuits surface roughening treatment, a cover plating layer is formed on the plated-through hole; and that in the process (4) of the multilayered printed circuit board of the first aspect of the present invention, at the time of formation of an opening for a via-hole, the opening for a via-hole is formed on the above-mentioned cover plating layer, the multilayered printed circuit board of the second aspect of the present invention can be manufactured by a similar method to the method for manufacturing the multilayered printed circuit board of the first aspect of the present invention.

Incidentally, the above-mentioned cover plating layer can be formed through the following processes (a) to (c).

That is, (a) after a plated-through hole is formed in a substrate and a resin filler layer is formed in the plated-through hole, a thin film conductor layer is formed on the surface of the substrate including the exposed face of the resin filler layer by electroless plating treatment or sputtering treatment. In the case the electroless plating treatment is carried out, a catalyst is previously supplied to the object surface to be coated.

(b) Next, the plating resist is formed in the portions other than the plated-through holes (including the resin filler layer) and electroplating is carried out using the above-mentioned thin film conductor layer as a plating lead.

(c) Next, on completion of the electroplating, the plating resist and the thin film conductor layer under the plating resist are removed to form a cover plating layer comprising the thin film conductor layer and the electroplating layer.

Instead of the processes (a) to (c) from the catalyst supply to the removal of the thin film conductor layer, methods similar to the methods (6) to (8) of the multilayered printed circuit board of the first aspect of the present invention may be employed to carry out.

In the case of formation of a cover plating layer comprising one layer, for example, after a catalyst is supplied to the surface of the substrate including the exposed face of the resin filler layer, the plating resist is formed in the portions other than the plated-through holes and then removal of the electroless plating treatment and the plating resist may be carried out.

Next, a multilayered printed circuit board of a third aspect of the present invention will be described.

The multilayered printed circuit board of the third aspect of the present invention is a multilayered printed circuit board comprising a substrate and, as serially built up thereon, a conductor circuit and an interlaminar resin insulating layer in an alternate fashion and in repetition, with:

a connection of the above-mentioned conductor circuits through the above-mentioned interlaminar resin insulating layer being performed by a via-hole; and a connection of the above-mentioned conductor circuits through the above-mentioned substrate and the above-mentioned interlaminar resin insulating layer being performed by a plated-through hole, wherein:

a via-hole having the stack-via structure is formed immediately above the above-mentioned plated-through hole; and at least one of the land diameters of the above-mentioned via-holes indifferent level layers having the stack-via structure is different from the land diameters of other via-holes in different level layers having the stack-via structure.

The multilayered printed circuit board of the third aspect of the present invention differs from the multilayered printed circuit board of the first aspect of the present invention in a point that via-holes having the stack-via structure are formed immediately above the plated-through holes connecting the conductor circuits sandwiching the substrate and the interlaminar resin insulating layers.

Figure 5:
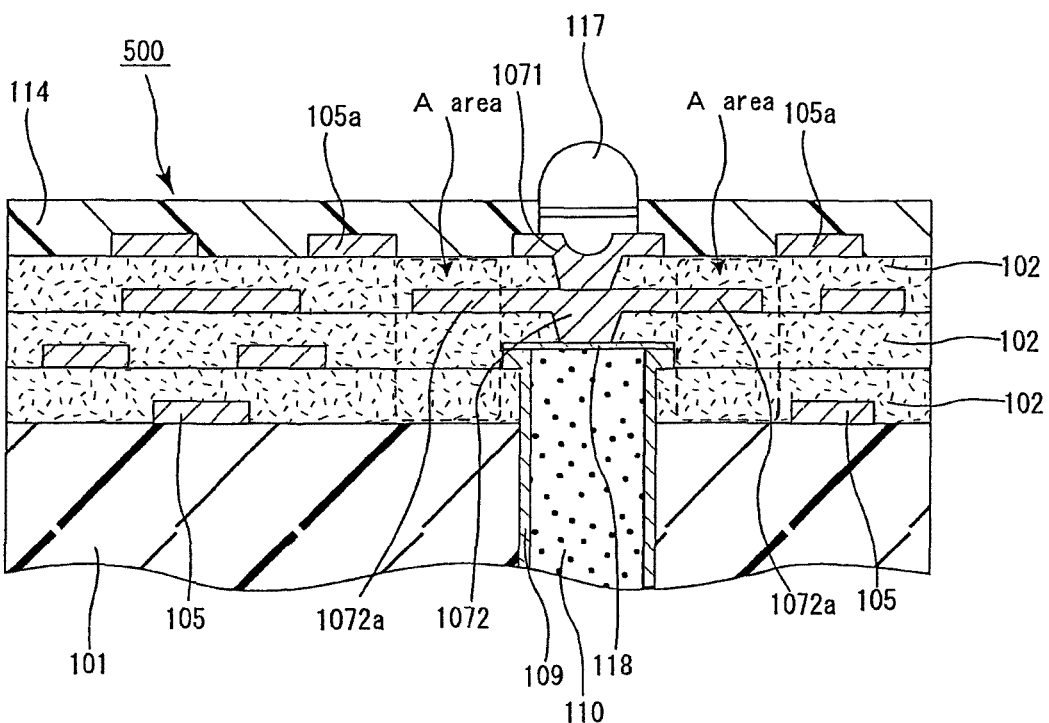
FIG. 5 is a partial cross-section figure schematically showing a part of an embodiment of a multilayered printed circuit board of a third aspect of the present invention.

FIG. 5 is a partial cross-section figure schematically showing a part of an embodiment of a multilayered printed circuit board of a third aspect of the present invention.

In a multilayered printed circuit board 500, a plated-through hole 109 for connecting conductor circuits sandwiching the substrate and the interlaminar resin insulating layers is formed and via-holes 1071 to 1072 having the stack-via structure are formed immediately above the plated-through hole. In order to form the via-holes with the stack-via structure, a cover plating layer 118 is formed on the plated-through hole 109. Also, a resin filler layer 110 is formed inside the plated-through hole 109.

In the multilayered printed circuit board with such a constitution, since via-holes having the stack-via structure are formed immediately above the plated-through holes, the wiring distance of the conductor circuits sandwiching the substrate and the interlaminar resin insulating layers is shortened and the signal transmission time can be shortened and at the same time, the room for option of the design of the conductor circuits is improved, so that the multilayered printed circuit board can easily satisfy high density wiring requirement.

Further, in the multilayered printed circuit board of the third aspect of the present invention, at least one of the land diameters of the above-mentioned via-holes having the stack-via structure is different from the land diameters of other via-holes having the stack-via structure. Specifically, for example, in the multilayered printed circuit board 500 shown in FIG. 5, the land diameter of the via-hole 1072 in an inner layer is wider than the land diameter of the via-hole 1071 in the outermost layer and the land portion 1072a of the via-hole 1072 exists in the A area.

Further, although via-holes in two layers are formed in the multilayered printed circuit board 500 shown in FIG. 5, via-holes comprising three or more layers may be formed so as to have a stack-via structure in the multilayered printed circuit board of the third aspect of the present invention and in the case of the tri-layered via-holes with the stack-via structure, the constitution may be similar to that of the multilayered printed circuit board of the first aspect of the present invention. That is, the following constitutions are all allowable: that the land diameter of the via-hole in the inner layer is larger than the land diameter of the via-hole of the outermost layer and the land portion of the via-hole exists in the A area; that the land diameter of the via-hole of the lowest layer is larger than the land diameter of the via-hole of the outermost layer; that some portions of the land diameter of a via-hole in the inner layers and the via-hole of the outermost layer are larger than the land diameter of the via-hole of the outermost layer in the respectively different portions of the A area.

Further, both of the land diameters of the via-holes in the inner layers and the land diameter of the via-hole of the lowest layer may be larger than the land diameter of the via-hole of the outermost layer.

Incidentally, the A area is the area composed of only the interlaminar resin insulating layers in the vicinity of the via-holes and it means the same as the A area in the multilayered printed circuit board of the second aspect of the present invention.

In the case the via-holes have such constitutions, similarly to the multilayered printed circuit board of the first aspect of the present invention, the via-holes with the larger land diameters work as a reinforcing material for the interlaminar resin insulating layer and mechanical strength of the interlaminar resin insulating layer is improved and especially, the cracking is hardly caused in the interlaminar resin insulating layer in the vicinity of the via-holes. That is, the land portions of the via-holes exist in portions of the area (in FIG. 5, the A area) under the non conductor circuit formed area between the via-hole of the outermost layer and the conductor circuits neighboring to the via-hole, so that the portions work as a reinforcing material of the interlaminar resin insulating layers.

In the multilayered printed circuit boards of the third aspect of the present invention, the number of layers of the via-holes with the stack-via structure is not limited if it is two or more and as the illustrated multilayered printed circuit board, the layers may be two layers or three or more layers.

Similarly to the multilayered printed circuit board of the first aspect of the present invention, the land diameters of the above-described via-holes are desirable to be such a length that at least one land portion exist in at least half area of the via-hole side of A area; and more desirable to be such a length that at least one land part penetrates the A area.

Also in the multilayered printed circuit board of the third aspect of the present invention, since the via-holes are formed so as to have the stack-via structure, the shape of the via-hole in the underlevel layer is desirable to be a filled via shape.

In the multilayered printed circuit board of the third aspect of the present invention, via holes with the stack-via structure are formed immediately above the plated-through hole and in order to make the multilayered printed circuit board excellent in the connection reliability, a cover plating layer is desirable to be formed on the plated-through hole. That is because the cover plating layer has a flat surface and therefore it is suitable to form via-holes thereon.

Further, it is desirable to form a resin filler layer inside the plated-through hole. That is because it is suitable for formation of the above-mentioned plating layer to fill the plated-through hole with the resin filler.

In the multilayered printed circuit board of the third aspect of the present invention, the via-holes with the stack-via structure are not necessarily formed immediately above all of the plated-through holes, and plated-through holes immediately above which a via-hole having no other via-hole piled thereon is formed or plated-through holes immediately above which no via-hole is formed may exist.

The method for manufacturing the multilayered printed circuit board of the third aspect of the present invention will be described in order of the processes.

(1) At first, a conductor circuit is formed on a substrate similarly to the process (1) of the method of manufacturing the multilayered printed circuit board of the first aspect of the present invention.

Since the multilayered printed circuit board of the third aspect of the present invention has plated-through holes for connecting the conductor circuits sandwiching a substrate and interlaminar resin insulating layers, different from the method for manufacturing the multilayered printed circuit board of the first aspect of the present invention, in this process, no plated-through hole is required to be formed.

However, since the multilayered printed circuit board of the third aspect of the present invention does not exclude the structure of the connection of the conductor circuits sandwiching only the substrate, plated-throughholes electrically connecting the conductor circuits sandwiching the substrate may be formed based on the necessity.

Further, after the conductor circuits are formed, based on the necessity, the surfaces of the conductor circuits may be roughened by the same method as that in the process (2) of the manufacturing method of the multilayered printed circuit board of the first aspect of the present invention.

(2) Next, by employing the same processes (3), (4) of the manufacturing method of the multilayered printed circuit board of the first aspect of the present invention, an un-cured resin layer of thermosetting resin and a resin complex or a resin layer of thermoplastic resin is formed on the conductor circuits and openings for via-holes are formed to obtain an interlaminar resin insulating layer.

After the interlaminar resin insulating layer formation, through holes penetrating the interlaminar resin insulating layers and the substrate are formed. The through holes may be formed by drilling process and laser treatment.

(3) Next, roughened surface is formed by carrying out for the surfaces of the interlaminar resin insulating layer including the inner walls of the openings for via-holes and the inner walls of the through holes by an acid or an oxidizing agent based on the necessity.

The roughened surface is formed by carrying out in order to increase the adhesion strength of an interlaminar resin insulating layer and a thin film conductor layer to be formed in the later process and therefore, it is not necessary to carry out this process if the adhesion strength of the interlaminar resin insulating layer and the thin film conductor layer is sufficient.

Incidentally, as the above-mentioned acid and oxidizing agent, those used in the process (5) of the manufacturing method of the multilayered printed circuit board of the first aspect of the present invention may be employed.

(4) Next, the thin film conductor layer is formed on the surface of the interlaminar resin insulating layer in which the openings for via-holes are formed and on the inner wall faces of the through holes.

The formation of the above-mentioned thin film conductor layer may be carried out by the same method as that employed in the process (6) of the manufacturing method of the multilayered printed circuit board of the first aspect of the present invention, that is, an electroless plating, a sputtering, and a vapor deposition method and the like.

Further, it is desirable that: the thin film conductor layer is formed on the through holes to form plated-through holes; and then the insides of the plated-through holes are filled with a resin filler and it is further desirable that a cover plating layer covering the resin filler is formed on the plated-through holes after that.

Because that is suitable for formation of the via-holes with the stack-via structure immediately thereon.

Further, the plated-through holes to be formed in this process may be not only for connecting the conductor circuits sandwiching: the substrate; and the interlaminar resin insulating layers, but also for connecting conductor circuits in total of four layers including these two conductor circuit layers and two conductor circuit layers formed respectively on both faces of the substrate.

(5) Next, the plating resist is formed in a portion of the above-mentioned thin film conductor layer using a dry film and after that, electrolytic plating is carried out using the above-mentioned thin film conductor layer as a plating lead to form an electroplating layer in the non resist formed area.

Here, an electroplating layer may be formed also on the thin film conductor layer formed in the wall faces of the through holes to make the thickness of the plated-through holes thick.

(6) After the electroplating layer formation, the plating resist is parted and then, the thin film conductor layer of a metal which exists under the plating resist may be removed by etching to form an independent conductor circuit.

As the etching solution, the same etching solution as that employed in the process (8) of the manufacturing method of the multilayered printed circuit board of the first aspect of the present invention may be employed.

The conductor circuits formed above, which are sandwiching the substrate and the interlaminar resin insulating layers, are connected through the plated-through holes.

In place of the above-mentioned processes described in (5), (6), the conductor circuits may be formed by employing the following methods.

That is, after an electroplating layer is formed on the entire surface of the above-mentioned thin film conductor layer, an etching resist is formed on a portion of the electroplating layer using a dry film and after that, the electroplating layer and the thin film conductor layer under the non etching resist formed area are removed by etching and then the etching resist is further parted to form an independent conductor circuits.

Further, as described above, after the conductor circuit formation, it is desirable to fill the insides of the plated-through holes with a resin filler and after that, a cover plating layer is formed on the plated-through holes (including the resin filler layer).

The above-mentioned cover plating layer can be formed through the following processes (a) to (c).

That is, (a) after formation of plated-through holes penetrating the substrate and the interlaminar resin insulating layers and formation of the resin filler layer in the insides of the plated-through holes, the thin film conductor layer is formed on the surface of a circuit board including the exposed face of the resin filler layer by electroless plating treatment or sputtering and the like. Incidentally, in the case of employing the electroless plating treatment, a catalyst is previously supplied to the object surface to be plated.

(b) Next, the plating resist is formed on the portion other than the plated-through holes (including the resin filler layer) and further electroplating is carried out using the above-mentioned thin film conductor layer as a plating lead.

(c) Successively, on completion of the electroplating, the plating resist is parted and the thin film conductor layer under the plating resist is removed to form the cover plating layer comprising the thin film conductor layer and the electroplating layer.

Incidentally, these processes (a) to (c) from the catalyst supply to the thin film conductor layer removal may be carried out by processes same as the processes (6) to (8) of the multilayered printed circuit board of the first aspect of the present invention.

The above-mentioned cover plating layer may be a monolayer, similarly to the multilayered printed circuit board of the second aspect of the present invention.

(7) After that, the above-mentioned processes (2) to (6) are repeated once or two or more times to produce the substrate on which the conductor circuits of the uppermost layer are formed on the interlaminar resin insulating layers. The number of the times to repeat the above-mentioned processes (2) to (6) may be selected properly corresponding to the design of the multilayered printed circuit board.

Here, in the case of the plating resist formation, the plating resist is formed so as to be able to form via-holes immediately above the through holes. Further, the plating resist is formed so as to be able to form via-holes with a desired land diameter. That is, in the particular level layer, if via-holes with a large land diameter is to be formed, the width of the non plating resist formed area should be made wide.

At the time of via-hole formation, it is desirable to make the via-holes have the filled via structure. Specifically, the openings for via-holes may be filled by electroplating to have the filled via structure, or once via-holes having the dents on the upper face are formed and then the dents may be filled with a conductor containing paste to have the filled via structure.

Further, after via-holes having dents on the upper face are formed, the dents may be filled with the resin filler and a cover plating layer may be formed thereon to form via-holes with flat upper faces.

In the case of forming the via-holes with the filled via structure by electroplating, it is desirable to employ an electroplating solution similar to the electroplating solution employed in the process (7) of the manufacturing method of the multilayered printed circuit board of the first aspect of the present invention.

(8) Next, employing the same processes (10), (11) of the manufacturing method of the multilayered printed circuit board of the first aspect of the present invention, a solder resist layer is formed and further solder bumps, BGA, PGA and the like are formed to obtain the multilayered printed circuit board.

Next, a multilayered printed circuit board of a fourth aspect of the present invention will be described.

The printed circuit board of the fourth aspect of the present invention is a multilayered printed circuit board comprising a substrate and, as serially built up thereon, a conductor circuit and an interlaminar resin insulating layer in an alternate fashion and in repetition, with a connection of the above-mentioned conductor circuits through the above-mentioned interlaminar resin insulating layer being performed by a via-hole, wherein:

via-holes in different level layers among the above-mentioned via-holes are formed so as to form the stack-via structure; and at least one of the lands of the above-mentioned via-holes in different level layers is formed to extend in a non conductor circuit formed area formed in the periphery of the via-hole with the stack-via structure.

That is, in the multilayered printed circuit board of the fourth aspect of the present invention, the via-holes are formed so as to reinforce the non conductor circuit formed area by the enlarged lands of the via-holes or the via-holes are formed so as to occupy the non conductor circuit formed area with the via-holes and the lands of the via-holes.

In the multilayered printed circuit board of the fourth aspect of the present invention, via-holes in different level layers are made to have the stack-via structure.

In the case the via-holes are formed so as to have the stack-via structure in such a manner, the wiring distance becomes short, so that the signal transmission time can be shortened and the room for option of the design of a conductor circuit can be increased and therefore it becomes easy to deal with high density wiring.

Further, in the above-mentioned multilayered printed circuit board, the land of at least one among the via-holes in the different level layers is enlarged so as to reinforce the non conductor circuit formed area formed in the periphery of the via-holes with the stack-via structure or so as to occupy the non conductor circuit formed area.

In the case the via-holes have such a constitution, the via-hole and its land work as a reinforcing material for the interlaminar resin insulating layer and accordingly, the mechanical strength of the interlaminar resin insulating layer is improved and especially, cracking is hardly caused in the interlaminar resin insulating layer in the vicinity of the via-holes.

Next, the multilayered printed circuit board of the fourth aspect of the present invention will be described with the reference to figures. Examples of embodiments of the multilayered printed circuit board of the fourth aspect of the present invention are those shown in the partial cross-section figures in FIG. 1 to FIG. 3 referred in the descriptions of the multilayered printed circuit board of the first aspect of the present invention. Accordingly, here, the multilayered printed circuit board of the fourth aspect of the present invention will be described with reference to FIG. 1 to FIG. 3.

In the multilayered printed circuit board of the fourth aspect of the present invention, the land of at least one among the via-holes in different level layers is formed while being enlarged to the non conductor circuit formed area formed in the periphery of the via-hole with the stack-via structure.

Specifically, for example, as illustrated in FIG. 1 (*a*) and FIG. 1 (*b*), the land of the via-hole 1072 in the inner layer is formed so as to be enlarged more than the land of the via-hole 1071 in the outermost layer. In this case, the respective via-holes in the respective level layers are formed so as to have circular shape in the planar view and be concentrically circular.

Further, for example, as illustrated in FIG. 2 (*a*) and FIG. 2 (*b*), the land of the via-hole 1073 in the lowest layer may be formed so as to be enlarged more than the land of the via-hole 1071 in the outermost layer. In this case, the respective via-holes in the respective level layers are formed so as to have circular shape in the planar view and be concentrically circular.

Further, as illustrated in FIG. 3 (*a*) and FIG. 3 (*b*), some portions of the land of the via-hole 1072 in the inner layer and the land of the via-hole 1073 in the lowest layer may be enlarged to be larger than the land of the via-hole 1071 of the outermost layer in different portions of the area (in figures, the A area) under the non conductor circuit formed area between the via-hole 1071 of the outermost layer and the conductor circuits 105*a* neighboring the via-hole 1071. In this case, the respective via-holes of the respective level layers have a circular shape in the planar view, however their centers are positioned at different points, that is, the center of the outer rim of the via-hole in the inner layer and the center of the outer rim of the via-hole in the lowest layer are formed at the positions on the opposite to each other while having the center of the outer rim of the via-hole of the outermost layer between them. Incidentally, the center of the outer rim of the via-hole in the inner layer and the center of the outer rim of the via-hole in the lowest layer may exist at positions other than the positions on the opposite to each other while having the center of the outer rim of the via-hole of the outermost layer between them.

In such a manner, in the case the land of at least one of the via-holes having the stack-via structure is enlarged, not only the interlaminar resin insulating layer 102 but also the land portions 1072*a*, 1073*a* of the via-holes exist in the portion of the area (A area) under the non conductor circuit formed area between the via-hole in the outermost layer and the conductor circuits neighboring the via-hole. In this case, the entire via-holes with the stack-via structure can provide the role and the effect as mentioned above. That is, since the via-holes and their land portions work as a reinforcing material for the interlaminar resin insulating layers, the mechanical strength of the A area is improved, and crack generation and separation of the conductor circuits and the via-holes from the interlaminar resin insulating layers can be prevented.

Incidentally, in FIG. 1 to FIG. 3, 101 denotes a substrate; 114 denotes a solder resist layer; and 117 denotes a solder bump.

The shape of the via-holes are not limited to those shown in FIG. 1 to FIG. 3, and although they are not illustrated, both of the land of the via-hole 1072 of the inner layer and the land of the via-hole 1073 of the lowest layer may be enlarged larger than the land of the via-hole in the outermost layer.

The land diameters of the via-holes of the respective level layers may be similar or dissimilar to one another.

Further in the above-mentioned example, the shapes of the via-holes of the respectively different level layers are circular in the planar view, however the shapes of the via-holes in the planar view are not limited to be circular, but may be elliptical or rectangular.

In the multilayered printed circuit board of the fourth aspect of the present invention, the number of the layers of the via-holes having the stack-via structure is not limited if it is two or more and it may be three-layers as the illustrated multilayered printed circuit board or two layers or four or more layers.

Further, a part of the enlarged via-holes are desirable to exist in a half or wider area of the width of the non conductor circuit formed area in the planar view of the non conductor circuit formed area formed in the peripheral part of the via-holes with the stack-via structure and further desirable to exist in the entire area of the above-mentioned non conductor circuit formed area.

That is because: enlargement of the via-holes so as to make the portion of lands exist in such an area assures the reinforcement of the above-mentioned non conductor circuit formed area; and the above-mentioned non conductor circuit formed area is surely occupied by the via-holes and their lands.

The constitutions other than that of the above-mentioned portion of the multilayered printed circuit board shown in FIG. 1 to FIG. 3 are same as those of the multilayered printed circuit board of the first aspect of the present invention and therefore, the descriptions are omitted.

Further, in the multilayered printed circuit board of the fourth aspect of the present invention, not all of the different via-holes in all of the level layers are made to have the stack-via structure, however some via-holes on which no other via-holes are piled may exist.

Next, the manufacturing method of the multilayered printed circuit board of the fourth aspect of the present invention will be described.

The multilayered printed circuit board of the fourth aspect of the present invention differs from the multilayered printed circuit board of the first aspect of the present invention, as described above, at a point that the land of at least one of via-holes in the different level layers is formed while being enlarged to the non conductor circuit formed area formed in the periphery of the via-holes with the stack-via structure.

Accordingly, the multilayered printed circuit board of the fourth aspect of the present invention can be manufactured by a similar manufacturing method to the manufacturing method of the multilayered printed circuit board of the first aspect of the present invention, except that the land of at least one of via-holes in the different level layers is formed while being enlarged to the non conductor circuit formed area.

Specifically, in the processes (7) to (9) of the manufacturing method of the multilayered printed circuit board of the first aspect of the present invention, in the case the land of a via-hole is formed while being enlarged, except that the non plating resist formed area is made wider at the time of the plating resist formation, the same method as the manufacturing method of the multilayered printed circuit board of the first aspect of the present invention can be employed.

Incidentally, in the surface roughening process (2) of the manufacturing method of the multilayered printed circuit board of the first aspect of the present invention, the irregularity of the roughened surface or the roughened layer to be formed is desirable to be 0.1 to 5 μm.

Next, a multilayered printed circuit board of a fifth aspect of the present invention will be described.

The multilayered printed circuit board of the fifth aspect of the present invention is a multilayered printed circuit board comprising a substrate and, as serially built up thereon, a conductor circuit and an interlaminar resin insulating layer in an alternate fashion and in repetition, with:

a connection of the above-mentioned conductor circuits through the above-mentioned interlaminar resin insulating layer being performed by a via-hole; and a connection of the above-mentioned conductor circuits through the above-mentioned substrate being performed by a plated-through hole, wherein:

a via-hole having the stack-via structure is formed immediately above the above-mentioned plated-through hole; and at least one of the lands of the above-mentioned via-holes having the stack-via structure is formed to extend in a non conductor circuit formed area formed in the periphery of the via-hole with the stack-via structure.

Accordingly, the multilayered printed circuit board of the fifth aspect of the present invention differs from the multilayered printed circuit board of the fourth aspect of the present invention at a point that via-holes with a stack-via structure are formed immediately above the plated-through hole.

Next, the multilayered printed circuit board of the fifth aspect of the present invention will be described with the reference to figures. An example of the embodiments of the multilayered printed circuit board of the fifth aspect of the present invention includes the embodiment shown in the partial cross-section of FIG. 4 referred in the description of the multilayered printed circuit board of the second aspect of the present invention. Accordingly, here, the multilayered printed circuit board of the fifth aspect of the present invention will be described with the reference to FIG. 4.

In the multilayered printed circuit board of the fifth aspect of the present invention, the land of at least one of the via-holes having the stack-via structure is formed while being enlarged to the non conductor circuit formed area formed in the periphery of the via-holes with the stack-via structure. That is, the via-holes are formed so as to reinforce the non conductor circuit formed area by the enlarged land of the via-hole or so as to occupy the non conductor circuit formed area with the via-hole and the land of the via-hole.

Specifically, for example, the multilayered printed circuit board of the fifth aspect of the present invention may have the constitution same as that of the multilayered printed circuit board of the fourth aspect of the present invention. That is, just like the multilayered printed circuit board 400 shown in FIG. 4, the constitution may be as following: that the land of the via-hole 1072 in an inner layer is formed while being enlarged so as to make the land portion 1072a of the via-hole 1072 exist in the A area; that the land of the via-hole in the lowest layer is formed while being enlarged so as to make the land portion of the via-hole exist in the A area; and that some portions of the land of the via-hole in the inner layer and the land of the via-hole in the outermost layer are formed while being enlarged to be larger than the land of the via-hole in the outermost layer in the respectively different areas of the A area.

Incidentally, the above-mentioned A area means the non conductor circuit formed area composed of only the interlaminar resin insulating layers formed in the periphery of the via-holes with the stack-via structure and the meaning is the same as that of the A area in the multilayered printed circuit board of the second aspect of the present invention.

Further, the constitution may be that both of the land of the via-hole in the inner layer and the land of the via-hole in the lowest layer are formed while being enlarged to be larger than the land of the via-hole in the outermost layer.

In the case the land of the via-hole is formed while being enlarged, similarly to the multilayered printed circuit board of the fourth aspect of the present invention, the via-hole and the land of the via-hole work as a reinforcing material for the interlaminar resin insulating layers and the mechanical strength of the interlaminar resin insulating layers is increased and especially, cracks are hardly generated in the interlaminar resin insulating layers in the vicinity of the via-holes. That is because the land portion of the via-hole exists in a portion of the area (in FIG. 4, the A area) under the non conductor circuit formed area between the via-hole of the outermost layer and the conductor circuits neighboring the via-hole and the portion works as a reinforcing material of the interlaminar resin insulating layers.

Also, in the multilayered printed circuit board of the fifth aspect of the present invention, the number of the layers of the via-holes having the stack-via structure is not particularly limited if it is two or more and it may be three as the illustrated multilayered printed circuit board or two layers or four or more layers.

Further, also in the multilayered printed circuit board of the fifth aspect of the present invention, apart of the enlarged via-holes are desirable to exist in a half or wider area in the width of the non conductor circuit formed area in the planar view of the non conductor circuit formed area formed in the peripheral part of the via-holes with the stack-via structure, and further desirable to exist in the entire area of the above-mentioned non conductor circuit formed area.

Incidentally, the constitution other than the above-mentioned portions of the multilayered printed circuit board shown in FIG. 4 is same as the multilayered printed circuit board of the second aspect of the present invention, its description is omitted.

Incidentally, in the multilayered printed circuit board of the fifth aspect of the present invention, the via-holes with the stack-via structure are not necessarily formed immediately above all of the plated-through holes, and plated-through holes immediately above which a via-hole having no other via-hole piled thereon is formed or plated-through holes immediately above which no via-hole is formed may exist.

Next, the manufacturing method of the multilayered printed circuit board of the fifth aspect of the present invention will be described.

The multilayered printed circuit board of the fifth aspect of the present invention differs from the multilayered printed circuit board of the fourth aspect of the present invention, as described above, at a point that the via-hole having the stack-via structure is formed immediately above the plated-through hole.

Accordingly, the multilayered printed circuit board of the fifth aspect of the present invention can be manufactured by a manufacturing method same as the manufacturing method of the multilayered printed circuit board of the fourth aspect of the present invention, except that the via-hole is formed immediately above the plated-through hole.

Specifically, except that, in the manufacturing method of the multilayered printed circuit board of the fourth aspect of the present invention, a plated-through hole connecting conductor circuits sandwiching a substrate is formed and further, depending on the necessity, after a resin filler layer is formed and the surface roughening of the conductor circuit surface is carried out, the cover plating layer is formed on the plated-through hole and further that, at the time of formation of openings for via-holes in the resin layer formed on the substrate, the openings for via-holes are formed on the above-mentioned cover plating layer, the multilayered printed circuit board can be manufactured by the same method as the manufacturing method of the multilayered printed circuit board of the fourth aspect of the present invention.

The cover plating layer can be formed through the same process as the process of cover plating layer formation in the manufacturing method of the multilayered printed circuit board of the second aspect of the present invention.

Next, a multilayered printed circuit board of a sixth aspect of the present invention will be described.

The multilayered printed circuit board of the sixth aspect of the present invention is a multilayered printed circuit board comprising a substrate and, as serially built up thereon, a conductor circuit and an interlaminar resin insulating layer in an alternate fashion and in repetition, with:

a connection of the above-mentioned conductor circuits through the above-mentioned interlaminar resin insulating layer being performed by a via-hole; and a connection of the above-mentioned conductor circuits through the above-mentioned substrate and the above-mentioned interlaminar resin insulating layer being performed by a plated-through hole, wherein:

a via-hole having the stack-via structure is formed immediately above the above-mentioned plated-through hole; and at least one of the lands of the above-mentioned via-holes having the stack-via structure is formed to extend in a non conductor circuit formed area formed in the periphery of the above-mentioned via-hole with the stack-via structure.

Accordingly, the multilayered printed circuit board of the sixth aspect of the present invention differs from the multilayered printed circuit board of the fourth aspect of the present invention at a point that via-holes with a stack-via structure are formed immediately above the plated-through hole connecting the conductor circuits sandwiching the substrate and interlaminar resin insulating layers.

Next, the multilayered printed circuit board of the sixth aspect of the present invention will be described with the reference to figures. An example of the embodiments of the multilayered printed circuit board of the sixth aspect of the present invention includes the embodiment shown in the partial cross-section of FIG. 5 referred in the description of the multilayered printed circuit board of the third aspect of the present invention. Accordingly, here, the multilayered printed circuit board of the sixth aspect of the present invention will be described with the reference to FIG. 5.

In the multilayered printed circuit board of the sixth aspect of the present invention, the land of at least one of the via-holes having the stack-via structure is formed while being enlarged to the non conductor circuit formed area formed in the periphery of the via-holes with the stack-via structure. That is, the via-holes are formed so as to reinforce the non conductor circuit formed area by the enlarged land of the via-hole or so as to occupy the nonconductor circuit formed area with the via-hole and the land of the via-hole.

Specifically, for example, as shown in the multilayered printed circuit board 500 of FIG. 5, the land of a via-hole 1072 is formed while being enlarged to be larger than the land of a via-hole 1071 in the outermost layer and the land portion 1072a of the via-hole 1072 in the A area exists.

Further, in the multilayered printed circuit board 500 shown in FIG. 5, via-holes in two layers are formed and the multilayered printed circuit board of the fifth aspect of the present invention may be formed to have via-holes in three or more layers with a stack-via structure and the constitution of the case the via-holes in three layers are formed to have the stack-via structure may be the same constitution as that of the multilayered printed circuit board of the fourth aspect of the present invention. That is, the constitutions are as follows: that the land of the via-hole in an inner layer is formed while being enlarged to be larger than the land of the via-hole in the outermost layer and therefore the land portion of the via-hole exists in the A area; that the land of the via-hole in the lowest layer is formed while being enlarged to be larger than the land of the via-hole in the outermost layer; and that some portions of the land of the via-hole in the inner layer and the land of the via-hole in the outermost layer are larger than the land of the via-hole in the outermost layer in the respectively different portions of the A area and the like.

Further, both of the land of the via-hole in the inner layer and the land of the via-hole in the lowest layer are larger than the land of the via-hole in the outermost layer.

Incidentally, the above-mentioned A area is a non conductor circuit formed area composed only of the interlaminar resin insulating layers in the vicinity of the via-holes having a stack-via structure, and it means the same as the A area in the multilayered printed circuit board of the fifth aspect of the present invention.

In the case the land of the via-hole is formed to be enlarged, similarly to the multilayered printed circuit board of the third aspect of the present invention, the via-hole and its land work as a reinforcing material for the interlaminar resin insulating layers and the mechanical strength of the interlaminar resin insulating layers is increased and especially, cracks are hardly generated in the interlaminar resin insulating layers in the vicinity of the via-holes. That is because the land portion of the via-hole exists in a portion of the area (in FIG. 5, the A area) under the non conductor circuit formed area between the via-hole of the outermost layer and the conductor circuits neighboring the via-hole and the portion works as a reinforcing material of the interlaminar resin insulating layers.

Also, in the multilayered printed circuit board of the sixth aspect of the present invention, the number of the layers of the via-holes having the stack-via structure is not particularly limited if it is two or more and it may be two as the illustrated multilayered printed circuit board or it may be three or more.

Further, also in the multilayered printed circuit board of the sixth aspect of the present invention, a part of portions of the lands of the enlarged via-holes are desirable to exist in a half or wider area in the width of the non conductor circuit formed area in the planar view of the non conductor circuit formed area formed in the peripheral part of the via-holes with the stack-via structure and further desirable to exist in the entire area of the above-mentioned non conductor circuit formed area.

The constitutions other than that of the above-mentioned portion of the multilayered printed circuit board shown in FIG. 5 are same as those of the multilayered printed circuit board of the third aspect of the present invention and therefore, the descriptions are omitted.

Further, in the multilayered printed circuit board of the sixth aspect of the present invention, the via-holes with a stack-via structure are not necessarily formed immediately above all of the plated-through holes and it is allowed the plated-through holes immediately above which the via-hole on which any other via-holes are not piled or the plated-through holes immediately above which no via-hole is formed to exist.

Next, the manufacturing method of the multilayered printed circuit board of the sixth aspect of the present invention will be described.

The multilayered printed circuit board of the sixth aspect of the present invention can be manufactured by the same method as the manufacturing method of the multilayered printed circuit board of the third aspect of the present invention, except that the land of at least one via-hole among the via-holes in different level layers is formed while being enlarge to the non conductor circuit formed area.

Specifically, except that: in the process (7) of the manufacturing method of the multilayered printed circuit board of the third aspect of the present invention, at the time of the plating resist formation, the plating resist is formed so as to be able to form via-holes immediately above the plated-through hole; and when the lands of the via-holes are formed to be widened, at the time of the plating resist formation, the non plating resist formed area is made wide, a method same as the manufacturing method of the multilayered printed circuit board of the third aspect of the present invention is employed for manufacturing the multilayered printed circuit board.

Next, a multilayered printed circuit board of a seventh aspect of the present invention will be described.

The multilayered printed circuit board of the seventh aspect of the present invention is a multilayered printed circuit board comprising: a substrate and, as serially built up thereon, a conductor circuit and an interlaminar resin insulating layer in an alternate fashion and in repetition; and a solder resist layer formed further thereon as an outermost layer, with a connection of the above-mentioned conductor circuits through the above-mentioned interlaminar resin insulating layer being performed by a via-hole, wherein:

via-holes in different level layers among the above-mentioned via-holes are formed so as to form the stack-via structure; and among the above-mentioned interlaminar resin insulating layers, a coefficient of linear expansion of the interlaminar resin insulating layer in the outermost layer is smaller than the coefficients of linear expansion of the interlaminar resin insulating layers in other layers or equal to the coefficients of linear expansion of the interlaminar resin insulating layers in other layers.

In the multilayered printed circuit board of the seventh aspect of the present invention, the coefficient of linear expansion of the interlaminar resin insulating layer in the outermost layer is smaller than the coefficient of linear expansion of other interlaminar resin insulating layers. Accordingly, in the via-hole in the uppermost level among the via-holes formed to have the stack-via structure, the stress generated owing to the difference of the coefficients of linear expansion among the interlaminar resin insulating layers is small and therefore cracking hardly takes place in the interlaminar resin insulating layer in the outermost layer.

Additionally, in the multilayered printed circuit board of the seventh aspect of the present invention, via-holes in the different level layers are formed to have the stack-via structure. Accordingly, as described above, the wiring distance becomes short, so that the signal transmission time can be shortened and the room for option of the design of a conductor circuit can be increased and therefore it becomes easy to deal with high density wiring.

Further, in the multilayered printed circuit board of the seventh aspect of the present invention, in the case the coefficients of linear expansion of the interlaminar resin insulating layers (the above-mentioned other interlaminar resin insulating layer) other than the outermost layer are small, the coefficients of linear expansion of the interlaminar resin insulating layer of the above-mentioned outermost layer and of the above-mentioned other interlaminar resin insulating layers may be same.

That is because, in this case, cracking hardly takes place in all of the interlaminar resin insulating layer including the interlaminar resin insulating layer in the outermost layer.

In the multilayered printed circuit board of the seventh aspect of the present invention, conductor circuits and interlaminar resin insulating layers are successively layered on a substrate and conductor circuits sandwiching the above-mentioned interlaminar resin insulating layers are connected through via-holes, and a solder resist layer is formed in the outermost layer.

Examples of the above-mentioned substrate include insulating substrates such as a glass epoxy substrate, a polyimide substrate, a bismaleimide-triazine resin substrate, a fluororesin substrate and the like.

The above-mentioned conductor circuits are made of a material, for example, Cu, Ni, P, Pd, Co, W and their alloys and formed by plating treatment and the like. A practical formation method of the conductor circuits will be described later.

Plated-through holes connecting conductor circuits laminated on both faces of the above-mentioned substrate may be formed on the substrate and the insides of the plated-through holes are desirable to be filled with the resin filler layer.

In the above-mentioned multilayered printed circuit board, the via-holes with the stack-via structure, which will be described later, may be formed immediately above the plated-through holes and in this case, it is desirable to fill the insides of the plated-through holes with the resin filler layer and to form a cover plating layer on the plated-through hole. That is because formation of the cover plating layer makes the connection reliability between the via-holes and the plated-through holes excellent.

The above-mentioned interlaminar resin insulating layers may be made of, for example, a resin composition containing thermosetting resin, photosensitive resin, thermoplastic resin, resin complexes of thermosetting resin and thermoplastic resin, and resin complexes of thermosetting resin and photosensitive resin.

Practical examples of the above-mentioned thermosetting resin include epoxy resin, phenol resin, polyimide resin, polyester resin, bismaleimide resin, polyolefin type resin, polyphenylene ether resin and the like.

The above-mentioned epoxy resin includes, for example, cresol-novolak type epoxy resin, bisphenol A-type epoxy resin, bisphenol F-type epoxy resin, phenol-novolak type epoxy resin, alkylphenol-novolak type epoxy resin, biphenol F-type epoxy resin, naphthalene type epoxy resin, dicyclopentadiene type epoxy resin, epoxylated compounds of condensates of phenols and aromatic aldehydes containing a phenolic hydroxyl group, triglycidyl isocyanurate, alicyclic epoxy resin and the like. They may be used alone or in combination of two or more of them. Accordingly, the heat resistance thereof is superior.

The above-mentioned polyolefin resin includes, for example, polyethylene, polystyrene, polypropylene, polyisobutylene, polybutadiene, polyisoprene, cycloolefin type resin, copolymers of these resin materials and the like.

The above-mentioned photosensitive resin includes, for example, acrylic resin and the like.

Further, those obtained by providing photosensitivity to the above-mentioned thermosetting resin can be employed as the photosensitive resin. Practical examples include those obtained by reaction of methacrylic acid or acrylic acid with the thermosetting groups (for example, epoxy group of epoxy resin) of the thermosetting resin to introduce acrylic group.

The above-mentioned thermoplastic resin includes, for example, phenoxy resin, polyether sulfone, polysulfone and the like.

The resin complexes of thermosetting resin and thermoplastic resin include, for example, those which contain the above-mentioned thermosetting resin and the above-mentioned thermoplastic resin. Above all, those which contain epoxy resin and/or phenol resin as the thermosetting resin and phenoxy resin and/or polyether sulfone (PES) as the thermoplastic resin are desirable.

Further, the above-mentioned complexes of the photosensitive resin and the thermoplastic resin include, for example, those containing the above-mentioned photosensitive resin and the above-mentioned thermoplastic resin.

One example of the above-mentioned resin compositions includes a resin composition for roughened surface formation. The above-mentioned resin compositions for roughened surface formation include, for example, those in which a substance soluble in the roughening solution containing at least one kind selected from an acid, an alkali, and an oxidizing agent is dispersed in the un-cured heat resistant resin matrix hardly soluble to a roughening solution containing at least one kind selected from an acid, an alkali, and an oxidizing agent.

Incidentally, the terms, "hardly soluble" and "soluble", means those which have a relatively high dissolution speed are called as "soluble" for the convenience and those which have a relatively slow dissolution speed are called as "hardly soluble" for the convenience in the case they are immersed in the same roughening solution for the same period.

The above-mentioned heat resistant resin matrix is desirable to be those which are capable of keeping the shape of the roughened surface at the time of roughened surface formation on an interlaminar resin insulating layer using the above-mentioned roughening solution and examples of the resin matrix include thermosetting resin, thermoplastic resin, and their complexes. Further, it may be a photosensitive resin. This is because an opening can be formed by exposure and development treatment in the process of forming an opening for a via-hole.

Examples of the above-mentioned thermosetting resin include epoxy resin, phenol resin, polyimide resin, polyolefin resin, fluororesin and the like. Further, resin obtained by providing photosensitivity to these thermosetting resin materials, that is, resin obtained by (meth)acrylation of the thermosetting group using methacrylic acid, acrylic acid and the like, may be used. Specifically, (meth)acrylate of epoxy resin is desirable and further epoxy resin containing two or more epoxy groups in one molecule is more desirable.

Examples of the above-mentioned thermoplastic resin include phenoxy resin, polyethersulfone, polysulfone, polyphenylenesulfone, polyphenylene sulfide, polyphenyl ether, polyetherimide and the like. They may be used alone or in combination of two or more of them.

Examples of the above-mentioned soluble substances include an inorganic particle, a resin particle, a metal particle, a rubber particle, a liquid-phase resin, a liquid-phase rubber and the like. They may be used alone or in combination of two or more of them.

Examples of the above-mentioned inorganic particle include aluminum compounds such as alumina, aluminum hydroxide and the like; calcium compounds such as calcium carbonate, calcium hydroxide; potassium compounds such as potassium carbonate and the like; magnesium compounds such as magnesia, dolomite, basic magnesium carbonate, talc and the like and the like; silicon compounds such as silica, zeolite and the like. They may be used alone or in combination of two or more of them.

The above-mentioned alumina particle can be dissolved in and removed by hydrofluoric acid and calcium carbonate can be dissolved in and removed by hydrochloric acid. Sodium-containing silica and dolomite can be dissolved in and removed in an aqueous alkaline solution.

Examples of the above-mentioned resin particle include those comprising thermosetting resin and thermoplastic resin and the like, and those which have a higher dissolution speed than that of the above-mentioned heat resistant resin matrix in the case of immersion in a roughening solution comprising at one kind of compounds selected from an acid, an alkali and an oxidizing agent can be used without any specific limitation and specifically, examples include amino resin (melamine resin, urea resin, guanamine resin and the like), epoxy resin, phenol resin, phenoxy resin, polyimide resin, polyphenylene resin, polyolefin resin, fluoro resin, bismaleimide-triazine resin and the like. They may be used alone or in combination of two or more of them.

The above-mentioned resin particle is required to be previously subjected to curing treatment. That is because if curing is not carried out, the above-mentioned resin particle is dissolved in a solvent for dissolving the resin matrix and mixed evenly and therefore, the resin particle cannot be dissolved and removed selectively alone.

Examples of the above-mentioned metal particle include gold, silver, copper, tin, zinc, stainless steel, aluminum, nickel, iron, lead and the like. They may be used alone or in combination of two or more of them.

Further, the above-mentioned metal particle may be coated with resin and the like on the surface layer in order to assure the insulating property.

In the case a resin composition including the thermosetting resin is used as such a resin composition, it is desirable to use those having a glass transition temperature of not higher than 180° C.

That is because, in the case of a resin composition with a glass transition temperature of higher than 180° C., since the temperature for the thermal curing exceeds 200° C., the substrate is sometimes warped at the time of heating or inconvenient matter takes place at the time of dissolution.

Further, in the above-mentioned multilayered printed circuit board, the coefficient of linear expansion of the interlaminar resin insulating layer in the outermost layer is either smaller than the coefficient of linear expansion of other interlaminar resin insulating layers or equal to the coefficient of linear expansion of other interlaminar resin insulating layers.

Therefore, for the multilayered printed circuit board of the seventh aspect of the present invention, resin compositions capable of forming interlaminar resin insulating layers in which the coefficient of linear expansion of the interlaminar resin insulating layer of the outermost layer and the coefficients of linear expansion of other interlaminar resin insulating layers satisfy the above-mentioned relations.

Since stress hardly takes place in the via-holes with the stack-via structure, especially, in the via-hole of the uppermost level in the multilayered printed circuit board bearing such interlaminar resin insulating layers, cracking hardly takes place in the interlaminar resin insulating layer and excellent connection reliability can be provided.

Further, in the above-mentioned multilayered printed circuit board, the via-holes in the different level layers are formed so as to have the stack-via structure.

In the via-holes with the stack-via structure, the signal transmission time can be shortened and the room for option of the design of a conductor circuit can be increased and therefore it becomes easy to deal with high density wiring.

Further, in the above-mentioned via-holes with the stack-via structure, at least one of the land diameters of the above-mentioned via-holes having the stack-via structure is different from the land diameters of other via-holes having the stack-via structure.

That is because, in the case where via-holes have such a constitution, the via-hole with a large land diameter functions as a reinforcing member of interlaminar resin insulating layers and accordingly, the mechanical strength of the interlaminar resin insulating layers is increased and especially, cracks are hardly generated in the interlaminar resin insulating layers in the vicinity of the via-holes.

The shapes of the via-holes of the above-mentioned multilayered printed circuit board are desirably the filled via shape. That is because the via-holes with the filled via shape have flat upper faces and therefore they are suitable for forming via-holes with the stack-via structure.

Further, the above-mentioned via-holes are made of a material such as Cu, Ni, P, Pd, Co, W and their alloys and formed by plating and the like, similarly to the above-described conductor circuits. A practical formation method of the via-holes will be described later.

Incidentally, in the multilayered printed circuit board of the seventh aspect of the present invention, it is not necessary that the different via-holes in all of level layers have the stack-via structure and it is allowed that via-holes on which other via-holes are not piled may exist.

Next, the manufacturing method of the multilayered printed circuit board of the seventh aspect of the present invention will be described in order of the processes.

(1) At first, the above-mentioned resin substrate or a copper-clad laminate plate bearing a copper foil on both faces is used as a starting material and conductor circuits are formed on the substrate.

Specifically, for example, after a conductor layer in a spread state is formed entirely on both faces of the substrate by electroless plating and the like, an etching resist corresponding to the conductor circuit pattern is formed on the conductor layer and then etching is carried out.

Further, the copper-clad laminate plate can be used as the substrate bearing conductor layers in a spread state.

Further, in the case plated-through holes are formed to connect the conductor circuits formed on both faces of the substrate, through holes are previously formed and then electroless plating is carried out also for the wall faces of the through holes, so that the plated-through holes for connecting the conductor circuits sandwiching the substrate are formed.

After the plated-through hole formation, it is desirable to fill a resin filler insides of the plated-through holes. At this time, it is also desirable to fill a resin filler insides of the non conductor circuit formed area.

The above-mentioned resin filler includes, for example, a resin composition and the like containing epoxy resin, a curing agent, and an inorganic particle.

Further, in the case the insides of the plated-through holes and the non conductor circuit formed area are filled with the resin filler, the wall faces of the plated-through holes and the side faces of the conductor circuits are subjected to the surface roughening treatment. This is because the adhesion strength between the resin filler and the plated-through holes and the like is increased.

Incidentally, the surface roughening treatment may be carried out by a method similar to that employed in the process (2), which will be described later.

In the case a cover plating layer is formed on the plated-through hole, the cover plating layer can be formed, for example, by the following processes (a) to (c).

That is, (a) after the above-mentioned process of the plated-through hole formation containing the resin filler layer in the inside, a thin film conductor layer is formed on the surface of the substrate including the exposed face of the resin filler layer by electroless plating, sputtering and the like. Incidentally, when the electroless plating is employed, a catalyst is previously supplied to the surface to be plated.

(b) Next, the plating resist is formed on portions other than the plated-through holes (including the resin filler layer) and electroplating is carried out using the above-mentioned thin film conductor layer as a plating lead.

(c) Successively, on completion of the electroplating, the plating resist separation and removal of the thin film conductor layer under the plating resist are carried out.

Through such processes (a) to (c), the cover plating layer comprising two layers, the thin film conductor layer and the electroplating layer, can be formed.

The processes (a) to (c) from the catalyst supply to the thin film conductor layer removal may be carried out by the same methods as those employed in the processes (6) to (8), which will be described later.

Further, in the case of forming a cover plating layer comprising one layer, for example, after a catalyst is supplied to the surface of the substrate including the exposed face of the resin filler layer, the plating resist is formed in the portions other than the plated-through holes and then removal of electroless plating and plating resist may be carried out.

(2) Next, based on necessity, the surface roughening of the conductor circuits is carried out. The roughening treatment method includes, for example, a blackening (oxidizing)-reducing treatment, an etching treatment using a solution mixture containing an organic acid and a cupric complex and the like, a treatment of Cu—Ni—P needle-like alloy plating and the like. The surface roughening treatment is carried out in order to assure the adhesion strength to an interlaminar resin insulating layer to be formed in a later process and therefore, it is not necessary to carry out this process if the adhesion strength between the conductor circuit and the layer interlaminar resin insulating layer is sufficient.

(3) Next, either an un-cured resin layer comprising thermosetting resin or a resin complex is formed or a resin layer of thermoplastic resin is formed on a conductor circuit.

The above-mentioned un-cured resin layer may be formed by applying un-cured resin by a roll coater, a curtain coater and the like or by thermally bonding an un-cured (half-cured) resin film. Further, a resin film obtained by forming a metal layer of such as a copper foil on one face of an un-cured resin film may be attached.

The resin layer comprising the thermoplastic resin is desirable to be formed by thermally bonding a resin formed body formed into a film-like thereon.

(4) Next, in the case of formation of the interlaminar resin insulating layers using the thermosetting resin or a resin complex containing the thermosetting resin, the un-cured resin layer is cured by the curing treatment and at the same time openings for via-holes are formed to obtain the interlaminar resin insulating layers.

The above-mentioned openings for via-holes are desirable to be formed by laser treatment. The above-mentioned laser treatment may be carried out before the curing treatment or after the curing treatment.

Also, in the case of formation of the interlaminar resin insulating layers of photosensitive resin and a resin complex containing the photosensitive resin, the openings for via-holes may be formed by carrying out exposure and development treatment. Incidentally, in this case, the exposure and development treatment is carried out before the above-mentioned curing treatment.

Further, in the case of formation of the interlaminar resin insulating layers using the thermoplastic resin as a material, the openings for via-holes may be formed by carrying out laser treatment for the resin layer comprising the thermoplastic resin to obtain the interlaminar resin insulating layer.

The laser to be used in this case includes, for example, carbonic acid gas laser, excimer laser, UV laser, YAG laser and the like. They may be properly employed in consideration of the shape and the like of the opening for a via-hole to be formed.

In the case of forming the above-mentioned openings for via-holes, laser beam radiation by excimer laser of a hologram method through a mask makes it possible to form a large number of openings for via-holes at once.

Further, in the case of forming the openings for via-holes using short pulses of carbonic acid gas laser, the remaining of resin in the openings can be slight and damages to the resin in the peripheral parts of the openings are scarce.

In the case of radiating laser beam through optical system lenses and a mask, a large number of openings for via-holes can be formed at once.

That is because use of the optical system lenses and the mask makes it possible to simultaneously radiate laser beam of the same intensity at the same radiation angle to a plurality of portions.

Further, although the thickness of the above-mentioned interlaminar resin insulating layer is not specifically limited, generally, it is desirable to be 5 to 50 µm. Additionally, although the opening diameter of the openings for via-holes is not specifically limited, generally, it is desirable to be 40 to 200 µm.

In the case of formation of the plated-through holes connecting the conductor circuits sandwiching the substrate and the interlaminar resin insulating layers, through holes penetrating the interlaminar resin insulating layers and the substrate are formed in this process. The through holes can be formed by drilling process, the laser treatment and the like.

(5) Next, the surface of the interlaminar resin insulating layer including the inner walls of the openings for via-holes is roughened by surface roughening treatment using an acid or an oxidizing agent based on the necessity.

Incidentally, the roughened surface is formed in order to improve the adhesion property of the interlaminar resin insulating layer to a thin film conductor layer to be formed thereon and therefore, if adhesion strength is sufficient between the interlaminar resin insulating layer and the thin film conductor layer, the roughened surface does not need to be formed. Further, in the case the through holes penetrating the substrate and the interlaminar resin insulating layers are formed, the wall faces thereof may be subjected to the surface roughening.

Examples of the above-mentioned acid include sulfuric acid, nitric acid, hydrochloric acid, phosphoric acid, formic acid and the like and examples of the above-mentioned oxidizing agent include chromic acid, chromic acid mixture, permanganate such as sodium permanganate and the like.

After the surface roughening, it is desirable to neutralize the surface of the interlaminar resin insulating layer using an aqueous alkaline solution, a neutralization solution and the like. That is because the acid and the oxidizing agent are prevented from causing effects on the next step.

Further, formation of the above-mentioned roughened surface, plasma treatment and the like may be employed.

(6) Next, the thin film conductor layer is formed on the surface of the interlaminar resin insulating layer in which the opening for a via-hole is formed.

The above-mentioned thin film conductor layer can be formed by an electroless plating, a sputtering, or a vapor deposition method and the like. Incidentally, in the case the surface of the interlaminar resin insulating layer is not subjected to the surface roughening, the above-mentioned thin film conductor layer is desirable to be formed by sputtering.

Incidentally, in the case the thin film conductor layer is formed by electroless plating, a catalyst is previously supplied to the surface to be plated. Examples of the above-mentioned catalyst include palladium chloride and the like.

Although the thickness of the above-mentioned thin film conductor layer is not particularly limited, in the case the thin film conductor layer is formed by electroless plating, the thickness thereof is desirably 0.6 to 1.2 µm, and in the case of formation by sputtering, the thickness thereof is desirably 0.1 to 1.0 µm.

Further, in the case the through holes penetrating the substrate and the interlaminar resin insulating layers are formed in the above-mentioned process (4), the thin film conductor layer is formed on the through hole to form the plated-through holes. Incidentally, in this case, it is desirable to form the resin filler layer inside the plated-through holes and then a cover plating layer may be formed on the plated-through holes.

Incidentally, the plated-through holes formed in such a manner not only connects the conductor circuits sandwiching: the substrate; and the interlaminar resin insulating layers, but also connects four layers of conductor circuits in total, that is, two layers of these conductor circuits and two layers of the conductor circuits formed on both faces of the substrate.

(7) Next, the plating resist is formed on a portion of the above-mentioned thin film conductor layer using a dry film and after that, electrolytic plating is carried out using the above-mentioned thin film conductor layer as a plating lead to form an electroplating layer in the non plating resist formed area.

Here, the plating resist is formed so as to make it possible to form via-holes with a desired land diameter. That is, in the particular level layer, if the via-holes with a large land diameter are to be formed, the width of the non plating resist formed area should be made wide.

Further, in this process, it is desirable that the openings for via-holes may be filled by electroplating to be filled via structure so as to make the shape of the via-holes to be formed in the later process be a filled via shape. That is because the via-holes with the filled via shape are suitable for formation of the stack-via structure.

Also, in this process, after an electroplating layer having a concave portion on the upper face is formed, the concave portion may be filled with a conductor containing paste to make the upper face flat, or after the electroplating layer having the concave portion on the upper face is formed once, then the concave portion may be filled with the resin filler and the like and further the cover plating layer may be formed to make the upper face flat.

In the case electroplating is carried out for filling, for example, an electroplating solution with the following composition is employed to carry out electroplating treatment.

That is, an electroplating solution containing 50 to 300 g/l of copper sulfate, 30 to 200 g/l of sulfuric acid, 25 to 90 mg/l of chlorine ion, and 1 to 1000 mg/l of additive comprising at least a leveling agent and a brightener is employed to carry out electroplating treatment.

With an electroplating solution of such a composition, the openings for the via-holes can be filled regardless of: the opening diameter of the via-holes; the material and the thickness of the resin insulating layer; and the existence of the roughened surface of the interlaminar resin insulating layers.

Additionally, since the above-mentioned electroplating solution contains copper ion at a high concentration, copper ion can be supplied sufficiently to the openings for via-holes and plating of the openings for via-holes can be carried out at a plating speed of 40 to 100 µm/hour to result in the high speed electroplating process.

The above-mentioned electroplating solution is desirable to have a composition containing 100 to 250 g/l of copper sulfate, 50 to 150 g/l of sulfuric acid, 30 to 70 mg/l of chlorine ion, and 1 to 600 mg/l of additives comprising at least a leveling agent and a brightener.

Further, in the above-mentioned electroplating solution, the above-mentioned additives may comprise at least a leveling agent and a brightener and may include other components.

Examples of the above-mentioned leveling agent include polyethylene, gelatin, and their derivatives and the like.

Also, examples of the above-mentioned brightener include sulfur oxide and its relevant compounds, hydrogen sulfide and its relevant compounds, and other sulfur compounds and the like.

The mixing amount of the above-mentioned leveling agent is desirably 1 to 1000 mg/l, the mixing amount of the above-mentioned brightener is desirably 0.1 to 100 mg/l and the mixing ratio of both is desirably (2:1) to (10:1).

(8) Next, the plating resist is separated and the thin film conductor layer which was under the plating resist is removed by etching to form an independent conductor circuit. Examples of an etching solution include an aqueous sulfuric acid-hydrogen peroxide solution, an aqueous solution of a persulfate such as ammonium persulfate and the like, ferric chloride, cupric chloride, hydrochloric acid and the like. Further, as the etching solution, a mixed solution containing the above-mentioned cupric complex and an organic acid may be used.

Further, in place of the above-mentioned methods described in (7), (8), the following method may be employed to form the conductor circuit.

That is, after formation of the electroplating layer on the entire surface of the above-mentioned thin film conductor layer, an etching resist is formed on a portion of the electroplating layer using a dry film and then, the electroplating layer and the thin film conductor layer under the non etching resist formed area are removed by etching and then further the etching resist is separated to form the independent conductor circuit.

(9) After that, the processes of the above-mentioned (3) to (8) are repeated once or twice or more to manufacture a substrate on which the interlaminar resin insulating layers bearing the conductor circuit on the uppermost layer are formed. Incidentally, the number of the times of repetition of the above-mentioned processes (3) to (8) may be properly selected corresponding to the design of the multilayered printed circuit board.

In this case, the respective via-holes are formed immediately above other via-holes so as to form the via-holes with the stack-via structure. Further, in the above-mentioned processes (7), (8), in the case plated-through holes penetrating the substrate and the interlaminar resin insulating layers are formed, via-holes with the stack-via structure may be formed on the plated-through holes.

Further, when the via-holes with the stack-via structure are formed and in the case the land diameter of at least one of them is made to be different from the land diameters of other via-holes, the size of the non plating resist formed area may be adjusted at the time of the plating resist formation.

Further, in the repeating processes, at the time of formation of the interlaminar resin insulating layer in the outermost layer, the interlaminar resin insulating layer in the outermost layer is formed so as to have a smaller coefficient of linear expansion than those of other interlaminar resin insulating layers. Accordingly, in consideration of the coefficients of linear expansion of other interlaminar resin insulating layers, the materials for the interlaminar resin insulating layers are selected.

Incidentally, if the coefficients of linear expansion of the above-mentioned other interlaminar resin insulating layers are sufficiently low, the interlaminar resin insulating layer in the outermost layer and other interlaminar resin insulating layers may be made of the same material.

(10) Next, on the substrate bearing the conductor circuit of the uppermost layer, a solder resist layer having a plurality of openings for solder bumps is formed.

Specifically, after: an un-cured solder resist composition is applied by a roll coater, a curtain coater and the like; or a solder resist composition formed to be like a film is pressure bonded, the openings for the solder bumps are formed by laser treatment and the exposure and development treatment, and based on the necessity, curing treatment is carried out to form the solder resist layer.

The above-mentioned solder resist layer may be formed using a solder resist composition containing, for example, polyphenylene ether resin, polyolefin resin, fluoro resin, thermoplastic elastomer, epoxy resin, polyimide resin and the like.

Further, the solder resist composition other than the above-mentioned one includes, for example, a paste-like fluid containing thermosetting resin comprising (meth)acrylate of novolak type epoxy resin, an imidazole curing agent, a bifunctional (meth)acrylic acid ester monomer, (meth)acrylic acid ester polymer with a molecular weight of about 500 to 5000, bisphenol type epoxy resin and the like, a photosensitive monomer such as a multivalent acrylic monomer, and a glycol ether type solvent and its viscosity is desirably adjusted to be 1 to 10 Pa·s at 25° C.

The above-mentioned solder resist composition may contain an elastomer and an inorganic filler.

Further, as the solder resist composition, a commercially available solder resist composition may be used.

Further, laser to be employed for forming the above-mentioned openings for the solder bumps may be the same laser as that employed at the time of formation of the above-mentioned openings for via-holes.

Next, based on the necessity, solder pads are formed on the surface of the conductor circuit exposed at the bottom faces of the openings for the solder bumps.

The above-mentioned solder pads may be formed by covering the above-mentioned conductor circuit surface with a corrosion resistant metal such as nickel, palladium, gold, silver, platinum and the like.

Specifically, it is desirable to form using a metallic material such as nickel-gold, nickel-silver, nickel-palladium, nickel-palladium-gold and the like.

Further, the above-mentioned solder pad can be formed by, for example, plating, vapor deposition, electrodeposition and the like, and among them, plating is desirable from a viewpoint that the coating layer is excellent in evenness.

(11) Next, a solder paste is filled in the above-mentioned openings for the solder bumps and subjected to reflow treatment or a solder paste is filled and subjected to reflow treatment after conductive pins are installed to form solder bumps or a BGA (Ball Grid Array) or PGA (Pin Grid Array).

A letter printing process for forming product identification latter and treatment with plasma of oxygen, tetrachlorocarbon and the like for the solder resist layer modification may be carried out.

Through such processes, the multilayered printed circuit board of the seventh aspect of the present invention can be manufactured.

Next, a multilayered printed circuit board of the eighth aspect of the present invention will be described.

The multilayered printed circuit board of the eighth aspect of the present invention is a multilayered printed circuit board comprising: a substrate and, as serially built up thereon, a conductor circuit and an interlaminar resin insulating layer in an alternate fashion and in repetition; and a solder resist layer formed further thereon as an outermost layer, with a connection of the above-mentioned conductor circuits through the above-mentioned interlaminar resin insulating layer being performed by a via-hole, wherein:

via-holes in different level layers among the above-mentioned via-holes are formed so as to form the stack-via structure; and among the above-mentioned interlaminar resin insulating layers, at least the interlaminar resin insulating layer in the outermost layer has a coefficient of linear expansion of 100 ppm/° C. or less.

In the above-mentioned multilayered printed circuit board of the eighth aspect of the present invention, the coefficient of linear expansion of at least the interlaminar resin insulating layer in the outermost layer is 100 ppm/° C. or less, which is low. Accordingly, in the via-holes in the uppermost layer among the via-holes formed to have the stack-via structure, the stress caused owing to the difference of the coefficients of linear expansion of the interlaminar resin insulating layers is small and cracks are hardly generated in the interlaminar resin insulating layer of the outermost layer.

The multilayered printed circuit board of the eighth aspect of the present invention is also formed in a manner that the via-holes in the different level layers have the stack-via structure. Accordingly, as described above, the wiring distance becomes short, since the signal transmission time can be shortened. Thus, it is possible to satisfy the requirement for the multilayered printed circuit board with high speed performance, and the room for option of the design of a conductor circuit can be increased and therefore it becomes possible to satisfy the requirement for high density wiring.

The multilayered printed circuit board of the eighth aspect of the present invention differs from the multilayered printed circuit board of the seventh aspect of the present invention only at a point that the coefficient of linear expansion of the interlaminar resin insulating layer of the outermost layer is not higher than 100 ppm/° C., and the entire structure other than the above-mentioned characteristics is the same as that of the multilayered printed circuit board of the seventh aspect of the present invention. Therefore, here, only the interlaminar resin insulating layer of the outer most layer of the multilayered printed circuit board will be described in details and the descriptions of other constituent members and the entire structure will be omitted.

The material for the above-mentioned interlaminar resin insulating layer of the outermost layer is not limited if it is capable of forming the interlaminar resin insulating layer with a coefficient of linear expansion within the above-mentioned range and for example, a resin composition to give a coefficient of linear expansion of 100 ppm/° C. or less may be selected properly among resin compositions similar to those to be employed for forming the interlaminar resin insulating layers of the multilayered printed circuit board of the seventh aspect of the present invention.

Specifically, examples include resin compositions obtained by mixing cresol-novolak type epoxy resin, a mixed composition containing photosensitive monomers; a mixed composition containing polyether sulfone (PES), a resin particle (Polymerpol, made by Sanyo Chemical Industries, Ltd.) and the like, and a mixed composition containing a curing agent and other additives.

The above-mentioned coefficient of linear expansion is desirable to be 30 to 90 ppm/° C.

If the coefficient of linear expansion is less than 30 ppm/° C., the rigidity is high and, for example, in the case the surface is roughened to be roughened surface, the irregularity of the roughened surface cannot be maintained. On the other hand, if it is within the above-mentioned range, the cracking resistance is excellent and the roughened surface shape maintaining property is excellent.

Further, in the multilayered printed circuit board of the eighth aspect of the present invention, the coefficients of linear expansion of the interlaminar resin insulating layers other than the outermost layer are also desirable to be 100 ppm/° C. or less.

That is because the stress is scarcely generated between the interlaminar resin insulating layers and via-holes and the multilayered printed circuit board can be provided with more excellent reliability.

Further, the multilayered printed circuit board of the eighth aspect of the present invention comprising such interlaminar resin insulating layers can be manufactured by the same method as the manufacturing method of the multilayered printed circuit board of the seventh aspect of the present invention, except that the interlaminar resin insulating layer of the outermost layer is formed using the resin composition capable of forming the interlaminar resin insulating layer with such a coefficient of linear expansion as described above.

Next, a multilayered printed circuit board of the ninth aspect of the present invention will be described.

The multilayered printed circuit board of the ninth aspect of the present invention is a multilayered printed circuit board comprising a substrate and, as serially built up thereon, a conductor circuit and an interlaminar resin insulating layer in an alternate fashion and in repetition; and a solder resist layer formed further thereon as an outermost layer, with a connection of the above-mentioned conductor circuits through the above-mentioned interlaminar resin insulating layer being performed by a via-hole, wherein:

via-holes in different level layers among the above-mentioned via-holes are formed so as to form the stack-via structure; and among the above-mentioned interlaminar resin insulating layers, at least the interlaminar resin insulating layer in the outermost layer contains a particle and a rubber component and has a coefficient of linear expansion of 100 ppm/° C. or less.

In the multilayered printed circuit board of the ninth aspect of the present invention, the coefficient of linear expansion of at least the interlaminar resin insulating layer in the outermost layer is as low as 100 ppm/° C. or less and accordingly, in the via-holes in the uppermost layer among the via-holes formed to have the stack-via structure, the stress caused owing to the difference of the coefficients of linear expansion of the interlaminar resin insulating layers is small and cracks are hardly generated in the interlaminar resin insulating layer of the outermost layer.

Additionally, since the particle is added to the interlaminar resin insulating layers of the above-mentioned multilayered printed circuit board, shape retaining property is excellent and since rubber component is added, owing to the flexibility and the resilient elasticity of the rubber component, even if the stress affects the interlaminar resin insulating layers, the stress can be absorbed or moderated.

The above-mentioned multilayered printed circuit board is also formed in a manner that the via-holes in the different level layers have the stack-via structure. Accordingly, as described above, the wiring distance becomes short. Therefore, since the signal transmission time can be shortened, it is possible to satisfy the requirement for the multilayered printed circuit board with high speed performance and the room for option of the design of a conductor circuit can be increased and thus it becomes easy to satisfy high density wiring.

The multilayered printed circuit board of the ninth aspect of the present invention differs from the multilayered printed circuit board of the seventh aspect of the present invention only at a point that the particle and the rubber component are added to the interlaminar resin insulating layer of the outermost layer and that the coefficient of linear expansion of the interlaminar resin insulating layer of the outermost layer is not higher than 100 ppm/° C., and the entire structure other than the above-mentioned characteristics is the same as that of the multilayered printed circuit board of the seventh aspect of the present invention. Therefore, here, only the interlaminar resin insulating layer of the outermost layer of the multilayered printed circuit board will be described in details and the descriptions of other constituent members and the entire structure will be omitted.

The material for the above-mentioned interlaminar resin insulating layer of the outermost layer is not limited if it contains the particle and the rubber component and is capable of forming the interlaminar resin insulating layer with a coefficient of linear expansion within the above-mentioned range and for example, a resin composition which is containing the particle and the rubber component in resin compositions similar to those to be employed for forming the interlaminar resin insulating layers of the multilayered printed circuit board of the seventh aspect of the present invention, and capable of giving a coefficient of linear expansion of 100 ppm/° C. or less may be selected properly.

The particle to be added to the above-mentioned interlaminar resin insulating layer is desirable to be at least one type selected from inorganic particles, resin particles, and metal particles.

The above-mentioned inorganic particles include, for example, aluminum compounds such as alumina, aluminum hydroxide and the like; calcium compounds such as calcium carbonate, calcium hydroxide and the like; potassium compounds such as potassium carbonate and the like; magnesium compounds such as magnesia, dolomite, basic magnesium carbonate, talc and the like; silicon compounds such as silica, zeolite and the like. They may be used alone or in combination of two or more of them.

The above-mentioned resin particles include, for example, amino resin (melamine resin, urea resin, guanamine resin and the like), epoxy resin, phenol resin, phenoxy resin, polyimide resin, polyphenylene resin, polyolefin resin, fluoro resin, bis-maleimide-triazine resin and the like. They may be used alone or in combination of two or more of them.

The above-mentioned metal particles include, for example, those of gold, silver, copper, tin, zinc, stainless steel, aluminum, nickel, iron, lead and the like. They may be used alone or in combination of two or more of them.

The above-mentioned metal particles may be coated with resin and the like on the surface in order to assure the insulating property.

In the case the interlaminar resin insulating layer is formed using the resin composition for the surface roughening described in the multilayered printed circuit board of the seventh aspect of the present invention, since the resin composition for the surface roughening contains the particle, further addition of the particle is not necessary at this time.

The rubber component to be added to the above-mentioned interlaminar resin insulating layer includes, for example, acrylonitrile-butadiene rubber, polychloroprene rubber, polyisoprene rubber, acrylic rubber, polysulfide type synthetic rubber, fluoro rubber, urethane rubber, silicone rubber, ABS resin and the like.

Further, polybutadiene rubber; a variety of modified polybutadiene rubber such as epoxy-modified, urethane-modified, (meth)acrylonitrile-modified ones; (meth)acrylonitrile-butadiene rubber having carboxyl group and the like may also be used.

Practical examples of the material for the interlaminar resin insulating layer containing such a particle and rubber component include, for example, resin compositions obtained by mixing polybutadiene rubber and silica particle and the like with a resin component containing, for instance, bisphenol A type epoxy resin, cresol-novolak type epoxy resin, and phenol novolak resin.

The mixing ratio of the above-mentioned particle and the rubber component is not particularly limited, however, on the basis of the mixing amount after the interlaminar resin insulating layer formation, the particle is desirable to be 1 to 25% by weight and the rubber component is desirable to be 5 to 20% by weight. That is because within these ranges, the above-mentioned characteristic properties can be obtained and the thermal expansion coefficients can be adjusted between the substrate and the solder resist layer and the stress owing to the curing shrinkage at the time of the interlaminar resin insulating layer formation can be moderated. The more desirable mixing amounts are 3 to 18% by weight for the particle and 7 to 18% by weight for the rubber component.

Also in the multilayered printed circuit board of the ninth aspect of the present invention, similarly to the eighth aspect of the present invention, the coefficient of linear expansion of the interlaminar resin insulating layer of the outermost layer is desirable to be 30 to 90 ppm/° C.

Further, in the multilayered printed circuit board of the ninth aspect of the present invention, the coefficients of linear expansion of the interlaminar resin insulating layers other than that of the outermost layer are also desirable to be not higher than 100 ppm/° C. Because stress is scarcely generated between the interlaminar resin insulating layers and the via-holes.

Further, in the above-mentioned multilayered printed circuit board, the interlaminar resin insulating layers other than the outermost layer are desirable to contain the particle and the rubber component. Because the above-mentioned effects can be obtained in the interlaminar resin insulating layers other than the outermost layer.

The multilayered printed circuit board of the ninth aspect of the present invention comprising such interlaminar resin insulating layers can be manufactured by the same method as the manufacturing method of the multilayered printed circuit board of the seventh aspect of the present invention, except that the interlaminar resin insulating layer of the outmost layer is formed using the resin composition containing the particle and the rubber component so as to be capable of forming the interlaminar resin insulating layers having the coefficients of linear expansion within the above-mentioned ranges therefrom.

Incidentally, in the multilayered printed circuit boards of the eighth and the ninth aspect of the present invention, it is not necessary that all of the via-holes in the different level layers have the stack-via structure and it is allowed that via-holes on which other via-holes are not piled may exist.

Next, the multilayered printed circuit board of the tenth aspect of the present invention will be described.

The printed circuit board of the tenth aspect of the present invention is a multilayered printed circuit board comprising: a substrate and, as serially built up thereon, a conductor circuit and an interlaminar resin insulating layer in an alternate fashion and in repetition; and a solder resist layer formed further thereon as an outermost layer, with a connection of the above-mentioned conductor circuits through the above-mentioned interlaminar resin insulating layer being performed by a via-hole, wherein:

via-holes in different level layers among the above-mentioned via-holes are piled on one another; and among the above-mentioned piled via-holes, at least one via-hole is piled on other via-holes with its center deviated from other via-holes, and other via-holes are piled on one another with those centers approximately overlapped one another.

In the multilayered printed circuit board of the tenth aspect of the present invention, at least one among the via-holes in different level layers is piled while its center being shifted from those of other via-holes, so that the stress generated owing to the difference of the coefficients of linear expansion of the via-holes and the interlaminar resin insulating layers can be dispersed and concentration of a high stress upon some of piled via-holes, especially, upon the via-hole in the uppermost level can be prevented, and accordingly, the cracking of the interlaminar resin insulating layers attributed to the stress concentration scarcely takes place and the multilayered printed circuit board is provided with excellent reliability.

Further, in the above-described multilayered printed circuit board, the via-holes other than the via-hole piled while its center being shifted are piled while their centers being approximately overlapped one another, and with the via-hole piled in such a manner, the wiring distance becomes short, so that the signal transmission time can be shortened and the room for option of the design of a conductor circuit can be increased and therefore it becomes easy to deal with high density wiring.

Hereinafter, the multilayered printed circuit board of the tenth aspect of the present invention will be described with the reference to the figures.

Figure 32:
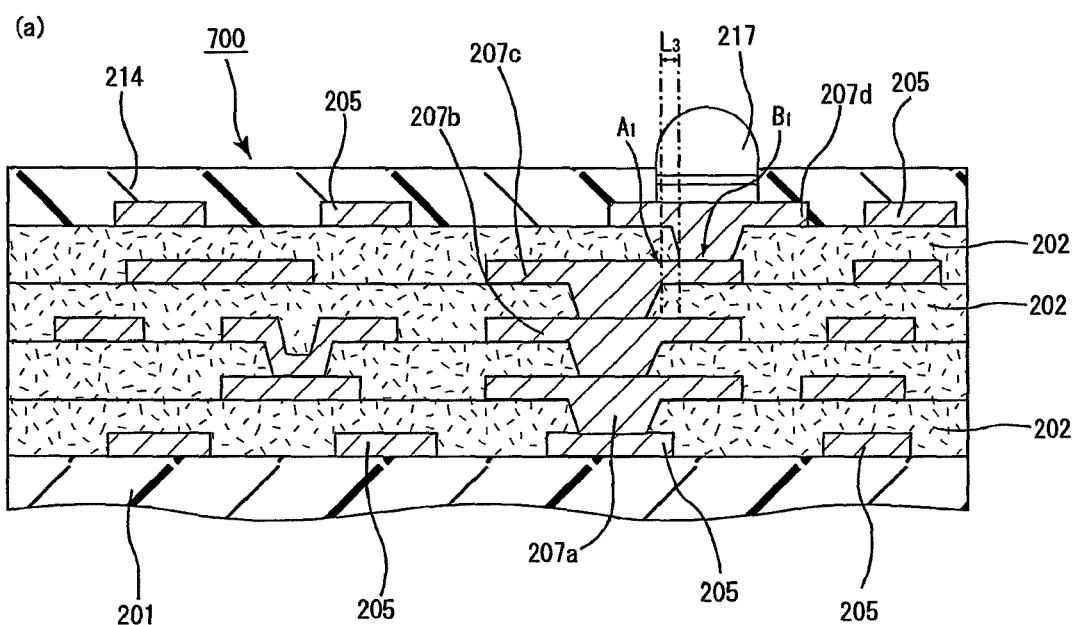
FIG. 32 (a) is a cross-section figure schematically showing an example of a multilayered printed circuit board of the tenth aspect of the present invention and FIG. 32 (b) is a perspective figure schematically showing only a via-hole of the multilayered printed circuit board shown in FIG. 32 (a).
Figure 32:
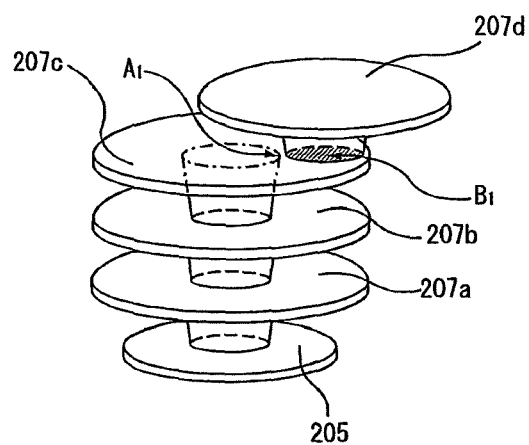
Figure 33:
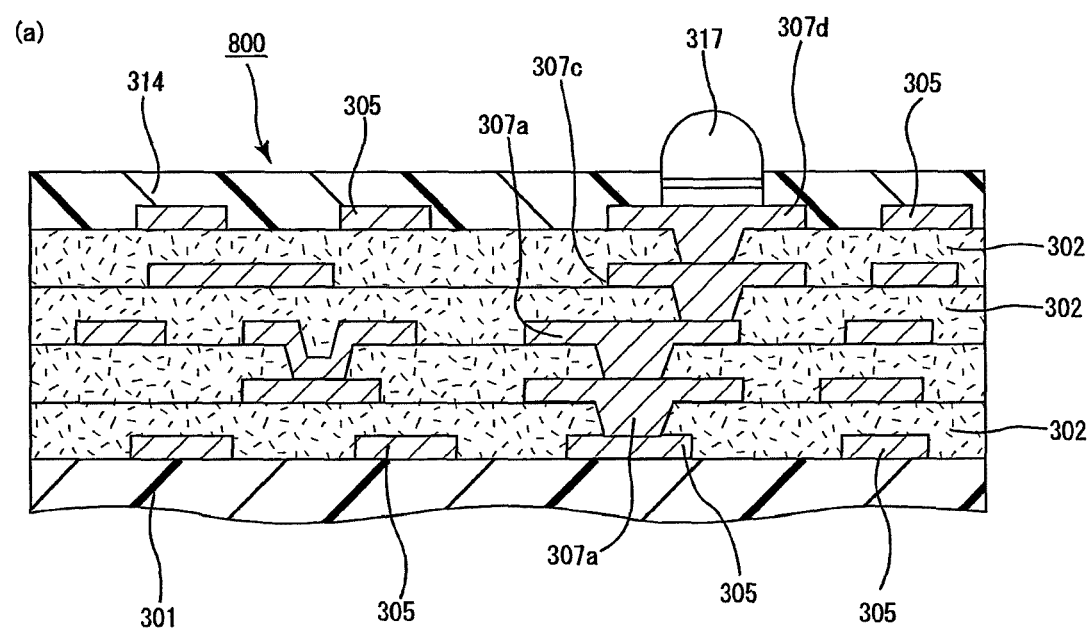
FIG. 33 (a) is a cross-section figure schematically showing another example of a multilayered printed circuit board of the tenth aspect of the present invention and FIG. 33 (b) is a perspective figure schematically showing only a via-hole of the multilayered printed circuit board shown in FIG. 33 (a).
Figure 33:
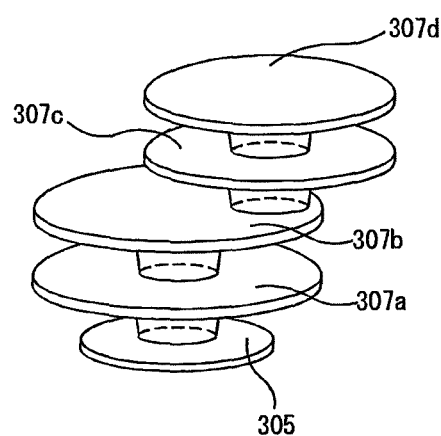

FIG. 32 and FIG. 33 respectively show (a) a partial cross-section figure schematically showing a part of one embodiment of a multilayered printed circuit board of the tenth aspect of the present invention and (b) a perspective figure schematically showing only a via-hole of the multilayered printed circuit board shown in (a).

As shown in FIG. 32, in the multilayered printed circuit board 700, conductor circuits 205 and interlaminar resin insulating layers 202 are successively layered on a substrate 201 and the conductor circuits 205 sandwiching the interlaminar resin insulating layers 202 are respectively connected through the via-holes. Further, in the outermost layer, a solder resist layer 214 having solder bumps 217 is formed.

Further, in the multilayered printed circuit board 700, via-holes 207a to 207d formed by being piled up one another are formed in a manner that the via-hole 207d in the uppermost level (the via-hole in the fourth level) is formed while the center thereof being shifted from that of the via-hole 207c (the via-hole in the third level) in the layer under the former via-hole and the via-holes 207a to 207c in the inner layers (the via-holes of the first to third levels) in different level layers are stacked while their centers being approximately overlapped one another.

In such a manner, since the via-hole in the uppermost level is piled while the center being shifted from that of the via-hole in the layer under the uppermost layer, high stress concentration in a part of piled via-holes can be suppressed.

Further, the via-holes 207 (207a to 207d) have a filled via shape. The via-holes with the filled via shape have flat upper faces and therefore are suitable to be piled on one another.

Further, as shown in FIG. 33, in the multilayered printed circuit board 800 of the present invention, it is allowable that the piled via-holes 307a to 307d are formed in a manner that: the via-hole 307d in the uppermost level (the via-hole in the fourth level) is piled on the via-hole 307c (the via-hole in the third level) in the layer under the uppermost layer while their center being approximately overlapped; the via-hole 307c is piled on the via-hole 307b (the via-hole in the second level) while their centers being shifted from each other; and the via-holes 307a and 307b in the inner layers (the via-holes in the first and the second levels) are piled each other while the centers being approximately overlapped. In the multilayered printed circuit board 800 of such a structure, the above-mentioned effect to suppress the concentration of the stress can be obtained.

Further, in the multilayered printed circuit board of the tenth aspect of the present invention, the shapes of the piled via-holes are not limited to those described above and in the case the via-holes are piled in four levels, the following arrangements are allowable: for example, the centers of the via-holes of the second to fourth levels are approximately overlapped and only the center of the first level is shifted; or the centers of the respective via-holes of the second to fourth levels are shifted from the centers of the via-holes in their under levels. Of course, the number of the levels of the via-holes to be piled is not limited and it may be two or three levels and 5 or more levels.

In the multilayered printed circuit board of the tenth aspect of the present invention, it is desirable that the via-holes are piled while their centers being shifted in a manner that the outer rim (in FIG. 32, shown as $A_1$) of the non land part of the lower level via-hole and the bottom face (in FIG. 32, shown as $B_1$) of the upper level via-hole are not overlapped.

In the case the outer rim of the non land part of the lower level via-hole and the bottom face of the upper level via-hole are overlapped, the stresses generated in the respective via-holes are probable to be concentrated upon a part (for example, the via-hole in the upper level) of the overlapped via-holes, whereas in the case the outer rim of the non land part of the lower level via-hole and the bottom face of the upper level via-hole are not overlapped, the stresses in the respective via-holes are dispersed and hardly concentrated upon some of the piled via-holes and therefore, troubles attributed to the concentration of the stress are hardly caused.

Further, the distance (in FIG. 32, shown as $L_3$) between the outer rim of the non land part of the lower level via-hole and the outer rim of the bottom face of the upper level via-hole is specifically desirable to be 5 to 70 μm, for example, in the case that the diameters of the non land parts of the lower level via-holes are about 40 to 200 μm.

That is because if it is within the above-mentioned range, the stress is hardly concentrated upon a part of the via-holes piled as described above and accordingly the room for option of the design can be assured.

Next, the constituent members of the multilayered printed circuit board of the tenth aspect of the present invention will be described.

In the multilayered printed circuit board of the tenth aspect of the present invention, the conductor circuits and interlaminar resin insulating layers are successively layered on a substrate, the above-mentioned conductor circuits sandwiching the above-mentioned interlaminar resin insulating layers are connected through the via-holes, and further a solder resist layer is formed in the outermost layer.

Examples of the materials for the above-mentioned substrate and the above-mentioned conductor circuits include those similar to the materials for the substrate and the conductor circuits of the multilayered printed circuit board of the seventh aspect of the present invention. Also, in the multilayered printed circuit board of the tenth aspect of the present invention, plated-through holes with the similar structure of those of the multilayered printed circuit board of the seventh aspect of the present invention may be formed to connect the conductor circuits sandwiching the substrate.

Further, in the multilayered printed circuit board of the tenth aspect of the present invention, plated-through holes penetrating the above-mentioned substrate and interlaminar resin insulating layers may be formed. Formation of such plated-through holes makes it possible to electrically connect the conductor circuits sandwiching the substrate and the interlaminar resin insulating layers.

Further, the above-mentioned interlaminar resin insulating layers may include those similar to the interlaminar resin insulating layers of the multilayered printed circuit board of the seventh aspect of the present invention. Here, in the multilayered printed circuit board of the tenth aspect of the present invention, at least the interlaminar resin insulating layer of the outermost layer is desirable to have a coefficient of linear expansion of 100 ppm/° C. or less and further desirably all of the interlaminar resin insulating layers have a coefficient of linear expansion of 100 ppm/° C. or less.

In the case the coefficients of linear expansion of the interlaminar resin insulating layers are low, stresses attributed to the difference of the coefficients of linear expansion among the interlaminar resin insulating layers, the via-holes, the substrate and the conductor circuits are scarcely generated and therefore, separation between the interlaminar resin insulating layers and the via-holes, and cracking in the interlaminar resin insulating layers hardly takes place. Accordingly, the multilayered printed circuit board comprising the interlaminar resin insulating layer with the coefficients of linear expansion within the above-mentioned range is provided with excellent reliability.

The coefficient of linear expansion of the above-mentioned interlaminar resin insulating layer is more desirable to be 30 to 90 ppm/° C. If the coefficient of linear expansion is less than 30 ppm/° C., the rigidity is high and, for example, in the case, the surface is roughened, the irregularity of the roughened surface cannot be maintained, whereas if it is within the above-mentioned range, the cracking resistance is excellent and the roughened surface shape maintaining property is excellent.

Further, a particle and a rubber component are desirable to be added to the above-mentioned interlaminar resin insulating layers.

If the particle is added, shape retaining property of the interlaminar resin insulating layers is improved and if the rubber component is added, owing to the flexibility and the resilient elasticity of the rubber component, even if the stress affects the interlaminar resin insulating layers, the stress can be absorbed or moderated.

The above-mentioned particle is desirable to be at least one kind of inorganic particles, resin particles, and metal particles.

The above-mentioned inorganic particles include, for example, aluminum compounds such as alumina, aluminum hydroxide and the like; calcium compounds such as calcium carbonate, calcium hydroxide and the like; potassium compounds such as potassium carbonate and the like; magnesium compounds such as magnesia, dolomite, basic magnesium carbonate, talc and the like; silicon compounds such as silica, zeolite and the like. They may be used alone or in combination of two or more of them.

The above-mentioned resin particles include, for example, amino resin (melamine resin, urea resin, guanamine resin and the like), epoxy resin, phenol resin, phenoxy resin, polyimide resin, polyphenylene resin, polyolefin resin, fluoro resin, bismaleimide-triazine resin and the like. They may be used alone or in combination of two or more of them.

The above-mentioned resin particles include, for example, gold, silver, copper, tin, zinc, stainless steel, aluminum, nickel, iron, lead and the like. They may be used alone or in combination of two or more of them.

Further, the above-mentioned metal particle may be coated with resin in the surface layer in order to assure the insulating property.

Further, the above-mentioned rubber component includes, for example, acrylonitrile-butadiene rubber, polychloroprene rubber, polyisoprene rubber, acrylic rubber, polysulfide type synthetic rubber, fluoro rubber, urethane rubber, silicone rubber, ABS resin and the like.

Further, polybutadiene rubber; a variety of modified polybutadiene rubber such as epoxy-modified, urethane-modified, (meth)acrylonitrile-modified ones; (meth)acrylonitrile-butadiene rubber having carboxyl group and the like may also be used.

The mixing ratios of the above-mentioned particle and rubber component are not particularly limited, however, regarding the mixing ratio on the basis of the mixing amount after the interlaminar resin insulating layer formation, the particle is desirable to be 1 to 25% by weight and the rubber component is desirable to be 5 to 20% by weight. That is because these ranges are suitable to adjust the thermal expansion coefficients of the substrate and the solder resist layer and the stress owing to the curing shrinkage at the time of the interlaminar resin insulating layer formation can be moderated. The more desirable mixing amounts are 3 to 18% by weight for the particle and 7 to 18% by weight for the rubber component.

The above-mentioned via-holes are made of a material, for example, Cu, Ni, Pd, Co, W and their alloys similarly to the above-mentioned conductor circuits, and are formed by plating and the like. Incidentally, the practical formation method of the via-holes will be described in details later.

In the above-mentioned piled via-holes, at least one via-hole among them is desirable to have a different land diameter from those of others. If the piled via-holes have such a constitution, the via-holes having a large land diameter work as a reinforcing material for the interlaminar resin insulating layers and the mechanical strength of the interlaminar resin insulating layers is improved and the cracking hardly takes place in the interlaminar resin insulating layers in the vicinity of the via-holes.

The shapes of the via-holes of the above-mentioned multilayered printed circuit board are desirable to be a filled via shape. That is because the via-holes with the filled via shape have flat upper faces and therefore are suitable to pile the via-holes on one another.

Incidentally, in the multilayered printed circuit board of the tenth aspect of the present invention, not all of the via-holes in the different level layers are necessarily piled and the via-holes on which no other via-holes are piled may exist.

The above-mentioned solder resist layer may be formed using, for example, a solder-resist composition containing polyphenylene ether resin, polyolefin resin, fluoro resin, thermoplastic elastomer, epoxy resin, polyimide resin and the like.

Further, the solder resist composition other than the above-mentioned ones includes, for example, a paste-like fluid containing thermosetting resin comprising (meth)acrylate of novolak type epoxy resin, an imidazole curing agent, a bifunctional (meth)acrylic acid ester monomer, (meth)acrylic acid ester polymer with a molecular weight of about 500 to 5000, bisphenol type epoxy resin and the like, a photosensitive monomer such as a multivalent acrylic monomer, and a glycol ether type solvent and its viscosity is desirably adjusted to be 1 to 10 Pa·s at 25° C.

The above-mentioned solder resist composition may contain an elastomer and an inorganic filler.

Further, as the solder resist composition, a commercially available solder resist composition may be used.

Next, a method for manufacturing the multilayered printed circuit board of the tenth aspect of the present invention will be described.

The multilayered printed circuit board of the tenth aspect of the present invention can be manufactured by the same method as the manufacturing method of the multilayered printed circuit board of the seventh aspect of the present invention, except that at least one via-hole among the above-mentioned piled via-holes is overlapped while its center being shifted from those of other via-holes and the rest of the via-holes are piled while their center being approximately overlapped one another.

Specifically, it can be manufactured by the same method as the manufacturing method of the multilayered printed circuit board of the seventh aspect of the present invention, except that a via-hole is formed while its center being shifted from that of the via-hole in the lower level in at least one repeating process at the time of formation of the via-holes by repeating the processes (3) to (8) of the manufacturing method of the multilayered printed circuit board of the seventh aspect of the present invention in the process (9) of the manufacturing method of the multilayered printed circuit board of the seventh aspect of the present invention.

As such a method, for example, at the time of formation of an opening for a via-hole, the formation position of an opening can be shifted from the center of the via-hole in the lower level.

In the processes (7), (8) of the manufacturing method of the multilayered printed circuit board of the seventh aspect of the present invention, in the case a plated-through hole penetrating the substrate and the interlaminar resin insulating layer is formed, the via-holes may be formed immediately above the plated-through hole.

Further, in the case via-holes are to be formed immediately above the through hole in the later process, it is desirable to form a cover plating layer.

Further, in the process (7) of the manufacturing method of the multilayered printed circuit board of the seventh aspect of the present invention, the opening for a via-hole may be filled by electroplating to make the shape of the via-hole to be formed in the later process be a filled via shape.

That is because if the via-hole has the filled via shape, the via-holes are easy to be piled thereon.

Next, a multilayered printed circuit board of the eleventh aspect of the present invention will be described.

The multilayered printed circuit board of the eleventh aspect of the present invention is a multilayered printed circuit board comprising: a substrate and, as serially built up thereon, a conductor circuit and an interlaminar resin insulating layer in an alternate fashion and in repetition; and a solder resist layer formed further thereon as an outermost layer, with a connection of the above-mentioned conductor circuits through the above-mentioned interlaminar resin insulating layer being performed by a via-hole, wherein:

via-holes in different level layers among the above-mentioned via-holes are piled one another; and among the above-mentioned piled via-holes, the via-hole in the uppermost level has a concave portion formed thereon.

In the multilayered printed circuit board of the eleventh aspect of the present invention, via-holes in the different levels are piled and among the piled via-holes, the via-hole in the uppermost level has a concave portion on the upper face, thus the via-hole is easy to be deformed as compared with the via-hole with the filled via shape in which the upper face is flat and the inside is completely filled and therefore it is easy to moderate the stress generated owing to the difference of the coefficients of linear expansion between the via-holes and the interlaminar resin insulating layers. Accordingly, the multilayered printed circuit board of the eleventh aspect of the present invention, a high stress is prevented from concentrating upon the via-hole in the uppermost level and cracking owing to the stress concentration hardly takes place in the interlaminar resin insulating layers and therefore the reliability becomes excellent.

Further, since the wiring distance becomes short by piling via-holes in the different level layers, the signal transmission time can be shortened and the room for option of the design of a conductor circuit can be increased and therefore it becomes easy to deal with high density wiring.

Hereinafter, the multilayered printed circuit board of the eleventh aspect of the present invention will be described with the reference to figures.

Figure 46:
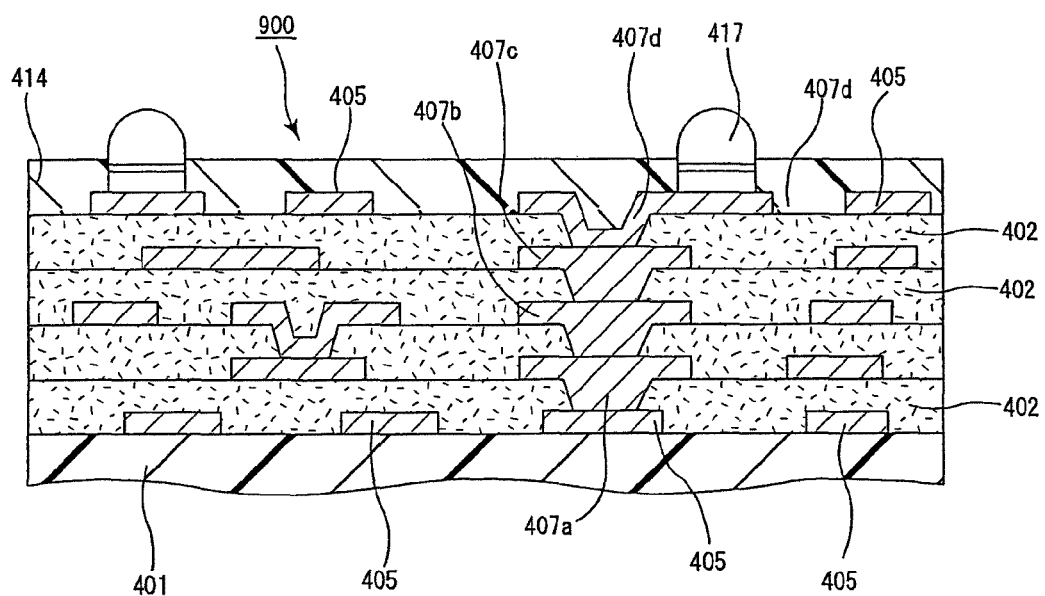
FIG. 46 is a partial cross-section figure schematically showing an example of a multilayered printed circuit board of the eleventh aspect of the present invention.
Figure 47:
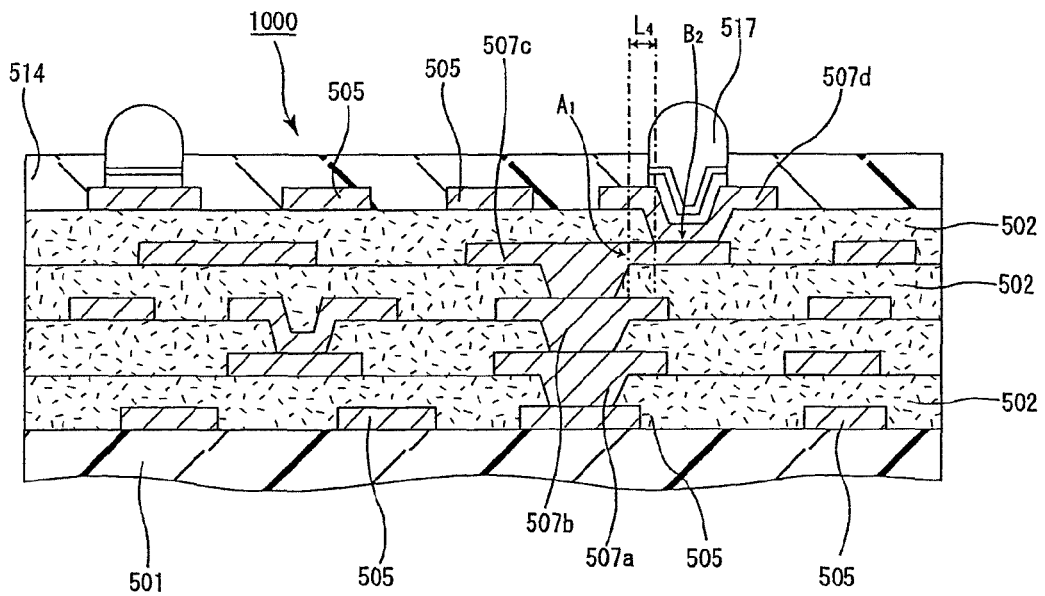
FIG. 47 is a partial cross-section figure schematically showing another example of a multilayered printed circuit board of the eleventh aspect of the present invention.

FIG. 46 and FIG. 47 are respectively a partial cross-section figure schematically showing an example of a multilayered printed circuit board of the eleventh aspect of the present invention.

As shown in FIG. 46, in the multilayered printed circuit board 900, conductor circuits 405 and interlaminar resin insulating layers 402 are successively layered on a substrate 401 and the conductor circuits 405 sandwiching the interlaminar resin insulating layers 402 are connected each other through the via-holes. Further, in the outermost layer, a solder resist layer 414 having solder bumps 417 is formed.

Further, in the multilayered printed circuit board 900, the via-hole 407d in the uppermost layer (the via-hole in the fourth level) among the piled via-holes 407a to 407d is formed in a manner that a concave portion is formed on the upper face.

The via-hole in the uppermost level having such a concave portion is easy to moderate the stress and therefore, a high stress is prevented from concentrating upon the via-hole in the uppermost level. Accordingly, the troubles owing to the above-mentioned concentration, that is, cracking occurrence in the interlaminar resin insulating layers in the vicinity of the via-hole of the uppermost level, or separation or disconnection of the conductor circuits in the vicinity of the interlaminar resin insulating layers owing to the cracking, is hardly caused.

The depth of the concave portion formed on the upper face of the via-hole in the above-mentioned uppermost level is not particularly limited, however desirable to be 5 to 25 µm.

If the above-mentioned depth of the concave portion is less than 5 µm, the effect to moderate the stress cannot be sufficient in some cases and on the other hand, if it exceeds 25 µm, disconnection occurs in the via-hole, or the via-hole and the interlaminar resin insulating layer are separated from each other to result in deterioration of the reliability in some cases.

Further, in the multilayered printed circuit board 900, the via-holes 407a to 407d are piled while their center being approximately overlapped one another.

In the multilayered printed circuit board of the eleventh aspect of the present invention, the via-holes of the respective level layers are desirable to be piled one another while their centers being overlapped, and in such a case, since the wiring distance becomes short, the signal transmission time can be shortened and the room for option of the design of a conductor circuit can be increased and therefore it becomes easy to deal with high density wiring.

Further, as shown in FIG. 47, in the multilayered printed circuit board 1000 of the eleventh aspect of the present invention, the piled via-holes 507a to 507d are formed in a manner that the via-hole 507d in the uppermost level is piled on the via-holes in the layers under the uppermost layer while the center thereof being shifted from those of the via-holes of under layers.

Thus, in the multilayered printed circuit board of the eleventh aspect of the present invention, it is also desirable that at least one via-hole among the piled via-holes is piled while its center being shifted from those of other via-holes and the rest of the via-holes are piled while their centers being approximately overlapped one another.

In such a manner, in the case at least one via-hole is piled while the center thereof being shifted, the stresses generated owing to the difference of the coefficients of liner expansion between the via-holes and the interlaminar resin insulating layers are dispersed and high stresses are hardly concentrated upon a part of the piled via-holes and therefore, cracking in the interlaminar resin insulating layer attributed to the concentration of the stress are hardly caused.

Further, in the case at least one via-hole is piled while the center thereof being shifted from those of others, the constitution is not limited to such a case as the multilayered printed circuit board 1000 wherein: only the via-hole in the uppermost level is piled on the via-holes in the lower levels while its center being shifted from those of the via-holes in the lower levels; and other via-holes are piled one another while their centers being overlapped approximately one another, and the following cases are also allowable: in the case the via-holes are piled in four levels, for example, the via-hole in the uppermost level and the via-hole in the third level are piled on each other while their centers being approximately overlapped on each other and also, they are piled on the via-hole in the lower level (the via-hole in the second level) while the centers thereof being shifted from that of the via-hole of the second level, and further the via-holes of the first and second levels are piled on each other while their centers being approximately overlapped each other. Further, the following case is also allowable: the via-holes of the second to the fourth levels are piled one another while their centers being approximately overlapped one another and they are piled on the via-hole of the first level while their centers being shifted from that of the via-hole of the first level: or the respective via-holes of the second to the fourth via-holes are piled while their centers being shifted from those of the via-holes in the respective lower levels.

Further, the number of the levels of the via-holes to be piled is not limited and it may be two or three levels and 5 or more levels.

Incidentally, in the multilayered printed circuit boards of the tenth and eleventh aspect of the present invention, the center of the via-hole means the center of the non land portion of the via-hole in the planar view of the via-hole.

Further, in the case that the via-holes are piled while the centers thereof are approximately overlapped in the multilayered printed circuit boards of the tenth and eleventh aspect of the present invention includes not only the case the centers of the via-holes in the upper and lower levels are piled while being just overlapped but also the case the centers of the via-holes in the upper and lower levels are piled while the distance between their centers being within 5 µm or shorter.

Accordingly, in the multilayered printed circuit boards of the tenth and eleventh aspect of the present invention, the constitution that the via-holes are piled while the centers thereof being shifted means the case the distance between their centers of the piled via-holes exceeds 5 µm.

Further, in this specification, the constitution that the via-holes are piled one another means the state that regarding the piled via-holes in the upper and lower levels, the upper face (regardless of the land part or the non land part) of the via-hole in the lower level and the bottom face of the via-hole in the upper level are electrically connected.

In the multilayered printed circuit board of the eleventh aspect of the present invention, the via-holes piled while their center being shifted are desirable to be piled in a manner that the outer rim (in FIG. 47, shown as $A_2$) of the non land part of the via-hole in the lower level and the bottom face (in FIG. 47, shown as $B_2$) of the via-hole in the upper level are not overlapped.

In the case the outer rim of the non land part of the via-hole in the lower level and the bottom face of the via-hole in the upper level are stacked so as to be overlapped, the stresses generated in the respective via-holes are probable to be concentrated upon a part (for example the via-hole in the upper level) of the piled via-holes, whereas in the case the outer rim of the non land part of the via-hole in the lower level and the bottom face of the via-hole in the upper level are not overlapped, the stresses are dispersed in the respective via-holes and therefore the stresses hardly concentrate upon some of the piled via-holes and troubles attributed to the stress concentration are hardly caused.

Further, the distance (in FIG. 47, shown as $L_4$) between the outer rim of the non land part of the via-hole in the lower level and the outer rim of the bottom face of the via-hole in the upper level is specifically desirable to be 5 to 70 µm in the case the diameter of the non land part of the via-hole is about 40 to 200 µm.

That is because, within the range, as described above, the stresses hardly concentrate upon a part of the piled via-holes and the room for option of the design can be assured.

Next, the constituent members composing the multilayered printed circuit board of the eleventh aspect of the present invention will be described.

In the multilayered printed circuit board of the eleventh aspect of the present invention, conductor circuits and interlaminar resin insulating layers are successively layered on a substrate, the above-mentioned conductor circuits sandwiching the respective interlaminar resin insulating layers are connected through the via-holes, and a solder resist layer is formed in the outermost layer.

The materials for the above-mentioned substrate and the above-mentioned conductor circuits, include the similar materials exemplified for the materials of the substrate and the conductor circuits of the multilayered printed circuit board of the seventh aspect of the present invention. Also, in the multilayered printed circuit board of the eleventh aspect of the present invention, plated-through holes with the similar constitution to that of the multilayered printed circuit board of the seventh aspect of the present invention may be formed in order to connect the conductor circuits sandwiching the substrate.

Further, in the multilayered printed circuit board of the eleventh aspect of the present invention, plated-through holes penetrating the above-mentioned substrate and interlaminar resin insulating layers may be formed. Formation of such plated-through holes makes it possible to electrically connect the conductor circuits sandwiching the substrate and interlaminar resin insulating layers.

Further, as the above-mentioned interlaminar resin insulating layers, those similar to the interlaminar resin insulating layers of the multilayered printed circuit board of the seventh aspect of the present invention can be exemplified. In the multilayered printed circuit board of the eleventh aspect of the present invention, it is desirable that at least the interlaminar resin insulating layer of the outermost layer has a coefficient of linear expansion not higher than 100 ppm/° C. and it is more desirable that all of the interlaminar resin insulating layers have a coefficient of linear expansion not higher than 100 ppm/° C.

In the case the coefficient of linear expansion of the interlaminar resin insulating layers is low as just described, stresses attributed to the difference of the coefficients of linear expansion are hardly generated among the interlaminar resin insulating layers, the via-holes, the substrate, and the conductor circuits, and therefore separation between the interlaminar resin insulating layers and the via-holes and cracking in the interlaminar resin insulating layers hardly take place. Accordingly, the multilayered printed circuit board comprising the interlaminar resin insulating layers having a coefficient of linear expansion within the above-mentioned range is provided with further excellent reliability.

Further, the above-mentioned coefficient of linear expansion is more desirable to be 30 to 90 ppm/° C. If the coefficient of linear expansion is less than 30 ppm/° C., the rigidity is too high and, for example, in the case the roughened surface is formed thereon, the irregularity of the roughened surface cannot be kept, whereas if within the above-mentioned range, the cracking resistance is excellent and the shape retention property of the roughened surface is also excellent.

Further, it is desirable to add a particle and a rubber component to the above-mentioned interlaminar resin insulating layers.

In the case the particle is added, the shape retaining property of the interlaminar resin insulating layers is further improved and in the case rubber component is added, owing to the flexibility and the resilient elasticity of the rubber component, even if the stress affects the interlaminar resin insulating layers, the stress can be absorbed or moderated.

As the above-mentioned particle, at least one kind of inorganic particles, resin particles, and metal particles is desirable.

As the above-mentioned inorganic particles, resin particles, and metal particles, for example, those exemplified for the multilayered printed circuit board of the tenth aspect of the present invention can be employed.

Further, similarly to the above-mentioned conductor circuits, the above-mentioned via-holes are made of a material such as Cu, Ni, P, Pd, Co, W and their alloys and formed by plating and the like.

Further, the concave portion is formed on the upper face of the via-hole in the uppermost level among the overlapped via-holes, however the shape of other via-holes is not particularly limited and may be a shape where a concave portion is formed on the upper face or a filled via shape.

Here, if the shapes of the via-holes other than the via-hole in the uppermost level are the filled via shape, since the upper faces are flat, they are suitable to pile the via-holes thereon.

Incidentally, in the multilayered printed circuit board of the eleventh aspect of the present invention, not all of the different via-holes in all of the level layers are made to have the stack-via structure, however some via-holes on which no other via-holes are piled may exist.

Incidentally, the respective formation methods of the via-hole having the concave portion on the upper face and the via-hole with a filled via shape will be described later.

In the above-mentioned piled via-holes, at least one of the land diameters among the above mentioned piled via-holes is desirable to be different from the land diameters of other piled via-holes. That is because if the piled via-holes have such a constitution, the via-hole with a large land diameter functions as a reinforcing member of interlaminar resin insulating layers and accordingly, the mechanical strength of the interlaminar resin insulating layers is increased and cracks are hardly generated in the interlaminar resin insulating layers in the vicinity of the via-holes.

Incidentally, in the multilayered printed circuit board of the eleventh aspect of the present invention, not all of the via-holes in the different level layers are piled and via-holes on which no other via-holes are piled may exist.

Next, a manufacturing method of the multilayered printed circuit board of the eleventh aspect of the present invention will be described.

The multilayered printed circuit board of the eleventh aspect of the present invention can be manufactured by a method similar to the manufacturing method of the multilayered printed circuit board of the seventh aspect of the present invention, except that the concave portion is formed on the upper face of the via-hole of the uppermost level.

Specifically, for example, the manufacture can be carried out by the same method as the manufacturing method of the multilayered printed circuit board of the seventh aspect of the present invention, except that in the process (7) of the manufacturing method of the multilayered printed circuit board of the seventh aspect of the present invention, the composition of the electroplating solution is properly selected to form an electroplating layer having the concave portion on the upper face, or except that in the process (9) of the manufacturing method of the multilayered printed circuit board of the seventh aspect of the present invention, at the time of the final repeating process in the case the processes (3) to (8), that is, at the time of formation of the electroplating layer (the above-mentioned process (7)) in the process of formation of the interlaminar resin insulating layer of the outermost layer and the via-hole of the uppermost level, the electroplating layer having the concave portion on the upper face is formed.

For example, in the case an electrolytic copper plating layer is formed using an electrolytic copper plating solution, the formation of the above-mentioned electroplating layer may be carried out using electrolytic copper plating solutions containing sulfuric acid, copper sulfate, and additives.

In the case an electrolytic copper plating solution containing additives of such as a specified leveling agent and a brightener is used among the above-described electrolytic copper plating solutions, an electrolytic copper plating layer with a flat upper face can be formed. That is, use of the electrolytic copper plating solution containing 50 to 300 g/l of copper sulfate, 30 to 200 g/l of sulfuric acid, 25 to 90 mg/l chlorine ion, and 1 to 1000 mg/l of additives comprising at least a leveling agent and a brightener makes it possible to form the electrolytic copper plating layer with a flat upper face.

The electrolytic copper plating solution with such a composition is capable of filling the openings for via-holes completely regardless of: the opening diameter of the via-holes; the material and the thickness of the resin insulating layers; and the existence of the roughened surface of the interlaminar resin insulating layers.

Additionally, since the above-mentioned electrolytic copper plating solution contains copper ion in a high concentration, copper ion can sufficiently be supplied to the openings for via-holes and the openings for via-holes can be plated at a plating speed of 40 to 100 μm/hour to result in speed up of the electroplating process.

Further, the above-mentioned electrolytic copper plating solution is desirable to contain 100 to 250 g/l of copper sulfate, 50 to 150 g/l of sulfuric acid, 30 to 70 mg/l of chlorine ion, and 1 to 600 mg/l of additives comprising at least a leveling agent and a brightener.

Further, in the above-mentioned electroplating solution, the above-mentioned additives may comprise at least a leveling agent and a brightener and may include other components.

The above-mentioned leveling agent includes, for example, polyethylene, gelatin, and their derivatives and the like.

Also, the above-mentioned brightener includes, for example, sulfur oxide and its relevant compounds, hydrogen sulfide and its relevant compounds, and other sulfur compounds and the like.

The mixing amount of the above-mentioned leveling agent is desirably 1 to 1000 mg/l, the mixing amount of the above-mentioned brightener is desirably 0.1 to 100 mg/l and the mixing ratio of both is desirably (2:1) to (10:1).

In the case the electroplating layer with a flat upper face is formed by using such a electrolytic copper plating solution, the shapes of the via-holes to be formed through the later processes become the filled via shape.

Incidentally, in the case an electroplating layer having the concave portion on the upper face is formed, for example, a conventionally known electrolytic copper plating solution, that is an electrolytic copper plating solution containing 120 to 250 g/l of sulfuric acid, 30 to 100 g/l of copper sulfate, and a variety of additives and the like can be employed.

Further, in this process, after the electroplating layer having the concave portion on the upper face is once formed, the concave portion may be filled with a conductor containing paste to form the electroplating layer with the flat upper face, or after the electroplating layer having the concave portion on the upper face is once formed, the concave portion may be filled with a resin filler and the like and further a cover plating layer is formed thereon to form the electroplating layer with the flat upper face.

Further, in the processes (7), (8) of the manufacturing method of the multilayered printed circuit board of the seventh aspect of the present invention, if a plated-through hole penetrating the substrate and the interlaminar resin insulating layers is formed, the via-holes may be formed immediately above the plated-through hole.

BEST MODE FOR CARRYING OUT THE INVENTION

Hereinafter, the present invention further will be described in details.

Example 1

A. Production of a Resin Film for an Interlaminar Resin Insulating Layer 30 parts by weight of Bisphenol A type epoxy resin (epoxy equivalent 469, Epikote 1001 made by Yuka Shell Epoxy Co.), 40 parts by weight of cresol novolak type epoxy resin (epoxy equivalent 215, Epichlon N-673 made by Dainippon Ink and Chemicals, Inc.), and 30 parts by weight of phenol novolak resin containing triazine structure (phenolic hydroxy equivalent 120, Phenolite KA-7052 made by Dainippon Ink and Chemicals, Inc.) were dissolved while being heated in 20 parts by weight of ethyl diglycol acetate and 20 parts by weight of solvent naphtha under stirring condition, followed by the addition of 15 parts by weight of epoxy-terminated polybutadiene rubber (made by Nagase Chemicals Ltd.; Denalex R-45EPT) and 1.5 parts by weight of a pulverized product of 2-phenyl-4,5-bis(hydroxymethyl)imidazole, 2 parts by weight of a finely pulverized silica, and 0.5 parts by weight of a silicon type defoaming agent to prepare an epoxy resin composition.

After the obtained epoxy resin composition was applied to a 38 μm-thick PET film so as to adjust the thickness after drying to be 50 μm by a roll coater, the resulting film was dried at 80 to 120° C. for 10 minutes to produce a resin film for an interlaminar resin insulating layer.

B. Preparation of a Resin Filler

A container was loaded with 100 parts by weight of bisphenol F type epoxy monomer (YL 983 U made by Yuka Shell Epoxy Co.; molecular weight: 310), 72 parts by weight of a $SiO_2$ spherical particle coated with a silane coupling agent and having an average particle diameter of 1.6 μm and a diameter of the maximum particle of 15 μm or less (made by Admatechs Co., Ltd.: CRS 1101-CE), and 1.5 parts by weight of a leveling agent (Perenol S4 made by San Nopco Ltd.) and they were stirred and mixed to prepare a resin filler with a viscosity of 30 to 80 Pa·s at 25±1° C.

Incidentally, as a curing agent, 6.5 parts by weight of an imidazole curing agent (made by Shikoku Chemicals Corp.: 2E4MZ-CN) was employed.

C. Manufacturing Method of a Printed Circuit Board (1) A copper-clad laminate plate composed of a substrate 1 which is made of a 0.8 mm-thick glass epoxy resin or BT (bismaleimide triazine) resin with a 18 μm-thick copper foil 8 laminated on both sides of the substrate 1 was used as a starting material (reference to FIG. 6 (*a*)). First, the copper-clad laminate plate was drilled to bore holes and then, electroless plating treatment was carried out and pattern etching was carried out to form under-level conductor circuits 4 on both faces of the substrate 1 and a plated-through hole 9 (reference to FIG. 6 (*b*)).

(2) The substrate in which the plated-through hole 9 and the under-level conductor circuits 4 were formed was washed with water and dried, then subjected to blackening treatment using an aqueous solution containing NaOH (10 g/l), $NaClO_2$ (40 g/l), $Na_3PO_4$ (6 g/l) as a blackening bath (oxidizing bath) and reducing treatment using an aqueous solution containing NaOH (10 g/l) and $NaBH_4$ (6 g/l) as a reducing bath to form roughened surface (not illustrated) on the entire surface of the under-level conductor circuits 4 including the plated-through hole 9.

(3) Next, after the resin filler described in the description B was prepared, the layer 10' of the resin filler was formed inside the plated-through hole 9 and the non conductor circuit formed area of the substrate 1 and the peripheral portion of the under-level conductor circuits 4 by the following method within 24 hours after the preparation.

That is, first, the resin filler was pushed in the plated-through hole using a squeegee and then dried under the conditions of 100° C. for 20 minutes. Next, a mask having an opening corresponding to the non conductor circuit formed area was put on the substrate and the layer 10' of the resin filler was formed in the non conductor circuit formed area, which was a concave portion, using a squeegee and then dried under the conditions of 100° C. for 20 minutes (reference to FIG. 6 (*c*)).

(4) The one side of the substrate for which the above-mentioned treatment (3) was just finished was ground by a belt sander grinder using #600 belt grinding-paper (made by Sankyo Chemical Engineering Co.) so as not to leave the resin filler on the surface of the under-level conductor circuits 4 and the land surface of the plated-through hole 9 and then, buffing was carried out to remove the scratches by the above-mentioned belt sander grinding. A series of such grinding steps were carried out for the other face of the substrate in the same manner.

Next, heating treatment at 100° C. for 1 hour and at 150° C. for 1 hour was carried out to form a resin filler layer 10.

Figure 6:
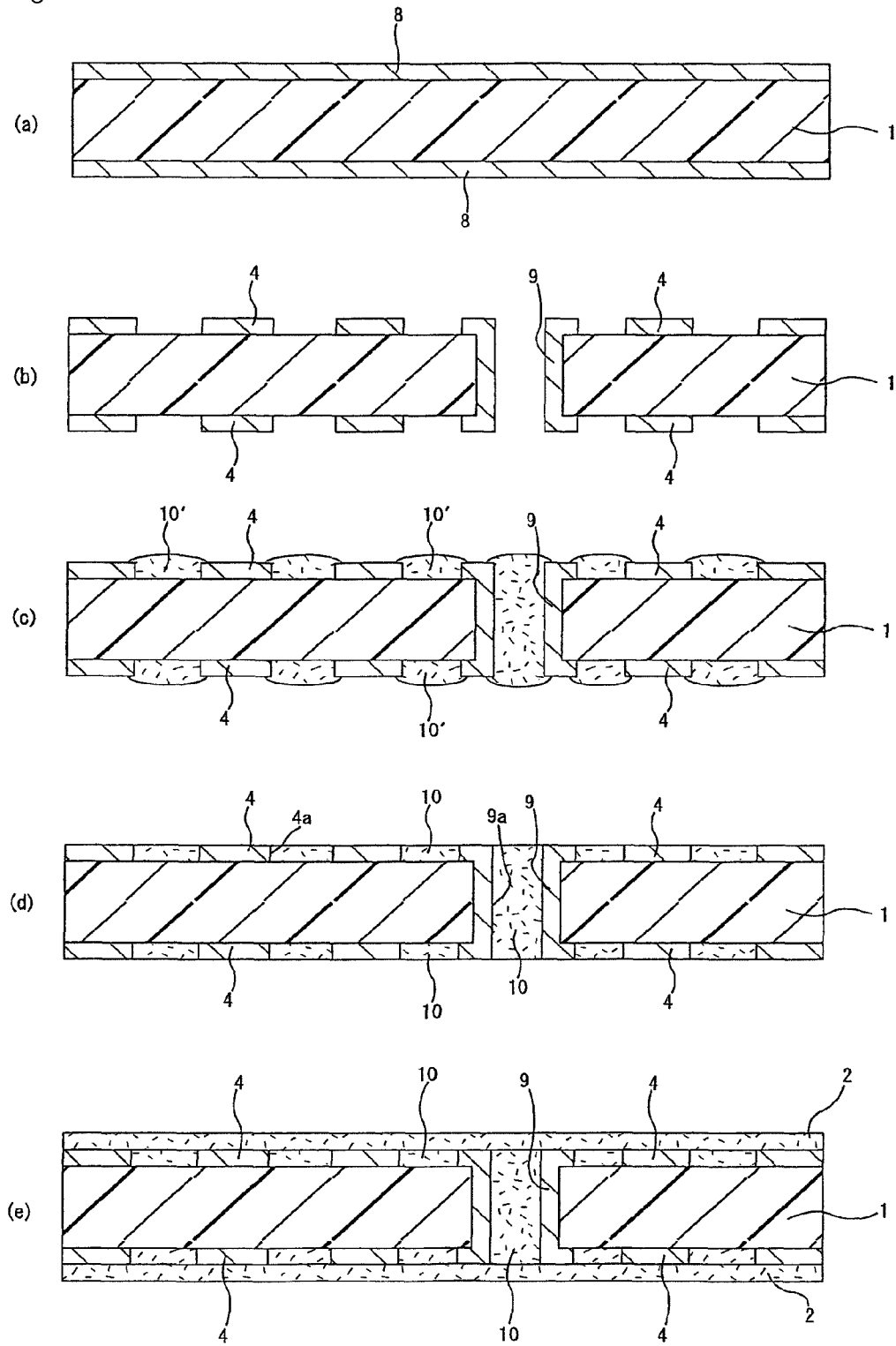
FIGS. 6 (a) to (e) are cross-section figures schematically showing a part of manufacturing processes of a multilayered printed circuit board of the present invention.

In such a manner, the surface layer part of the resin filler layer 10 formed in the plated-through hole 9 and the non conductor circuit formed area and the surface of the under-level conductor circuits 4 were made flat and the resin filler layer 10 and the side faces 4a of the under-level conductor circuits 4 were firmly stuck to each other through the roughened surface and also the inner wall faces 9a of the plated-through hole 9 and the resin filler layer 10 were firmly stuck to each other through the roughened surface to obtain an insulating substrate (reference to FIG. 6 (*d*)). That is, by this process, the surface of the resin filler layer 10 and the surface of the under-level conductor circuits 4 were in a single plane face.

(5) After the above-mentioned substrate was washed with water and degreased with an acid, soft etching was carried out and then, an etching solution was sprayed on both faces of the substrate to etch the surface of the under-level conductor circuits 4 and the land surface of the plated-through hole 9 to form the roughened surface (not illustrated) on the entire surface of the under-level conductor circuits 4. Incidentally, as the etching solution, an etching solution (made by Meck Co.; Meck etch bond) containing 10 parts by weight of an imidazole copper(II) complex and 7 parts by weight of glycolic acid, and 5 parts by weight of potassium chloride was used.

(6) Next, a resin film for the interlaminar resin insulating layer with a slightly larger size than the substrate produced by the above-mentioned process A was put on both faces of the substrate, temporarily pressure-bonded under the conditions of 0.4 MPa pressure, 80° C. temperature, and 10 second pressure bonding period and cut and after that, laminated by the following method using a vacuum laminator apparatus and successively subjected to thermosetting treatment to form interlaminar resin insulating layers 2 (reference to FIG. 6 (*e*)). That is, the resin film for the interlaminar resin insulating layer was laminated on the substrate by primary pressure bonding under the conditions of 67 Pa degree of vacuum, 0.4 MPa pressure, 80° C. temperature, and 60 second pressure bonding period and further subjected to thermosetting at 170° C. for 30 minutes.

(7) Next, opening parts for via-holes 6 with 80 μm diameter were formed in the interlaminar resin insulating layers 2 by radiating $CO_2$ gas laser of 10.4 μm wavelength through a 1.2 mm-thick mask having through holes in conditions of the beam diameter of 4.0 mm, the top hat mode, the pulse width of 8.0 μs, 11.0 mm-diameter of the through holes of the mask, and one shot. (reference to FIG. 7 (*a*)).

(8) Further, the substrate in which the openings 6 for via-holes were formed was immersed in a solution containing 60 g/l of permanganic acid at 80° C. for 10 minutes to dissolve and remove the epoxy resin particle existing on the surface of the interlaminar resin insulating layers 2 and consequently, to form the roughened surface (not illustrated) on the interlaminar resin insulating layers 2 including the inner walls of the openings 6 for via-holes.

(9) Next, the substrate subjected to the above-mentioned treatment was immersed in a neutralization solution (made by Shiplay Co., Inc.) and washed with water.

Further, a palladium catalyst (made by Atotech Co.) was supplied to the surface of the substrate subjected to the surface roughening treatment (the roughening depth 3 μm), so that catalyst core was adhered to the surface of the interlaminar resin insulating layers 2 and the inner wall faces of the openings 6 for via-holes.

Figure 7:
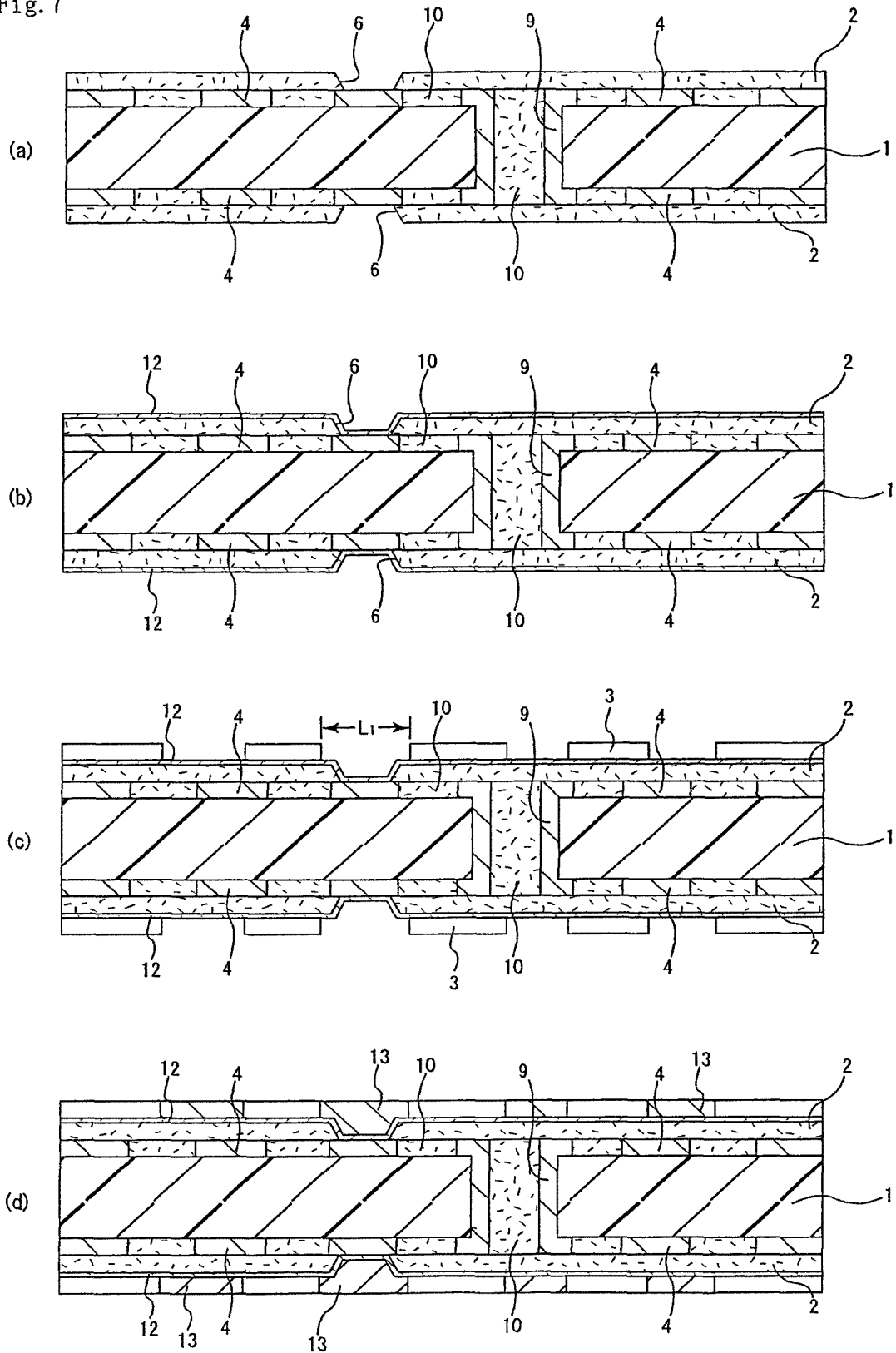
FIGS. 7 (a) to (d) are cross-section figures schematically showing a part of manufacturing processes of a multilayered printed circuit board of the present invention.

(10) Next, the substrate was immersed in an electroless copper plating aqueous solution having the following composition to form thin film conductor layers 12 with a thickness of 0.6 to 3.0 μm on the entire roughened surface (reference to FIG. 7 (*b*)).

[Electroless Plating Solution]

| | |
|---|---|
| $NiSO_4$ | 0.003 mol/l |
| tartaric acid | 0.200 mol/l |
| copper sulfate | 0.030 mol/l |
| HCHO | 0.050 mol/l |
| NaOH | 0.100 mol/l |
| α,α'-bipyridyl | 40 mg/l |
| polyethylene glycol (PEG) | 0.10 g/l |

[Electroless Plating Condition]

at 35° C. liquid temperature for 40 minutes

(11) Next, a commercialized photosensitive dry film was stuck to the thin film conductor layers 12 and a mask was put thereon and exposure with a dose of 100 $mJ/cm^2$ and development with an aqueous 0.8% sodium carbonate solution were carried out to form a plating resist 3. Incidentally, the shape of the non plating resist formed areas for forming via-holes was circular in the planar view and the diameter $L_1$ was 150 μm (reference to FIG. 7 (*c*)).

(12) Next, the substrate was washed with water at 50° C. to be degreased and washed with water at 25° C. and further washed with sulfuric acid and after that the substrate was subjected to electrolytic copper plating under the following conditions to form electrolytic copper plating layers 13 (reference to FIG. 7 (*d*)).

[Electroplating Solution]

| | |
|---|---|
| $CuSO_4 \cdot 5H_2O$ | 210 g/l |
| sulfuric acid | 150 g/l |
| $Cl^-$ | 40 mg/l |
| polyethylene glycol | 300 mg/l |
| bisdisulfide | 100 mg/l |

[Electroplating Condition]

| | |
|---|---|
| current density | 1.0 $A/dm^2$ |
| time | 60 minutes |
| temperature | 25° C. |

(13) Successively, the plating resist 3 was separated and removed in an aqueous 40 g/l NaOH solution at 50° C. After that, heating treatment at 150° C. for 1 hour was carried out to the substrate, and using an etching solution containing an aqueous sulfuric acid-hydrogen peroxide solution, the thin film conductor layers which were under the plating resist were removed to form independent conductor circuits and via-holes with a filled via shape (reference to FIG. 8 (*a*)). Incidentally, the land diameter of the formed via-holes was 35 μm.

(14) The above-mentioned processes (5) to (11) were repeated to form interlaminar resin insulating layers 2 and thin film conductor layers 12 in further upper layers and after that, the plating resist 3 was formed on the thin film conductor layers 12. The shape of the non plating resist formed area for forming via-holes was circular in a planar view and the diameter $L_2$ thereof was 250 μm (reference to FIG. 8 (*b*)).

Figure 8:
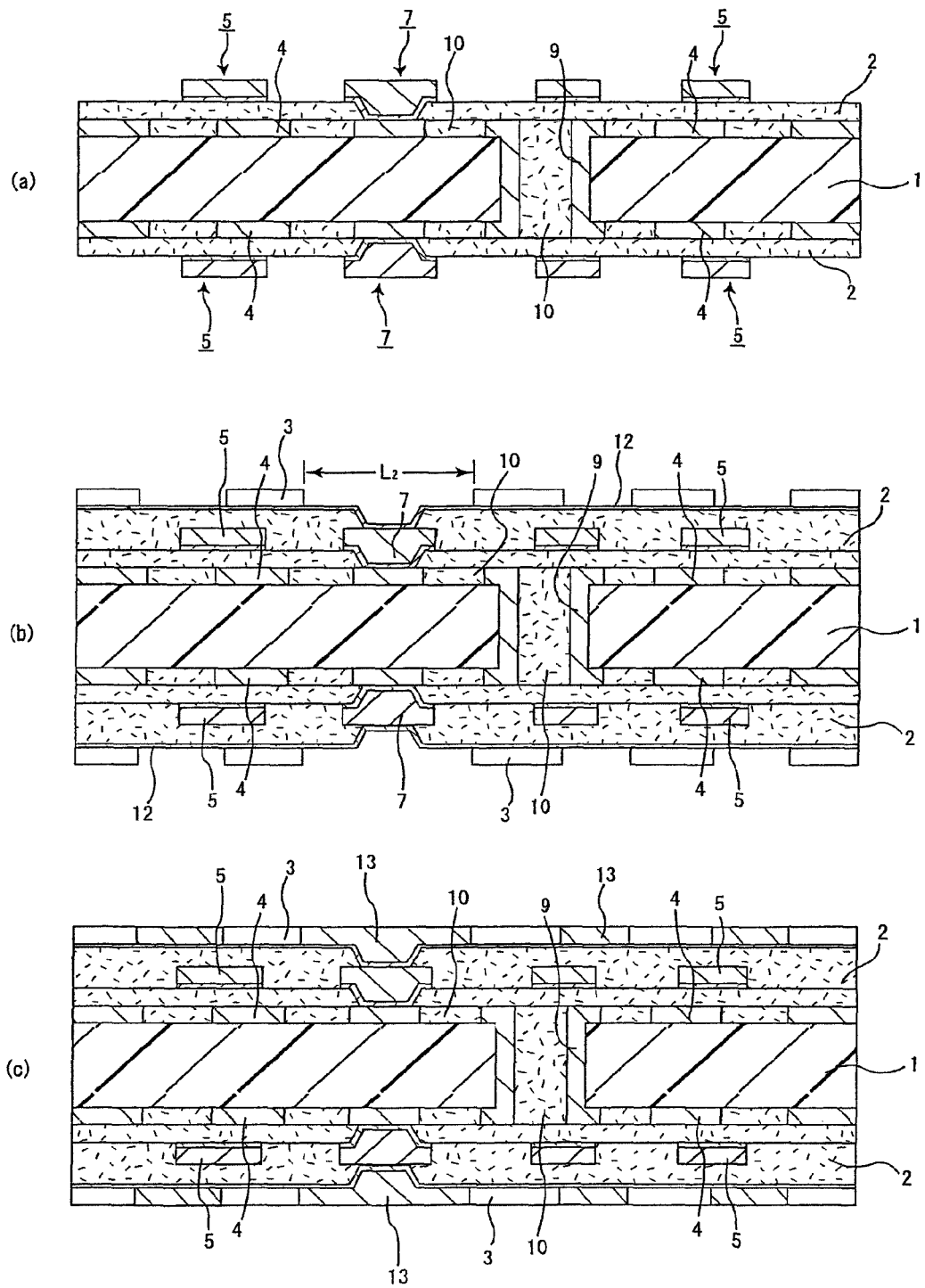
FIGS. 8 (a) to (c) are cross-section figures schematically showing a part of manufacturing processes of a multilayered printed circuit board of the present invention.
Figure 9:
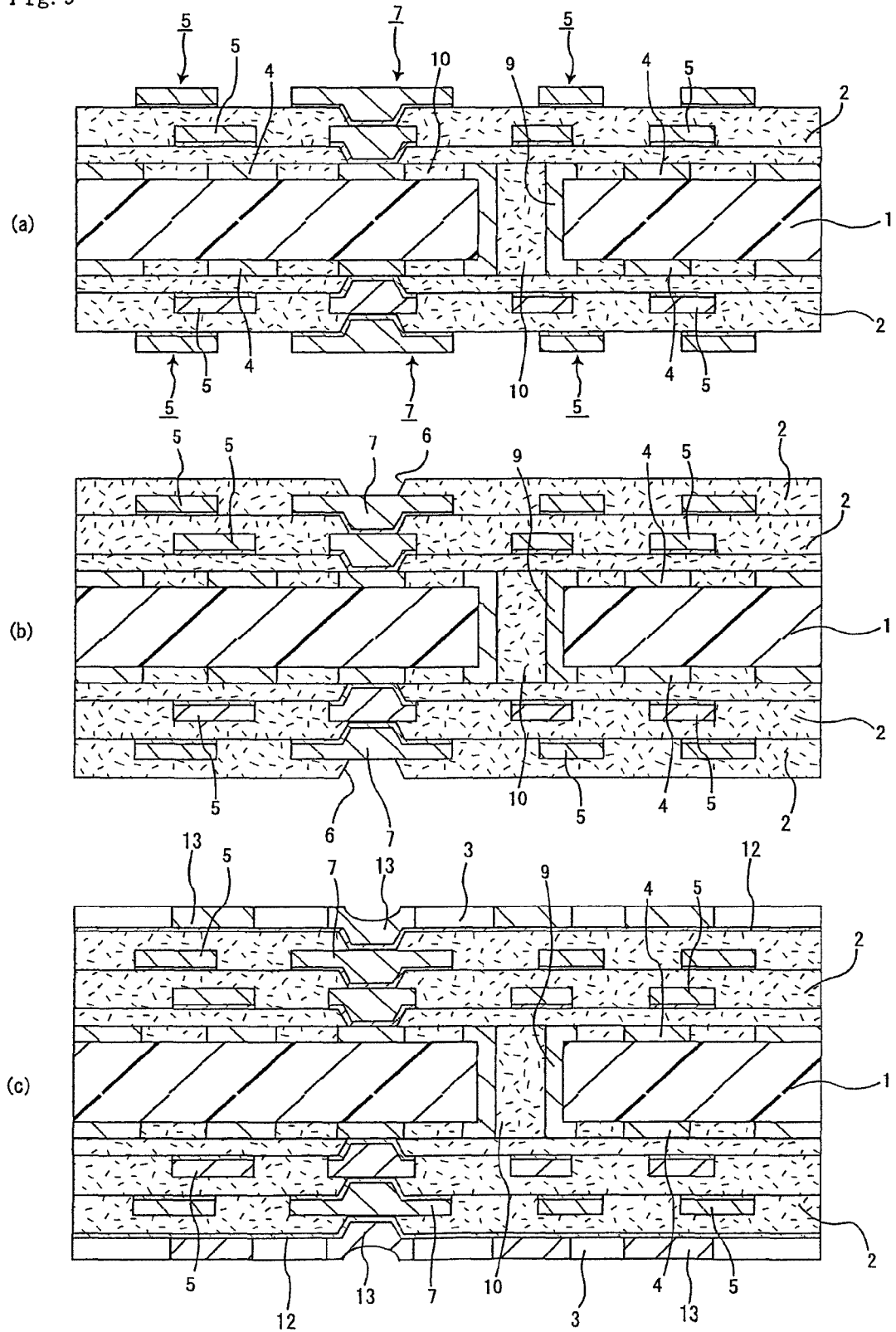
FIGS. 9 (a) to (c) are cross-section figures schematically showing a part of manufacturing processes of a multilayered printed circuit board of the present invention.

(15) Next, in the same manner as the above-mentioned processes (12), (13), the electrolytic copper plating treatment and the parting and removal of the plating resist and etching of thin film conductor layers were carried out to form independent conductor circuits and via-holes with the filled via shape (reference to FIG. 8 (*c*) to FIG. 9 (*a*)). The land diameter of the via-holes formed in this case was 85 μm.

(16) Next, the above-mentioned processes (5) to (11) were repeated to form interlaminar resin insulating layers 2 and thin film conductor layers 12 in further upper layers and after that, the plating resist 3 was formed on the thin film conductor layers 12. The shape of the non plating resist formed area for forming via-holes was circular in a planar view and the diameter thereof was 150 μm. Successively, the substrate was washed with water at 50° C. to be degreased and washed with water at 25° C. and further washed with sulfuric acid and after that, the substrate was subjected to electrolytic plating under the following conditions to form electrolytic copper plating layers 13 on the area where the plating resist 3 is not formed. (reference to FIGS. 9 (*b*) to (*c*)).

[Electroplating Solution]

| | |
|---|---|
| sulfuric acid | 2.24 mol/l |
| copper sulfate | 0.26 mol/l |
| additive | 19.5 ml/l |
| (made by Atotech Japan CO., Cupracid GL) | |

[Electroplating Condition]

| | |
|---|---|
| current density | 1 $A/dm^2$ |
| time | 65 minutes |
| temperature | 22 ± 2° C. |

Figure 10:
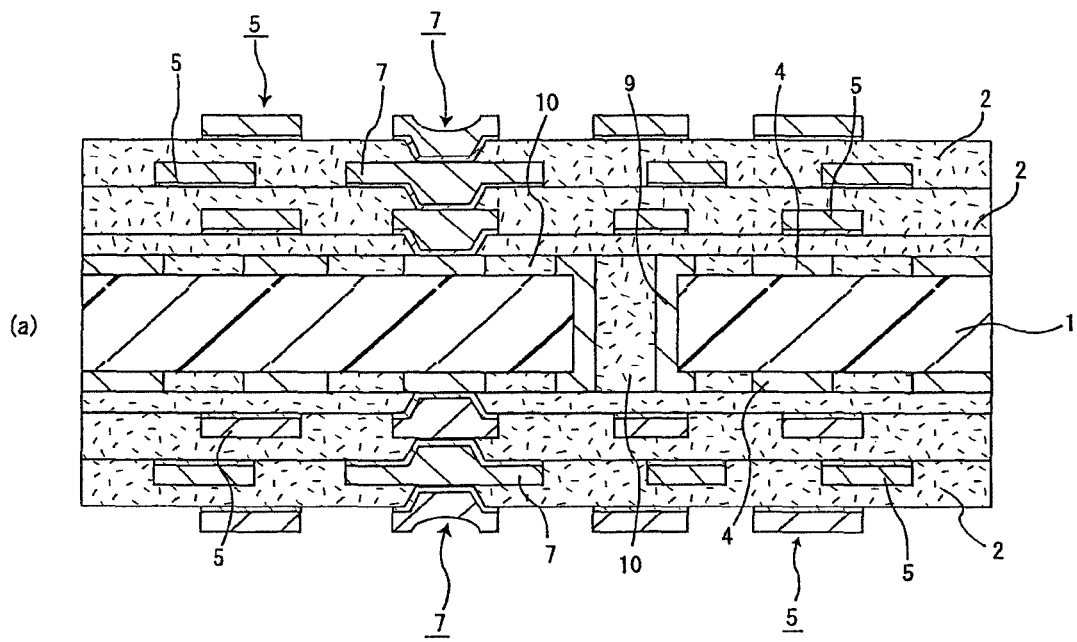
FIGS. 10 (a), (b) are cross-section figures schematically showing a part of manufacturing processes of a multilayered printed circuit board of the present invention.
Figure 10:
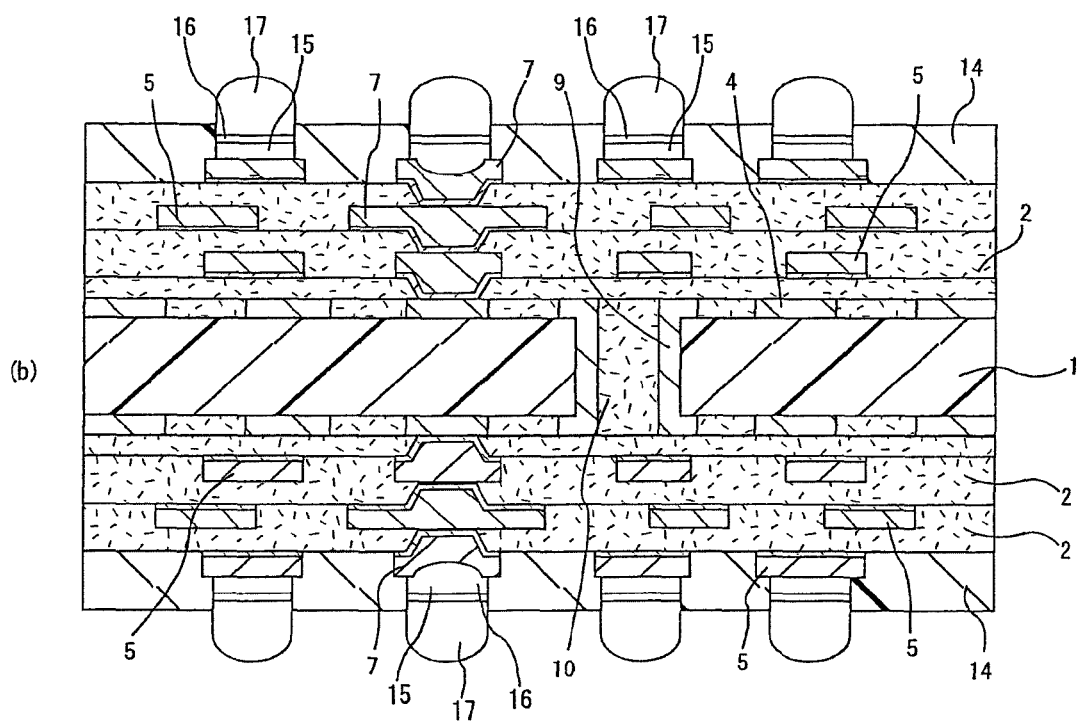

(17) Next, in the same manner as the above-mentioned process (13), the parting and removal of the plating resist 3 and etching of thin film conductor layers were carried out to form independent conductor circuits and via-holes. Incidentally, the via-holes formed in this process had a land diameter 35 µm and a shape having concave portion on the upper face. Additionally, the distance between a via-hole formed in this process and the neighboring conductor circuit was 50 µm (reference to FIG. 10 (a)).

(18) Next, a container was loaded with: 46.67 parts by weight of an oligomer provided with a photosensitivity (molecular weight: 4000) obtained by acrylating 50% of an epoxy group of cresol novolak type epoxy resin (made by Nippon Kayaku Co., Ltd.), dissolved in diethylene glycol dimethyl ether (DMDG) to be 60% by weight concentration; 15.0 parts by weight of bisphenol A type epoxy resin (trade name: Epikote 1001 made by Yuka Shell Epoxy Co.) dissolved in methyl ethyl ketone to be 80% by weight concentration; 1.6 parts by weight of imidazole curing agent (trade name: 2E4MZ-CN made by Shikoku Chemicals Corp.); 3.0 parts by weight of a polyvalent acrylic monomer, which was a photosensitive monomer (trade name: R604, made by Nippon Kayaku Co., Ltd.); 1.5 parts by weight of a similarly polyvalent acrylic monomer (trade name: DPE 6 A made by Kyoei Chemical Co., Ltd.); and 0.71 parts by weight of the dispersion type defoaming agent (made by San Nopco Ltd., S-65), and they were stirred and mixed to prepare the mixed composition. Then, to the mixed composition, 2.0 parts by weight of benzophenone (made by Kanto Chemical Co., Inc.) as a photopolymerization initiator and 0.2 parts by weight of Michler's ketone (made by Kanto Chemical Co., Inc.) as a photosensitizer were added to obtain a solder resist composition adjusted to have a viscosity of 2.0 Pa·s at 25° C.

The viscosity measurement was carried out using a rotor No. 4 in the case of 60/min$^{-1}$ (rpm) and a rotor No. 3 in the case of 6/min$^{-1}$ (rpm) using a B-type viscometer (made by Tokyo Instruments Co. Ltd., DVL-B type).

(19) Next, the above-mentioned solder resist composition was applied in 20 µm thickness to both faces of the multilayered printed circuit board and dried under conditions of 70° C. for 20 minutes and 70° C. for 30 minutes and then, a 5 mm-thick photomask drawing a pattern corresponding to the solder pad was closely stuck to the solder resist layers, followed by the exposure to UV rays of 1000 mJ/cm$^2$ dose and development with the DMTG solution to form the openings with 80 µm diameter.

Further, the solder resist layers were cured by carrying out heating treatment under the respective conditions of 80° C. for 1 hour, 100° C. for 1 hour, 120° C. for 1 hour, and 150° C. for 3 hours to form 20 µm-thick solder resist layers 14 having the openings for the solder bumps.

(20) Next, the substrate on which the solder resist layers 14 was formed was immersed in an etching solution containing sodium persulfate as a main component for 1 minute to form roughened surfaces (not illustrated) with an average roughness (Ra) of 1 µm or less on the surface of the conductor circuit.

Further, the resulting substrate was immersed in an electroless nickel plating solution having pH 4.5 and containing nickel chloride ($2.3 \times 10^{-1}$ mol/l), sodium hypophosphite ($2.8 \times 10^{-1}$ mol/l), and sodium citrate ($1.6 \times 10^{-1}$ mol/l) for 20 minutes to form a 5 µm-thick nickel plating layer 15 in the openings. Further, the obtained substrate was immersed in an electroless gold plating solution containing potassium cyanoaurate ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) under the conditions of 80° C. for 7.5 minutes to form a 0.03 µm-thick gold plating layer 16 on the nickel plating layer 15, thus obtaining solder pads.

(21) After that, a mask was put on the solder resist layer 14 and a solder paste was printed in the openings for the solder bumps using a piston type pressure injection type printer. After that, the solder paste was subjected to reflow at 250° C. and further to flux washing to obtain a multilayered printed circuit board comprising the solder bumps (reference to FIG. 10 (b)).

Example 2

A multilayered printed circuit board was manufactured in the same manner as Example 1, except that after the processes (1) to (4) of Example 1, a cover plating layer was formed on the plated-through hole (including the resin filler layer) by the following method and openings for the via-holes were formed on the cover plating layer in the process (7).

[Formation of a Cover Plating Layer]

A resin filler layer was formed in the plated-through holes and the non conductor circuit formed area to make the surface of each conductor circuit (including the land parts of the plated-through holes) and the surface of each resin filler layer in the same plane, a palladium catalyst (made by Atotech Japan CO.) was supplied to the surface of the substrate, so that catalyst core adhered to the conductor circuit surface and the surface of the resin filler layer.

Next, the substrate was immersed in an electroless copper plating aqueous solution with a composition same as the electroless plating solution employed in the process (10) of Example 1 to form a thin film conductor layer with a thickness of 0.6 to 3.0 µm on the entire surface.

Next, using a commercialized photosensitive dry film, the plating resist was formed on portions other than on the plated-through holes.

The resulting substrate was washed with water at 50° C. to be degreased and washed with water at 25° C. and further washed with sulfuric acid, and after that, the substrate was subjected to electrolytic copper plating under the following conditions to form electrolytic copper plating layers on the plated-through holes.

[Electroplating Solution]

| | |
|---|---|
| sulfuric acid | 2.24 mol/l |
| copper sulfate | 0.26 mol/l |
| additive | 19.5 ml/l |
| (made by Atotech Japan CO., Cupracid GL) | |

[Electroplating Condition]

| | |
|---|---|
| current density | 1 A/dm$^2$ |
| time | 65 minutes |
| temperature | 22 + 2° C. |

Further, the plating resist was separated and removed in an aqueous 40 g/l NaOH solution at 50° C. and after that, using an etching solution containing an aqueous sulfuric acid-hydrogen peroxide solution, the thin film conductor layers which were under the plating resist were removed to form the cover plating layer.

Example 3

A multilayered printed circuit board was manufactured in the same manner as Example 1, except that interlaminar resin insulating layers having openings for the via-holes were formed by the following method, in the processes (6), (7) of Example 1.

That is, after the processes (1) to (5) of Example 1, a photosensitive resin composition B (viscosity: 1.5 Pa·s) was produced and applied by a roll coater within 24 hours after the production and left in horizontal state for 20 minutes and dried (pre-baked) at 60° C. for 30 minutes. After that, a photosensitive resin composition A (viscosity: 7 Pa·s) was produced and applied by a roll coater within 24 hours after the production and left in horizontal state for 20 minutes and dried (pre-baked) at 60° C. for 30 minutes to form a resin layer comprising two layers in half-cured state.

Next, a photomask film on which black circles with a diameter of 80 μm were printed was closely attached to both faces of the substrate bearing the resin layer in half-cured state and after exposure with a dose of 500 mJ/cm$^2$ was carried out using an ultrahigh pressure mercury lamp, spray development was carried out using DMDG solution. After that, the resulting substrate was further subjected to exposure with a dose of 3000 mJ/cm$^2$ using an ultrahigh pressure mercury lamp and heating treatment at 100° C. for 1 hour, at 120° C. for 1 hour, and at 150° C. for 3 hours to form interlaminar resin insulating layers having openings for the via-holes with a diameter of 80 μm, which is excellent in size precision corresponding to those of the photomask film.

The photosensitive resin compositions A and B were produced by the following methods.

[Production of Photosensitive Resin Composition A]

(i) A container was loaded with 35 parts by weight of a resin solution obtained by dissolving a 25% acrylated compound of cresol novolak type epoxy resin (made by Nippon Kayaku Co., Ltd.; molecular weight: 2500) in diethylene glycol dimethyl ether (DMDG) to be 80% by weight concentration, 3.15 parts by weight of a photosensitive monomer (made by Toagosei Chemical Industry Co., Ltd., Aronix M 315), 0.5 parts by weight of a defoaming agent (made by San Nopco Ltd., S-65), and 3.6 parts by weight of N-methylpyrrolidone (NMP) and then, they were stirred and mixed to prepare a mixed composition.

(ii) Another container was loaded with 12 parts by weight of polyether sulfone (PES), 7.2 parts by weight of an epoxy resin particle (Polymerpol, made by Sanyo Chemical Industries, Ltd.) with an average particle size of 1.0 μm and 3.09 parts by weight of the epoxy resin particle with an average particle size of 0.5 μm and they were stirred and mixed. Then, 30 parts by weight of NMP was further added to the obtained solution, and they were stirred and mixed by a bead mill to prepare another mixed composition.

(iii) Further another container was loaded with 2 parts by weight of an imidazole curing agent (made by Shikoku Chemicals Corp.: 2E4MZ-CN), 2 parts by weight of a photopolymerization initiator (made by Chiba Specialty Chemicals Corp., Irgacure I-907), 0.2 parts by weight of a photosensitizer (DETX-S made by Nippon Kayaku Co., Ltd.) and 1.5 parts by weight of NMP and they were stirred and mixed to prepare a mixed composition.

The mixed compositions produced as (i), (ii), and (iii) were mixed to obtain a photosensitive resin composition.

[Production of Photosensitive Resin Composition B]

(i) A container was loaded with 35 parts by weight of a resin solution obtained by dissolving a 25% acrylated compound of cresol novolak type epoxy resin (made by Nippon Kayaku Co., Ltd.; molecular weight: 2500) in diethylene glycol dimethyl ether (DMDG) to be 80% by weight concentration, 4 parts by weight of a photosensitive monomer (made by Toagosei Chemical Industry Co., Ltd., Aronix M 315), 0.5 parts by weight of a defoaming agent (made by San Nopco Ltd., S-65), and 3.6 parts by weight of N-methylpyrrolidone (NMP) and they were stirred and mixed to prepare a mixed composition.

(ii) Another container was loaded with 12 parts by weight of polyether sulfone (PES) and 14.49 parts by weight of an epoxy resin particle (Polymerpol, made by Sanyo Chemical Industries, Ltd.) with an average particle size of 0.5 μm and they were stirred and mixed. Then, 30 parts by weight of NMP was further added to the obtained solution, and they were stirred and mixed by a bead mill to prepare another mixed composition.

(iii) Further another container was loaded with 2 parts by weight of an imidazole curing agent (made by Shikoku Chemicals Corp.: 2E4MZ-CN), 2 parts by weight of a photopolymerization initiator (made by Chiba Specialty Chemicals Corp., Irgacure I-907), 0.2 parts by weight of a photosensitizer (DETX-S made by Nippon Kayaku Co., Ltd.) and 1.5 parts by weight of NMP and they were stirred and mixed to prepare a mixed composition.

The mixed compositions produced as (i), (ii), and (iii) were mixed to obtain a photosensitive resin composition.

Example 4

A. Production of a Resin Film for an Interlaminar Resin Insulating Layer and Preparation of a Resin Filler Production of a resin film for an interlaminar resin insulating layer and production of a resin filler were carried out in the same manner as Example 1.

B. Manufacture of Multilayered Printed Circuit Board (1) A copper-clad laminate plate comprising a substrate of a 0.8 mm-thick glass epoxy resin or a BT resin and a 18 μm-copper foil 28 laminated on both faces of the insulating substrate 21 was used as a starting material (reference to FIG. 11 (*a*)). At first, the copper-clad laminate plate was etched in underlevel conductor layer circuit patterns to form underlevel conductor circuits 24 on both faces of the substrate (reference to FIG. 11 (*b*)).

(2) The substrate 21 on which the under-level conductor circuits 24 were formed was washed with water and dried and then subjected to blackening treatment using an aqueous solution containing NaOH (10 g/l), NaClO$_2$ (40 g/l), Na$_3$PO$_4$ (6 g/l) as a blackening bath (oxidizing bath) and reducing treatment using an aqueous solution containing NaOH (10 g/l) and NaBH$_4$ (6 g/l) as a reducing bath to form roughened surface (not illustrated) on the entire surface of the under-level conductor circuits 24.

Figure 11:
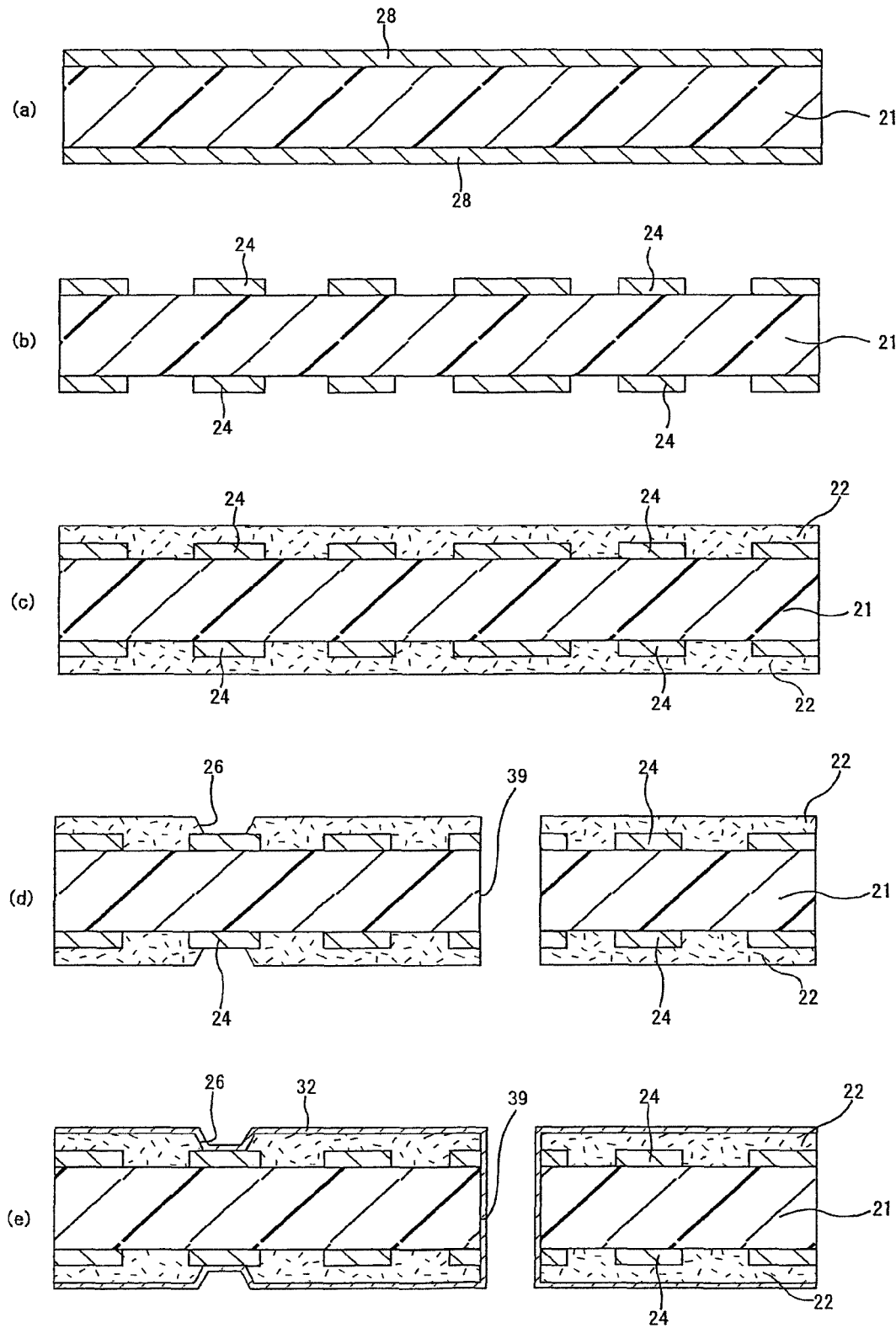
FIGS. 11 (a) to (e) are cross-section figures schematically showing a part of manufacturing processes of a multilayered printed circuit board of the present invention.

(3) Next, the resin film for interlaminar resin insulating layers produced in the above-mentioned A was laminated by vacuum pressure lamination at 0.5 MPa while the temperature being increased from 50 to 150° C. to form interlaminar resin insulating layers 22 (reference to FIG. 11 (*c*)).

Further, the substrate 21 on which the interlaminar resin insulating layers 22 were formed was subjected to drill process to form the through hole 39 with a diameter of 300 μm.

(4) Next, a 1.2 mm-thick mask having through holes was put on the interlaminar resin insulating layers 22 and the interlaminar resin insulating layers 22 were treated by CO$_2$ gas laser with wavelength of 10.4 μm under the conditions of 4.0 mm beam diameter, a top hat mode, 8.0μ second pulse width, 1.0 mm diameter of the through holes of the mask, and one shot to form openings parts 26 of via-holes with a diameter of 80 μm (reference to FIG. 11 (*d*)).

(5) Further, the substrate on which the openings parts 26 of via-holes were formed was immersed in a solution containing 60 g/l of permanganic acid at 80° C. for 10 minutes to carry out desmear treatment for the wall face of the through holes 39 and to dissolve and remove the epoxy resin particles existing on the surface of the interlaminar resin insulating layers 21 to form roughened surface (not illustrated) including the inner walls of the openings parts 26 of via-holes.

(6) Next, the substrate subjected to the above-mentioned treatment was immersed in a neutralization solution (made by Shiplay Co., Inc.) and washed with water.

Further, a palladium catalyst was supplied to the surface of the substrate subjected to the surface roughening treatment (the roughening depth 3 μm), so that catalyst core adhered to the surface of the interlaminar resin insulating layers 22 (including the inner wall faces of the openings parts 26 of via-holes) and the wall faces of the through holes 39 (not illustrated). That is, the above-mentioned substrate was immersed in a catalyst solution containing palladium chloride ($PdCl_2$) and stannous chloride ($SnCl_2$) to deposit palladium metal and supply the catalyst.

(7) Next, the substrate was immersed in an electroless copper plating aqueous solution at 34° C. for 40 minutes to form thin film conductor layers 32 with a thickness of 0.6 to 3.0 μm on the surface of the interlaminar resin insulating layers 22 (including the inner wall faces of the openings 26 for the via-holes) and the wall faces of the through holes 39 (reference to FIG. 11 (*e*)). Incidentally as the electroless copper plating solution, the same aqueous solution as the electroless copper plating solution employed in the process (10) of Example 1 was employed.

Figure 12:
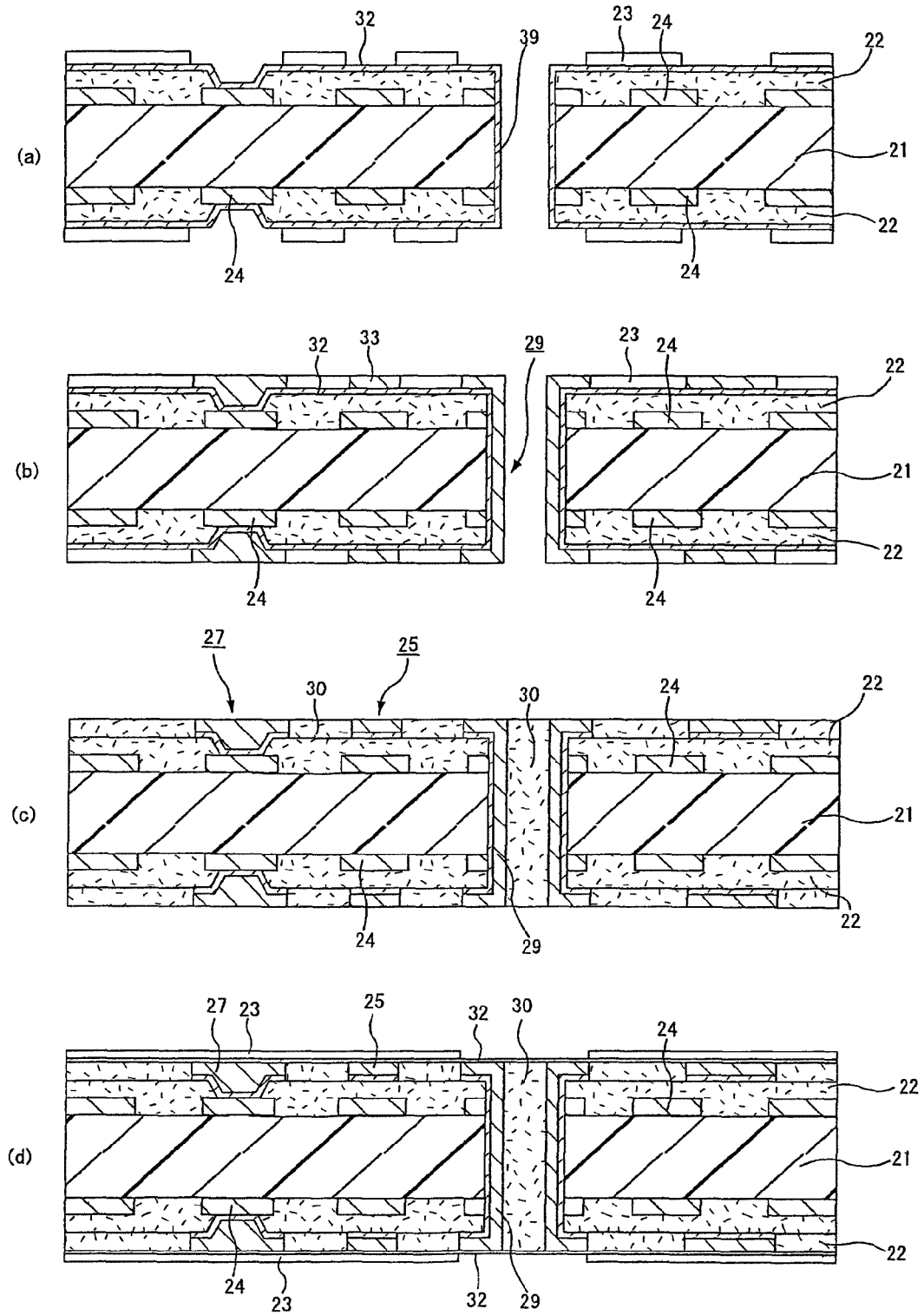
FIGS. 12 (a) to (d) are cross-section figures schematically showing a part of manufacturing processes of a multilayered printed circuit board of the present invention.

(8) Next, a commercialized photosensitive dry film was stuck to the substrate bearing the thin film conductor layers 32 and a mask was put thereon and exposure with a dose of 100 $mJ/cm^2$ and development with an aqueous 0.8% sodium carbonate solution were carried out to form the plating resist 23 (reference to FIG. 12 (*a*)).

(9) Next, the substrate was washed with water at 50° C. to be degreased and washed with water at 25° C. and further washed with sulfuric acid, and after that, the substrate was subjected to electrolytic plating under the same conditions as those of the process (12) of Example 1 to form electrolytic copper plating films 33 in the non plating resist 23 formed area (reference to FIG. 12 (*b*)).

(10) Successively, the plating resist 23 was separated and removed by 5% KOH and after that, using an etching solution containing sulfuric acid and hydrogen peroxide, the electroless plating films which were under the plating resist 23 were etched to form a plated-through hole 29 and conductor circuits 25 (including the via-holes 27).

(11) Next, the substrate 30 in which the plated-through hole 29 was formed was immersed in an etching solution to roughen the surface (not illustrated) of the plated-through hole 29 and conductor circuits 25 (including the via-holes 27). Incidentally, as the etching solution, Meck etch bond made by Meck Co. was used.

(12) Next, after the resin filler described in the description A was prepared, the layer of the resin filler was formed inside the plated-through hole 29 and the non conductor circuit formed area and the peripheral portion of the conductor circuits 25 on the interlaminar resin insulating layers 22 by the following method within 24 hours after the preparation.

That is, at first, the resin filler was pushed in the plated-through holes using a squeegee and then dried under the conditions of 100° C. for 20 minutes. Next, using a mask having an opening corresponding to the non conductor circuit formed area and a squeegee, the layer of the resin filler was formed in the non conductor circuit formed area, which was a concave portion, and then dried under the conditions of 100° C. for 20 minutes.

Successively, in the same manner as the process (4) of Example 1, the surface layer part of the plated-through hole 29 and the resin filler layers 30 formed in the non conductor circuit formed area and the surface of the conductor circuits 25 were made flat to make the surface of each resin filler layer 30 and each conductor circuit 25 in the same plane (reference to FIG. 12 (*c*)).

(13) Next, a palladium catalyst (not illustrated) was supplied to the surface of the interlaminar resin insulating layers 22 and the exposed faces of the resin filler layers 30 by the same treatment as the above-mentioned (6). Next, the electroless plating treatment was carried out in the same conditions as those described in (7) to form thin film conductor layers 32 on the exposed faces of the resin filler layers 30 and the upper faces of the conductor circuits 25.

(14) Next, in the same manner as the above-mentioned process (8), the plating resist 23 was formed on the thin film conductor layers 32 (reference to FIG. 12 (*d*)). Successively, the substrate was washed with water at 50° C. to be degreased and washed with water at 25° C. and further washed with sulfuric acid and after that the substrate was subjected to electrolytic plating under the following conditions to form electrolytic copper plating films 33 in the non plating resist 23 formed area (reference to FIG. 13 (*a*)).

[Electroplating Solution]

| sulfuric acid | 2.24 mol/l |
|---|---|
| copper sulfate | 0.26 mol/l |
| additive | 19.5 ml/l |
| (made by Atotech Japan CO., Cupracid GL) | |

[Electroplating Condition]

| current density | 1 $A/dm^2$ |
|---|---|
| time | 65 minutes |
| temperature | 22 + 2° C. |

Figure 13:
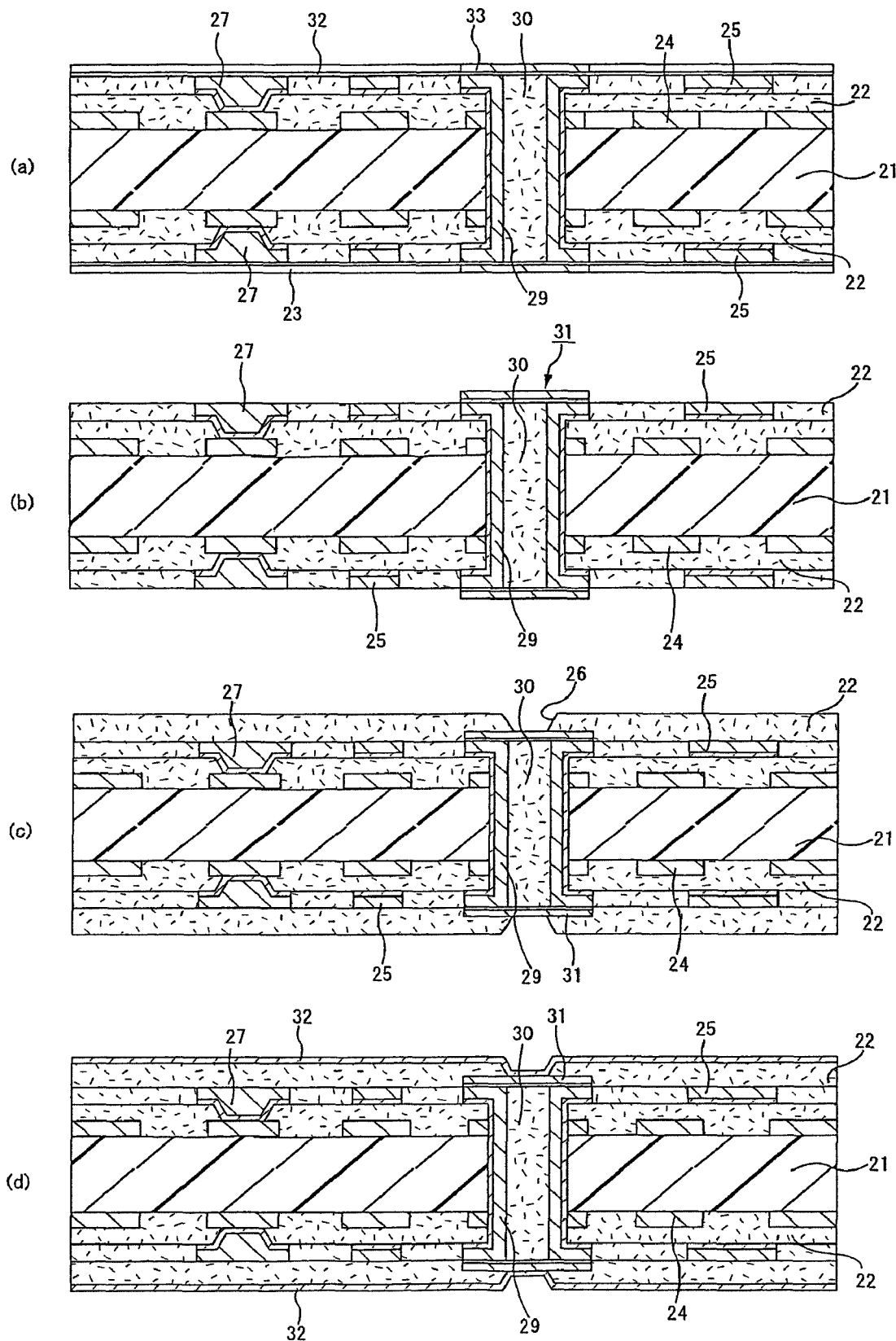
FIGS. 13 (a) to (d) are cross-section figures schematically showing a part of manufacturing processes of a multilayered printed circuit board of the present invention.
Figure 14:
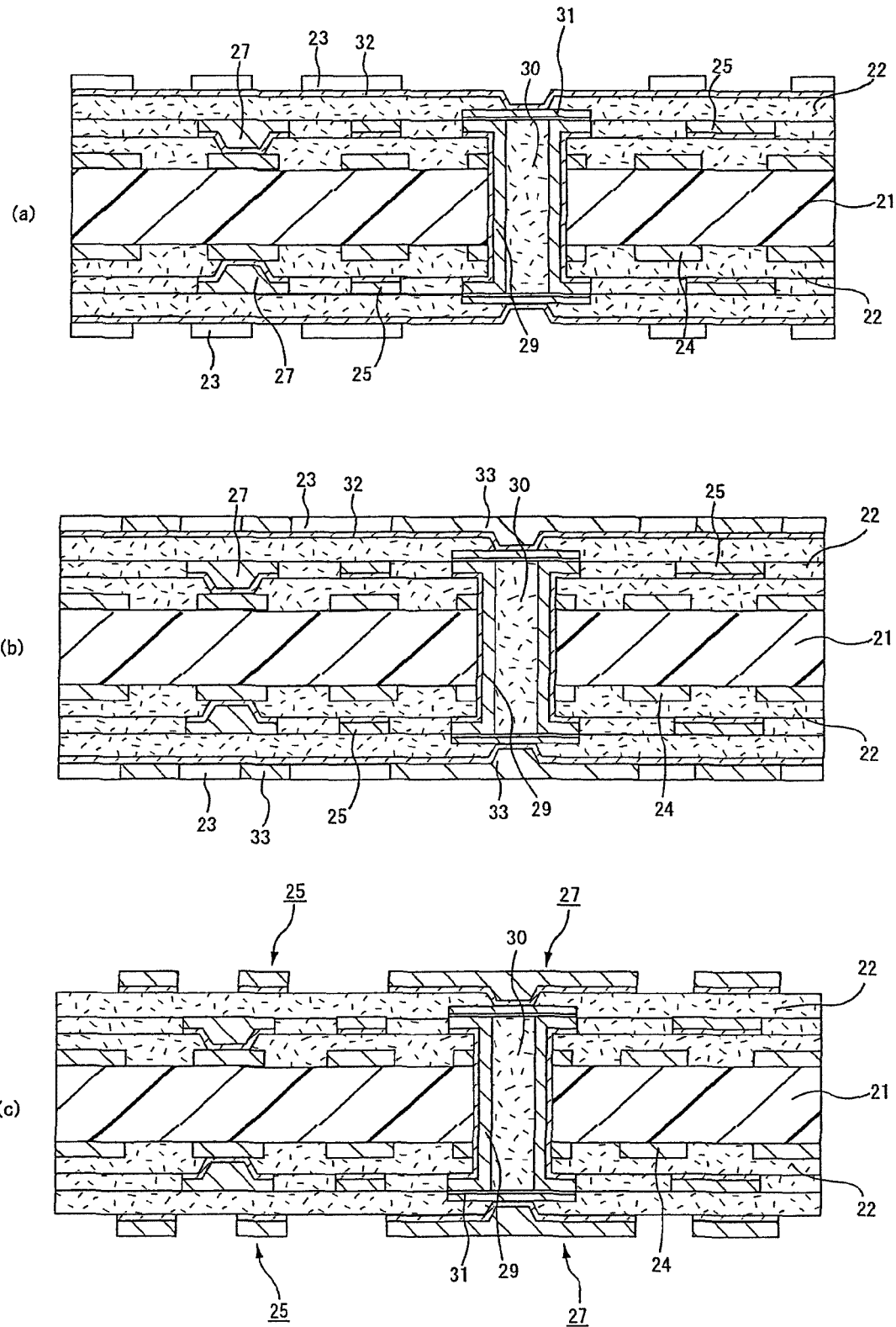
FIGS. 14 (a) to (c) are cross-section figures schematically showing a part of manufacturing processes of a multilayered printed circuit board of the present invention.
Figure 15:
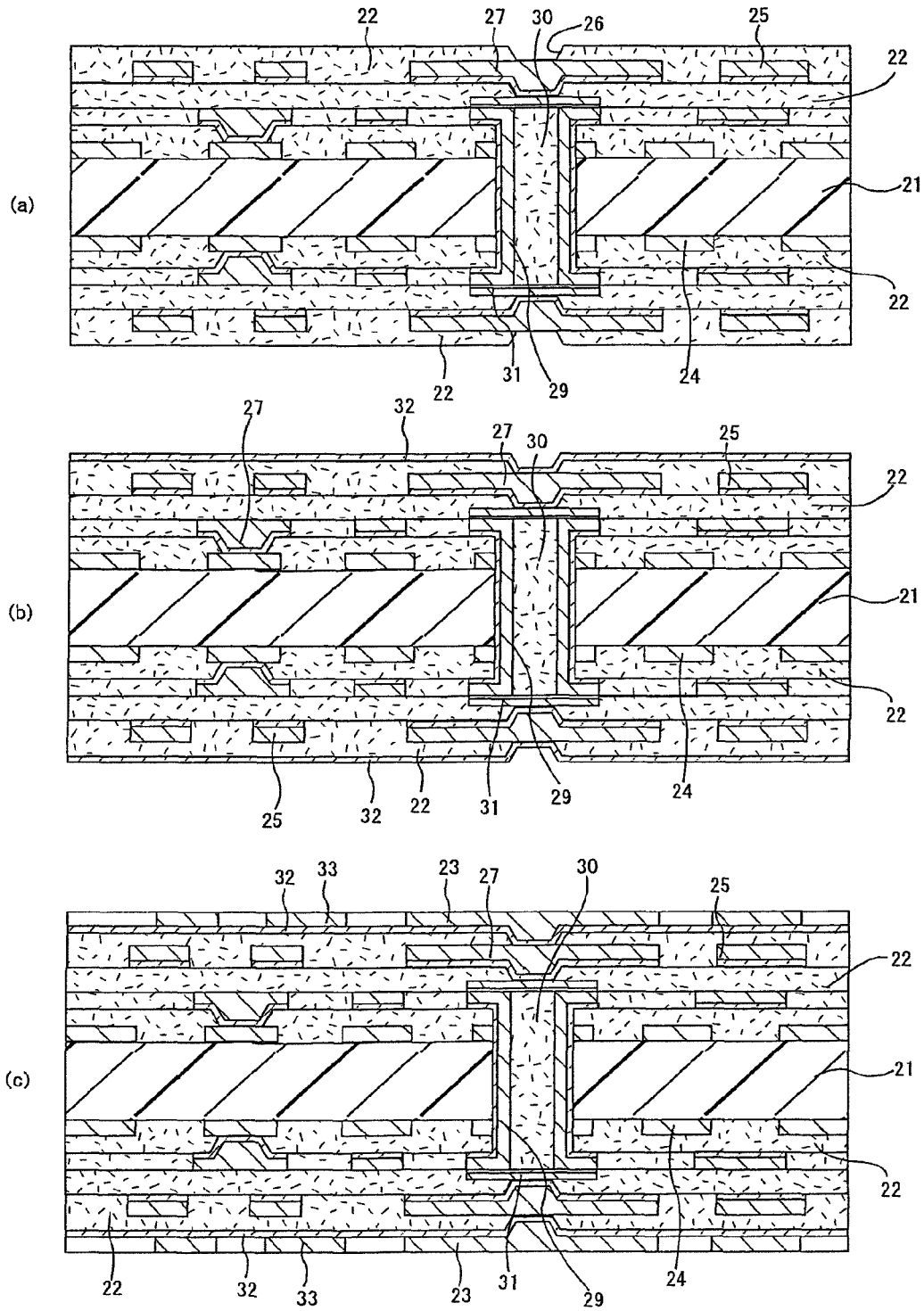
FIGS. 15 (a) to (c) are cross-section figures schematically showing a part of manufacturing processes of a multilayered printed circuit board of the present invention.

(15) Next, after the plating resist 33 was separated and removed with 5% KOH, the electroless plating film under the plating resist 33 was dissolved and removed by etching with a mixed solution of sulfuric acid and hydrogen peroxide to form a cover plating layer 31 (reference to FIG. 13 (*b*)).

(16) Next, the surface of the cover plating layer 31 was roughened (not illustrated) using an etching solution (Meck Etch Bond).

Figure 16:
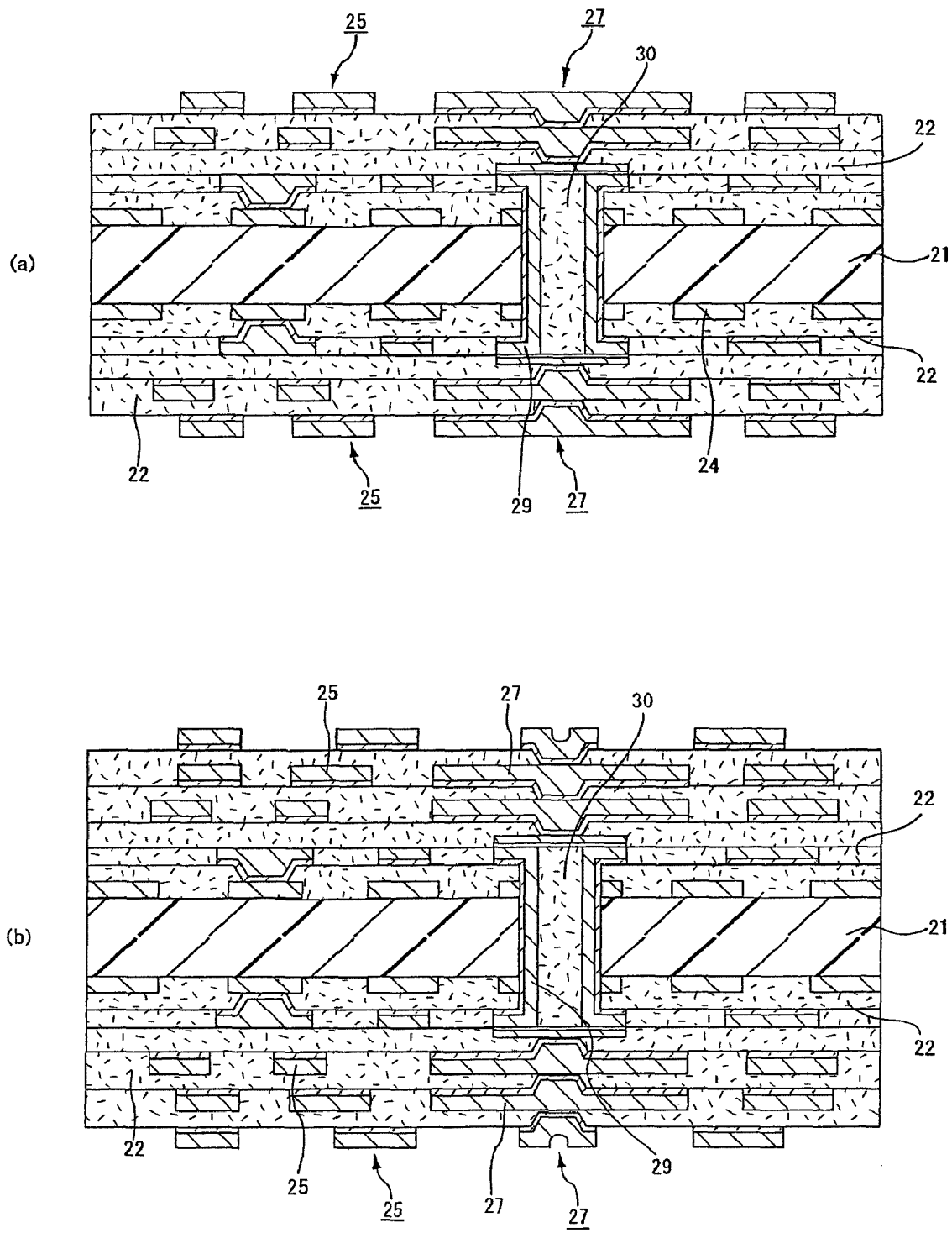
FIGS. 16 (a), (b) are cross-section figures schematically showing a part of manufacturing processes of a multilayered printed circuit board of the present invention.

(17) Next, the above-mentioned processes (3) to (11) were repeated twice to form interlaminar resin insulating layers 22 and conductor circuits 25 (including the via-holes 27) of the further upper layer (reference to FIG. 13 (*c*) to FIG. 16 (*a*)). Incidentally, in this process, no plated-through hole was formed. Regarding the plating resist formed in the process, the shape of the non plating resist formed area for forming via-holes was circular in a planar view and the diameter thereof was 250 μm. Also, the formed via-holes had a land diameter of 85 μm and a filled via shape.

(18) Further, the above-mentioned processes (3) to (11) were repeated except the electroplating was carried out under the following conditions to form the interlaminar resin insulating layers 22 and conductor circuits 25 (including the via-holes 27) in the further upper layer and obtain a multilayered circuit board (reference to FIG. 16 (b)). Incidentally, in this process, no plated-through hole was formed.
[Electroplating Solution]

| sulfuric acid | 2.24 mol/l |
| copper sulfate | 0.26 mol/l |
| additive | 19.5 ml/l |
| (made by Atotech Japan CO., Cupracid GL) | |

[Electroplating Condition]

| current density | 1 A/dm$^2$ |
| time | 65 minutes |
| temperature | 22 ± 2° C. |

Incidentally, regarding the plating resist formed in the process, the shape of the non plating resist formed area for forming via-holes was circular in a planar view and the diameter was 150 μm. Also, the formed via-holes had a land diameter of 35 μm and an upper face with a dent. Further, the distance between a formed via-hole and a neighboring conductor circuit was 50 μm.

Figure 17:
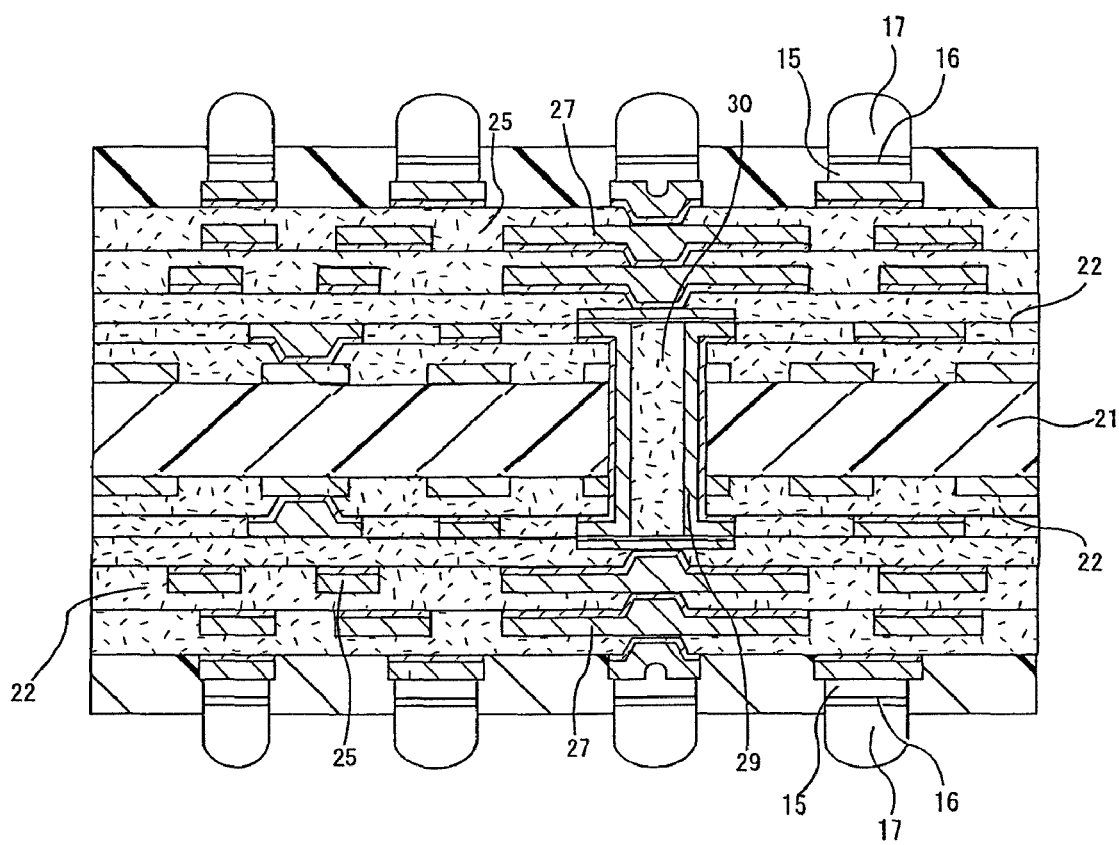
FIG. 17 is a cross-section figure schematically showing a part of manufacturing processes of a multilayered printed circuit board of the present invention.

(19) Next, in the same manner as the above-mentioned processes (18) to (21) of Example 1, a multilayered printed circuit board comprising solder bumps was obtained (reference to FIG. 17).

Example 5

A multilayered printed circuit board was manufactured in the same manner as Example 4, except that the shape of the non plating resist formed area for forming via-holes was made to be circular in a planar view and have a diameter of 150 μm in the second repeating processes when the processes (3) to (11) were repeated twice in the process (17) of Example 4. Consequently, a multilayered printed circuit board having the via-holes with a 85 μm-land diameter in the lowest layer and the via-holes with a 35 μm-land diameter in the inner layers and the outermost layer among the via-holes formed to have the stack-via structure was obtained (reference to FIG. 18 (a)).

Example 6

A multilayered printed circuit board was manufactured in the same manner as Example 4, except that: the shape of the non plating resist formed area for forming via-holes was made to be circular in a planar view with a diameter of 200 μm having the maximum land diameter of 85 μm in the first repeating processes; and the shape of the non plating resist formed area for forming via-holes was made to be circular in a planar view and with a diameter of 200 μm having the maximum land diameter of 85 μm and the direction of the maximum land diameter being in the opposed direction of that of the maximum land diameter formed in the first repeating processes, in the second repeating processes when the processes (3) to (11) were repeated twice in the process (17) of Example 4.

Figure 18:
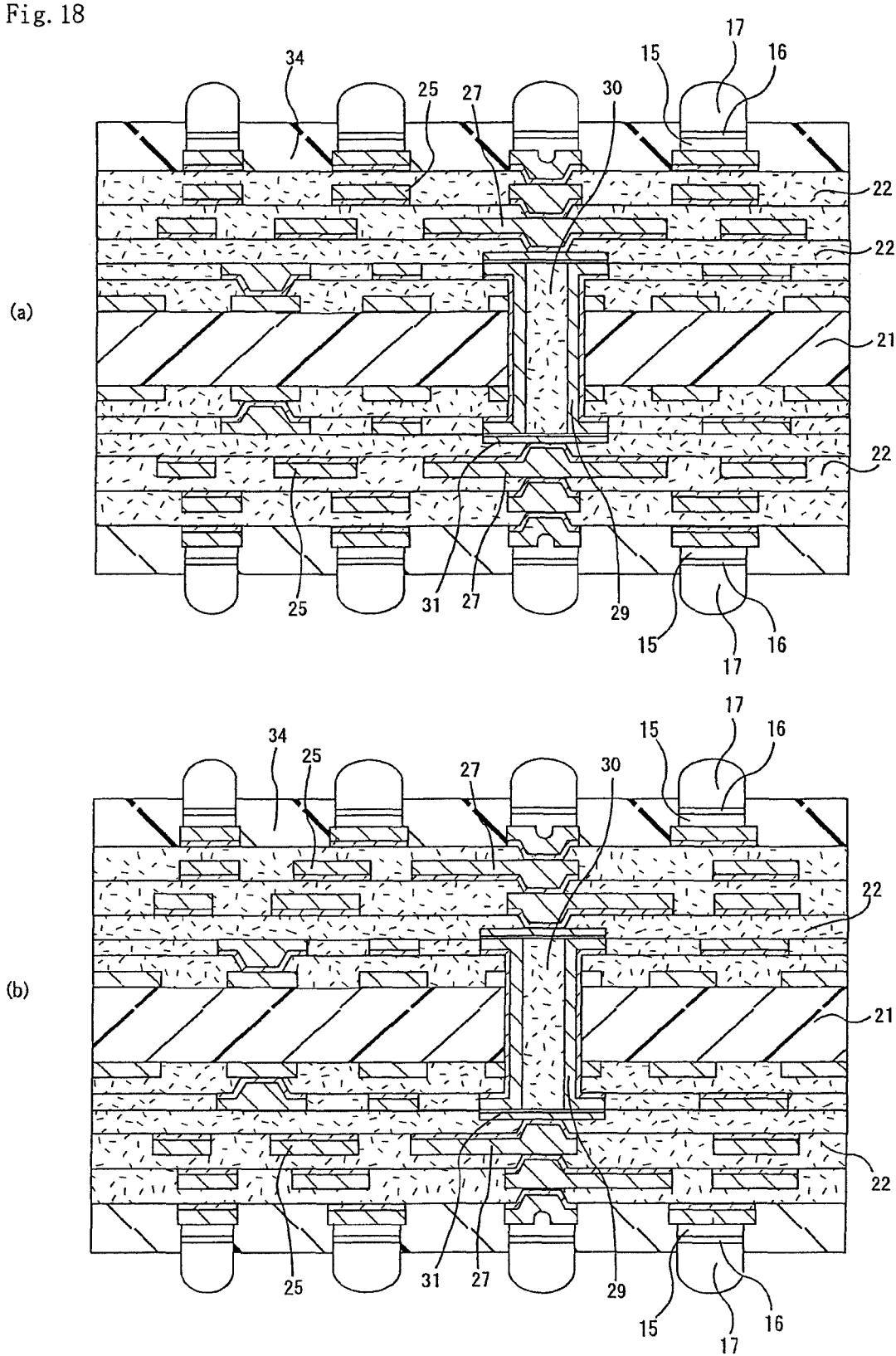
FIGS. 18 (a), (b) are cross-section figures schematically showing an example of a multilayered printed circuit board of the present invention.
Figure 19:
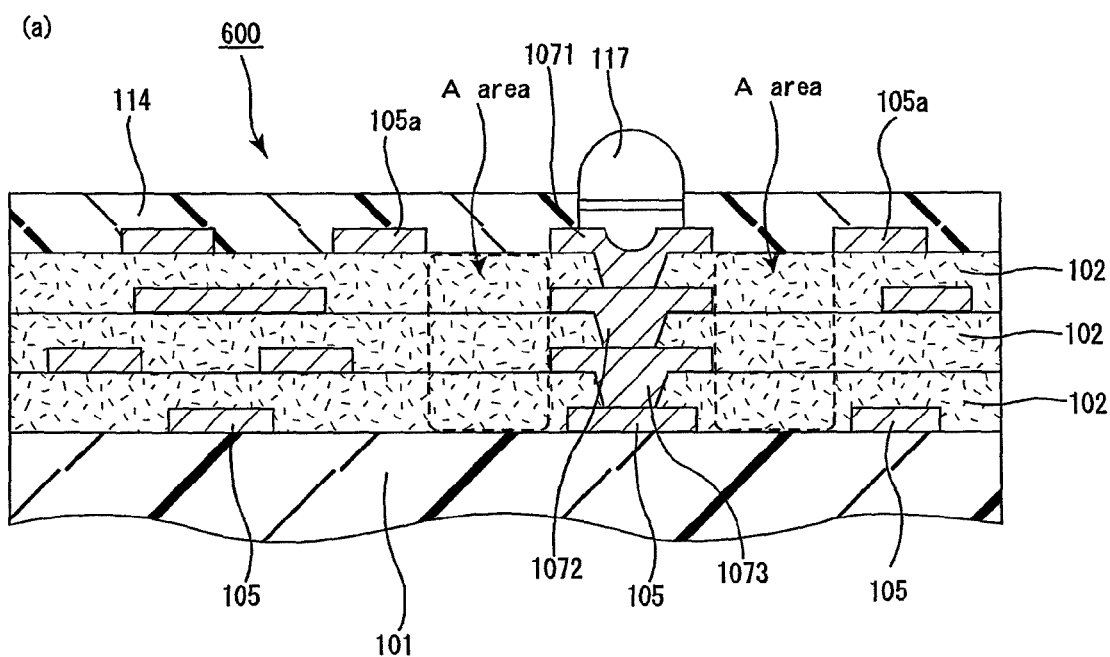
FIG. 19 (a) is across-section figure schematically showing an example of a conventional multilayered printed circuit board and FIG. 19 (b) is a perspective figure schematically showing a via-hole of the multilayered printed circuit board shown in FIG. 19 (a).
Figure 19:
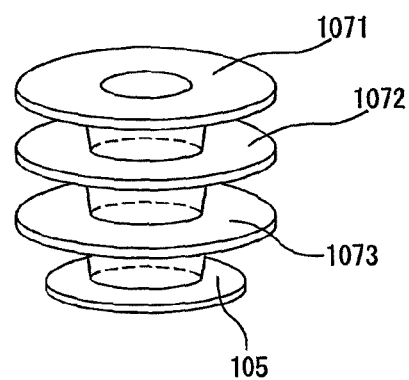

Consequently, the obtained multilayered printed circuit board had the 85 μm-maximum land diameter and the 35 μm-minimum land diameter of the via-hole land diameters of the via-holes formed to have the stack-via structure in the lowest layer and the inner layers and the directions of the maximum land diameter between the via-holes in the lowest layer and the via-holes in the inner layers opposed to each other (reference to FIG. 18 (b)).

Comparative Example 1

A multilayered printed circuit board was manufactured in the same manner as Example 2, except the land diameter was made all 35 μm in the via-holes having the stack-via structure.

Comparative Example 2

A multilayered printed circuit board was manufactured in the same manner as Example 4, except the land diameter was made all 35 μm in the via-holes having the stack-via structure. The shape observation of cross-sections of the via-holes having the stack-via structure and an electric continuity test were carried out before and after a heat cycle test for the multilayered printed circuit boards obtained in Example 1 to 6 and Comparative Example 1 and 2.

Evaluation Method
(1) Heat Cycle Test
A cycle comprising steps of keeping at −65° C. for 3 minutes and at 130° C. for 3 minutes was repeated 1000 times
(2) Electric Continuity Test
After a multilayered printed circuit board was manufactured, an electric continuity test was carried out using a checker before and after the above-mentioned heat cycle test to evaluate the electric communication state from the results displayed on a monitor.
(3) Shape Observation
After a multilayered printed circuit board was manufactured, the multilayered printed circuit board was cut so as to cross the via-holes having the stack-via structure before and after the above-mentioned heat cycle test and the cross-section was observed using an optical microscope with 100 to 400 times magnification.

As a result, in the multilayered printed circuit boards of Example 1 to 6, no short circuit and disconnection was found before and after the heat cycle test to show the excellent electric communication state. Further, in the cross-section shape observation, the occurrence of cracking in the interlaminar resin insulating layers and the occurrence of separation between the interlaminar resin insulating layers and the via-holes were not observed.

On the other hand, in the multilayered printed circuit boards of the Comparative Example 1 and 2, electric continuity failure attributed to short circuit and disconnection was found after the heat cycle test. In the cross-section shape observation, cracking was found occurring in a lower area of the non conductor circuit formed area between the via-hole in the outermost layer and a conductor circuit neighboring to the circuit and separation was observed between the interlaminar resin insulating layers and the via-holes.

Example 7

A. Preparation of a Photosensitive Resin Composition A (i) A container was loaded with 35 parts by weight of a resin solution obtained by dissolving a 25% acrylated compound of cresol novolak type epoxy resin (made by Nippon Kayaku Co., Ltd.; molecular weight: 2500) in diethylene glycol dimethyl ether (DMDG) to be 80% by weight concentration, 3.15 parts by weight of a photosensitive monomer (made by Toagosei Chemical Industry Co., Ltd., Aronix M 315), 0.5 parts by weight of a defoaming agent (made by San Nopco Ltd., S-65), and 3.6 parts by weight of N-methylpyrrolidone, and they were stirred and mixed to prepare a mixed composition.

(ii) Another container was loaded with 12 parts by weight of polyether sulfone (PES), 7.2 parts by weight of an epoxy resin particle (Polymerpol, made by Sanyo Chemical Industries, Ltd.) with an average particle size of 1.0 μm and 3.09 parts by weight of the epoxy resin particle with an average particle size of 0.5 μm, and they were stirred and mixed. Then, 30 parts by weight of NMP was further added to the obtained solution, and they were stirred and mixed by a bead mill to prepare another mixed composition.

(iii) Further another container was loaded with 2 parts by weight of an imidazole curing agent (2E4MZ-CN produced by Shikoku Chemicals Corp.), 2 parts by weight of a photopolymerization initiator (made by Chiba Specialty Chemicals Corp., Irgacure I-907), 0.2 parts by weight of a photosensitizer (DETX-S made by Nippon Kayaku Co., Ltd.) and 1.5 parts by weight of NMP, and they were stirred and mixed to produce a mixed composition.

The mixed compositions produced as (i), (ii), and (iii) were mixed to obtain a photosensitive resin composition A.

B. Production of Photosensitive Resin Composition B (i) A container was loaded with 35 parts by weight of a resin solution obtained by dissolving a 25% acrylated compound of cresol novolak type epoxy resin (made by Nippon Kayaku Co., Ltd.; molecular weight: 2500) in diethylene glycol dimethyl ether (DMDG) to be 80% by weight concentration, 4 parts by weight of a photosensitive monomer (made by Toagosei Chemical Industry Co., Ltd., Aronix M 315), 0.5 parts by weight of a defoaming agent (made by San Nopco Ltd., S-65), and 3.6 parts by weight of N-methylpyrrolidone (NMP) and they were stirred and mixed to prepare a mixed composition.

(ii) Another container was loaded with 12 parts by weight of polyether sulfone (PES), 14.49 parts by weight of an epoxy resin particle (Polymerpol, made by Sanyo Chemical Industries, Ltd.) with an average particle size of 0.5 μm and they were stirred and mixed. Then, 30 parts by weight of NMP was further added to the obtained solution, and they were stirred and mixed by a bead mill to prepare another mixed composition.

(iii) Further another container was loaded with 2 parts by weight of an imidazole curing agent (2E4MZ-CN produced by Shikoku Chemicals Corp.), 2 parts by weight of a photopolymerization initiator (made by Chiba Specialty Chemicals Corp., Irgacure I-907), 0.2 parts by weight of a photosensitizer (DETX-S made by Nippon Kayaku Co., Ltd.) and 1.5 parts by weight of NMP and they were stirred and mixed to prepare a mixed composition.

The mixed compositions produced as (i), (ii), and (iii) were mixed to obtain a photosensitive resin composition B.

C. Preparation of a Resin Filler

A container was loaded with 100 parts by weight of bisphenol F type epoxy monomer (YL 983 U produced by Yuka Sell Epoxy K.K.; molecular weight: 310), 72 parts by weight of a $SiO_2$ spherical particle coated with a silane coupling agent on the surface and having an average particle diameter of 1.6 μm and a diameter of the maximum particle of 15 μm or less (CRS 1101-CE produced by Adotex Co.), and 1.5 parts by weight of a leveling agent (Perenol S4 made by San Nopco Ltd.) and they were stirred and mixed to prepare a resin filler with a viscosity of 30 to 80 Pa·s at 25±1° C.

Incidentally, as a curing agent, 6.5 parts by weight of an imidazole curing agent (2E4MZ-CN produced by Shikoku Chemicals Corp.) was employed.

D. Manufacture Method of a Printed Circuit Board (1) A copper-laminated laminate plate comprising a substrate 41 of a 0.8 mm-thick glass epoxy resin or a BT (bismaleimide triazine) resin and a 18 μm-copper foil 48 laminated on both faces of the substrate 41 was used as a starting material (reference to FIG. 20 (*a*)). At first, the copper-clad laminate plate was drilled to bore holes and electroless plating treatment was carried out and pattern etching was carried out to form under-level conductor circuits 44 on both faces of the substrate 41 and a plated-through hole 49 (reference to FIG. 20 (*b*)).

(2) The substrate on which the plated-through hole 49 and the underlevel conductor layers 44 were formed was washed with water and dried and then subjected to blackening treatment using an aqueous solution containing NaOH (10 g/l), $NaClO_2$ (40 g/l), $Na_3PO_4$ (6 g/l) as a blackening bath (oxidizing bath) and reducing treatment using an aqueous solution containing NaOH (10 g/l) and $NaBH_4$ (6 g/l) as a reducing bath to form roughened surface (not illustrated) on the entire surface of the underlevel conductor layers 44 including the plated-through hole 49.

(3) Next, after the resin filler described in the description C was prepared, the layer 50' of the resin filler was formed inside the plated-through hole 49 and the non conductor circuit formed area and the peripheral portion of the underlevel conductor layers 44 of the substrate 41 by the following method within 24 hours after the preparation.

That is, at first, the resin filler was pushed in the plated-through hole using a squeegee and then dried under the conditions of 100° C. for 20 minutes. Next, a mask having an opening corresponding to the non conductor circuit formed area was put on the substrate and the layer 50' of the resin filler was formed in the non conductor circuit formed area, which was a concave portion, using a squeegee and then dried under the conditions of 100° C. for 20 minutes (reference to FIG. 20 (*c*)).

(4) One face of the substrate subjected to the above-mentioned treatment (3) was grinded by a belt sander grinding using #600 belt abrasive paper (made by Sankyo Rikagaku Co., Ltd.) so as not to leave the resin filler on the surface of the underlevel conductor layers 44 and the land surface of the plated-through hole 49 and then, buffing was carried out to eliminate the scratches by the above-mentioned belt sander grinding. A series of such grinding steps were carried out for the other face of the substrate in the same manner.

Next, heating treatment at 100° C. for 1 hour and at 150° C. for 1 hour was carried out to form a resin filler layer 50.

Figure 20:
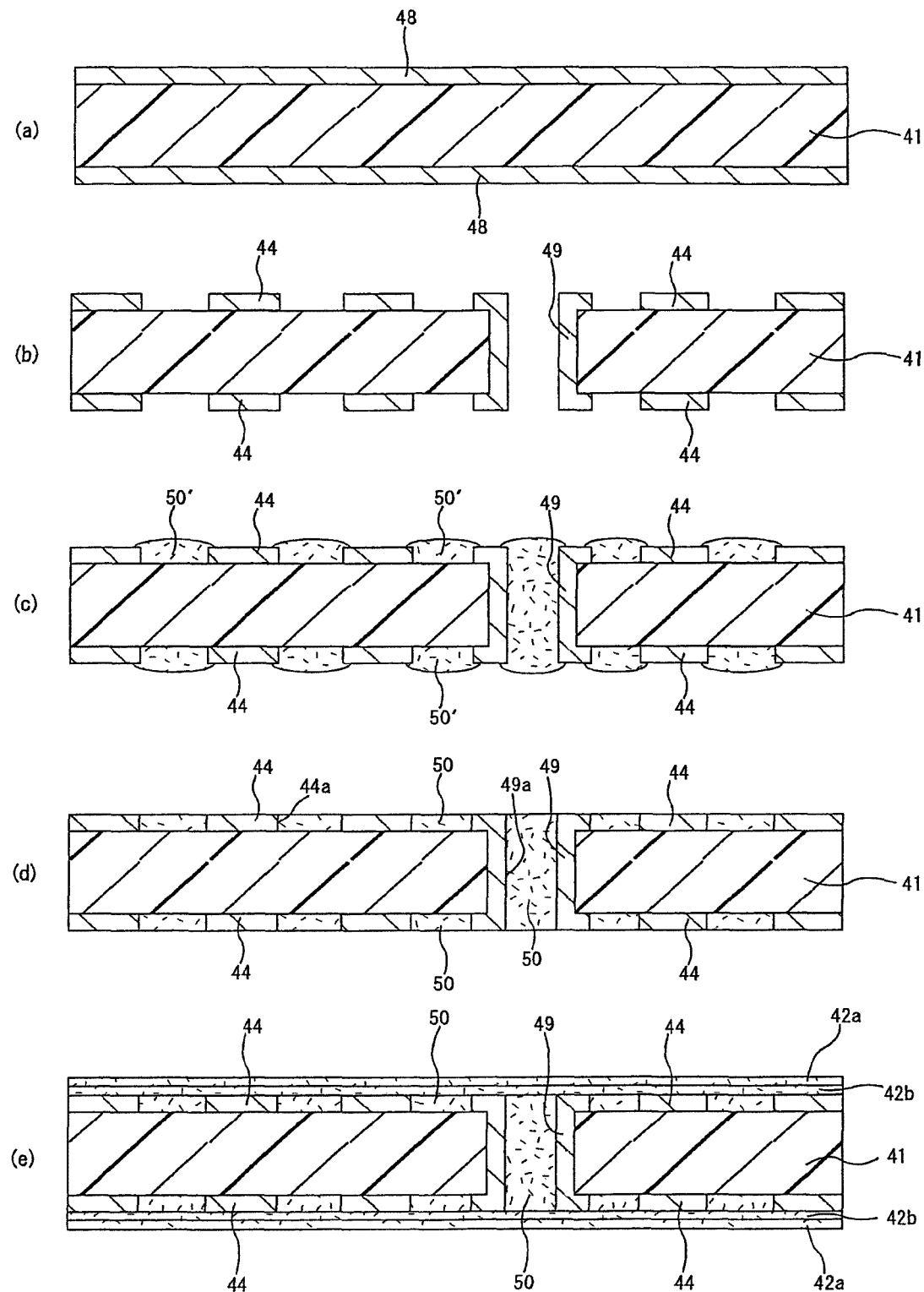
FIGS. 20 (a) to (e) are cross-section figures schematically showing a part of manufacturing processes of a multilayered printed circuit board of the present invention.

In such a manner, the surface layer part of the resin filler layer 50 formed in the plated-through hole 49 and the non conductor circuit formed area and the surface of the underlevel conductor layers 40 were made flat and the resin filler layer 50 and the side faces 44*a* of the underlevel conductor layers 44 were firmly stuck to each other through the roughened surface and also the inner wall faces 49*a* of the plated-through hole 49 and the resin filler layer 50 were firmly stuck to each other through the roughened surface to obtain an insulating substrate (reference to FIG. 20 (*d*)). That is, by this process, the surface of the resin filler layer 50 and the surface of the underlevel conductor layers 40 were in the same plane.

(5) After the above-mentioned substrate was washed with water and degreased with an acid, soft etching was carried out and then, an etching solution was sprayed on both faces of the substrate to etch the surface of the underlevel conductor layers 44 and the land surface of the plated-through hole 49 to form roughened surface on the entire surface (not illustrated) of the underlevel conductor layers 44. Incidentally, as the etching solution, an etching solution (made by Meck Co.; Meck etch) containing 10 parts by weight of an imidazole copper(II) complex, 7 parts by weight of glycolic acid and 5 parts by weight of potassium chloride was used.

(6) Next, the photosensitive resin composition B (viscosity: 1.5 Pa·s) prepared in the above-mentioned B was applied to both faces of the substrate by a roll coater within 24 hours after the preparation, left in horizontal state for 20 minutes and dried (pre-baked) at 60° C. for 30 minutes. After that, the photosensitive resin composition A (viscosity: 7 Pa·s) prepared in the above-mentioned A was applied by a roll coater within 24 hours after the preparation and left in horizontal state for 20 minutes and dried (pre-baked) at 60° C. for 30 minutes to form resin layers 42a and 42b composed of two layers in half-cured state (reference to FIG. 20 (e)).

(7) Next, a photomask film on which black circles with a diameter of 80 μm were printed was closely attached to both faces of the substrate bearing the resin layers 42a, 42b in half-cured state and after exposure with a dose of 500 mJ/cm$^2$ was carried out using an ultrahigh pressure mercury lamp, spray development was carried out using DMDG solution. After that, the resulting substrate was further subjected to exposure with a dose of 3000 mJ/cm$^2$ using an ultrahigh pressure mercury lamp and heating treatment at 100° C. for 1 hour, at 120° C. for 1 hour, and at 150° C. for 3 hours to form interlaminar resin insulating layers 42 each composed of two layers and having opening part 46 of the via-holes with a diameter of 80 μm, which is excellent in size precision corresponding to those of the photomask film (reference to FIG. 21 (a)).

Incidentally, the coefficient of linear expansion of each interlaminar resin insulating layer 42 formed in this process was 70 ppm/° C.

(8) Successively, the substrate on which the opening part 46 for via-holes were formed was immersed in a solution containing 60 g/l of permanganic acid at 80° C. for 10 minutes to dissolve and remove the epoxy resin particle existing on the surface of the interlaminar resin insulating layers 42, consequently to form the roughed surface (not illustrated) on the interlaminar resin insulating layers 42 including the inner walls of the opening part 46 of via-holes.

(9) Next, the substrate subjected to the above-mentioned treatment was immersed in a neutralization solution (made by Shiplay Co., Inc.) and washed with water.

Further, a palladium catalyst (made by Atotech Japan CO.) was supplied to the surface of the substrate subjected to the surface roughening treatment (the roughening depth 3 μm), so that catalyst core adhered to the surface of the interlaminar resin insulating layers 42 and the inner wall faces of the opening part 46 for via-holes.

Figure 21:
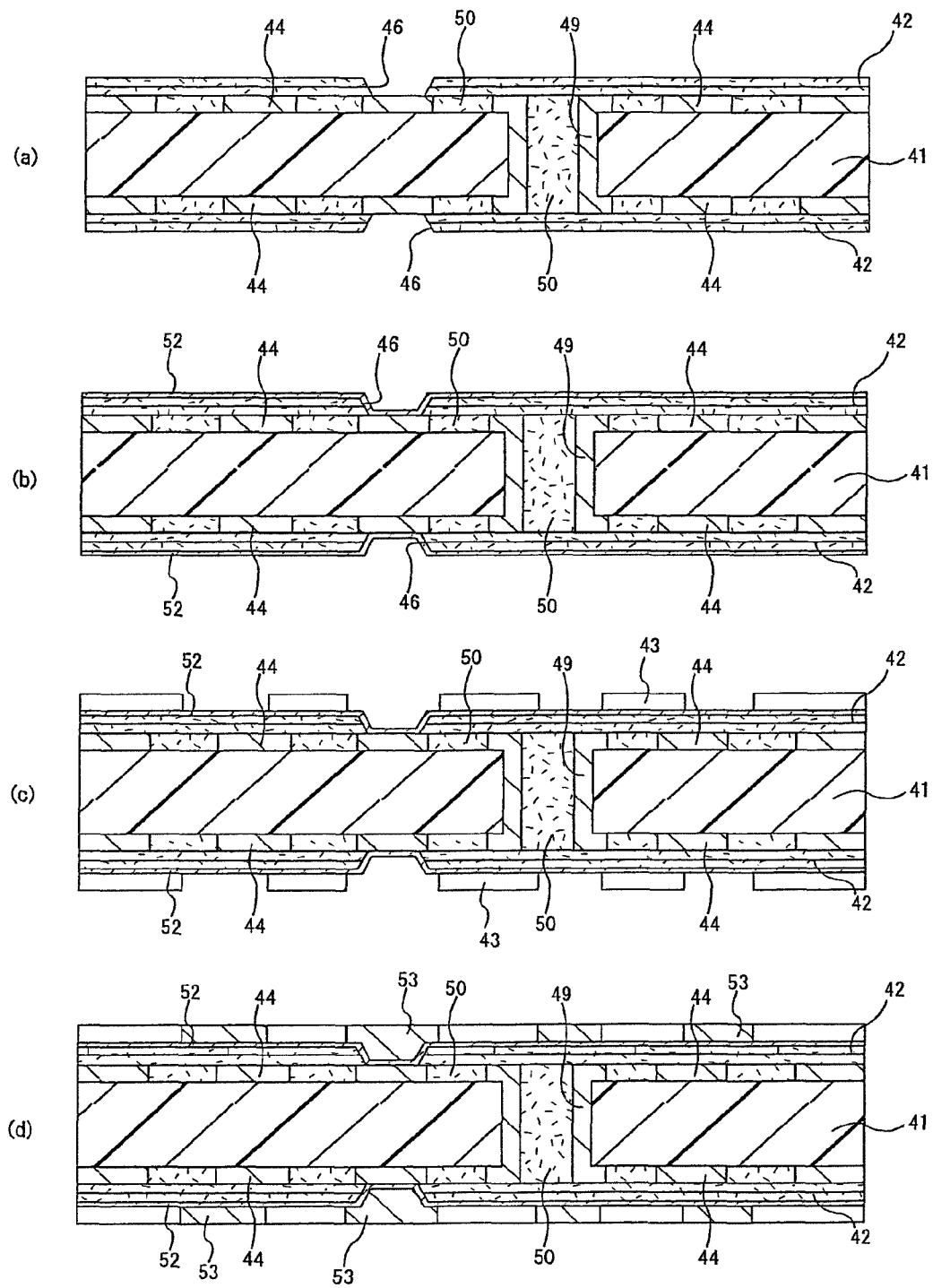
FIGS. 21 (a) to (d) are cross-section figures schematically showing a part of manufacturing processes of a multilayered printed circuit board of the present invention.

(10) Next, the substrate was immersed in an electroless copper plating aqueous solution having the following composition to form thin film conductor layers 52 with a thickness of 0.6 to 3.0 μm on the entire roughened surface (reference to FIG. 21 (b)).

[Electroless Plating Solution]

| | |
|---|---|
| $NiSO_4$ | 0.003 mol/l |
| tartaric acid | 0.200 mol/l |
| copper sulfate | 0.030 mol/l |
| HCHO | 0.050 mol/l |
| NaOH | 0.100 mol/l |
| α,α'-bipyridyl | 40 mg/l |
| polyethylene glycol (PEG) | 0.10 g/l |

[Electroless Plating Condition]

at 35° C. liquid temperature for 40 minutes

(11) Next, a commercialized photosensitive dry film was stuck to the thin film conductor layers 52 and a mask was put thereon and exposure with a dose of 100 mJ/cm$^2$ and development with an aqueous 0.8% sodium carbonate solution were carried out to form the plating resist 43 (reference to FIG. 21 (c)).

(12) Next, the substrate was washed with water at 50° C. to be degreased and washed with water at 25° C. and further washed with sulfuric acid and after that, the substrate was subjected to electrolytic copper plating under the following conditions to form electrolytic copper plating layers 53 (reference to FIG. 21 (d)).

[Electroplating Solution]

| | |
|---|---|
| $CuSO_4·5H_2O$ | 210 g/l |
| sulfuric acid | 150 g/l |
| Cl$^-$ | 40 mg/l |
| polyethylene glycol | 300 mg/l |
| bisdisulfide | 100 mg/l |

[Electroplating Condition]

| | |
|---|---|
| current density | 1.0 A/dm$^2$ |
| time | 60 minutes |
| temperature | 25° C. |

(13) Successively, the plating resist 43 was separated and removed in an aqueous 40 g/l NaOH solution at 50° C. After that, heating treatment at 150° C. for 1 hour was carried out for the substrate, and using an etching solution containing an aqueous sulfuric acid-hydrogen peroxide solution, the thin film conductor layers which were under the plating resist were removed to form independent conductor circuits 45 and via-holes 47 with the filled via shape (reference to FIG. 22 (a)).

Figure 22:
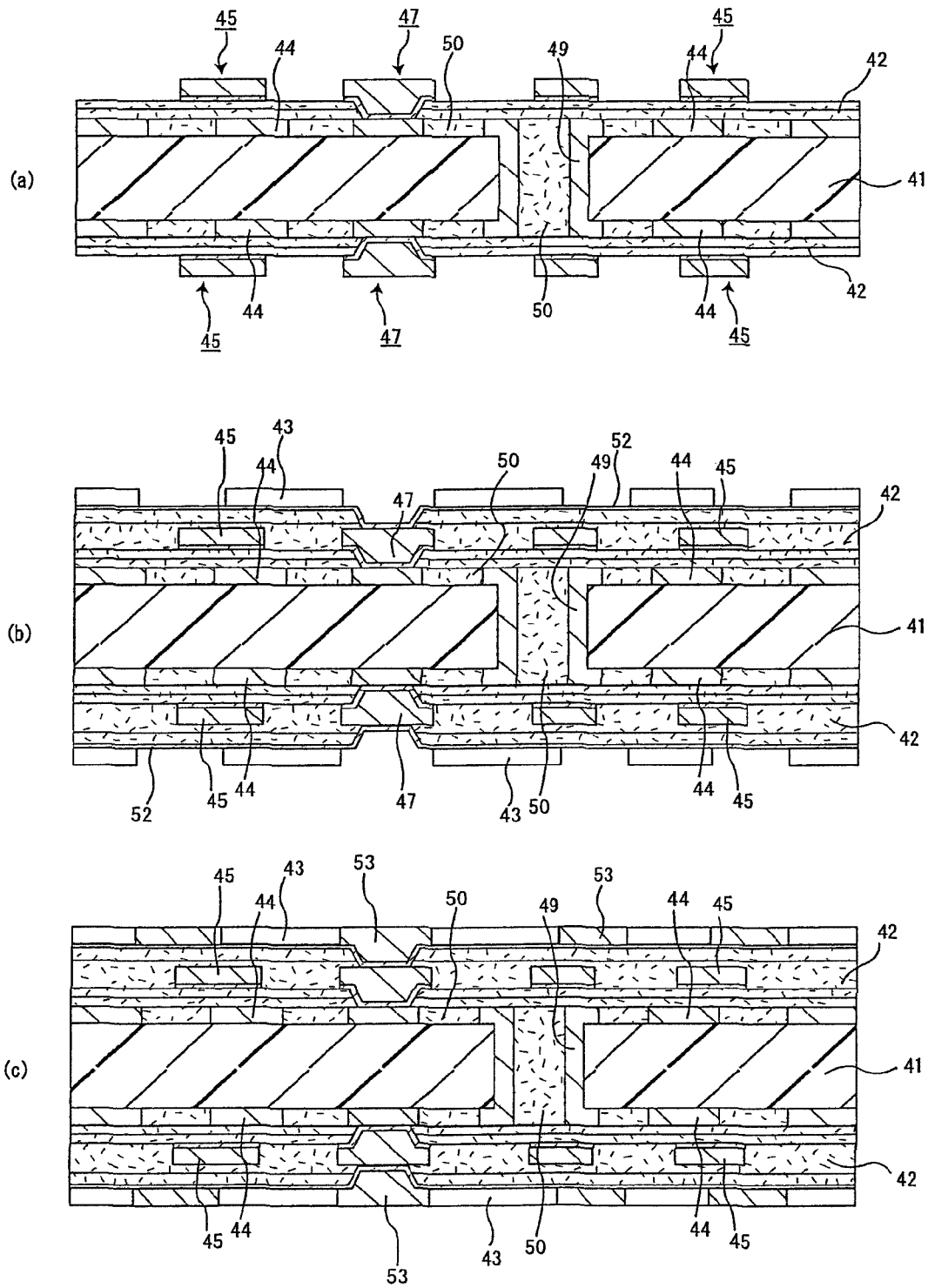
FIGS. 22 (a) to (c) are cross-section figures schematically showing a part of manufacturing processes of a multilayered printed circuit board of the present invention.

(14) The above-mentioned processes (5) to (11) were repeated to form interlaminar resin insulating layers 42 and thin film conductor layers 52 in further upper layers and after that, the plating resist 43 was formed on the thin film conductor layers 52 (reference to FIG. 22 (b)). Incidentally, the coefficient of linear expansion of the interlaminar resin insulating layers 42 formed in this process was 70 ppm/° C.

Figure 23:
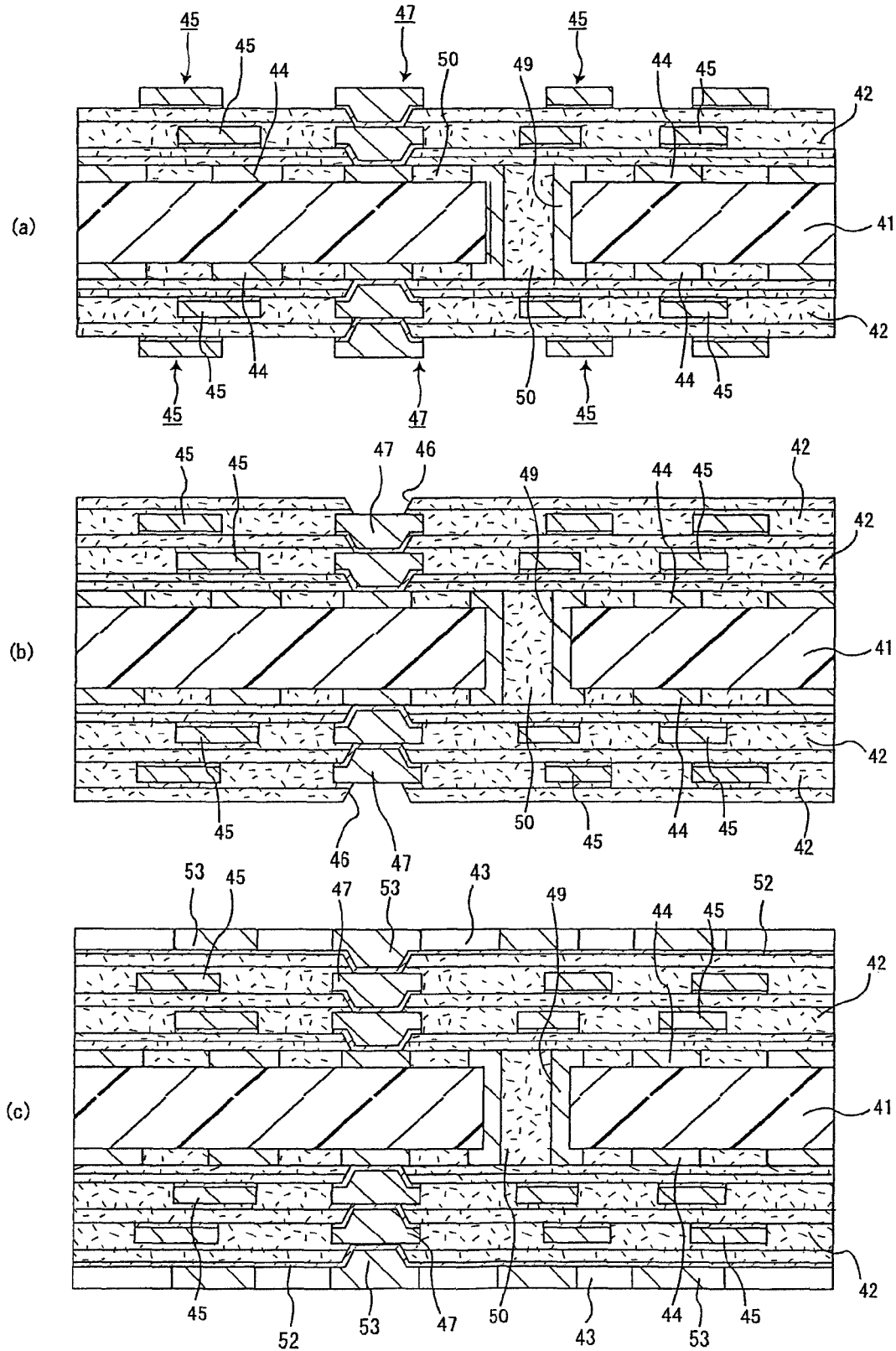
FIGS. 23 (a) to (c) are cross-section figures schematically showing a part of manufacturing processes of a multilayered printed circuit board of the present invention.

(15) Next, in the same manner as the above-mentioned processes (12), (13), the electrolytic copper plating treatment, parting and removal of the plating resist and etching of thin film conductor layers were carried out to form independent conductor circuits and via-holes with the filled via shape (reference to FIG. 22 (c) to FIG. 23 (a)).

(16) Next, the above-mentioned processes (5) to (11) were repeated to form interlaminar resin insulating layers 42 and thin film conductor layers 52 in further upper layers and after that, plating resist 43 was formed on the thin film conductor layers 52. Incidentally, the coefficient of linear expansion of the interlaminar resin insulating layers 42 formed in this process was 70 ppm/° C. (reference to FIG. 23 (b)).

Figure 24:
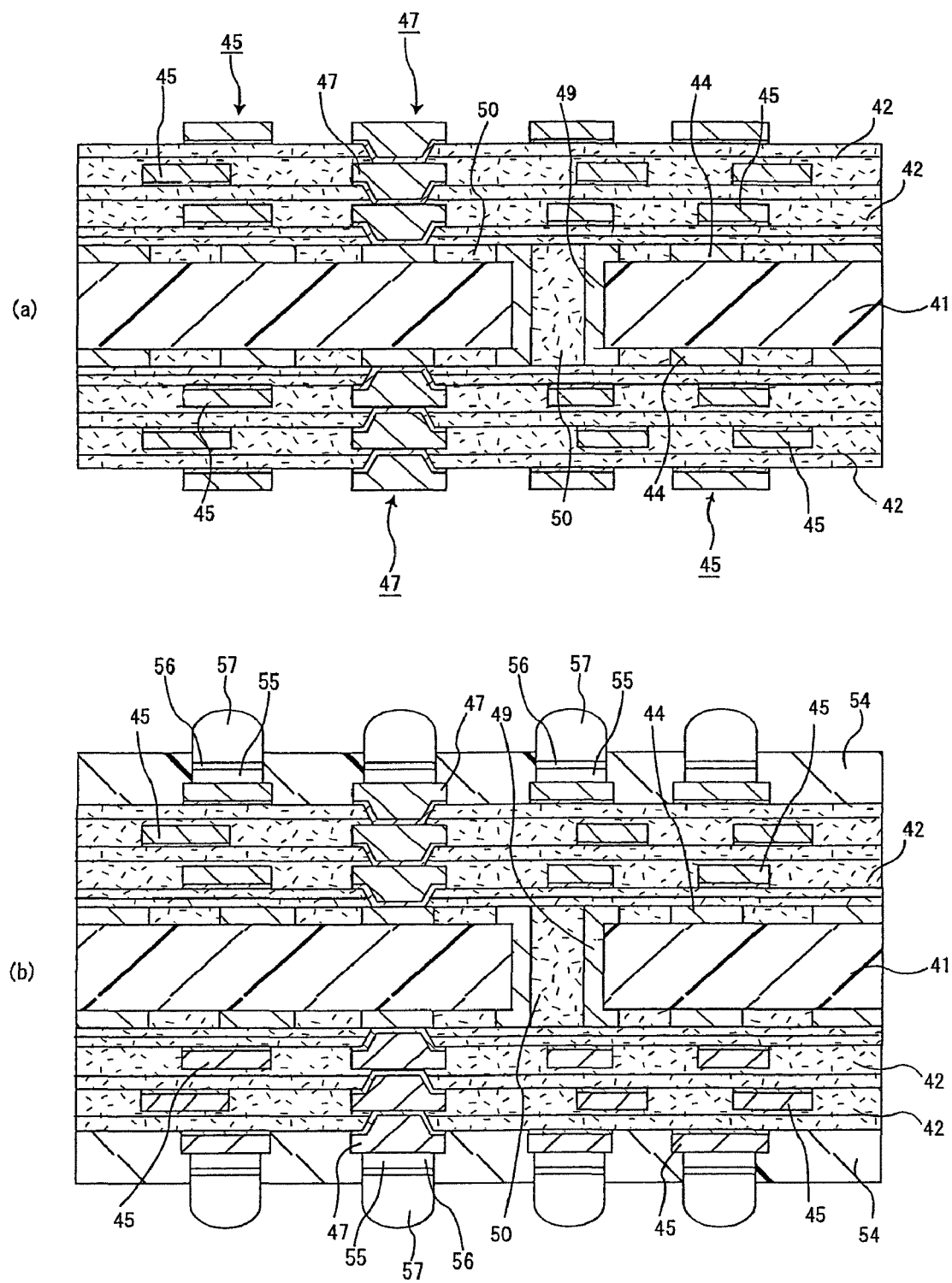
FIGS. 24 (a), (b) are cross-section figures schematically showing a part of manufacturing processes of a multilayered printed circuit board of the present invention.

(17) Next, in the same manner as the above-mentioned processes (12), (13), the electrolytic copper plating treatment, parting and removal of the plating resist 43 and etching of thin film conductor layers were carried out to form independent conductor circuits and via-holes with the filled via shape (reference to FIG. 23 (c) to FIG. 24 (a)).

(18) Next, a container was loaded with: 46.67 parts by weight of an oligomer provided with a photosensitivity (molecular weight: 4000) obtained by acrylating 50% of an epoxy group of cresol novolak type epoxy resin (made by Nippon Kayaku Co., Ltd.), dissolved in diethylene glycol dimethyl ether (DMDG) to be 60% by weight concentration; 15.0 parts by weight of bisphenol A type epoxy resin (trade name: Epikote 1001 made by Yuka Shell Epoxy Co.) dissolved in methyl ethyl ketone to be 80% by weight concentration; 1.6 parts by weight of imidazole curing agent (trade name: 2E4MZ-CN made by Shikoku Chemicals Corp.); 3.0 parts by weight of a polyvalent acrylic monomer, which was a photosensitive monomer (trade name: R604, made by Nippon Kayaku Co., Ltd.); 1.5 parts by weight of a similarly polyvalent acrylic monomer (trade name: DPE 6 A made by Kyoei Chemical Co., Ltd.); and 0.71 parts by weight of the dispersion type defoaming agent (made by San Nopco Ltd., S-65), and they were stirred and mixed to prepare the mixed composition. Then, to this mixed composition, 2.0 parts by weight of benzophenone (made by Kanto Chemical Co., Inc.) as a photopolymerization initiator and 0.2 parts by weight of Michler's ketone (made by Kanto Chemical Co., Inc.) as a photosensitizer were added to obtain a solder resist composition with a viscosity of 2.0 Pa·s at 25° C. The viscosity measurement was carried out using a rotor No. 4 in the case at 60/min$^{-1}$ (rpm) and a rotor No. 3 in the case at 4.6/min$^{-1}$ (rpm) using a B-type viscometer (made by Tokyo Instruments Co. Ltd., DVL-B type).

(19) Next, the above-mentioned solder resist composition was applied in 20 μm thickness to both faces of the multilayered printed circuit board and dried under conditions of 70° C. for 20 minutes and 70° C. for 30 minutes and then, a 5 mm-thick photomask drawing a pattern corresponding to the solder pad was firmly stuck to the solder resist layers and the solder resist layers were exposed to UV rays of 1000 mJ/cm$^2$ dose and developed with the DMTG solution to form opening part with a diameter of 80 μm.

Further, the solder resist layers were cured by carrying out heating treatment under the respective conditions of 80° C. for 1 hour, 100° C. for 1 hour, 120° C. for 1 hour, and 150° C. for 3 hours to form 20 μm-thick solder resist layers 54 having the opening part for the formation of a solder bump.

(20) Next, the substrate on which the solder resist layers 54 was formed was immersed in an etching solution containing sodium persulfate as a main component for 1 minute to form roughened surfaces (not illustrated) with an average roughness (Ra) of 1 μm or less on the conductor circuit surface.

Further, the substrate was immersed in an electroless nickel plating solution having pH 4.5 containing nickel chloride ($2.3 \times 10^{-1}$ mol/l), sodium hypophosphite ($2.8 \times 10^{-1}$ mol/l), and sodium citrate ($1.6 \times 10^{-1}$ mol/l) for 20 minutes to form a 5 μm-thick nickel plating layer 55 in the openings. Further, the substrate was immersed in an electroless gold plating solution containing potassium cyanoaurate ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) under the conditions of 80° C. for 7.5 minutes to form a 0.03 μm-thick gold plating layer 56 on the nickel plating layer 55 and form solder pads.

(21) After that, a mask was put on the solder resist layers 54 and a solder paste was printed in the openings for forming the solder bumps using a piston type pressure injection printer. After that, the solder paste was subjected to reflow at 250° C. and further to flux washing to obtain a multilayered printed circuit board comprising the solder bumps (reference to FIG. 24 (b)).

Example 8

A. Production of a Resin Film a (for Inner Layer) for an Interlaminar Resin Insulating Layer 30 parts by weight of Bisphenol A type epoxy resin (epoxy equivalent 469, Epikote 1001 produced by Yuka Sell Epoxy K.K.), 40 parts by weight of cresol novolak type epoxy resin (epoxy equivalent 215, Epichlon N-673 produced by Dainippon Ink and Chemicals, Inc.), and 30 parts by weight of phenol novolak resin containing triazine structure (phenolic hydroxy equivalent 120, Phenolite KA-7052 produced by Dainippon Ink and Chemicals, Inc.) were dissolved while being heated in 20 parts by weight of ethyl di-glycol acetate and 20 parts by weight of solvent naphtha under stirring condition, followed by the addition of 15 parts by weight of epoxy-terminated polybutadiene rubber (Denalex R 45EPT produced by Nagase Chemicals Ltd.) and 1.5 parts by weight of a pulverized product of 2-phenyl-4,5-bis(hydroxymethyl) imidazole, 2 parts by weight of a finely pulverized silica, and 0.5 parts by weight of a silicon type defoaming agent to prepare an epoxy resin composition.

After the obtained epoxy resin composition was applied to a 38 μm-thick PET film so as to adjust the thickness after drying to be 50 μm by using a roll coater, a resin film for an interlaminar resin insulating layer was produced by means of drying at 80 to 120° C. for 10 minutes.

B. Production of a Resin Film b (for Outermost Layer) for an Interlaminar Resin Insulating Layer A resin film b (for outermost layer) for interlaminar resin insulating layer was produced in the same manner as the above-mentioned A, except that the addition amount of the epoxy-terminated polybutadiene was changed to be 12 parts by weight and the addition amount of the finely pulverized silica was changed to be 4 parts by weight.

C. Preparation of a Resin Filler

A resin filler was prepared in the same manner as Example 7.

D. Manufacture of a Multilayered Printed Circuit Board (1) A copper-clad laminate plate composed of an insulating substrate 61 which is made of a 0.8 mm-thick glass epoxy resin or BT resin with a 18 μm-thick copper foil 68 laminated on both sides of an insulating substrate 61 was used as a starting material (reference to FIG. 25 (a)). At first, the copper-clad laminate plate was etched in under-level conductor circuit patterns to form underlevel conductor layers 64 on both faces of the substrate (reference to FIG. 25 (b)).

(2) The substrate 61 on which the under-level conductor circuits 64 was formed was washed with water and dried and then subjected to blackening treatment using an aqueous solution containing NaOH (10 g/l), NaClO$_2$ (40 g/l), Na$_3$PO$_4$ (6 g/l) as a blackening bath (oxidizing bath) and reducing treatment using an aqueous solution containing NaOH (10 g/l) and NaBH$_4$ (6 g/l) as a reducing bath to form roughened surface (not illustrated) on the surface of the under-level conductor circuits 64.

Figure 25:
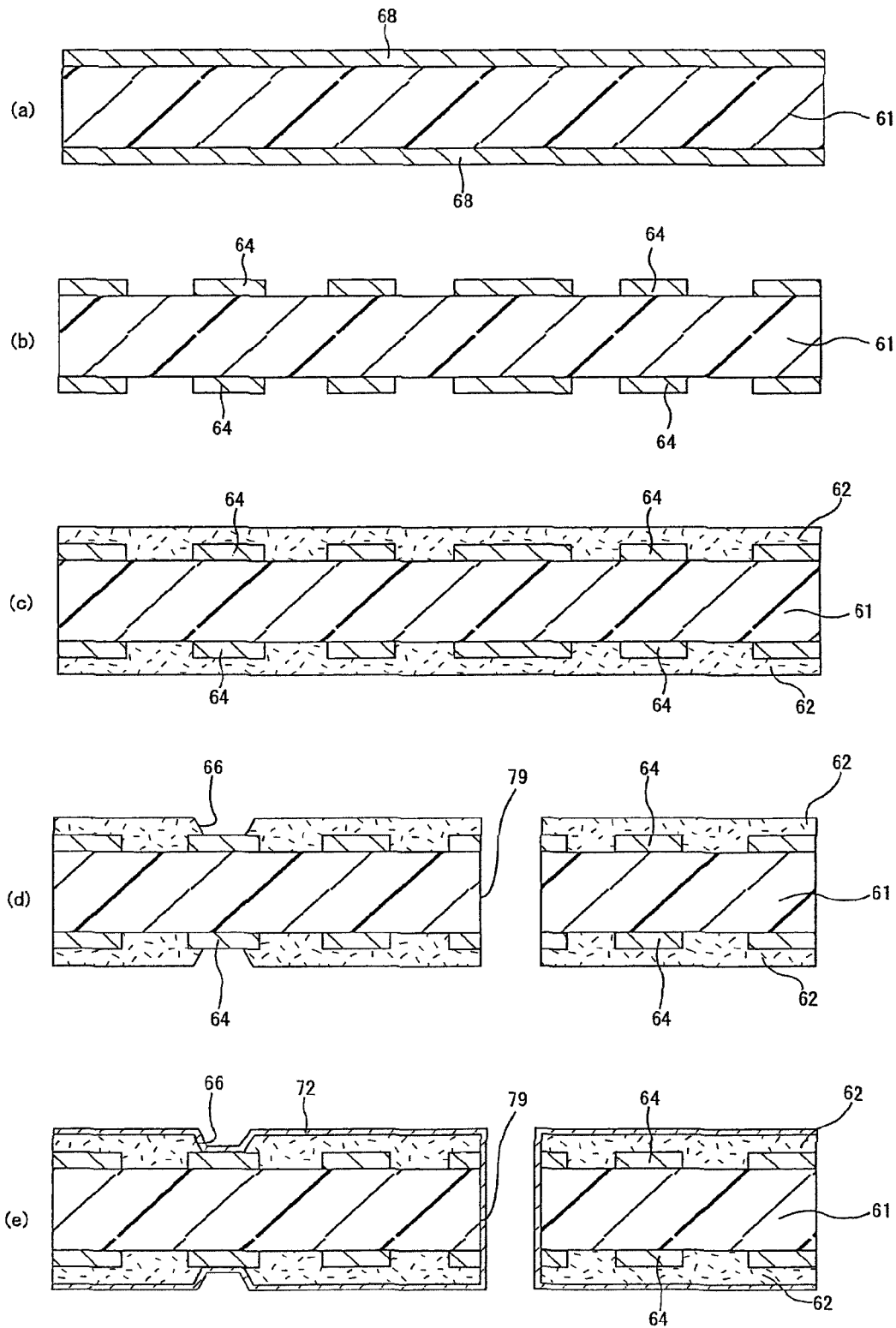
FIGS. 25 (a) to (e) are cross-section figures schematically showing a part of manufacturing processes of a multilayered printed circuit board of the present invention.

(3) Next, the resin film a for interlaminar resin insulating layers produced in the above-mentioned A was attached by vacuum pressure lamination at 0.5 MPa while the temperature being increased from 50 to 150° C. to form interlaminar resin insulating layers 62 (reference to FIG. 25 (c)). In addition, the coefficient of liner expansion of the interlaminar resin insulating layer 62 formed in this process was 112 ppm/° C.

Further, through holes 79 with a diameter of 300 μm was formed on the substrate 61 bearing the interlaminar resin insulating layers 62 was formed by drilling.

(4) Next, a 1.2 mm-thick mask having through holes was put on the interlaminar resin insulating layers 62 and openings 66 for via-holes with a diameter of 80 μm were formed on the interlaminar resin insulating layers 62 under the conditions of 4.0 mm beam diameter, a top hat mode, 8.0μ second pulse width, 1.0 mm diameter of the through holes of the mask, and one shot by CO$_2$ gas laser with wavelength of 10.4 μm (reference to FIG. 25 (d)).

(5) Further, the substrate on which the openings 66 for via-holes were formed was immersed in a solution containing 60 g/l of permanganic acid at 80° C. for 10 minutes to carry out desmear treatment for the wall face of the through holes 79 and to dissolve and remove the epoxy resin particle existing on the surface of the interlaminar resin insulating layers 62 so as to form roughened surface (not illustrated) including the inner wall faces of the openings 66 for via-holes on the surface.

(6) Next, the substrate subjected to the above-mentioned treatment was immersed in a neutralization solution (made by Shiplay Co., Inc.) and washed with water.

Further, a palladium catalyst was supplied to the surface of the substrate subjected to the surface roughening treatment (the roughening depth 3 μm), so that the catalyst core adhered to the surface of the interlaminar resin insulating layers 62 (including the inner wall faces of the openings 66 for via-holes) and the wall faces of the through holes 79 (not illustrated). That is, the above-mentioned substrate was immersed in a catalyst solution containing palladium chloride (PdCl$_2$) and stannous chloride (SnCl$_2$) to deposit palladium metal so as to supply the catalyst.

(7) Next, the substrate was immersed in an electroless copper plating aqueous solution at 34° C. to form thin film conductor layers 72 with a thickness of 0.6 to 3.01 on the surface of the interlaminar resin insulating layers 62 (including the inner wall faces of the openings 66 for the via-holes) and the wall faces of the through holes 79 (reference to FIG. 25 (e)). Incidentally as the electroless copper plating solution, the same aqueous solution as the electroless copper plating solution employed in the process (10) of Example 7 was employed.

Figure 26:
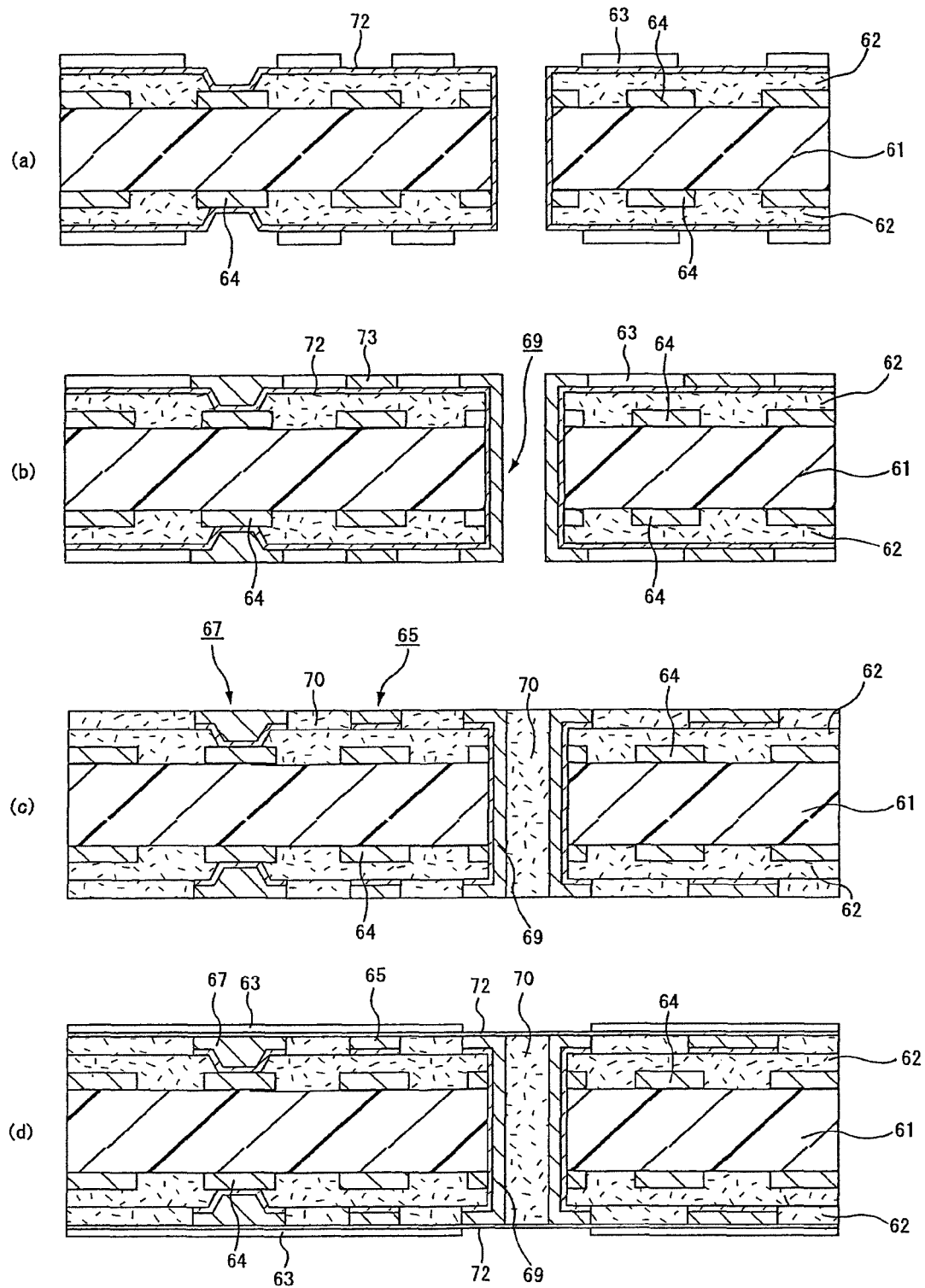
FIGS. 26 (a) to (d) are cross-section figures schematically showing a part of manufacturing processes of a multilayered printed circuit board of the present invention.

(8) Next, a commercialized photosensitive dry film was stuck to the substrate bearing the thin film conductor layers 72 were formed and a mask was put thereon and exposure with a dose of 100 mJ/cm$^2$ and development with an aqueous 0.8% sodium carbonate solution were carried out to provide a plating resist 63 (reference to FIG. 26 (a)).

(9) Next, the substrate was washed with water at 50° C. to be degreased and washed with water at 25° C. and further washed with sulfuric acid and after that, the substrate was subjected to electrolytic plating under the same conditions as the process (12) of Example 7 to form electrolytic copper plating films 73 in the non plating resist 63 formed area (reference to FIG. 26 (b)).

(10) Successively, the plating resist 63 was separated and removed with 5% KOH and after that, using an etching solution containing sulfuric acid and hydrogen peroxide, the electroless plating films which were under the plating resist 63 were etched to form a plated-through hole 69 and conductor circuits 65 (including the via-holes 67).

(11) Next, the substrate 70 in which the plated-through hole 69 and the like was formed was immersed in an etching solution to form a roughened surface (not illustrated) on the surface of the plated-through hole 69 and conductor circuits 65 (including the via-holes 67). Incidentally, as the etching solution, Meck etch bond made by Meck Co. was used.

(12) Next, after the resin filler described in the above-mentioned C was produced, the layer of the resin filler was formed inside the plated-through hole 69 and the non conductor circuit formed area and the peripheral portion of the conductor circuits 65 on the interlaminar resin insulating layers 62 by the following method within 24 hours after the preparation.

That is, at first, the resin filler was pushed in the plated-through holes using a squeegee and then dried under the conditions of 100° C. for 20 minutes. Next, using a mask having an opening corresponding to the non conductor circuit formed area and a squeegee, the layer of the resin filler was formed in the non conductor circuit formed area, which was formed as concave portions, and then dried under the conditions of 100° C. for 20 minutes.

Successively, in the same manner as the process (4) of Example 7, the surface layer part of the resin filler layers formed in the plated-through hole and in the non conductor circuit formed area and the surface of the conductor circuits 65 were made flat to form the surface of each resin filler layer 70 and each conductor circuit 65 in the same plane by the heating treatment (reference to FIG. 26 (c)).

(13) Next, a palladium catalyst (not illustrated) was supplied to the surface of the interlaminar resin insulating layers 62 and the exposed faces of the resin filler layers 70 by the same treatment as the above-mentioned (6). Next, the electroless plating treatment was carried out in the same conditions as the above-mentioned (7) to form thin film conductor layers 72 on the exposed faces of the resin filler layers 70 and the upper faces of the conductor circuits 65.

(14) Next, in the same manner as the above-mentioned (8), the plating resist 63 was provided on the thin film conductor layers 72 (reference to FIG. 26 (d)). Successively, the substrate was washed with water at 50° C. to be degreased and washed with water at 25° C. and further washed with sulfuric acid and after that, the substrate was subjected to electroplating under the following conditions to form electrolytic copper plating films 73 in the non plating resist 63 formed area (reference to FIG. 27 (a)).

[Electroplating Solution]

| | |
|---|---|
| sulfuric acid | 2.24 mol/l |
| copper sulfate | 0.26 mol/l |
| additive | 19.5 ml/l |
| (made by Atotech Japan CO., Cupracid GL) | |

[Electroplating Condition]

| | |
|---|---|
| current density | 1 A/dm² |
| time | 65 minutes |
| temperature | 22 + 2° C. |

Figure 27:
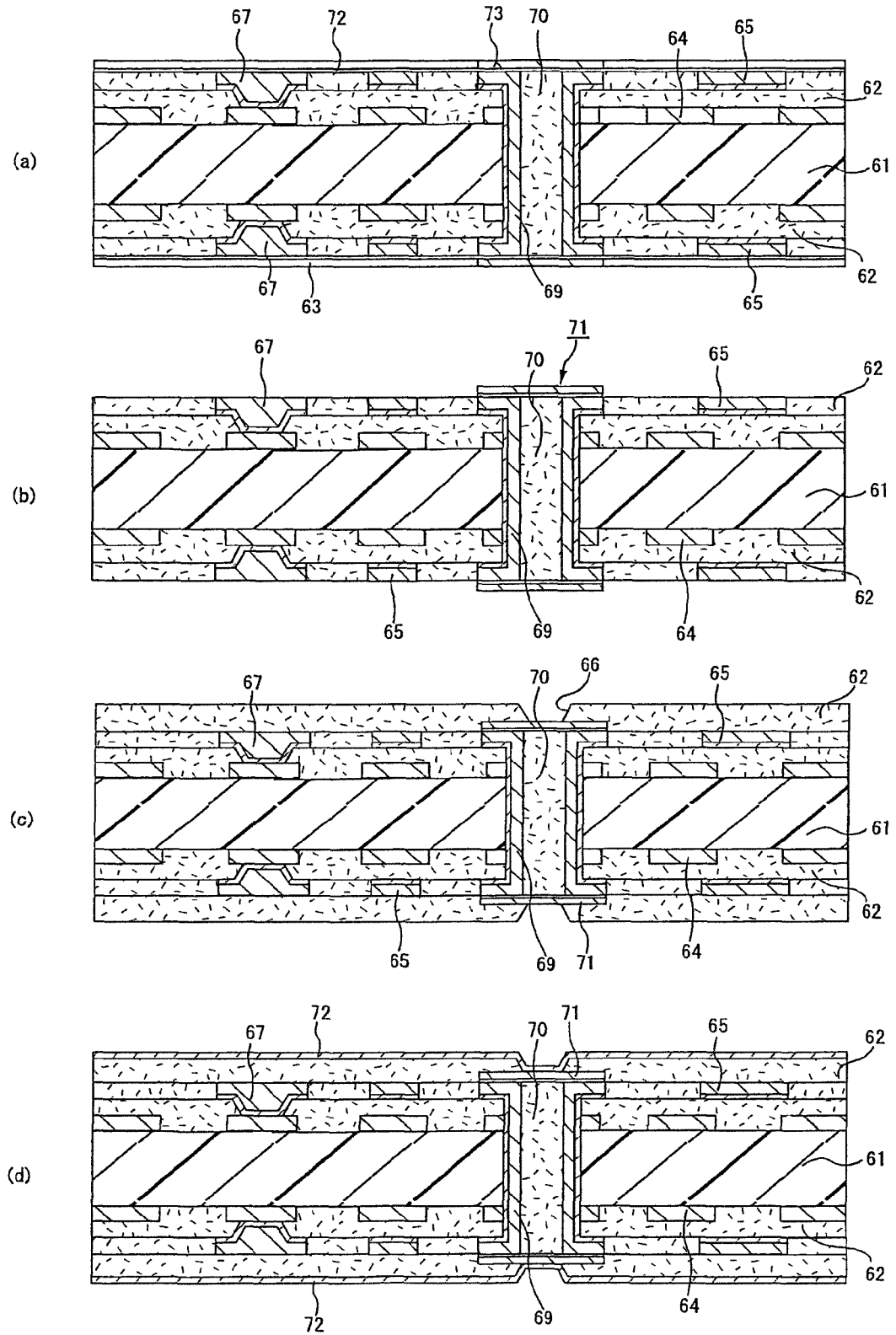
FIGS. 27 (a) to (d) are cross-section figures schematically showing a part of manufacturing processes of a multilayered printed circuit board of the present invention.
Figure 28:
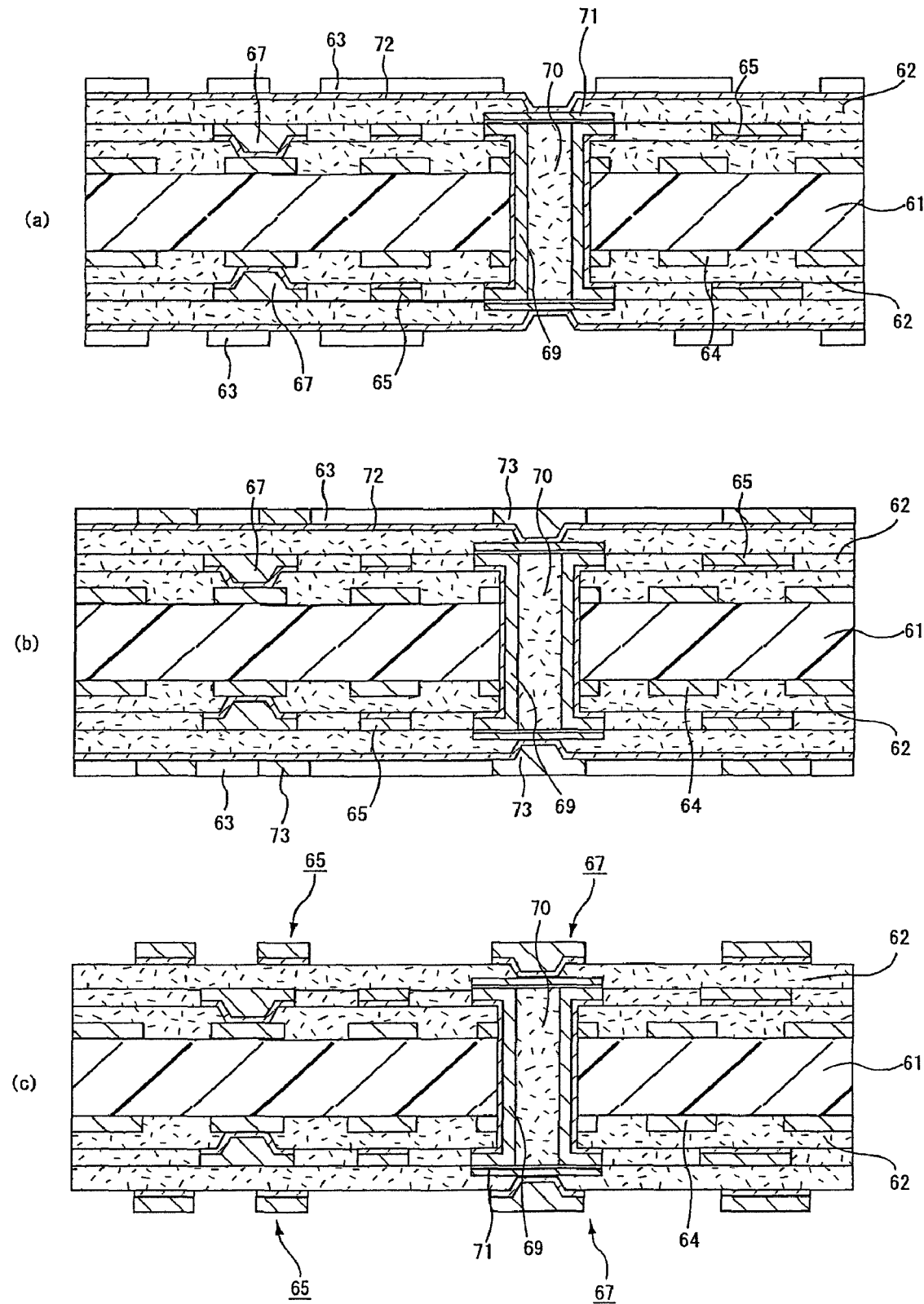
FIGS. 28 (a) to (c) are cross-section figures schematically showing a part of manufacturing processes of a multilayered printed circuit board of the present invention.
Figure 29:
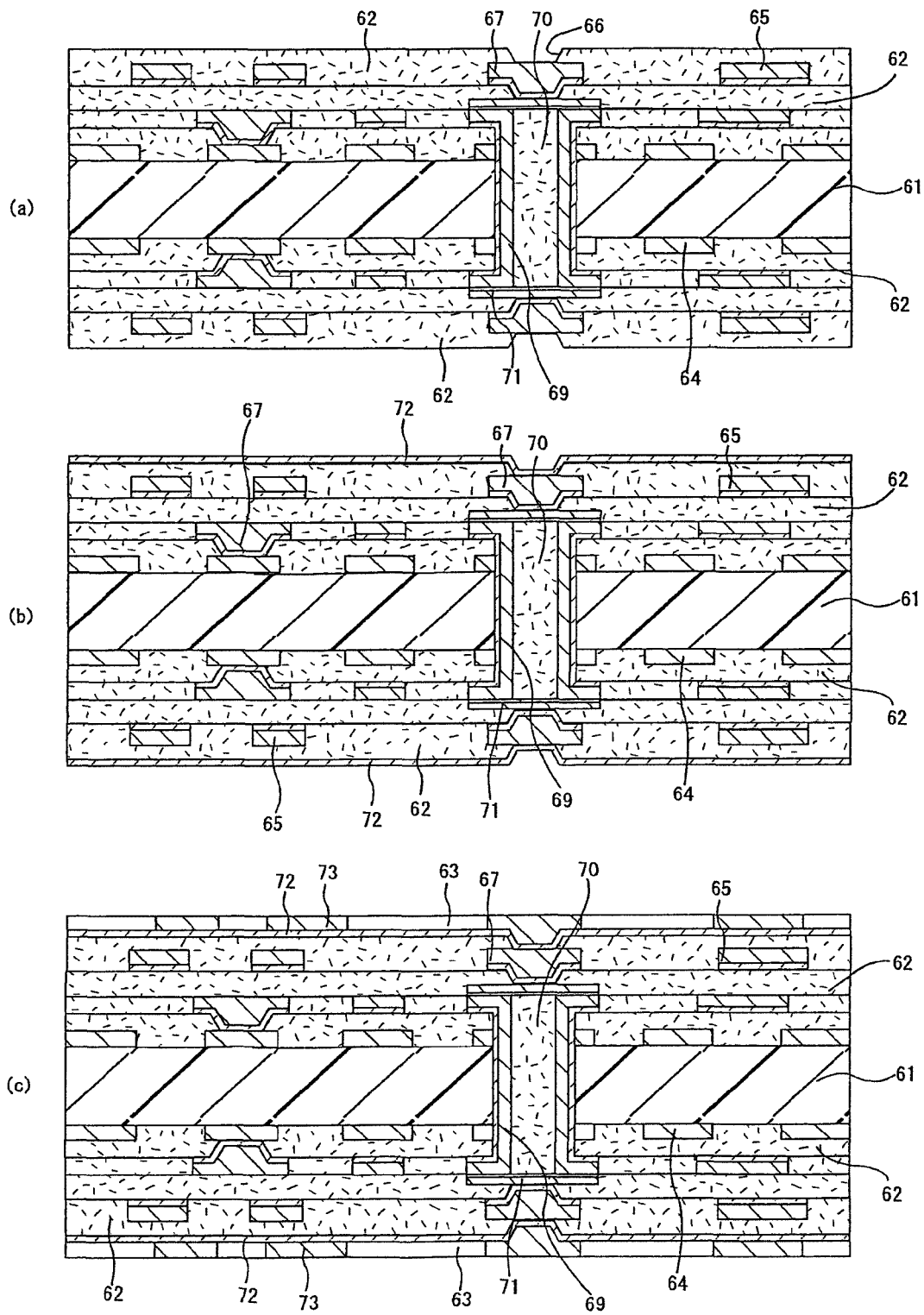
FIGS. 29 (a) to (c) are cross-section figures schematically showing a part of manufacturing processes of a multilayered printed circuit board of the present invention.

(15) Next, after the plating resist 73 was separated and removed with 5% KOH, the electroless plating film under the plating resist 73 was dissolved and removed by etching with a mixed solution of sulfuric acid and hydrogen peroxide to form a cover plating layer 71 (reference to FIG. 27 (*b*)).

(16) Next, the roughened surface (not illustrated) was formed on the surface of the cover plating layer 71 using an etching solution (Meck Etch Bond).

Figure 30:
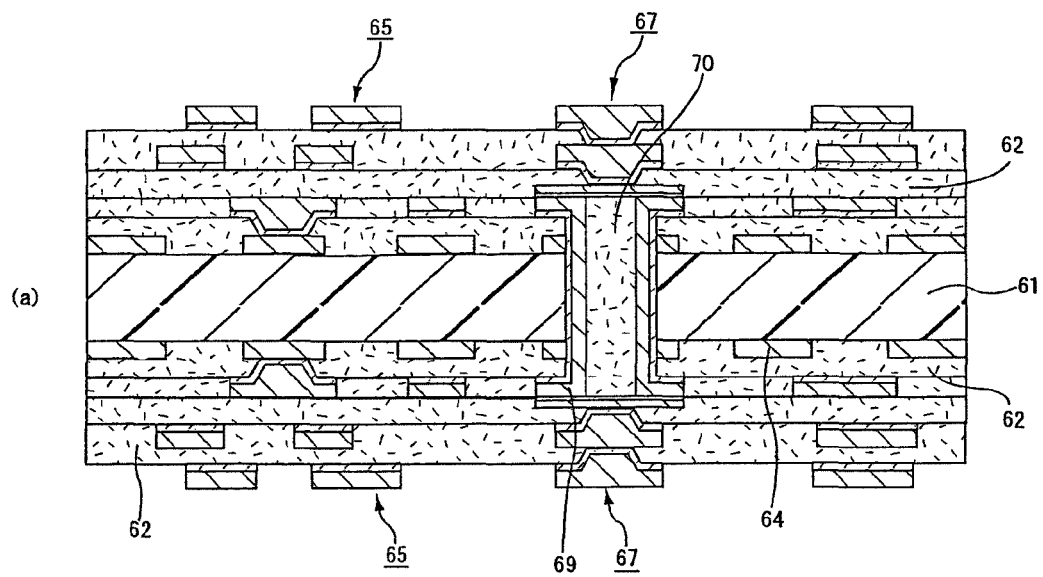
FIGS. 30 (a), (b) are cross-section figures schematically showing a part of manufacturing processes of a multilayered printed circuit board of the present invention.
Figure 30:
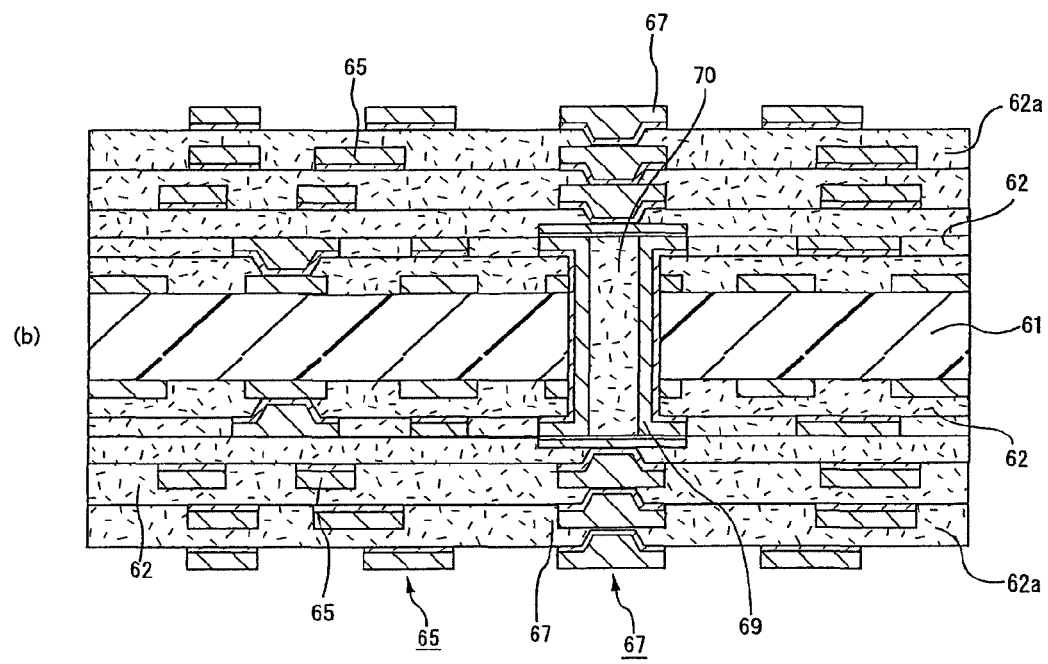

(17) Next, the above-mentioned processes (3) to (11) were repeated twice to form interlaminar resin insulating layers 62 and conductor circuits 65 (including the via-holes 67) in the further upper layer (reference to FIG. 27 (*c*) to FIG. 30 (*a*)). Incidentally, the coefficient of linear expansion of the interlaminar resin insulating layers 62 formed in this process was 112 ppm/° C.

Also, in this process, no plated-through hole was formed.

(18) Further, the above-mentioned processes (3) to (11) were repeated again to form the interlaminar resin insulating layer 62a in the outermost layer and the conductor circuits 65 (including the via-holes 67) to obtain a multilayer circuit board (reference to FIG. 30 (*b*)). Incidentally, here, in place of the resin film a for the interlaminar resin insulating layer, the resin film b for the interlaminar resin insulating layer produced in the above-mentioned B is used, and the coefficient of linear expansion of the interlaminar resin insulating layer 62a in the outermost layer formed in this process was 60 ppm/° C. Incidentally, in this process, no plated-through hole was formed.

Figure 31:
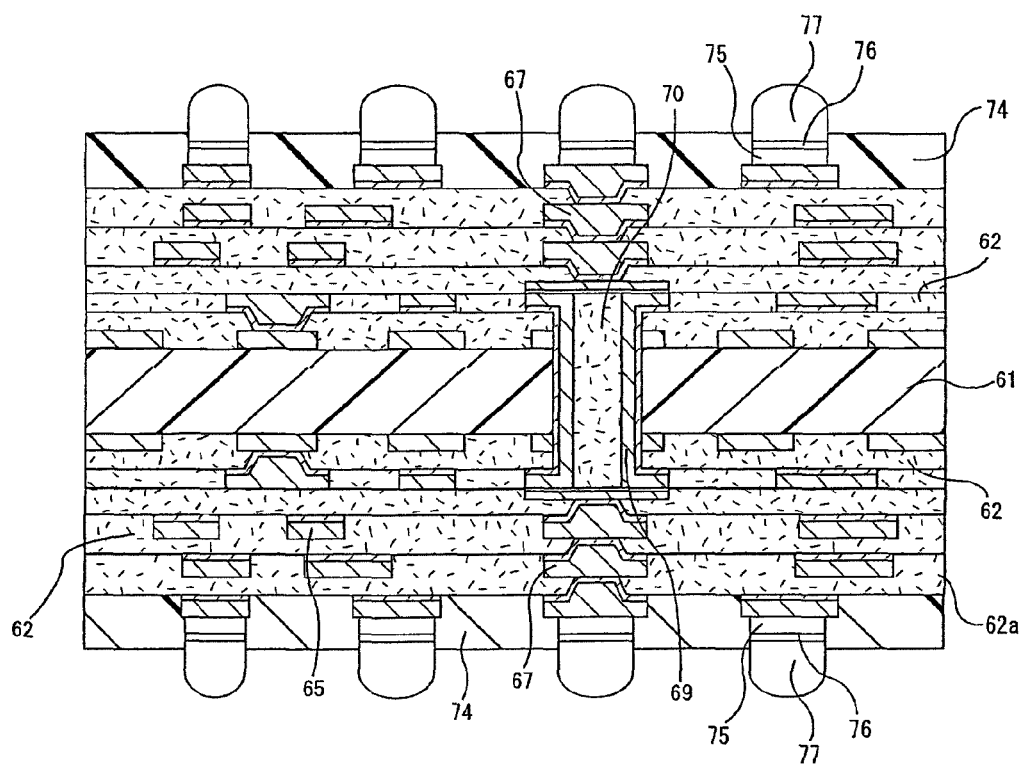
FIG. 31 is a cross-section figure schematically showing a part of manufacturing processes of a multilayered printed circuit board of the present invention.

(19) Next, in the same manner as the processes (18) to (21) of Example 7, a multilayered printed circuit board comprising solder bumps was obtained (reference to FIG. 31).

Example 9

A multilayered printed circuit board was manufactured in the same manner as Example 8, except that the resin film b for the interlaminar resin insulating layer produced in the B of Example 8 was used in place of the resin film a for the interlaminar resin insulating layer produced in the A of Example 8 at the time of the resin film adhesion in the processes (3), (17).

Accordingly, the coefficient of linear expansion of all of the interlaminar resin insulating layers was 60 ppm/° C. in the multilayered printed circuit board produced in the present example.

Example 10

A multilayered printed circuit board was manufactured in the same manner as Example 8, except that the resin film c for the interlaminar resin insulating layer produced by the following method was used in place of the resin film b for the interlaminar resin insulating layer in the process (18) of Example 8. In the multilayered printed circuit board produced in the present example, the coefficient of linear expansion of the interlaminar resin insulating layer in the outermost layer was 100 ppm/° C.

Production of Resin Film c (for Outermost Layer) for Interlaminar Resin Insulating Layer The resin film c for interlaminar resin insulating layer was produced in the same manner as the A of Example 8 (Production of resin film a), except that 10 parts by weight of an epoxy resin particle with a particle diameter of 0.5 μm was added in place of 2 parts by weight of the finely pulverized silica.

Example 11

A multilayered printed circuit board was manufactured in the same manner as Example 8, except that the resin film d for the interlaminar resin insulating layer produced by the following method was used in place of the resin film b for the interlaminar resin insulating layer in the process (18) of Example 8. Incidentally, in the multilayered printed circuit board manufactured in the present example, the coefficient of linear expansion of the interlaminar resin insulating layer in the outermost layer was 30 ppm/° C.

Production of Resin Film d (for Outermost Layer) for Interlaminar Resin Insulating Layer The resin film d for interlaminar resin insulating layer was produced in the same manner as the A (Production of resin film a for interlaminar resin insulating layer) of Example 8, except that the addition amount of the finely pulverized silica was changed to be 8 parts by weight.

Example 12

A multilayered printed circuit board was manufactured in the same manner as Example 2, except that the resin film e for the interlaminar resin insulating layer produced by the following method was used in place of the resin film b for the interlaminar resin insulating layer in the process (18) of Example 8. Incidentally, in the multilayered printed circuit board manufactured in the present example, the coefficient of linear expansion of the interlaminar resin insulating layer in the outermost layer was 90 ppm/° C.

Production of Resin Film e (for Outermost Layer) for Interlaminar Resin Insulating Layer The resin film e for interlaminar resin insulating layer was produced in the same manner as the A (Production of resin film a for interlaminar resin insulating layer) of Example 8, except that the addition amount of the finely pulverized silica was changed to be 3 parts by weight.

Regarding the multilayered printed circuit boards obtained in Example 7 to 12, the shape observation of the interlaminar resin insulating layers, the cross-sections of the via-holes having the stack-via structure and an electric continuity test before and after a heat cycle test were carried out.

As a result, in the multilayered printed circuit boards of Example 7 to 12, no short circuit and disconnection was found out before and after carrying out the heat cycle test to show excellent electric communication state. Further, in the cross-section shape observation, the occurrence of cracking in all of the interlaminar resin insulating layers including the interlaminar resin insulating layer of the outermost layer and the occurrence of separation of the interlaminar resin insulating layers and the via-holes were not observed.

Example 13

A. Preparation of a Photosensitive Resin Composition A

The photosensitive resin composition A was prepared in the same manner as Example 7.

B. Preparation of a Photosensitive Resin Composition B

The photosensitive resin composition B was prepared in the same manner as Example 7.

C. Preparation of a Resin Filler

The resin filler was prepared in the same manner as Example 7.

D. Method for a Manufacturing Printed Circuit Board (1) A copper-clad laminate plate composed of a substrate 81 which is made of a 0.8 mm-thick glass epoxy resin or BT (bismaleimide triazine) resin with a 18 µm-thick copper foil 88 laminated on both sides of the substrate 81 was used as a starting material (reference to FIG. 34 (*a*)). At first, the copper-clad laminate plate was drilled to bore holes and electroless plating treatment was carried out and then pattern etching was carried out to form underlevel conductor layers 84 on both faces of the substrate 81 and a plated-through hole 89 (reference to FIG. 34 (*b*)).

(2) The substrate in which the plated-through hole 89 and the underlevel conductor layers 84 were formed was washed with water and dried, and then subjected to blackening treatment using an aqueous solution containing NaOH (10 g/l), $NaClO_2$ (40 g/l), $Na_3PO_4$ (6 g/l) as a blackening bath (oxidizing bath) and reducing treatment using an aqueous solution containing NaOH (10 g/l) and $NaBH_4$ (6 g/l) as a reducing bath to form roughened surface (not illustrated) on the entire surface of the underlevel conductor layers 84 including the plated-through hole 89.

(3) Next, after the resin filler described in the above-mentioned C was prepared, the layer 90' of the resin filler was formed inside of the plated-through hole 89 and in the non conductor circuit formed area and the peripheral portion of the underlevel conductor layers 84 of the substrate 81 by the following method within 24 hours after the production of the resin filler.

That is, at first, the resin filler was pushed in the plated-through hole using a squeegee and then dried under the conditions of 100° C. for 20 minutes. Next, a mask having an opening corresponding to the non conductor circuit formed area was put on the substrate and the layer 90' of the resin filler was formed in the non conductor circuit formed area, which was concave portions, using a squeegee and then dried under the conditions of 100° C. for 20 minutes (reference to FIG. 34 (*c*)).

(4) One face of the substrate subjected to the above-mentioned treatment (3) was grinded by a belt sander grinding using #600 belt abrasive paper (made by Sankyo Rikagaku Co., Ltd.) so as not to leave the resin filler in the surface of the underlevel conductor layers 84 and the land surface of the plated-through hole 89 and then, buffing was carried out to remove the scratches by the above-mentioned belt sander grinding. A series of such grinding steps were carried out for the other face of the substrate in the same manner.

Next, heating treatment at 100° C. for 1 hour and at 150° C. for 1 hour was carried out to form a resin filler layer 90.

Figure 34:
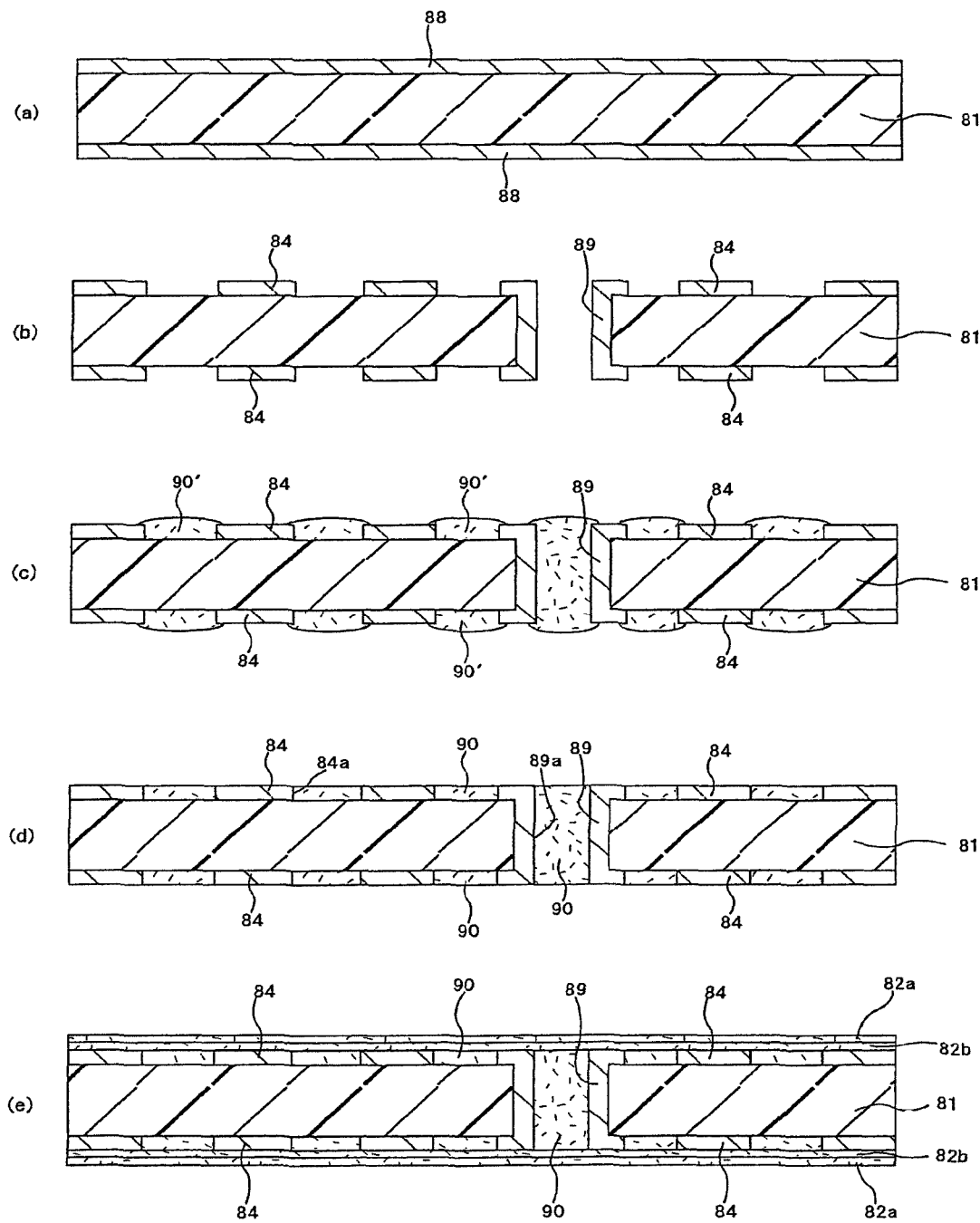
FIGS. 34 (a) to (e) are cross-section figures schematically showing a part of manufacturing processes of a multilayered printed circuit board of the present invention.

In such a manner, the surface layer part of the resin filler layer 90 formed in the plated-through hole 9 and the non conductor circuit formed area and the surface of the underlevel conductor layers 84 were made flat, the resin filler layer 90 and the side faces 84*a* of the underlevel conductor layers 84 were firmly stuck to each other through the roughened surface and also the inner wall faces 89*a* of the plated-through hole 89 and the resin filler layer 90 were firmly stuck to each other through the roughened surface to obtain an insulating substrate (reference to FIG. 34 (*d*)). That is, by this process, the surface of the resin filler layer 90 and the surface of the underlevel conductor layers 84 were in the same plane face.

(5) After the above-mentioned substrate was washed with water and degreased with an acid, soft etching was carried out and then, an etching solution was sprayed on both faces of the substrate to etch the surface of the underlevel conductor layers 84 and the land surface of the plated-through hole 89 to form a roughened surface (not illustrated) on the entire surface of the underlevel conductor layers 84. Incidentally, as the etching solution, an etching solution (made by Meck Co.; Meck etch bond) containing 10 parts by weight of an imidazole copper(II) complex and 7 parts by weight of glycolic acid, and 5 parts by weight of potassium chloride was used.

(6) Next, the photosensitive resin composition B (viscosity: 1.5 Pa·s) prepared in the above-mentioned B was applied to both faces of the substrate by a roll coater within 24 hours after the preparation and left in horizontal state for 20 minutes and then dried (pre-baked) at 60° C. for 30 minutes. Successively, the photosensitive resin composition A (viscosity: 7 Pa·s) prepared in the above-mentioned A was applied by a roll coater within 24 hours after the preparation and left in horizontal state for 20 minutes, and then dried (pre-baked) at 60° C. for 30 minutes to form resin layers comprising two layers 82*a*, 82*b*, in half-cured state, (reference to FIG. 34 (*e*)).

(7) Next, a photomask film in which black circles with a diameter of 80 µm were printed was firmly attached to both faces of the substrate bearing the resin layers 82*a*, 82*b* in half-cured state and after exposure with a dose of 500 mJ/cm$^2$ was carried out using an ultrahigh pressure mercury lamp, spray development was carried out using DMDG solution. After that, the resulting substrate was further subjected to exposure with a dose of 3000 mJ/cm$^2$ using an ultrahigh pressure mercury lamp and heating treatment at 100° C. for 1 hour, at 120° C. for 1 hour, and at 150° C. for 3 hours to form interlaminar resin insulating layers 82 comprising 2 layers having openings 86 with excellent size precision for the via-holes with a diameter of 80 µm corresponding to those of the photomask film (reference to FIG. 35 (*a*)).

(8) Further, the substrate in which the openings 86 for via-holes was immersed in a solution containing 60 g/l of permanganic acid at 80° C. for 10 minutes to dissolve and remove the epoxy resin particle existing on the surface of the interlaminar resin insulating layers 82 to be a roughened surface (not illustrated) of the interlaminar resin insulating layers 82 including the inner walls of the openings 86 for via-holes.

(9) Next, the substrate subjected to the above-mentioned treatment was immersed in a neutralization solution (made by Shiplay Co., Inc.) and washed with water.

Further, a palladium catalyst (made by Atotech Japan CO.) was supplied to the surface of the substrate subjected to the surface roughening treatment (the roughening depth 3 µm), so that the catalyst core adhered to the surface of the interlaminar resin insulating layers 82 and the inner wall faces of the openings 86 for via-holes.

Figure 35:
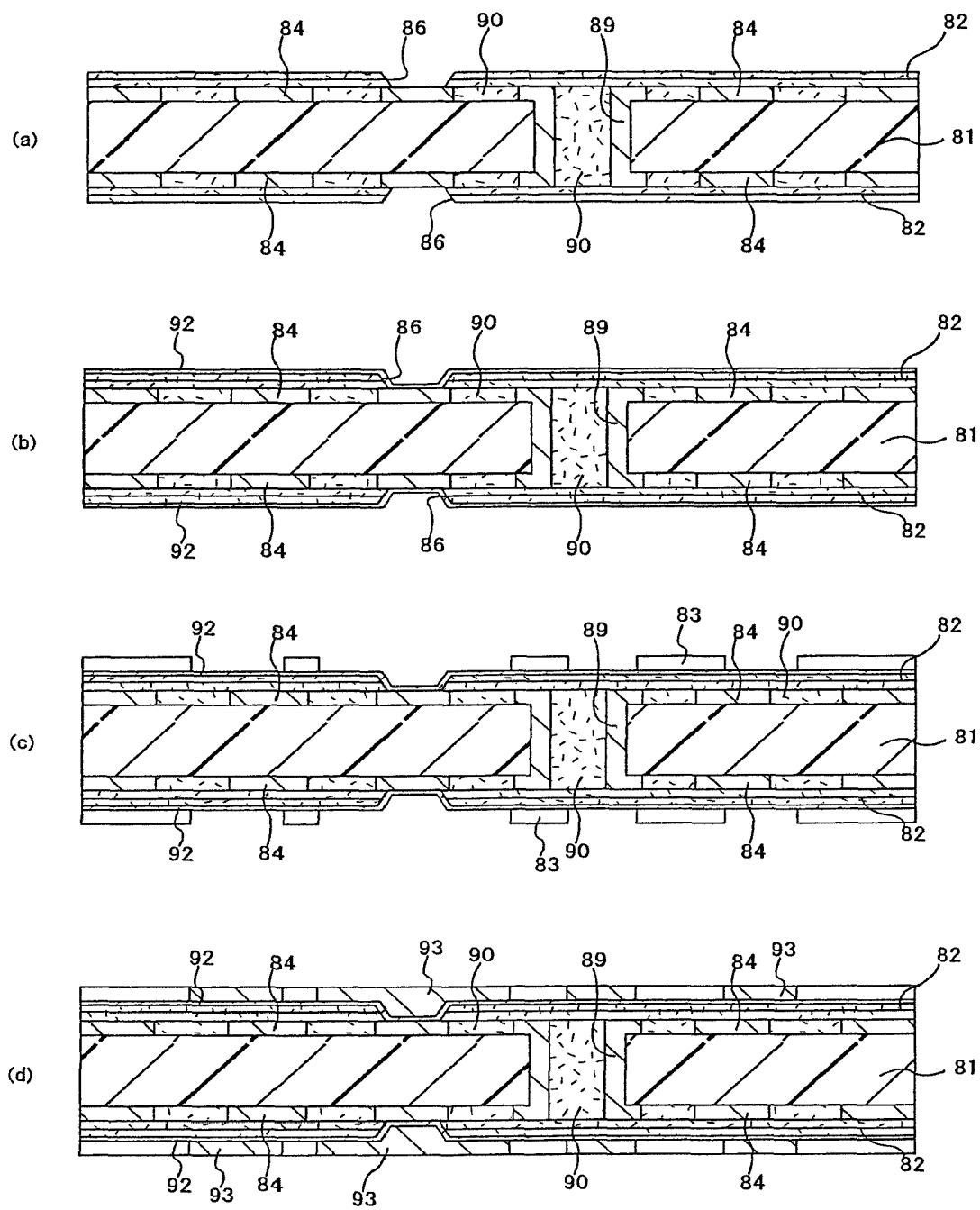
FIGS. 35 (a) to (d) are cross-section figures schematically showing a part of manufacturing processes of a multilayered printed circuit board of the present invention.

(10) Next, the substrate was immersed in an electroless copper plating aqueous solution having the following composition to form thin film conductor layers 92 with a thickness of 0.6 to 3.0 µm on the entire roughened surface (reference to FIG. 35 (*b*)).

[Electroless Plating Solution]

| | |
|---|---|
| $NiSO_4$ | 0.003 mol/l |
| tartaric acid | 0.200 mol/l |
| copper sulfate | 0.030 mol/l |
| HCHO | 0.050 mol/l |
| NaOH | 0.100 mol/l |
| $\alpha,\alpha'$-bipyridyl | 40 mg/l |
| polyethylene glycol (PEG) | 0.10 g/l |

[Electroless Plating Condition]
at 35° C. liquid temperature for 40 minutes

(11) Next, a commercialized photosensitive dry film was stuck to the thin film conductor layers 92 and a mask was put thereon and exposure with a dose of 100 mJ/cm² and development treatment with an aqueous 0.8% sodium carbonate solution were carried out to form a plating resist 83 (reference to FIG. 35 (*c*)).

(12) Next, the substrate was washed with water at 50° C. to be degreased and washed with water at 25° C. and further washed with sulfuric acid and after that the substrate was subjected to electrolytic copper plating under the following conditions to form electrolytic copper plating layers 93 (reference to FIG. 35 (*d*)).

[Electroplating Solution]

| | |
|---|---|
| $CuSO_4 \cdot 5H_2O$ | 210 g/l |
| sulfuric acid | 150 g/l |
| $Cl^-$ | 40 mg/l |
| polyethylene glycol | 300 mg/l |
| bisdisulfide | 100 mg/l |

[Electroplating Condition]

| | |
|---|---|
| current density | 1.0 A/dm² |
| time | 60 minutes |
| temperature | 25° C. |

(13) Successively, the plating resist 83 was separated and removed in an aqueous 40 g/l NaOH solution at 50° C. After that, heating treatment at 150° C. for 1 hour was carried out for the substrate, and using an etching solution containing an aqueous sulfuric acid-hydrogen peroxide solution, the thin film conductor layers which were under the plating resist were removed to form independent conductor circuits 85 and via-holes 87 with a filled via shape (reference to FIG. 36 (*a*)). Incidentally, the diameter (in FIG. 36 (*a*), shown as d) of the non land parts of the via-holes 87 formed in this process was 80 μm.

Figure 36:
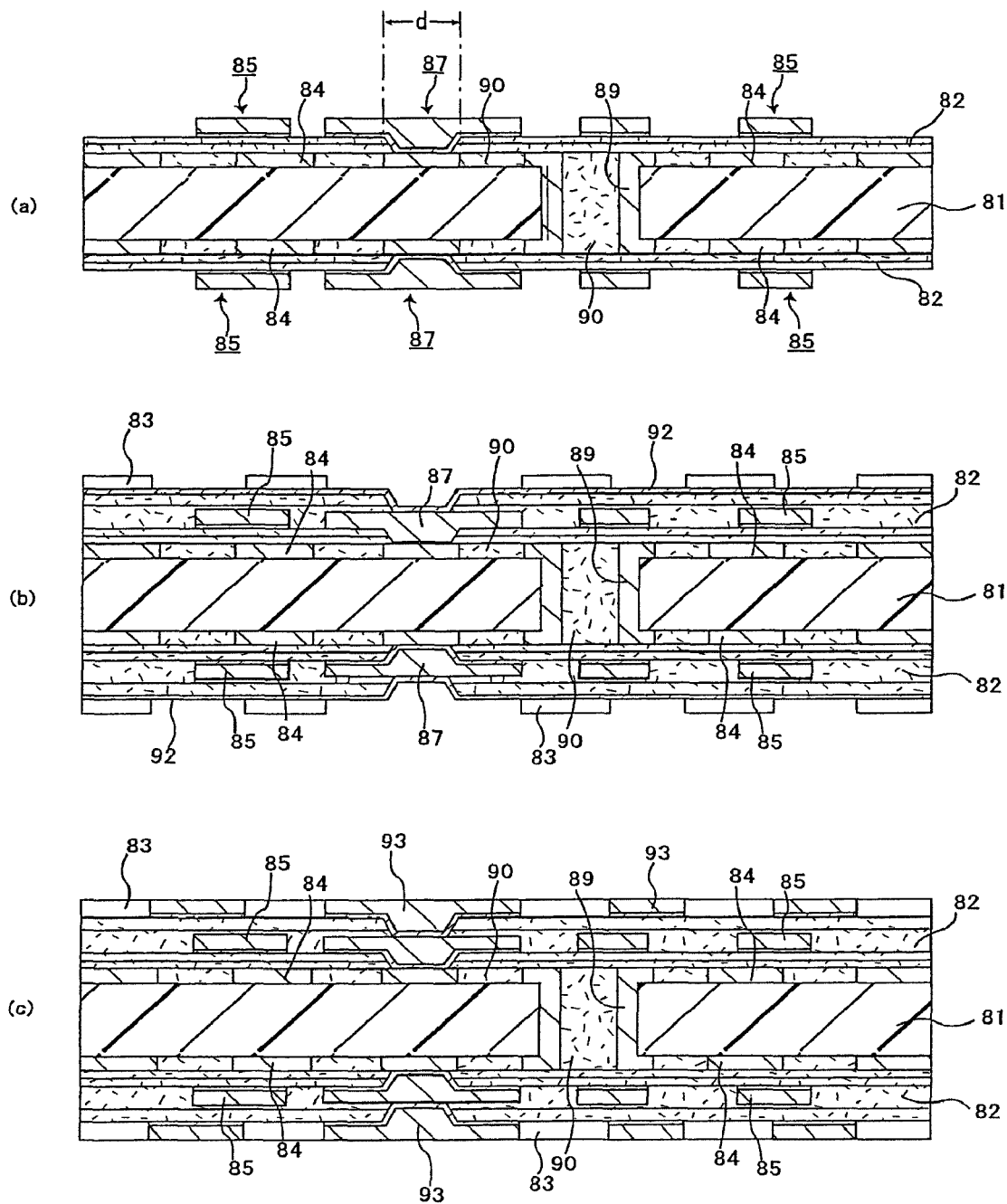
FIGS. 36 (a) to (c) are cross-section figures schematically showing a part of manufacturing processes of a multilayered printed circuit board of the present invention.
Figure 37:
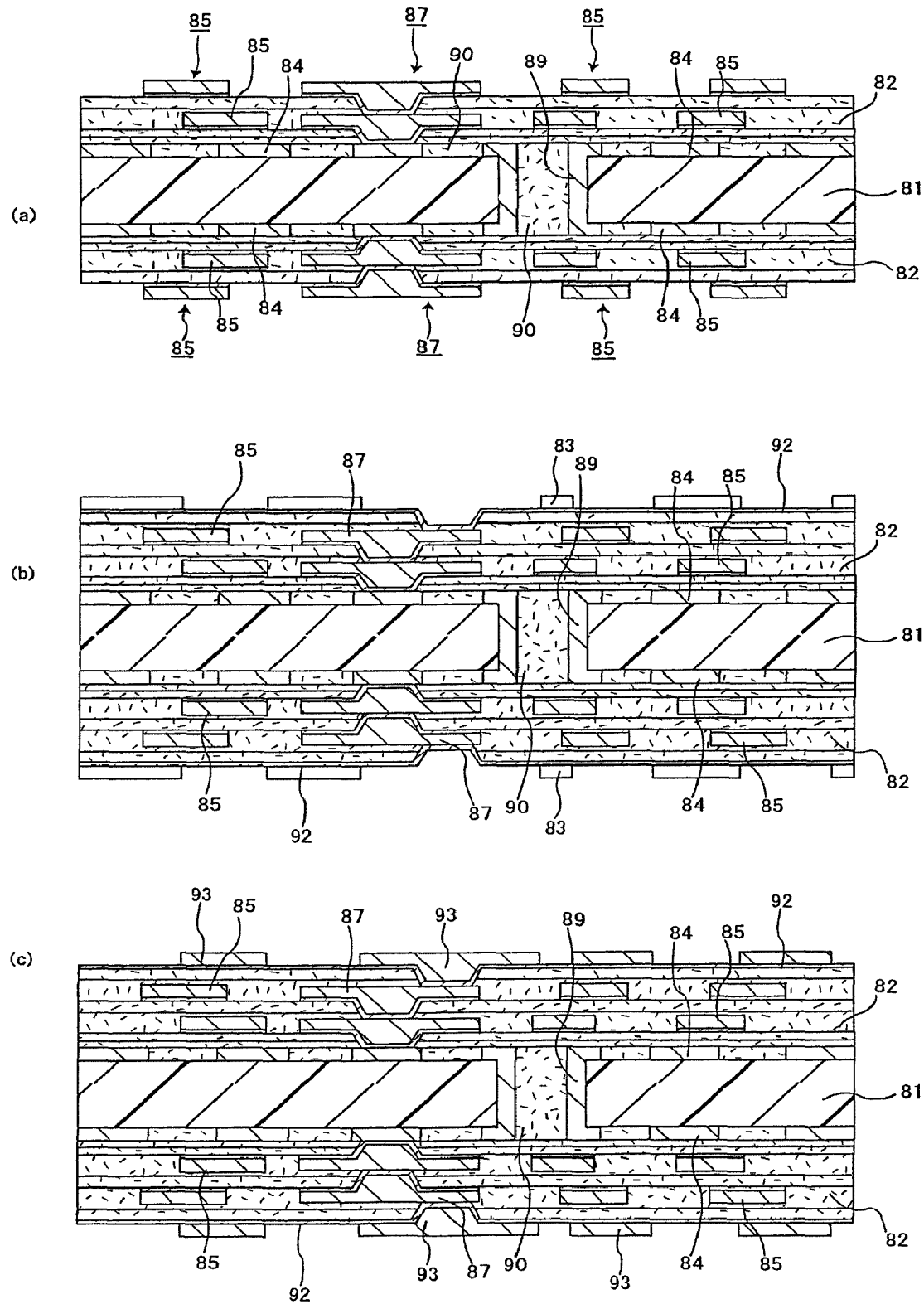
FIGS. 37 (a) to (c) are cross-section figures schematically showing a part of manufacturing processes of a multilayered printed circuit board of the present invention.

(14) Next, the above-mentioned processes (5) to (13) were repeated to form interlaminar resin insulating layers 82 and independent conductor circuits 85 in further upper layers and thus, independent conductor circuits 85 and via-holes 87 with the filled via shape were formed (reference to FIG. 36 (*b*) to FIG. 37 (*a*)).

In this process, the formation positions of the openings for via-holes were adjusted so as to pile the via-holes while their centers being approximately overlapped on one another.

(15) Further, the above-mentioned processes (5) to (13) were repeated to form interlaminar resin insulating layers 82, independent conductor circuits 85 and via-holes 87 with the filled via shape in further upper layers (reference to FIG. 37 (*b*) to FIG. 37 (*c*)).

In this process, the formation positions of the openings for via-holes were adjusted so as to pile the via-holes while their centers being shifted from those in underlevel layers. Incidentally, the distance between the outer rim of the bottom face of the via-hole (the via-hole in the third level) formed in this process and the outer rim of the non land part of the via-hole in the under level layer (the via-hole in the second level) was 5 μm.

Figure 38:
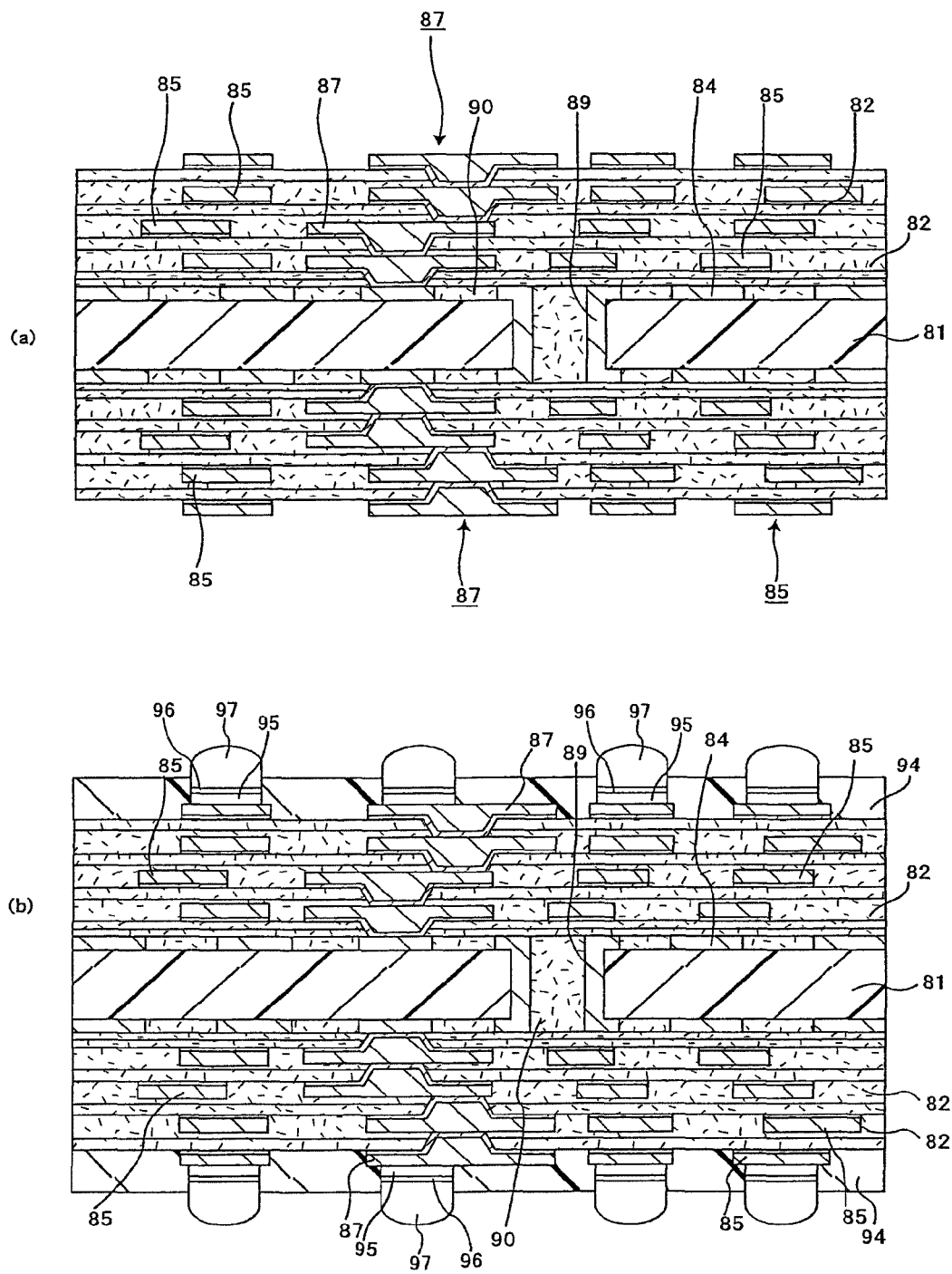
FIGS. 38 (a), (b) are cross-section figures schematically showing a part of manufacturing processes of a multilayered printed circuit board of the present invention.

(16) Further, the above-mentioned processes (5) to (13) were repeated again to form interlaminar resin insulating layers 82, independent conductor circuits 85 and via-holes 87 with the filled via shape in further upper layers (reference to FIG. 38 (*a*)).

In this process, the formation positions of the openings for via-holes were adjusted so as to pile the via-holes while the center being approximately overlapped with the via-holes in the under level.

(17) Next, a container was loaded with: 46.67 parts by weight of an oligomer provided with a photosensitivity (molecular weight: 4000) obtained by acrylating 50% of an epoxy group of cresol novolak type epoxy resin (made by Nippon Kayaku Co., Ltd.), dissolved in diethylene glycol dimethyl ether (DMDG) to be 60% by weight concentration; 15.0 parts by weight of bisphenol A type epoxy resin (trade name: Epikote 1001 made by Yuka Shell Epoxy Co.) dissolved in methyl ethyl ketone to be 80% by weight concentration; 1.6 parts by weight of imidazole curing agent (trade name: 2E4MZ-CN made by Shikoku Chemicals Corp.); 3.0 parts by weight of a polyvalent acrylic monomer, which was a photosensitive monomer (trade name: R604, made by Nippon Kayaku Co., Ltd.); 1.5 parts by weight of a similarly polyvalent acrylic monomer (trade name: DPE 6 A made by Kyoei Chemical Co., Ltd.); and 0.71 parts by weight of the dispersion type defoaming agent (made by San Nopco Ltd., S-65), and they were stirred and mixed to prepare the mixed composition. Then, to the mixed composition, 2.0 parts by weight of benzophenone (made by Kanto Chemical Co., Inc.) as a photopolymerization initiator and 0.2 parts by weight of Michler's ketone (made by Kanto Chemical Co., Inc.) as a photosensitizer were added to obtain a solder resist composition with a viscosity of 2.0 Pa·s at 25° C. Incidentally, the viscosity measurement was carried out using a rotor No. 4 in the case at 60/min⁻¹ (rpm) and a rotor No. 3 in the case at 4.6/min⁻¹ (rpm) using a B-type viscometer (made by Tokyo Instruments Co. Ltd., DVL-B type).

(18) Next, the above-mentioned solder resist composition was applied in 20 μm thickness to both faces of the multilayered printed circuit board and dried under conditions of 70° C. for 20 minutes and 70° C. for 30 minutes and then, a 5 mm-thick photomask drawing a pattern corresponding to the solder pad was closely stuck to the solder resist layers, followed by the exposure to UV rays of 1000 mJ/cm² dose and development with the DMTG solution to form openings with diameter of 80 μm.

Further, the solder resist layers were cured by carrying out heating treatment under the respective conditions of 80° C. for 1 hour, 100° C. for 1 hour, 120° C. for 1 hour, and 150° C. for 3 hours to form 20 μm-thick solder resist layers 14 having a openings for forming the solder bumps.

(19) Next, the substrate bearing the solder resist layers 94 was immersed in an etching solution containing sodium persulfate as a main component for 1 minute to form roughened surfaces (not illustrated) with an average roughness (Ra) of 1 μm or less in the conductor circuit surface.

Further, the resulting substrate was immersed in an electroless nickel plating solution having pH 4.5 and containing nickel chloride (2.3×10⁻¹ mol/l), sodium hypophosphite ($2.8 \times 10^{-1}$ mol/l), and sodium citrate ($1.6 \times 10^{-1}$ mol/l) for 20 minutes to form a 5 μm-thick nickel plating layer 95 in the openings. Further, the obtained substrate was immersed in an electroless gold plating solution containing potassium cyanoaurate ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) under the conditions of 80° C. for 7.5 minutes to form a 0.03 μm-thick gold plating layer 96 on the nickel plating layer 95 and form solder pads.

(20) After that, a mask was put on the solder resist layer 94 and a solder paste was printed in the openings for the solder bumps using a piston type pressure injection type printer. After that, the solder paste was subjected to reflow at 250° C. and further to flux-washing to obtain a multilayered printed circuit board comprising the solder bumps 97 (reference to FIG. 38 (*b*)).

Incidentally, the coefficient of linear expansion of the interlaminar resin insulating layers of the multilayered printed circuit board produced in the present example was 70 ppm/° C.

Example 14

A. Production of a Resin Film of an Interlaminar Resin Insulating Layer 30 parts by weight of Bisphenol A type epoxy resin (epoxy equivalent 469, Epikote 1001 produced by Yuka Sell Epoxy K.K.), 40 parts by weight of cresol novolak type epoxy resin (epoxy equivalent 215, Epichlon N-673 produced by Dainippon Ink and Chemicals, Inc.), and 30 parts by weight of phenol novolak resin containing triazine structure (phenolic hydroxy equivalent 120, Phenolite KA-7052 produced by Dainippon Ink and Chemicals, Inc.) were dissolved while being heated in 20 parts by weight of ethyl diglycol acetate and 20 parts by weight of solvent naphtha under stirring condition, followed by the addition of 12 parts by weight of epoxy-terminated polybutadiene rubber (Denalex R 45EPT produced by Nagase Chemicals Ltd.) and 1.5 parts by weight of a pulverized product of 2-phenyl-4,5-bis(hydroxymethyl) imidazole, and 4 parts by weight of a finely pulverized silica, and 0.5 parts by weight of a silicon type defoaming agent to obtain an epoxy resin composition.

After the obtained epoxy resin composition was applied to a 38 μm-thick PET film so as to adjust the thickness thereof after drying to be 50 μm by a roll coater, the resulting film was dried at 80 to 120° C. for 10 minutes to produce a resin film for an interlaminar resin insulating layer.

B. Production of a Resin Filler

The resin filler was produced in the same manner as Example 7.

C. Manufacture of a Multilayered Printed Circuit Board (1) A copper-clad laminate plate composed of an insulating substrate 121 which is made of a 0.8 mm-thick glass epoxy resin or BT resin with a 18 μm-thick copper foil 128 laminated on both sides of the insulating substrate 121 was used as a starting material (reference to FIG. 39 (*a*)). At first, the copper-clad laminate plate was pattern-etched to form underlevel conductor layers 124 on both faces of the substrate (reference to FIG. 39 (*b*)).

(2) The substrate 121 in which the underlevel conductor layers 124 were formed was washed with water and dried, and then subjected to blackening treatment using an aqueous solution containing NaOH (10 g/l), NaClO$_2$ (40 g/l), Na$_3$PO$_4$ (6 g/l) as a blackening bath (oxidizing bath) and reducing treatment using an aqueous solution containing NaOH (10 g/l) and NaBH$_4$ (6 g/l) as a reducing bath to form roughened surface (not illustrated) on the surface of the underlevel conductor layers 124.

Figure 39:
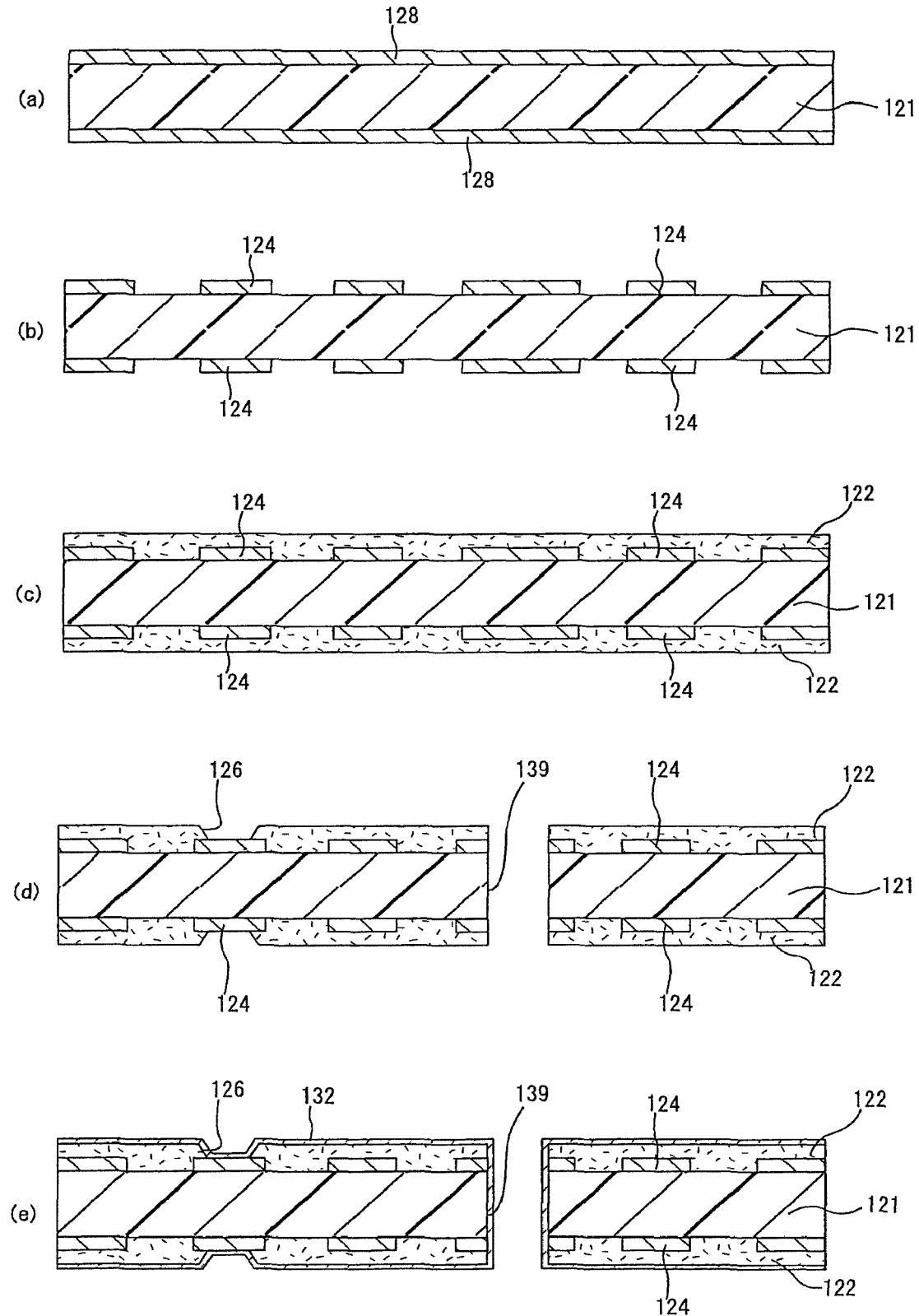
FIGS. 39 (a) to (e) are cross-section figures schematically showing a part of manufacturing processes of a multilayered printed circuit board of the present invention.

(3) Next, the resin film for interlaminar resin insulating layers produced in the above-mentioned A was laminated by vacuum pressure lamination at 0.5 MPa while the temperature being increased from 50 to 150° C. to form interlaminar resin insulating layers 122 (reference to FIG. 39 (*c*)).

Further, through holes 139 with a diameter of 300 μm were formed on the substrate 121 bearing the interlaminar resin insulating layers 122 by drilling.

(4) Next, a 1.2 mm-thick mask having through holes was put on the interlaminar resin insulating layers 122 and the interlaminar resin insulating layers 122 were treated by CO$_2$ gas laser with wavelength of 10.4 μm under the conditions of 4.0 mm beam diameter, a top hat mode, 8.0μ second pulse width, 1.0 mm diameter of the through holes of the mask, and one shot to form openings 126 for via-holes with a diameter of 80 μm (reference to FIG. 39 (*d*)).

(5) Further, the substrate in which the openings 126 for via-holes were formed was immersed in a solution containing 60 g/l of permanganic acid at 80° C. for 10 minutes to carry out desmear treatment for the wall face of the throughholes 139 and to dissolve and remove the epoxy resin particle existing on the surface of the interlaminar resin insulating layers 122 to form a roughened surface (not illustrated) including the inner walls of the openings 126 for via-holes.

(6) Next, the substrate subjected to the above-mentioned treatment was immersed in a neutralization solution (produced by Shipley Co., Inc.) and washed with water.

Further, a palladium catalyst was supplied to the surface of the substrate subjected to the surface roughening treatment (the roughening depth 3 μm), so that the catalyst core adhered to the surface of the interlaminar resin insulating layers 122 (including the inner wall faces of the openings 126 for via-holes) and the wall faces of the through holes 139 (not illustrated). That is, the above-mentioned substrate was immersed in a catalyst solution containing palladium chloride (PdCl$_2$) and stannous chloride (SnCl$_2$) to deposit palladium metal, thus supplying the catalyst.

(7) Next, the substrate was immersed in an electroless copper plating aqueous solution at 34° C. to form thin film conductor layers 132 with a thickness of 0.6 to 3.0 μm on the surface of the interlaminar resin insulating layers 122 (including the inner wall faces of the openings 126 for the via-holes) and the wall faces of the through holes 139 (reference to FIG. 39 (*e*)).

(8) Next, a commercialized photosensitive dry film was stuck to the substrate bearing the thin film conductor layers 132 and a mask was put thereon. Then, exposure with a dose of 100 mJ/cm$^2$ and development with an aqueous 0.8% sodium carbonate solution were carried out to form a plating resist 123 (reference to FIG. 40 (*a*)).

Figure 40:
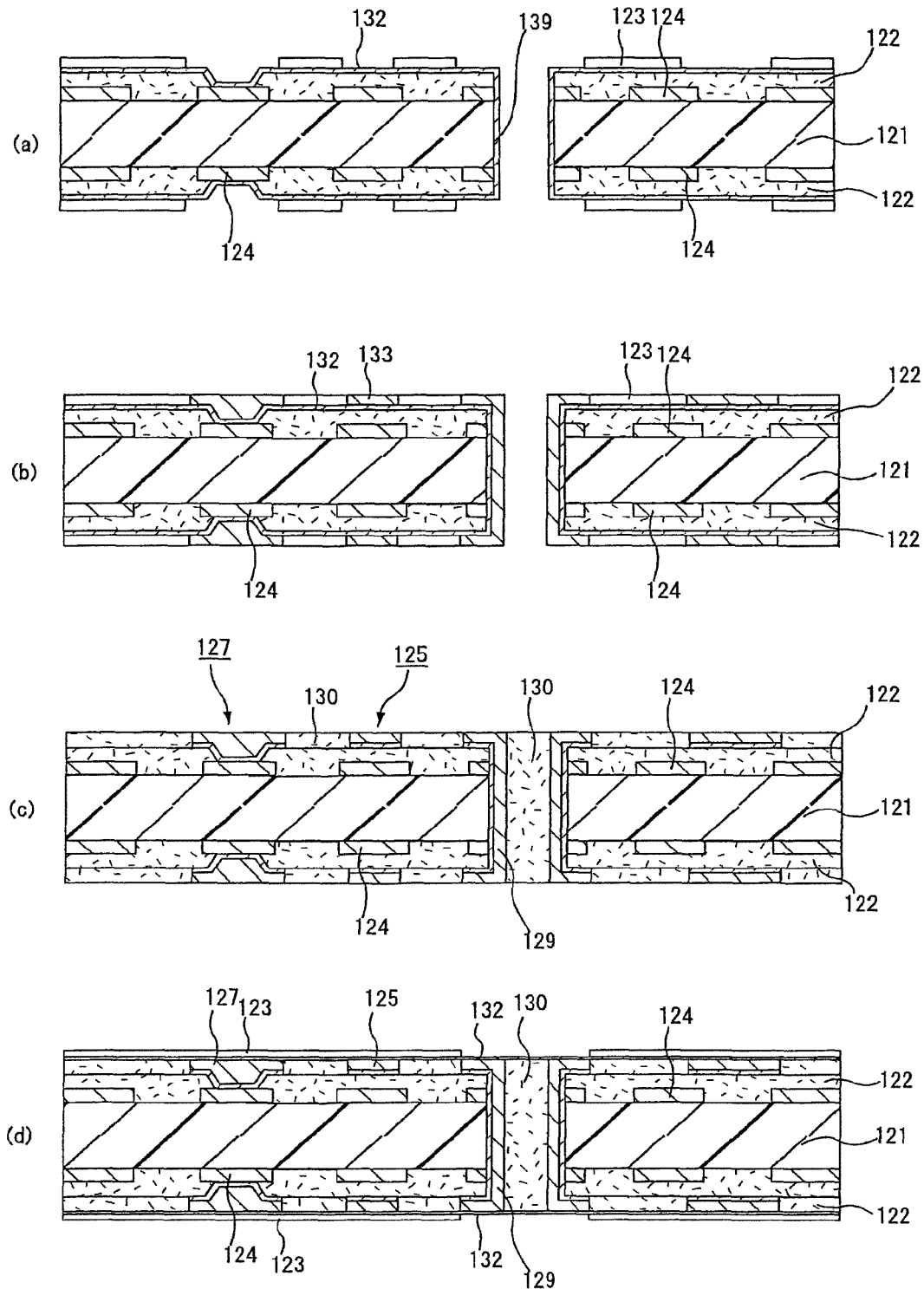
FIGS. 40 (a) to (d) are cross-section figures schematically showing a part of manufacturing processes of a multilayered printed circuit board of the present invention.

(9) Next, the substrate was washed with water at 50° C. to be degreased and washed with water at 25° C. and further washed with sulfuric acid and after that, the substrate was subjected to electrolytic plating under the same conditions as those of the process (12) of Example 13 to form electrolytic copper plating films 133 in the non plating resist 123 formed area (reference to FIG. 40 (*b*)).

(10) Successively, the plating resist 123 was separated and removed in a 5% KOH solution and after that, using an etching solution containing sulfuric acid and hydrogen peroxide, the electroless plating films which were under the plating resist 123, were etched to form a plated-through hole 129 and conductor circuits 125 (including the via-holes 127).

(11) Next, the substrate in which the plated-through hole 129 and the like was formed was immersed in an etching solution to form the roughened surfaces (not illustrated) on the surface of the plated-through hole 129 and conductor circuits 125 (including the via-holes 127). Incidentally, as the etching solution, Meck Etch Bond produced by Meck Co. was used.

(12) Next, after the resin filler described in the above-mentioned B was prepared, the layer of the resin filler was formed inside the plated-through hole 129 and in the non conductor circuit formed area and the peripheral portion of the conductor circuits 125 on the interlaminar resin insulating layers 122 by the following method within 24 hours after its preparation.

That is, at first, the resin filler was pushed in the plated-through holes using a squeegee and then dried under the conditions of 100° C. for 20 minutes. Next, using a mask having an opening corresponding to the non conductor circuit formed area and a squeegee, the layer of the resin filler was formed in the non conductor circuit formed area, which was concave portions, and then dried under the conditions of 100° C. for 20 minutes.

Successively, in the same manner as the process (4) of Example 13, the surface layer part of the resin filler layers formed inside the plated-through hole and in the non conductor circuit formed area and the surface of the conductor circuits 125 were made flat and then were heated to form a resin filler layer 130, surface of which is on the same plane as the surface of the conductor circuit 125 (reference to FIG. 40 (c)).

(13) Next, a palladium catalyst (not illustrated) was supplied to the surface of the interlaminar resin insulating layers 122 and the exposed faces of the resin filler layers 130 by the same treatment as the above-mentioned (6). Next, the electroless plating treatment was carried out in the same conditions as those described in the above-mentioned (7) to form thin film conductor layers 132 on the exposed faces of the resin filler layers 130 and the upper faces of the conductor circuits 125.

(14) Next, in the same manner as the above-mentioned process (8), the plating resist 123 was formed on the thin film conductor layer 132 (reference to FIG. 40 (d)). Successively, the substrate was washed with water at 50° C. to be degreased, and washed with water at 25° C. and further washed with sulfuric acid and after that, the substrate was subjected to electroplating under the following conditions to form electrolytic copper plating films 133 in the non plating resist 123 formed area (reference to FIG. 41 (a)).

[Electroplating Solution]

| | |
|---|---|
| sulfuric acid | 2.24 mol/l |
| copper sulfate | 0.26 mol/l |
| additive | 19.5 ml/l |
| (made by Atotech Japan CO., Cupracid GL) | |

[Electroplating Condition]

| | |
|---|---|
| current density | 1 A/dm$^2$ |
| time | 65 minutes |
| temperature | 22 ± 2° C. |

Figure 41:
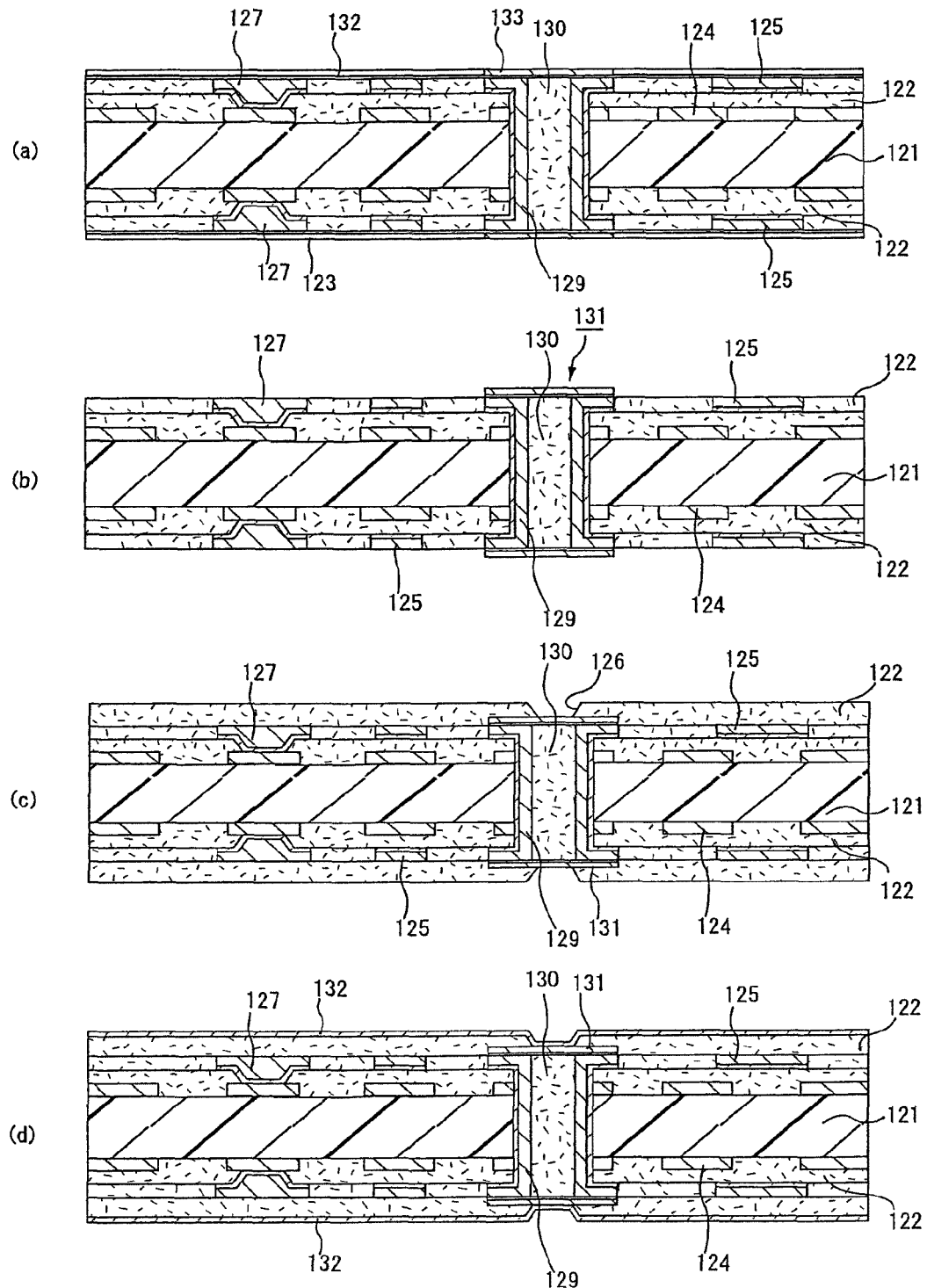
FIGS. 41 (a) to (d) are cross-section figures schematically showing a part of manufacturing processes of a multilayered printed circuit board of the present invention.

(15) Next, after the plating resist 133 was separated and removed with 5% KOH, the electroless plating film which was under the plating resist 133 was dissolved and removed by etching treatment with a mixed solution of sulfuric acid and hydrogen peroxide to form a cover plating layer 131 (reference to FIG. 41 (b)).

(16) Next, the roughened surface (not illustrated) was formed on the surface of the cover plating layer 131 using an etching solution (Meck Etch Bond).

Figure 42:
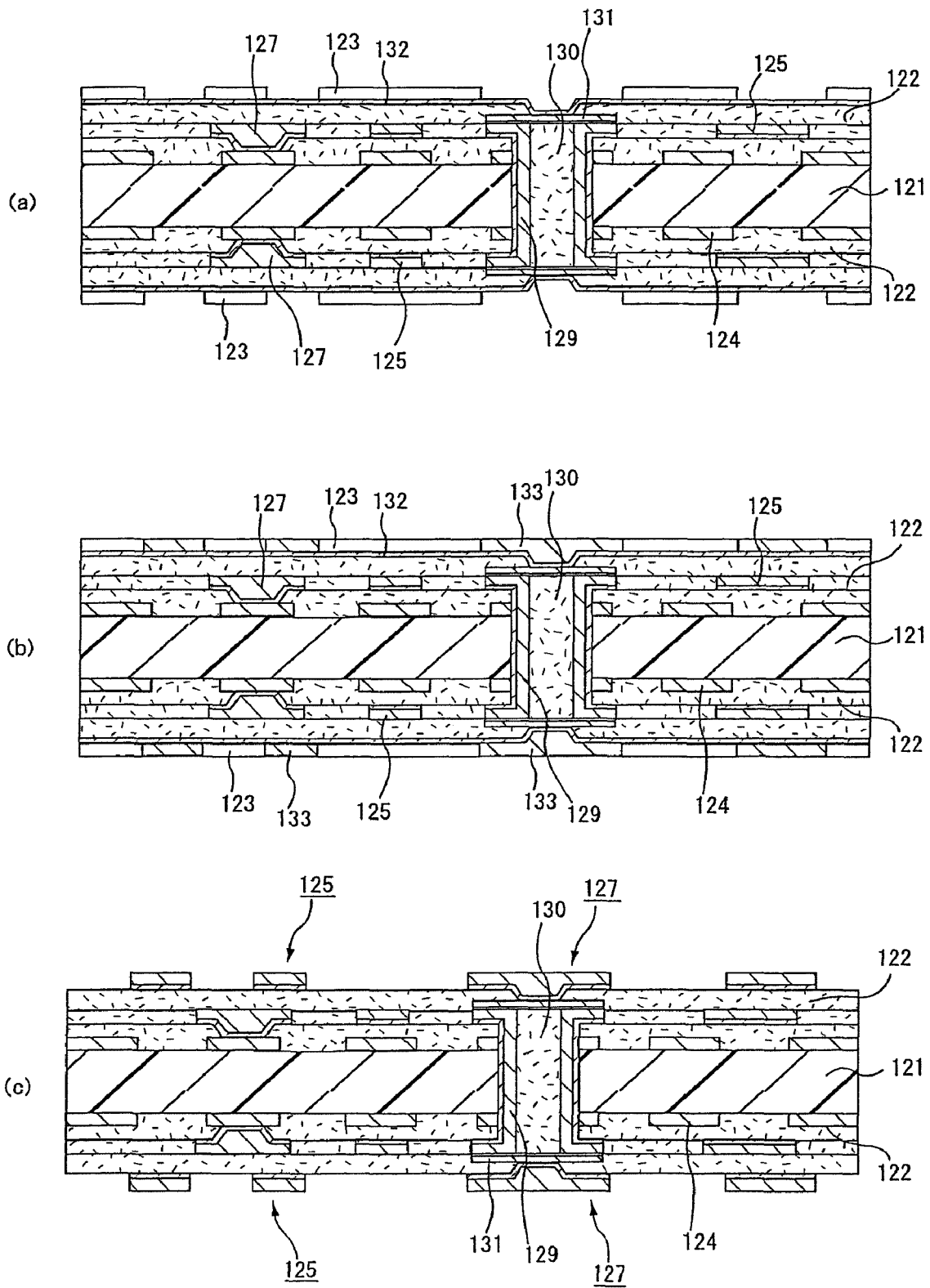
FIGS. 42 (a) to (c) are cross-section figures schematically showing a part of manufacturing processes of a multilayered printed circuit board of the present invention.

(17) Next, the above-mentioned processes (3) to (11) were repeated to form interlaminar resin insulating layers 122 and conductor circuits 125 (including the via-holes 127) in the further upper layer (reference to FIG. 41 (c) to FIG. 42 (c)). Incidentally, the diameter of the non land parts of the via-holes 127 was 80 μm. Further, in this process, the via-holes were formed immediately above the cover plating layer 131.

Figure 43:
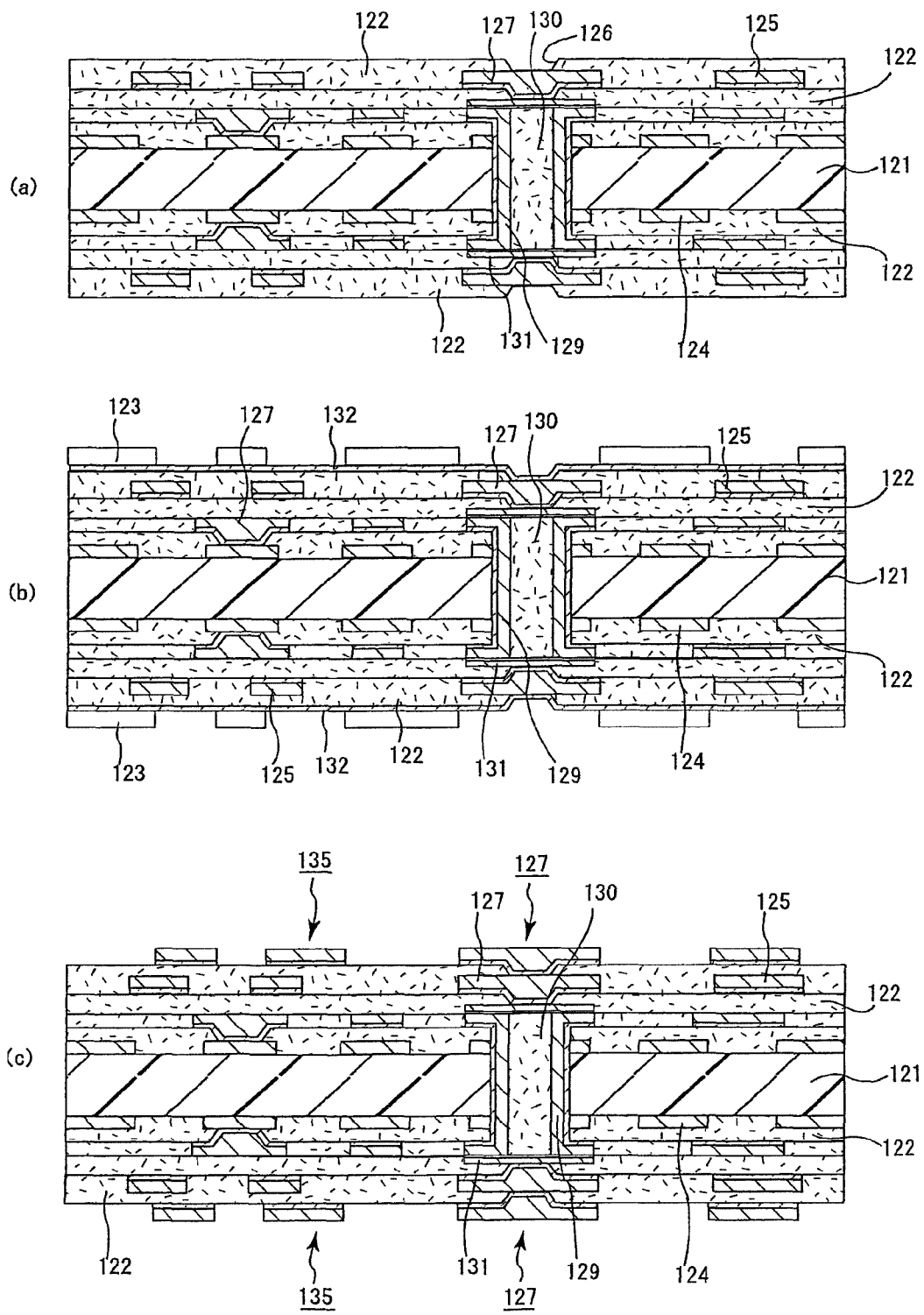
FIGS. 43 (a) to (c) are cross-section figures schematically showing a part of manufacturing processes of a multilayered printed circuit board of the present invention.
Figure 44:
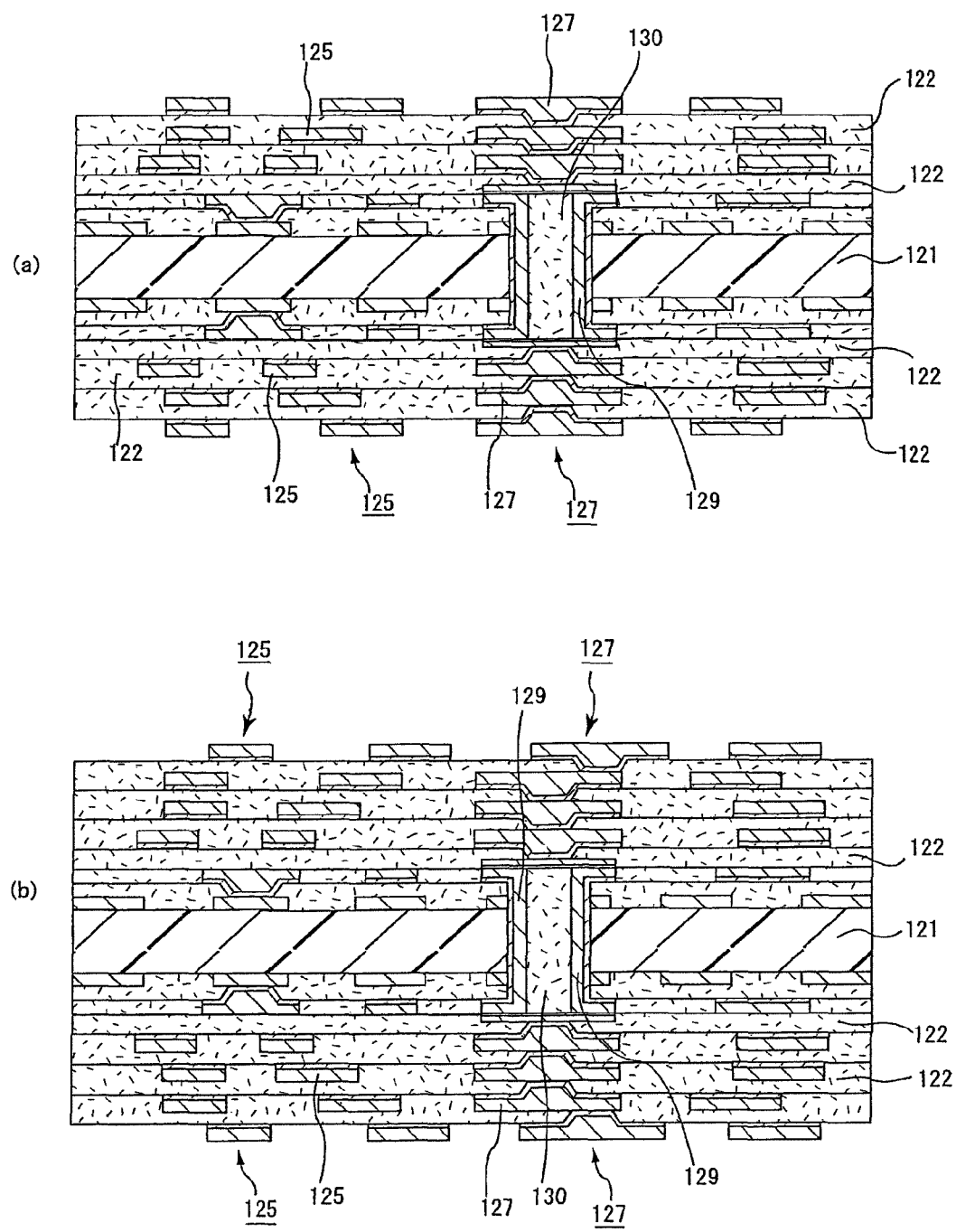
FIGS. 44 (a), (b) are cross-section figures schematically showing a part of manufacturing processes of a multilayered printed circuit board of the present invention.

(18) Next, the above-mentioned processes (3) to (11) were repeated twice to form the interlaminar resin insulating layer 122 and the conductor circuits 125 (including the via-holes 127) in the upper level layer (reference to FIG. 43 (a) to FIG. 44 (a)). Incidentally, the diameter of the non land parts of the via-holes 127 was 80 μm.

Further, in this process, the formation positions of the openings for via-holes were adjusted so as to pile the via-holes while their centers being approximately overlapped on those in the underlevel layers.

In this process, no plated-through hole was formed.

(19) Further, the above-mentioned processes (3) to (11) were repeated again to form the interlaminar resin insulating layer 122a and the conductor circuits 125 (including the via-holes 127) in the outermost layer (reference to FIG. 44 (b)). Incidentally, the diameter of the non land parts of the via-holes 127 was 80 μm.

Further, in this process, the formation positions of the openings for via-holes were adjusted so as to pile the via-holes while their centers being shifted from those in under-level layers. Incidentally, the distance between the outer rim of the bottom face of the via-hole (the via-hole in the fourth level) formed in this process and the outer rim of the non land part of the via-hole in the underlevel layer (the via-hole in the third level) was 8 μm.

In this process, no plated-through hole was formed.

Figure 45:
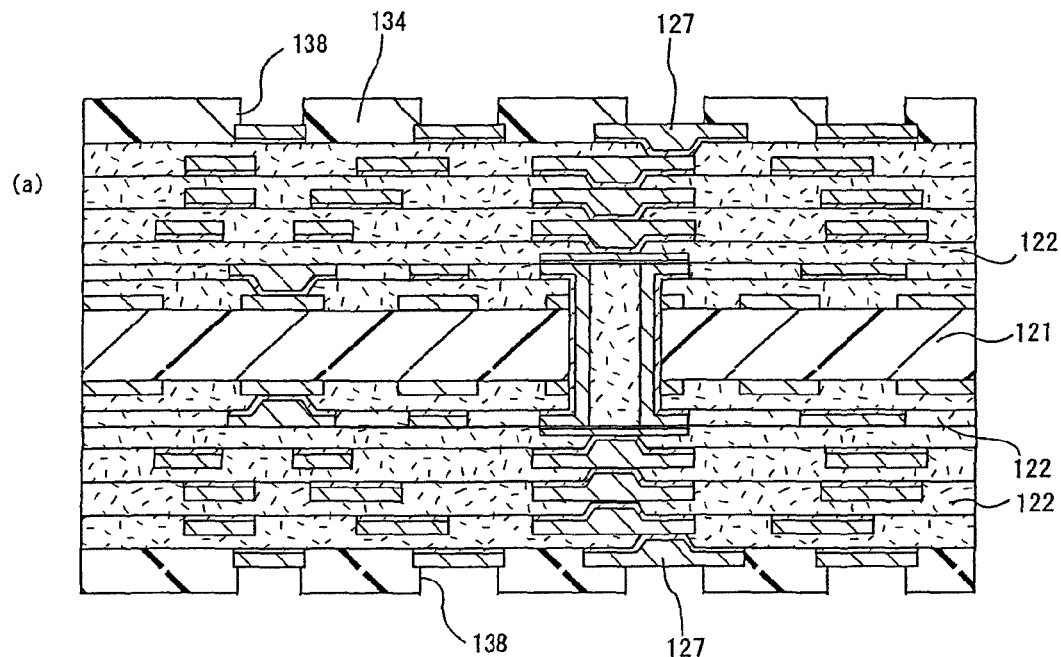
FIGS. 45 (a), (b) are cross-section figures schematically showing a part of manufacturing processes of a multilayered printed circuit board of the present invention.
Figure 45:
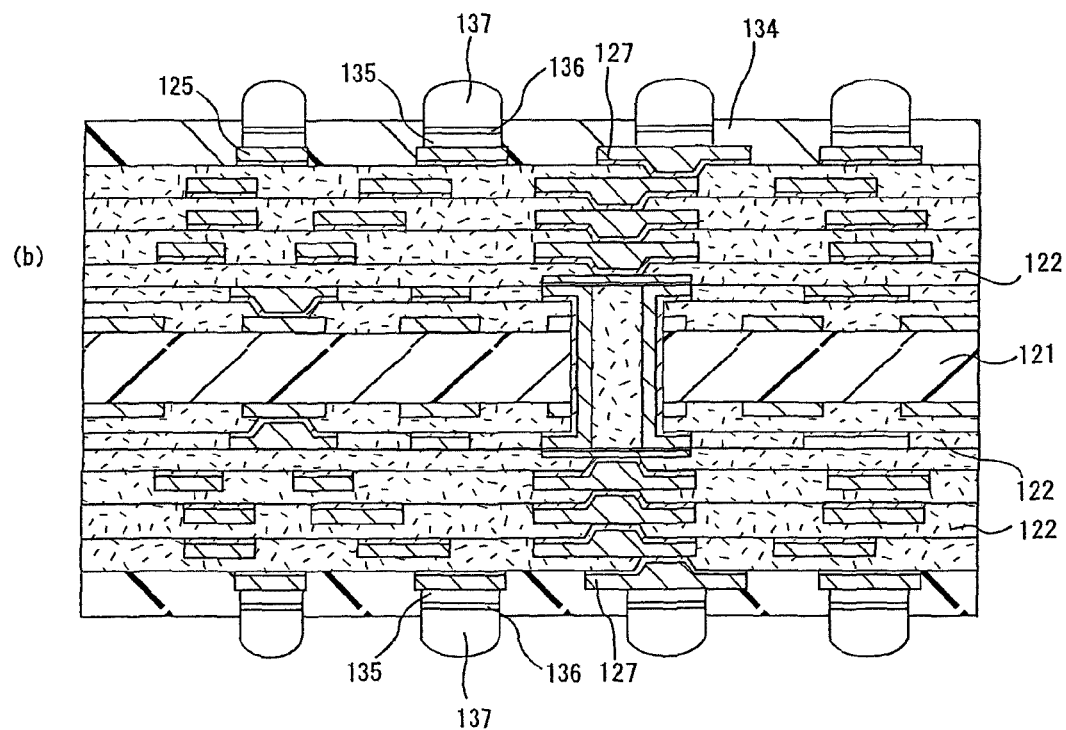

(20) Next, in the same manner as the processes (17) to (20) of Example 13, a multilayered printed circuit board comprising solder bumps was obtained (reference to FIGS. 45 (a), (b)).

Incidentally, the coefficient of linear expansion of the interlaminar resin insulating layers in the multilayered printed circuit board produced by the present example was 60 ppm/° C.

Example 15

A multilayered printed circuit board was manufactured in the same manner as Example 13, except that the via-holes were piled in the process (15) of Example 13 so as to adjust the distance between the outer rim of the bottom face of the via-hole in the third level and the outer rim of the non land part of the via-hole in the underlevel layer (the via-hole in the second level) to be 20 μm.

Example 16

A multilayered printed circuit board was manufactured in the same manner as Example 14, except that the via-holes were piled in the process (19) of Example 14 so as to adjust the distance between the outer rim of the bottom face of the via-hole in the fourth level formed and the outer rim of the non land part of the via-hole in the underlevel layer (the via-hole in the third level) to be 40 μm.

Example 17

A multilayered printed circuit board was manufactured in the same manner as Example 13, except that the via-holes were piled in the process (15) of Example 13 so as to adjust the distance between the outer rim of the bottom face of the via-hole in the third level and the outer rim of the non land part of the via-hole in the underlevel layer (the via-hole in the second level) to be 70 μm.

Regarding the multilayered printed circuit boards manufactured in Example 13 to 17, a heat cycle test was carried out, then the shape observation of the interlaminar resin insulating layers and the via-holes and electric continuity test, before and after the heat cycle test were carried out.

Regarding the multilayered printed circuit boards obtained in Example 13 to 17, by the shape observation of the cross-section before and after the heat cycle test, in the all of the interlaminar resin insulating layers including the interlaminar resin insulating layer in the outermost layer, the occurrence of cracking insulating layers including the interlaminar resin insulating and the separation of the interlaminar resin insulating layers and the via-holes were not observed. Further, before and after the heat cycle test, short circuit or disconnection were neither caused to show excellent electric communication state.

Example 18

A. Preparation of a Photosensitive Resin Composition A

The photosensitive resin composition A was prepared in the same manner as Example 7.

B. Preparation of a Photosensitive Resin Composition B

The photosensitive resin composition B was prepared in the same manner as Example 7.

C. Preparation of a Resin Filler

The resin filler was prepared in the same manner as Example 7.

D. Method for Manufacturing a Multilayered Printed Circuit Board (1) Independent conductor circuits 45 and via-holes 47 with the filled via shape and the like were formed by carrying out the same processes of (1) to (13) of Example 7 (reference to FIG. 20 (a) to FIG. 22 (a)).

(2) Next, the processes (5) to (13) of Example 7 were repeated to form interlaminar resin insulating layers 42 and independent conductor circuits 45 and via-holes 47 with the filled via shape in further upper layers (reference to FIG. 22 (b) to FIG. 23 (a)).

Incidentally, here the formation position of the openings for via-holes was adjusted so as to pile the via-holes in the second level on the via-holes in the first level in the manner their centers were approximately overlapped on those of the via-holes in the first level.

Figure 48:
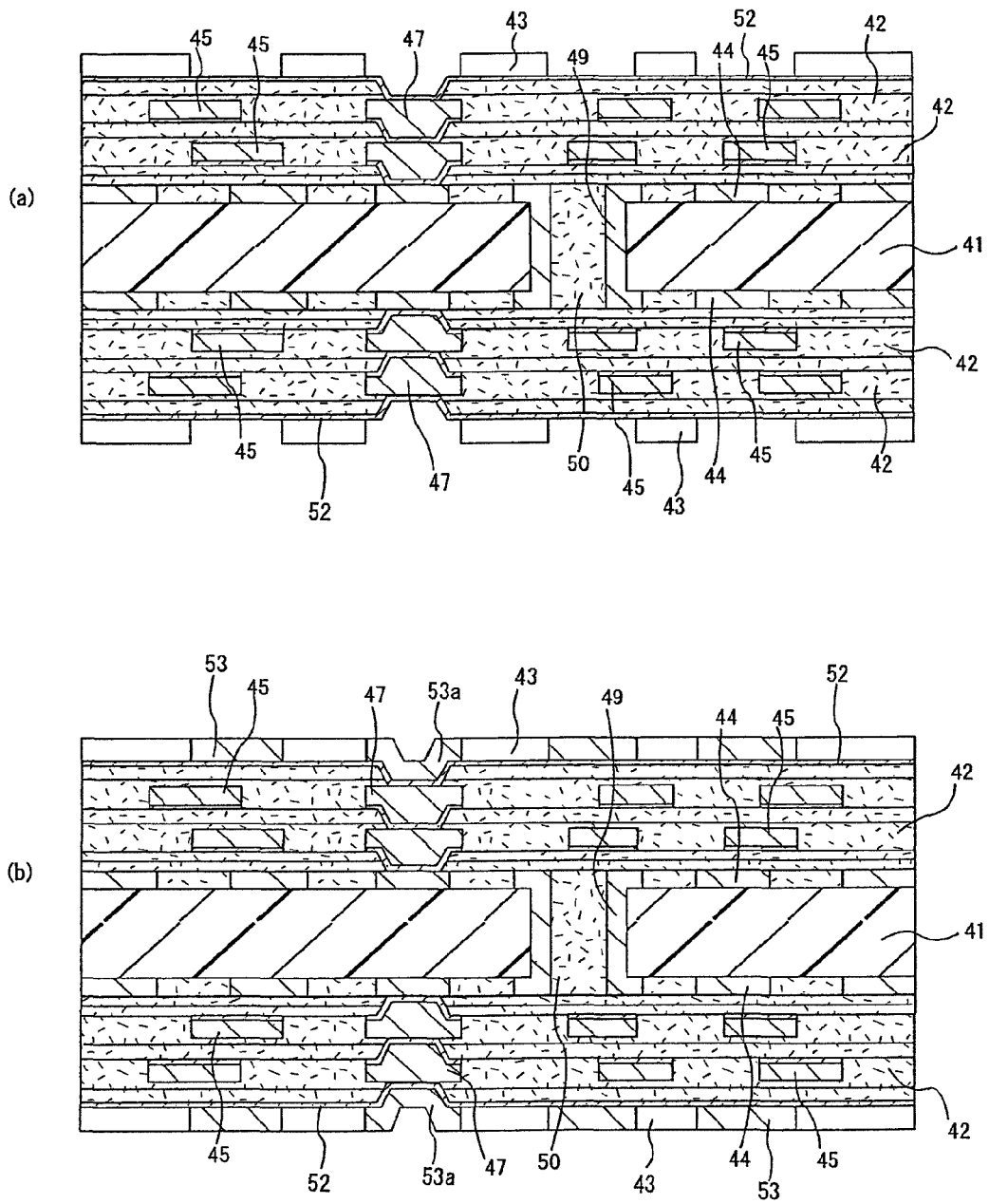
FIGS. 48 (a), (b) are cross-section figures schematically showing a part of manufacturing processes of a multilayered printed circuit board of the present invention.

(3) Further, the processes (5) to (11) of Example 7 were repeated to form interlaminar resin insulating layers 42 and thin film conductor layers 52 in further upper layers, and after that, the plating resist 43 was provided on the thin film conductor layers 52 (reference to FIG. 48 (a)).

(4) Next, the substrate on which the plating resist 43 was formed was washed with water at 50° C. to be degreased, and washed with water at 25° C. and further washed with sulfuric acid and after that, the substrate was subjected to electrolytic copper plating under the following conditions to form electrolytic copper plating layers 53 (reference to FIG. 48 (b)). Incidentally, the electrolytic copper plating layers 53a having concave portions on the upper face were formed in the openings for via-holes.

[Electroplating Solution]

| | |
|---|---|
| sulfuric acid | 2.24 mol/l |
| copper sulfate | 0.26 mol/l |
| additive | 19.5 ml/l |
| (made by Atotech Japan CO., Cupracid GL) | |

[Electroplating Condition]

| | |
|---|---|
| current density | 1.0 A/dm$^2$ |
| time | 65 minutes |
| temperature | 22 ± 2° C. |

Figure 49:
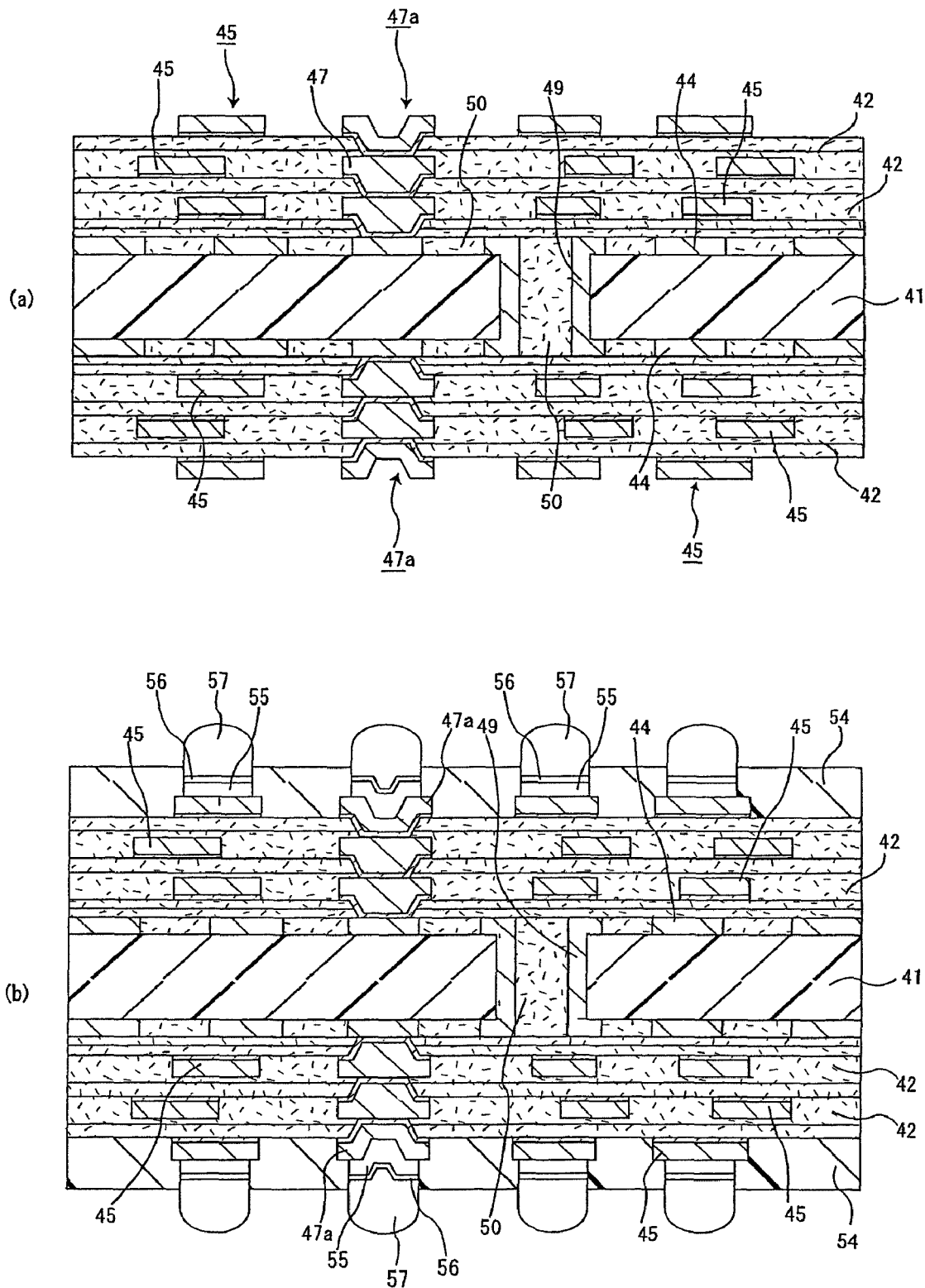
FIGS. 49 (a), (b) are cross-section figures schematically showing a part of manufacturing processes of a multilayered printed circuit board of the present invention.

(5) Next, in the same manner as the process (13) of Example 7, after the plating resist 43 was separated and removed, the thin film conductor layers 52 were etched to form independent conductor circuits and via-holes 47a having concave portions on the upper face thereof (reference to FIG. 49 (a)). Incidentally, here the formation position of the openings for via-holes was adjusted to pile the via-holes in the uppermost layer on the via-holes in the second level in the manner their centers were approximately overlapped on those of the via-holes in the second level.

(6) Next, a container was loaded with: 46.67 parts by weight of an oligomer provided with a photosensitivity (molecular weight: 4000) obtained by acrylating 50% of an epoxy group of cresol novolak type epoxy resin (made by Nippon Kayaku Co., Ltd.), dissolved in diethylene glycol dimethyl ether (DMDG) to be 60% by weight concentration; 15.0 parts by weight of bisphenol A type epoxy resin (trade name: Epikote 1001 made by Yuka Shell Epoxy Co.) dissolved in methylethyl ketone to be 80% by weight concentration; 1.6 parts by weight of imidazole curing agent (tradename: 2E4MZ-CN made by Shikoku Chemicals Corp.); 3.0 parts by weight of a polyvalent acrylic monomer, which was a photosensitive monomer (trade name: R604, made by Nippon Kayaku Co., Ltd.); 1.5 parts by weight of a similarly polyvalent acrylic monomer (trade name: DPE 6 A made by Kyoei Chemical Co., Ltd.); and 0.71 parts by weight of the dispersion type defoaming agent (made by San Nopco Ltd., S-65), and they were stirred and mixed to prepare the mixed composition. Then, to the mixed composition, 2.0 parts by weight of benzophenone (made by Kanto Chemical Co., Inc.) as a photopolymerization initiator and 0.2 parts by weight of Michler's ketone (made by Kanto Chemical Co., Inc.) as a photosensitizer were added to obtain a solder resist composition with a viscosity of 2.0 Pa·s at 25° C. The viscosity measurement was carried out using a rotor No. 4 in the case at 60/min$^{-1}$ (rpm) and a rotor No. 3 in the case at 4.6/min$^1$ (rpm) using a B-type viscometer (made by Tokyo Instruments Co. Ltd., DVL-B type).

(7) Next, the above-mentioned solder resist composition was applied in 20 μm thickness to both faces of the multilayered printed circuit board and dried under conditions of 70° C. for 20 minutes and 70° C. for 30 minutes and then, a 5 mm-thick photomask drawing a pattern corresponding to the solder pad was firmly stuck to the solder resist layers and the solder resist layers were exposed to UV rays of 1000 mJ/cm$^2$ dose and developed with the DMTG solution to form openings having a diameter of 80 μm.

Further, the solder resist layers were cured by carrying out heating treatment under the respective conditions of 80° C. for 1 hour, 100° C. for 1 hour, 120° C. for 1 hour, and 150° C. for 3 hours to form 20 μm-thick solder resist layers 54.

(8) Next, the substrate bearing the solder resist layers 54 was immersed in an etching solution containing sodium persulfate as a main component for 1 minute to form roughened surfaces (not illustrated) with an average roughness (Ra) of 1 μm or less in the conductor circuit surface.

Further, the resulting substrate was immersed in an electroless nickel plating solution having pH 4.5 containing nickel chloride (2.3×10$^{-1}$ mol/l), sodium hypophosphite (2.8×10$^{-1}$ mol/l), and sodium citrate (1.6×10$^{-1}$ mol/l) for 20 minutes to form a 5 μm-thick nickel plating layer 55 in the openings. Further, the obtained substrate was immersed in an electroless gold plating solution containing potassium cyanoaurate (7.6×10$^{-3}$ mol/l), ammonium chloride (1.9×10$^{-1}$ mol/l), sodium citrate (1.2×10$^{-1}$ mol/l), and sodium hypophosphite (1.7×10$^{-1}$ mol/l) under the conditions of 80° C. for 7.5 minutes to form a 0.03 μm-thick gold plating layer 56 on the nickel plating layer 55 and form solder pads.

(9) After that, a mask was put on the solder resist layers 54 and a solder paste was printed in the openings for the solder bumps using a piston type pressure injection printer. After that, the solder paste was subjected to reflow at 250° C. and further to flux washing to obtain a multilayered printed circuit board comprising the solder bumps (reference to FIG. 49 (b))

The coefficient of linear expansion of the interlaminar resin insulating layers formed in the present example was 70 ppm/° C.

Example 19

A. Production of a Resin Film of an Interlaminar Resin Insulating Layer

The resin film for the interlaminar resin insulating layer was produced in the same manner as Example 14.

B. Preparation of a Resin Filler

The resin filler was prepared in the same manner as Example 7.

C. Manufacture of a Multilayered Printed Circuit Board (1) Independent conductor circuits 65, via-holes 67 with the filled via shape, cover plating layers 71 and the like were formed by carrying out the same processes (1) to (16) of Example 8 (reference to FIG. 25 (a) to FIG. 27 (b)).

(2) Next, the processes (3) to (11) of Example 8 were repeated twice to form interlaminar resin insulating layers 62, conductor circuits 65 and via-holes 67 with the filled via shape in further upperlevel layers (reference to FIG. 27 (c) to FIG. 30 (a)). Incidentally, here the formation position of the openings for via-holes was adjusted so as: to form the via-holes immediately above the cover plating layers 71 in the first repeating process; and to form the via-holes in the second level on the via-holes in the underlevel layer in the manner that their centers were approximately overlapped in the second repeating process. In this process, no plated-through hole was formed.

Figure 50:
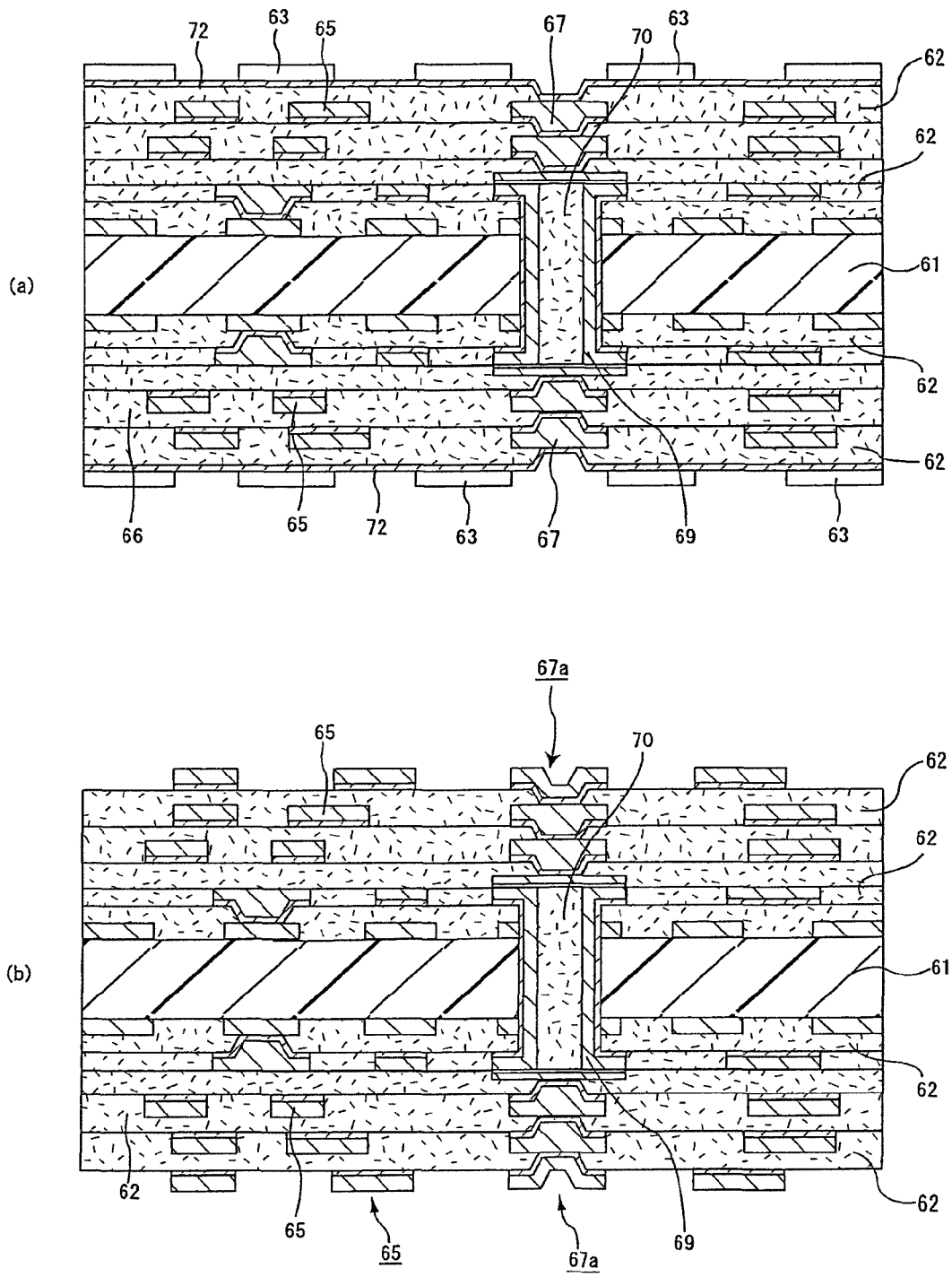
FIGS. 50 (a), (b) are cross-section figures schematically showing a part of manufacturing processes of a multilayered printed circuit board of the present invention.

(3) Further, the processes (3) to (8) of Example 8 were repeated to form interlaminar resin insulating layers 62 and thin film conductor layers 72 in further upperlevel layers, and after that the plating resist 63 was formed on the thin film conductor layers 72 (reference to FIG. 50 (a)).

(4) Next, the substrate on which the plating resist 63 was formed was washed with water at 50° C. to be degreased and washed with water at 25° C. and further washed with sulfuric acid and after that, the substrate was subjected to electrolytic plating under the same conditions as those of the process (4) of Example 18 to form electrolytic copper plating layers. Incidentally, the electrolytic copper plating layers having concave portions on the upper face were formed in the openings for via-holes.

(5) Next, in the same manner as the process (10) of Example 8, the plating resist 63 was separated and removed and the thin film conductor layers 72 were etched to form independent conductor circuits 65 and via-holes 67a having concave portions on the upper face (reference to FIG. 50 (b)). Further, in the same manner as the process (11) of Example 8, the roughened surface (not illustrated) was formed on the surface of the conductor circuits 65 and the via-holes 67a.

Figure 51:
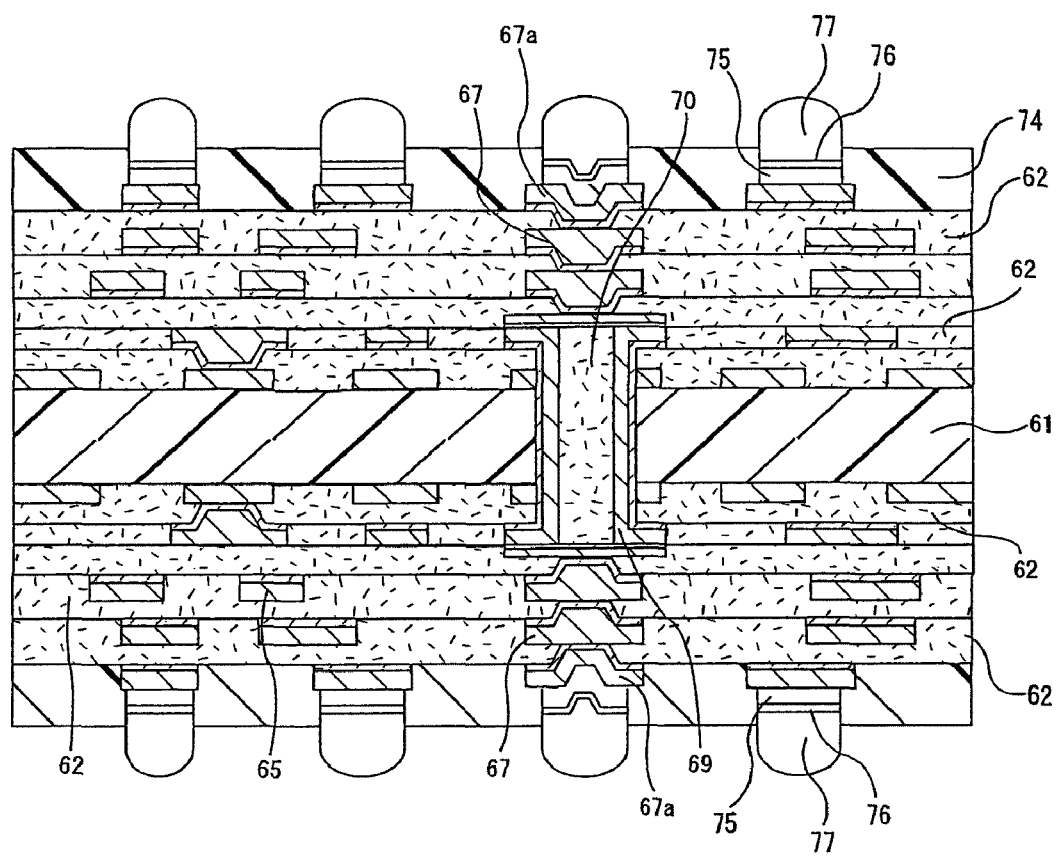
FIG. 51 is a cross-section figure schematically showing a part of manufacturing processes of a multilayered printed circuit board of the present invention.

(6) Next, in the same manner as the processes (6) to (9) of Example 18, a multilayered printed circuit board comprising solder bumps 77 was obtained (reference to FIG. 51).

The coefficient of linear expansion of the interlaminar resin insulating layers formed in this example was 60 ppm/° C.

Example 20

A. Preparation of Photosensitive Resin Compositions A and B

The photosensitive resin compositions A and B were prepared in the same manner as Example 7.

B. Preparation of a Resin Filler

The resin filler was prepared in the same manner as Example 7.

C. Manufacturing Method of a Multilayered Printed Circuit Board (1) Independent conductor circuits 85 and via-holes 87 with the filled via shape and the like were formed on the substrate by carrying out the same processes (1) to (13) of Example 13 (reference to FIG. 34 (a) to FIG. 36 (a)).

(2) Next, the processes (5) to (13) of Example 13 were repeated to form interlaminar resin insulating layers 82 and independent conductor circuits 85 and via-holes 87 with the filled via shape in further upperlevel layers (reference to FIG. 36 (b) to FIG. 37 (a)). Incidentally, here the formation position of the openings for via-holes was adjusted so as to form the via-holes in the second level on the via-holes in the underlevel layer in the manner their centers were approximately overlapped.

Figure 52:
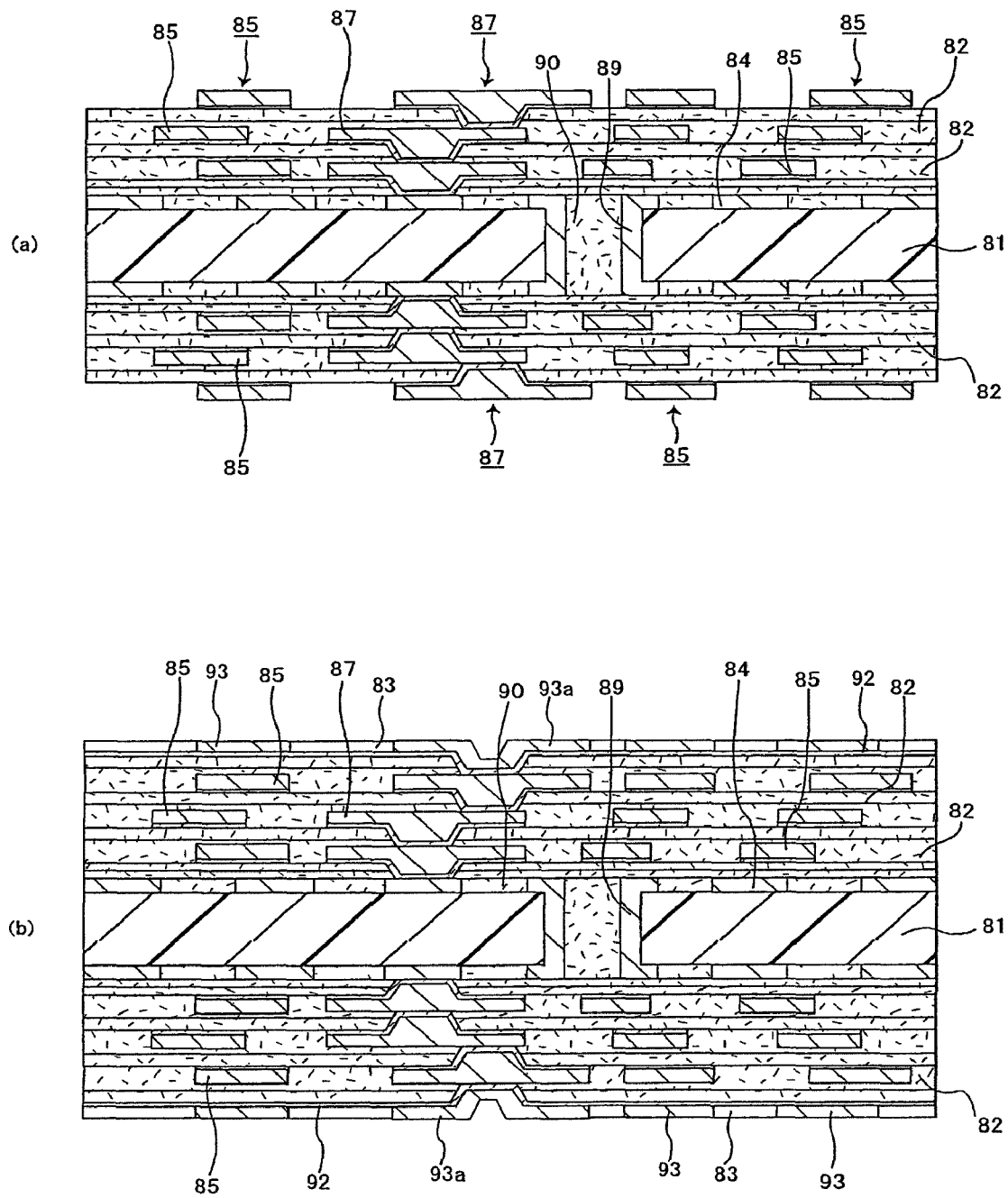
FIGS. 52 (a), (b) are cross-section figures schematically showing a part of manufacturing processes of a multilayered printed circuit board of the present invention.

(3) Further, the processes (5) to (13) of Example 13 were repeated to form interlaminar resin insulating layers 82 and independent conductor circuits 85 and via-holes 87 with the filled via shape in further upperlevel layers (reference to FIG. 52 (*a*)).

Incidentally, here the formation position of the openings for via-holes was adjusted to so as to pile the via-holes in the third level being shifted from the center of the via-holes in the second level layer. Also, the distance between the outer rim of the bottom face of the via-hole (the via-hole in the third level) formed in this process and the outer rim of the non land parts of the via-hole in the underlevel layer (the via-hole in the second level) was 5 μm.

(4) Further, the processes (5) to (11) of the Example 13 were repeated again to form interlaminar resin insulating layers 82 and thin film conductor layers 92 in further upperlevel layers and after that, the plating resist 83 was formed on the thin film conductor layers 92.

(5) Next, the substrate on which the plating resist 83 was formed was washed with water at 50° C. to be degreased and washed with water at 25° C. and further washed with sulfuric acid, and after that, the substrate was subjected to electrolytic copper plating under the same conditions as those of the process (4) of Example 18 to form electrolytic copper plating layers 93 (reference to FIG. 52 (*b*)). Incidentally, the electrolytic plating layers 93*a* having concave portions on the upper face were formed in the openings for via-holes.

Figure 53:
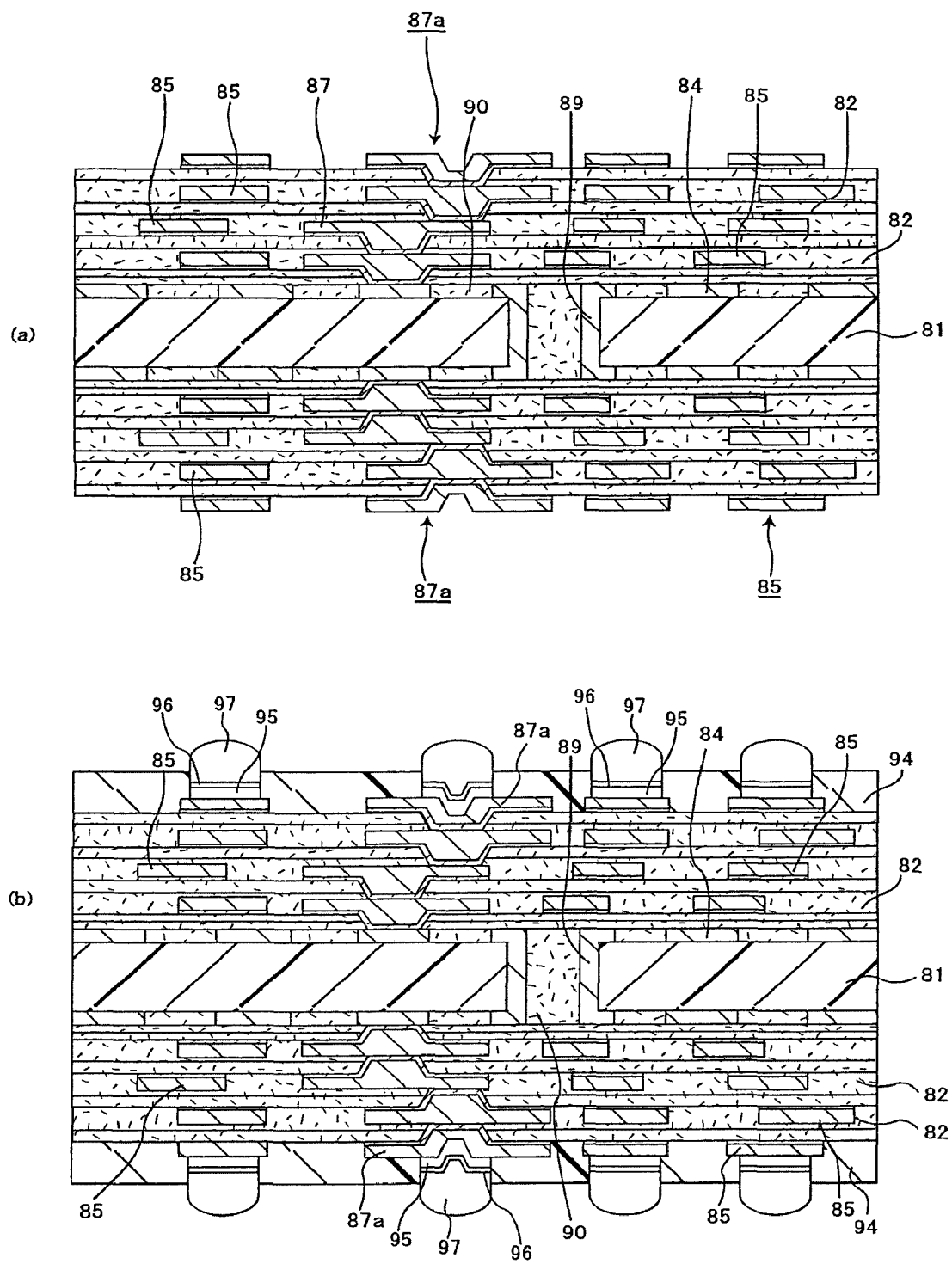
FIGS. 53 (a), (b) are cross-section figures schematically showing a part of manufacturing processes of a multilayered printed circuit board of the present invention.

Successively, in the same manner as the process (13) of Example 13, the plating resist 83 was separated and removed and the thin film conductor layers were etched to form independent conductor circuits and via-holes 87*a* having concave portions on the upper face (reference to FIG. 53 (*a*)). Incidentally, here the via-holes in the uppermost level were formed so as to keep their centers approximately overlapping on those of via-holes in the underlevel layers.

(6) Next, in the same manner as the processes (6) to (9) of Example 18, a multilayered printed circuit board comprising solder bumps 97 was obtained (reference to FIG. 53 (*a*)). The coefficient of linear expansion of the interlaminar resin insulating layers formed in this example was 70 ppm/° C.

Example 21

A. Production of a Resin Film of an Interlaminar Resin Insulating Layer

The resin film for the interlaminar resin insulating layer was produced in the same manner as Example 14.

B. Preparation of a Resin Filler

The resin filler was produced in the same manner as Example 7.

C. Manufacture of a Multilayered Printed Circuit Board (1) Independent conductor circuits 125, via-holes 127 with the filled via shape, cover plating layers 131 and the like were formed by carrying out the same processes of (1) to (16) of Example 14 (reference to FIG. 39 (*a*) to FIG. 41 (*b*)).

(2) Next, the processes (3) to (11) of Example 14 were repeated to form interlaminar resin insulating layers 122, conductor circuits 125, and via-holes 127 with the filled via shape in further upperlevel layers (reference to FIG. 41 (*c*) to FIG. 42 (*c*)). Incidentally, here the formation position of the openings for via-holes was adjusted so as to form the via-holes immediately above the cover plating layers 131. In this process, no plated-through hole was formed.

(3) Further, the processes (3) to (11) of Example 14 were repeated twice to form interlaminar resin insulating layers 122, conductor layers 125 and the via-holes 127 with a filled via shape in further upperlevel layers (reference to FIG. 43 (*a*) to (*c*)). Incidentally, here the formation position of the openings for via-holes was adjusted such that the via-hole is piled on the via-holes in the underlevel layer while their centers being approximately overlapped.

In this step, no plated-through hole was formed.

Figure 54:
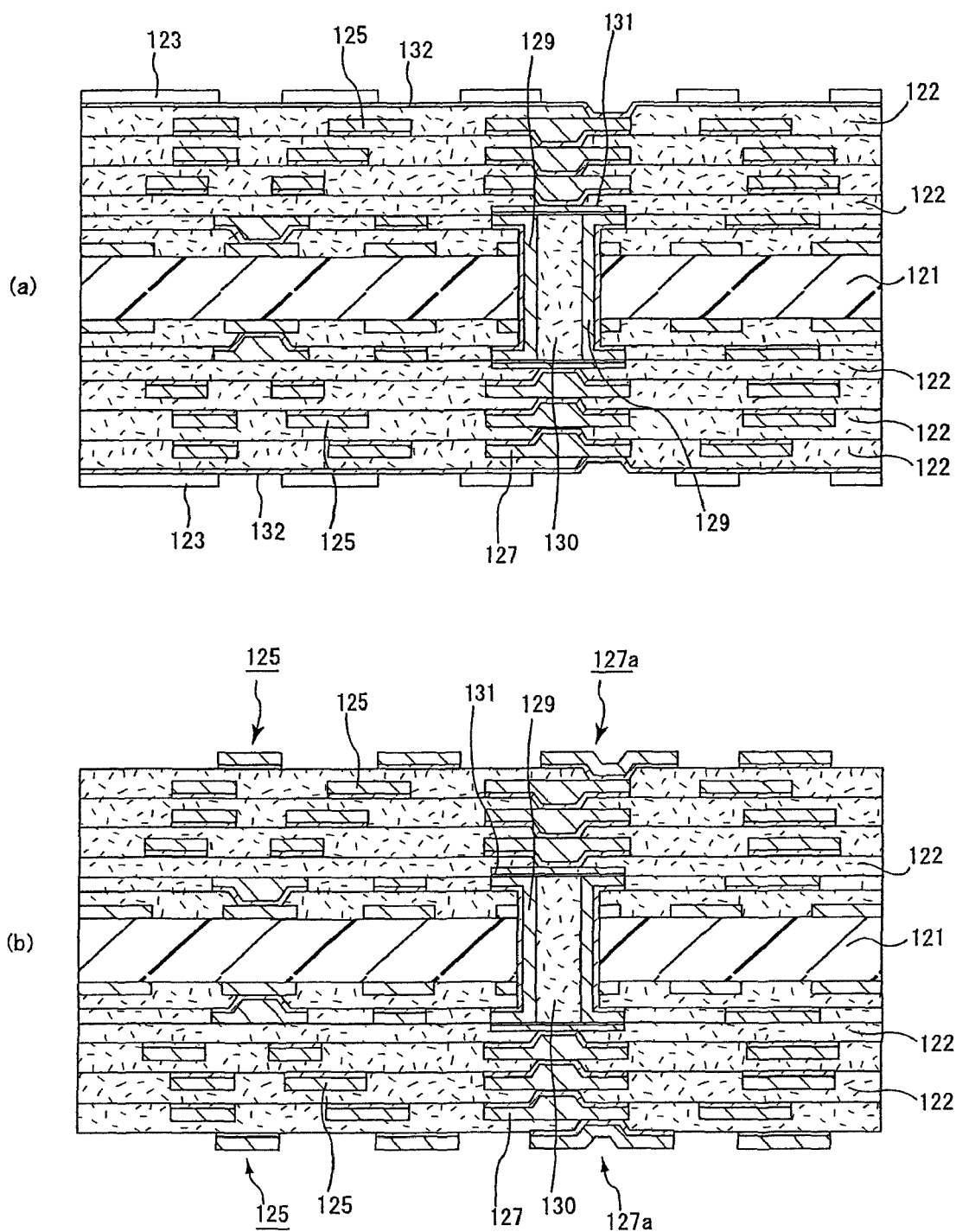
FIGS. 54 (a), (b) are cross-section figures schematically showing a part of manufacturing processes of a multilayered printed circuit board of the present invention.

(4) Further, again the processes (3) to (8) of Example 14 were repeated to form interlaminar resin insulating layers 122 and thin film conductor layers 132 in further upperlevel layers and after that, the plating resist 123 was formed on the thin film conductor layers 132 (reference to FIG. 54 (*a*)).

(5) Next, the substrate on which the plating resist 123 was formed was washed with water at 50° C. to be degreased and washed with water at 25° C. and further washed with sulfuric acid and after that, the substrate was subjected to electrolytic plating under the same conditions as those of the process (4) of Example 18 to form electrolytic copper plating layers. Incidentally, the electrolytic plating layers having concave portions on the upper face were formed in the openings for via-holes.

(6) After that, in the same manner as the process (10) of Example 14, the plating resist 123 was separated and removed and the thin film conductor layers 132 were etched to form independent conductor circuits 125 and via-holes 127*a* having concave portions on the upper face (reference to FIG. 54 (*b*)). Further, in the same manner as the process (11) of Example 14, the roughened surface (not illustrated) was formed on the surface of the conductor circuits 125 and the via-holes 127*a*.

Incidentally, in the series of the processes (4) to (6), the formation position of the openings for via-holes was adjusted so as to pile the via-holes being shifted from the center of the via-holes in the underlevel layer. Incidentally, the distance between the outer rim of the bottom face of the via-hole in the uppermost level formed in this process (the via-hole in fourth level) and the outer rim of the non land part of the via-hole in the underlevel layer (the via-hole in the third level) was 8 μm.

Figure 55:
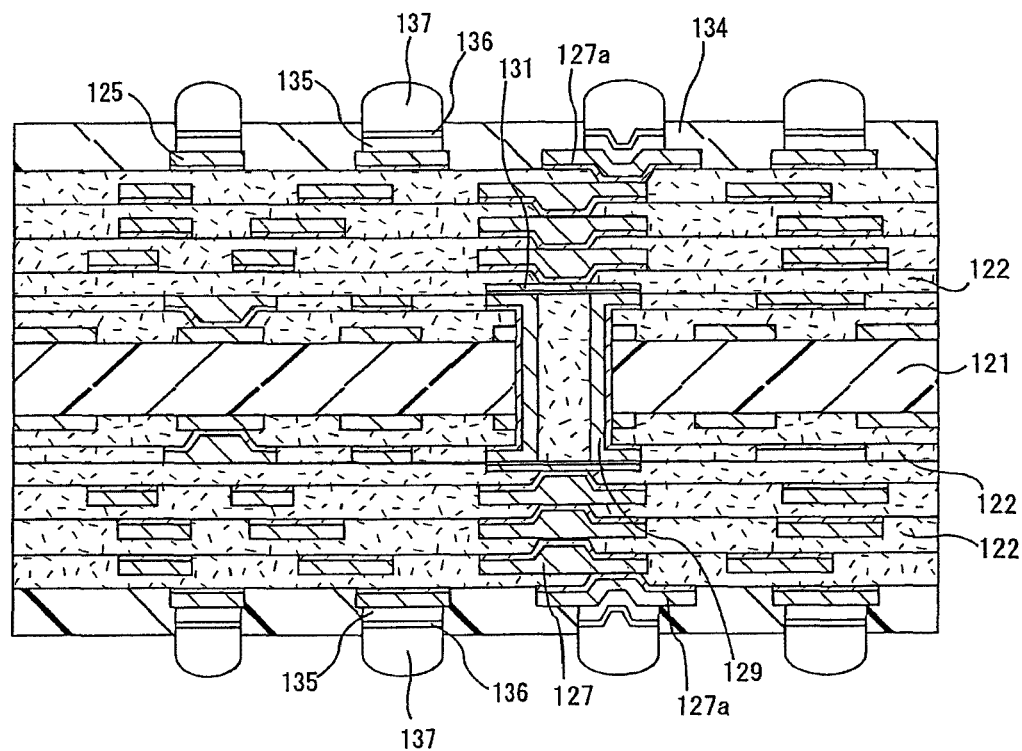
FIG. 55 is a cross-section figure schematically showing a part of manufacturing processes of a multilayered printed circuit board of the present invention.

(7) Next, in the same manner as the processes (6) to (9) of Example 18, a multilayered printed circuit board comprising solder bumps 77 was obtained (reference to FIG. 55).

The coefficient of linear expansion of the interlaminar resin insulating layers in the multilayered printed circuit board produced in this example was 60 ppm/° C.

Example 22

A multilayered printed circuit board was manufactured in the same manner as Example 20, except that the via-holes were piled in the process (3) of Example 20 so as to adjust the distance between the outer rim of the bottom face of the via-hole in the third level and the outer rim of the non land part of the via-hole in the underlevel layer (the via-hole in the second level) to be 20 μm.

Example 23

A multilayered printed circuit board was manufactured in the same manner as Example 21, except that the via-holes were piled in the process (6) of Example 21 so as to adjust the distance between the outer rim of the bottom face of the via-hole in the fourth level and the outer rim of the non land part of the via-hole in the underlevel layer (the via-hole in the third level) to be 40 μm.

Example 24

A multilayered printed circuit board was manufactured in the same manner as Example 20, except that the via-holes were piled in the process (3) of Example 20 so as to adjust the distance between the outer rim of the bottom face of the via-hole in the third level and the outer rim of the non land part of the via-hole in the underlevel layer (the via-hole in the second level) to be 70 μm.

Example 25

A multilayered printed circuit board was manufactured in the same manner as Example 20, except that the via-holes were piled in the process (3) of Example 20 so as to adjust the distance in the horizontal direction between the center of the via-hole in the third level and the center of the via-hole in the underlevel layer (the via-hole in the second level) to be 70 μm.

Example 26

A multilayered printed circuit board was manufactured in the same manner as Example 21, except that the via-holes were piled in the process (6) of Example 21 so as to adjust the distance in the horizontal direction between the center of the via-hole in the uppermost level (the via-hole in the fourth level) and the center of the via-hole in the underlevel layer (the via-hole in the third level) to be 70 μm.

Regarding the multilayered printed circuit boards manufactured in Example 18 to 26, a heat cycle test was carried out, then the shape observation of the interlaminar resin insulating layers and the via-holes and electric continuity test, before and after the heat cycle test were carried out.

As a result, in the multilayered printed circuit boards manufactured in Example 18 to 26, the occurrence of cracking and the occurrence of separation between the interlaminar resin insulating layers and the via-holes were not observed in the interlaminar resin insulating layers including the interlaminar resin insulating layer around the upper level via-holes in the shape observation of the cross-section before and after the heat cycle test. Further, before and after the heat cycle test, short circuit or disconnection were neither occurred to show excellent electric communication state.

INDUSTRIAL APPLICABILITY

As described above, in the multilayered printed circuit boards of the first to the sixth aspect of the present invention, since the via-holes in the different level layers are formed to have the stack-via structure, the wiring distance of the conductor circuits is shortened and the signal transmission time can be shortened and at the same time, the room for option of the design of the conductor circuits is improved, so that the multilayered printed circuit board can easily satisfy high density wiring requirement.

Further, in the multilayered printed circuit boards of the first to the third aspect of the present invention, at least one via-hole among via-holes in the different levels has a different land diameter from those of other via-holes, the via-holes with a large land diameter serves as a reinforcing member of the interlaminar resin insulating layers and therefore, a mechanical strength of the interlaminar resin insulating layers is improved and an occurrence of cracking can be avoided in the interlaminar resin insulating layers in the vicinity of the via-holes.

Further, in the multilayered printed circuit boards of the fourth to the sixth aspect of the present invention, since the land of at least one via-hole among via-holes having the stack-via structure is formed as being enlarged to the non conductor circuit formed area formed around the via-holes with the stack-via structure, the via-hole having the enlarged land serves as a reinforcing member of the interlaminar resin insulating layers and therefore, the mechanical strength of the interlaminar resin insulating layers is improved and an occurrence of cracking can be avoided in the interlaminar resin insulating layers in the vicinity of the via-holes.

Further, in the multilayered printed circuit boards of the second, the third, the fifth, and the sixth aspect of the present invention, since the via-holes having the stack-via structure are formed on the plated-through hole, the signal transmission time can further be shortened and the multilayered printed circuit boards can easily satisfy high density wiring requirement.

Further, in the multilayered printed circuit boards of the seventh to the ninth aspect of the present invention, since the coefficient of linear expansion of the interlaminar resin insulating layer in the outermost layer is small as described above, in the via-hole in the uppermost level of the via-hole formed in the stack-via structure, the stress generated owing to the difference of the coefficient of linear expansion among the interlaminar resin insulating layers is small and therefore a crack is hard to generate in the outermost interlaminar resin insulating layers. Accordingly, in the multilayered printed circuit boards of the seventh to the ninth aspect of the present invention, separation of the conductor circuits (including the via-holes) owing to the generation of the cracking in the interlaminar resin insulating layers and the interlaminar resin insulating layers, communication failure, short circuit and the like do not occur to give excellent reliability.

Additionally, in the multilayered printed circuit board of the ninth aspect of the present invention, since a particle and a rubber component are combined in the interlaminar resin insulating layer in the outermost layer, the multilayered printed circuit board is excellent in a shape retention property and a property of moderating the generated stress.

Further, in the multilayered printed circuit boards of the seventh to the ninth aspect of the present invention, since the via-holes in the different levels are formed so as to form a stack-via structure, the wiring distance of the conductor circuits is shortened and the signal transmission time can be shortened and at the same time, the room for option of the design of the conductor circuits is improved, so that the multilayered printed circuit board can easily satisfy high density wiring requirement.

Further, in the multilayered printed circuit board of the tenth aspect of the present invention, since at least one among the via-holes in the different levels is piled with other via-holes with the center being shifted, the stress generated owing to the difference of the coefficient of linear expansion between via-holes and the interlaminar resin insulating layers can be dispersed and concentration of a high stress upon some of piled via-holes, especially, upon the via-hole in the uppermost level can be prevented, and accordingly, the occurrence of the cracking in the interlaminar resin insulating layers owing to the stress concentration scarcely takes place and the multilayered printed circuit board has excellent reliability.

Further, in the multilayered printed circuit board of the tenth aspect of the present invention, the via-holes except the via-hole which is piled with its center being shifted are piled with their center being approximately overlapped on those of other via-holes, and in the via-holes piled in such a manner, the wiring distance is shortened and the signal transmission time can be shortened and at the same time, the room for option of the design of the conductor circuits is improved, so that the multilayered printed circuit board can easily satisfy high density wiring requirement.

Further, in the multilayered printed circuit board of the eleventh aspect of the present invention, the via-holes in the different levels are piled and among the piled via-holes, the via-hole in the uppermost level has a concave portion on the upper face, so that the stress generated owing to the difference of the coefficient of linear expansion between the via-holes and the interlaminar resin insulating layers can be moderated and concentration of a high stress upon the via-holes in the uppermost level can be avoided and accordingly, the occurrence of the cracking of the interlaminar resin insulating layers owing to the stress concentration scarcely takes place and the multilayered printed circuit board is provided with excellent reliability.

Further, in the multilayered printed circuit board of the eleventh aspect of the present invention, since the via-holes in the different levels are piled, the wiring distance is shortened and the signal transmission time can be shortened and at the same time, the option of the design of the conductor circuits is improved, so that the multilayered printed circuit board can easily satisfy high density wiring requirement.

What is claimed is:

1. A multilayered printed circuit board comprising:
   a substrate;
   a multilayered structure built thereon and comprising a plurality of conductor circuits and a plurality of interlaminar resin insulating layers in an alternate fashion; and
   at least one stack-via structure comprising a plurality of via-holes stacked one another and electrically connected to at least one of said conductor circuits through said interlaminar resin insulating layers,
   wherein each of said via-holes comprises a land portion formed on a respective one of said interlaminar resin insulating layers and a filled via structure portion filling an opening of the respective one of the interlaminar resin insulating layers with a metal layer such that said via-holes are stacked one another immediately above said filled via structure portion of each of said via-holes, said via-holes include an outermost layer via-hole in an outermost layer of said interlaminar resin insulating layers, and at least one of said via-holes has said land portion having a land diameter which is larger than a land diameter of said land portion of said outermost layer via-hole.

2. The multilayered printed circuit board according to claim 1, further comprising a plated-through hole formed in the substrate, wherein the plated-through hole is electrically connected to at least one of said conductor circuits.

3. The multilayered printed circuit board according to claim 1, further comprising a plated-through hole penetrating through said substrate and at least one of said interlaminar resin insulating layers adjacent to said substrate, wherein the plated-through hole is electrically connected to at least one of said conductor circuits.

4. The multilayered printed circuit board according to claim 1, wherein said stack-via structure comprises at least three via-holes stacked one another.

5. A multilayered printed circuit board comprising:
   a substrate;
   a multilayered structure built thereon and comprising a plurality of conductor circuits and a plurality of interlaminar resin insulating layers in an alternate fashion; and
   at least one stack-via structure comprising a plurality of via-holes stacked one another and electrically connected to at least one of said conductor circuits through said interlaminar resin insulating layers,
   wherein each of said via-holes comprises a land portion formed on a respective one of said interlaminar resin insulating layers and a filled via structure portion filling an opening of the respective one of the interlaminar resin insulating layers with a metal layer such that said via-holes are stacked one another immediately above said filled via structure portion of each of said via-holes, said via-holes include an outermost layer via-hole in an outermost layer of said interlaminar resin insulating layers, and at least one of said via-holes other than said outermost layer via-hole has said land portion protruding from a periphery portion of said stack-via structure to an area where said interlaminar resin insulating layers occupy and none of said conductor circuits are present.

6. The multilayered printed circuit board according to claim 5, further comprising a plated-through hole formed in the substrate, wherein the plated-through hole is electrically connected to at least one of said conductor circuits through said substrate.

7. The multilayered printed circuit board according to claim 5, further comprising a plated-through hole penetrating through said substrate and at least one of said interlaminar resin insulating layers adjacent to said substrate, wherein the plated-through hole is electrically connected to at least one of said conductor circuits through said substrate and at least one of said interlaminar resin insulating layers adjacent to said substrate.

8. The multilayered printed circuit board according to claim 5, wherein a part of the via-hole formed in an extending manner exists in a region of ½ or more of a width of the area where said interlaminar resin insulating layers occupy and none of said conductor circuits are present, in a planar view of the area.

9. The multilayered printed circuit board according to claim 5, wherein said stack-via structure comprises at least three via-holes stacked one another.

10. A multilayered printed circuit board comprising:
    a substrate;
    a multilayered structure built thereon and comprising a plurality of conductor circuits and a plurality of interlaminar resin insulating layers in an alternate fashion;
    at least one stack-via structure comprising a plurality of via-holes stacked one another and electrically connected to at least one of said conductor circuits through said interlaminar resin insulating layers; and
    a solder resist layer formed on said multilayered structure,
    wherein each of said via-holes comprises a land portion formed on a respective one of said interlaminar resin insulating layers and a filled via structure portion filling an opening of the respective one of the interlaminar resin insulating layers with a metal layer such that said via-holes are stacked one another immediately above said filled via structure portion of each of said via-holes, and said interlaminar resin insulating layers include an outermost layer having a coefficient of linear expansion which is smaller than coefficients of linear expansion of the interlaminar resin insulating layers other than said outermost layer.

11. The multilayered printed circuit board according to claim 10, wherein the outermost layer has a coefficient of linear expansion of 100 ppm/° C. or less.

12. The multilayered printed circuit board according to claim 11, wherein said outermost layer contains a particle and a rubber component.

13. The multilayered printed circuit board according to claim 12, wherein said particle is at least one of an inorganic particle, a resin particle and a metal particle.

14. The multilayered printed circuit board according to claim 10, wherein said outermost layer is made of a resin composition including at least one resin selected from the group consisting of a thermosetting resin, a photosensitive resin, a resin composition of a thermosetting resin and a thermoplastic resin, and a resin composition of a thermosetting resin and a photosensitive resin.

15. The multilayered printed circuit board according to claim 11, further comprising a solder bump provided on said uppermost via-hole and extending through said solder resist layer, wherein said uppermost via-hole has a concave portion and the solder bump is formed on the concave portion.

16. The multilayered printed circuit board according to claim 15, wherein said via-holes are piled on one another with centers substantially overlapped.

17. The multilayered printed circuit board according to claim 15, wherein the depth of said concave portion is 5 to 25 μm.

18. The multilayered printed circuit board according to claim 15, further comprising at least one layer comprising gold, said at least one layer connecting said uppermost via-hole and said solder bump.

19. The multilayered printed circuit board according to claim 10, wherein said stack-via structure comprises at least three via-holes stacked one another.

20. A multilayered printed circuit board comprising:
a substrate;
a multilayered structure built thereon and comprising a plurality of conductor circuits and a plurality of interlaminar resin insulating layers in an alternate fashion;
at least one stack-via structure comprising a plurality of via-holes stacked one another and electrically connected to at least one of said conductor circuits through said interlaminar resin insulating layers; and
a solder resist layer formed on said multilayered structure, wherein each of said via-holes comprises a land portion formed on a respective one of said interlaminar resin insulating layers and a filled via structure portion filling an opening of the respective one of the interlaminar resin insulating layers with a metal layer such that said via-holes are stacked one another immediately above said filled via structure portion of each of said via-holes, said via-holes include an outermost layer via-hole in an outermost layer of said interlaminar resin insulating layers, and at least one of said via-holes has a center deviated from an axis of said stack-via structure.

21. The multilayered printed circuit board according to claim 20, wherein said interlaminar resin insulating layers include an outermost layer having a coefficient of linear expansion of 100 ppm/° C. or less.

22. The multilayered printed circuit board according to claim 21, wherein said outermost layer contains a plurality of particles and a rubber component.

23. The multilayered printed circuit board according to claim 22, wherein said particles comprise at least one of inorganic particles, resin particles and metal particles.

24. The multilayered printed circuit board according to claim 21, wherein said outermost layer is made of a resin composition including at least one resin selected from the group consisting of a thermosetting resin, a photosensitive resin, a resin composition of a thermosetting resin and a thermoplastic resin, and a resin composition of a thermosetting resin and a photosensitive resin.

25. The multilayered printed circuit board according to claim 20, wherein said outermost layer contains a plurality of particles and a rubber component in a resin.

26. The multilayered printed circuit board according to claim 25, wherein said particles comprise at least one of inorganic particles, resin particles and metal particles.

27. The multilayered printed circuit board according to claim 25, wherein said interlaminar resin insulating layers include an outermost layer made of a resin composition including at least one resin selected from the group consisting of a thermosetting resin, a photosensitive resin, a resin composition of a thermosetting resin and a thermoplastic resin, and a resin composition of a thermosetting resin and a photosensitive resin.

28. The multilayered printed circuit board according to claim 25, wherein said outermost layer is made of a resin composition including at least one resin selected from the group consisting of a thermosetting resin, a photosensitive resin, a resin composition of a thermosetting resin and a thermoplastic resin, and a resin composition of a thermosetting resin and a photosensitive resin.

29. The multilayered printed circuit board according to claim 20, wherein said via holes comprise at least three via-holes stacked or piled one another.

30. A multilayered printed circuit board comprising:
a substrate;
a multilayered structure built thereon and comprising a plurality of conductor circuits and a plurality of interlaminar resin insulating layers in an alternate fashion;
a plurality of via-holes piled one another and electrically connected to at least one of said conductor circuits through said interlaminar resin insulating layers, said via-holes include an uppermost via-hole provided through an outermost layer of said interlaminar resin insulating layers, said uppermost via-hole has a concave portion; and
a solder resist layer formed on said multilayered structure, wherein each of said via-holes comprises a land portion formed on a respective one of said interlaminar resin insulating layers and a filled via structure portion filling an opening of the respective one of the interlaminar resin insulating layers with a metal layer such that said via-holes are stacked one another immediately above said filled via structure portion of each of said via-holes, said via-holes include an outermost layer via-hole in an outermost layer of said interlaminar resin insulating layers, said outermost layer contains a plurality of particles and a rubber component in a resin layer via-hole has a concave portion on a surface.

31. The multilayered printed circuit board according to claim 30, wherein said via holes comprise at least three via-holes stacked or piled one another.

32. A multilayered printed circuit board comprising:
a substrate;
a multilayered structure built thereon and comprising a plurality of conductor circuits and a plurality of interlaminar resin insulating layers in an alternate fashion;
at least one stack-via structure comprising a plurality of via-holes stacked one another and electrically connected to at least one of said conductor circuits through said interlaminar resin insulating layers; and
a solder resist layer formed on said multilayered structure, wherein each of said conductor circuits and via-holes comprises a copper plating layer, said copper plating layer of each of said via-holes has a land portion formed on a respective one of said interlaminar resin insulating layers and a via hole portion extending through said respective one of said interlaminar resin insulating layers, said via hole portion of said copper plating layer comprises a filled via structure portion filling an opening of the respective one of the interlaminar resin insulating layers with a metal layer such that said via-holes are stacked one another immediately above said filled via structure portion of each of said via-holes, at least one of said via-holes has a center deviated from an axis of said stack-via structure, said at least one of said via-holes having said center deviated is piled such that an outer rim of a lower one of said via-holes and an outer rim of a bottom surface of an upper one of said via-holes have a distance of 5 to 70 μm, and said via-holes are piled on one another such that centers of said via-holes are within 5 μm.

33. The multilayered printed circuit board according to claim 32, further comprising an uppermost via-hole having a concave portion on the upper surface over said via-holes.

34. The multilayered printed circuit board according to claim 32, wherein said via holes comprise at least three via-holes stacked or piled one another.

35. A multilayered printed circuit board comprising:
a substrate;
a multilayered structure built thereon and comprising a plurality of conductor circuits and a plurality of interlaminar resin insulating layers in an alternate fashion;
a plurality of via-holes piled one another and electrically connected to at least one of said conductor circuits through said interlaminar resin insulating layers, said via-holes include an uppermost via-hole provided through an outermost layer of said interlaminar resin insulating layers, said uppermost via-hole has a concave portion; and
wherein each of said via-holes comprises a land portion formed on a respective one of said interlaminar resin insulating layers and a filled via structure portion filling an opening of the respective one of the interlaminar resin insulating layers with a metal layer such that said via-holes are stacked one another immediately above said filled via structure portion of each of said via-holes, said via-holes include an outermost layer via-hole in an outermost layer of said interlaminar resin insulating layers, said outermost layer via-hole has a concave portion on a surface.

* * * * *